(12) United States Patent
Bawa et al.

(10) Patent No.: US 12,284,793 B2
(45) Date of Patent: Apr. 22, 2025

(54) COOLING SYSTEMS, COOLING STRUCTURES AND ELECTRONIC DEVICES AND METHODS FOR MANUFACTURING OR OPERATING COOLING SYSTEMS, COOLING STRUCTURES AND ELECTRONIC DEVICES

(71) Applicant: Intel Corporation, Santa Clara, CA (US)

(72) Inventors: Ritu Bawa, Bangalore (IN); Ruander Cardenas, Portland, OR (US); Kathiravan D, Bangalore (IN); Jia Yan Go, Kulim (MY); Chin Kung Goh, Pulau Pinang (MY); Jeff Ku, Taipei (TW); Prakash Kurma Raju, Bangalore (IN); Baomin Liu, Hillsborough, OR (US); Twan Sing Loo, Penang (MY); Mikko Makinen, Santa Clara, CA (US); Columbia Mishra, Mountain View, CA (US); Juha Paavola, Hillsboro, OR (US); Prasanna Pichumani, Bangalore (IN); Daniel Ragland, Sherwood, OR (US); Kannan Raja, Beaverton, OR (US); Khal Ern See, Batu Gajah (MY); Javed Shaikh, Bangalore (IN); Gokul Subramaniam, Bangalore (IN); George Baoci Sun, Folsom, CA (US); Xiyong Tian, Beijing (CN); Hua Yang, Beijing (CN); Mark Carbone, Cupertino, AL (US); Vivek Paranjape, Hillsboro, OR (US); Nehakausar Pinjari, Bangalore (IN); Hari Shanker Thakur, Bangalore (IN); Christopher Moore, Hillsboro, OR (US); Gustavo Fricke, San Jose, CA (US); Justin Huttula, Portland, OR (US); Gavin Sung, Taipei (TW); Sammi Wy Liu, Taipei (TW); Arnab Sen, Bangalore (IN); Chun-Ting Liu, Taipei (TW); Jason Y. Jiang, Taipei (TW); Gerry Juan, Taipei (TW); Shih Wei Nien, Taipei (TW); Lance Lin, Taipei (TW); Evan Kuklinski, North Plains, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 17/754,429

(22) PCT Filed: Dec. 23, 2020

(86) PCT No.: PCT/CN2020/138747
§ 371 (c)(1),
(2) Date: Apr. 1, 2022

(87) PCT Pub. No.: WO2021/129692
PCT Pub. Date: Jul. 1, 2021

(65) Prior Publication Data
US 2023/0337406 A1      Oct. 19, 2023

(51) Int. Cl.
*H05K 7/20* (2006.01)
*G06F 1/20* (2006.01)
*H01L 23/34* (2006.01)

(52) U.S. Cl.
CPC ......... *H05K 7/20963* (2013.01); *G06F 1/203* (2013.01); *H01L 23/34* (2013.01);
(Continued)

(58) Field of Classification Search
CPC ...... G06F 1/20; G06F 2200/201; G06F 1/206; G06F 1/203; H01L 23/427; H01L 23/467;
(Continued)

(56) References Cited

U.S. PATENT DOCUMENTS 6,550,531 B1 * 4/2003 Searls ................ F28D 15/0233
165/104.33
6,924,978 B2 * 8/2005 DiStefano ............... G06F 1/203
361/679.48
(Continued)

FOREIGN PATENT DOCUMENTS

| CN | 1987727 A | 6/2007 |
|---|---|---|
| CN | 101257778 A | 9/2008 |
| EP | 2192827 A2 | 6/2010 |

*Primary Examiner* — Michael A Matey
(74) *Attorney, Agent, or Firm* — SPL Patent Attorneys PartG mbB; Kieran O'Leary

(57) ABSTRACT

An electronic device comprises a heat source and a heat distribution structure coupled to the heat source to distribute heat generated by the heat source during operation of the electronic device.

21 Claims, 107 Drawing Sheets

(52) U.S. Cl.
CPC ..... *H05K 7/20154* (2013.01); *H05K 7/20309* (2013.01); *H05K 7/20318* (2013.01); *H05K 7/20336* (2013.01); *H05K 7/2099* (2013.01)

(58) Field of Classification Search
CPC ....... H01L 23/34; H01L 23/367; H01L 23/38; H05K 7/20154; H05K 7/20145; H05K 7/20336; H05K 7/20136; H05K 7/20163; H05K 7/20172; H05K 7/20972; H05K 7/20727; H05K 7/20309; H05K 7/20318; H05K 7/20963; H05K 7/2099; H05K 1/0203; H05K 7/20381; F28D 15/0275; F28D 15/02; F28D 15/0266; F28D 15/04; F28D 2021/0028; F28D 9/00; G02F 1/133385
See application file for complete search history.

(56) References Cited

U.S. PATENT DOCUMENTS

| | | | |
|---|---|---|---|
| 6,957,692 B1 | 10/2005 | Win-Haw et al. | |
| 7,480,140 B2* | 1/2009 | Hara | H05K 7/20145 361/709 |
| 9,170,615 B2* | 10/2015 | Wilke | H05K 7/20727 |
| 9,795,055 B1* | 10/2017 | Campbell | G06F 1/20 |
| 10,423,200 B1* | 9/2019 | North | G06F 1/1616 |
| 10,698,458 B2* | 6/2020 | Delano | F28D 15/0233 |
| 11,632,876 B2* | 4/2023 | Zhang | H05K 7/20154 361/695 |
| 11,775,034 B2* | 10/2023 | Chen | H05K 7/20163 361/679.46 |
| 2002/0075647 A1* | 6/2002 | DiFonzo | H05K 7/20172 361/679.48 |
| 2002/0140446 A1* | 10/2002 | Kung | G06F 1/206 361/679.47 |
| 2002/0186532 A1* | 12/2002 | Tomioka | H05K 7/20154 361/679.48 |
| 2004/0114322 A1* | 6/2004 | Agata | G06F 1/203 361/679.27 |
| 2004/0201958 A1 | 10/2004 | Lev | |
| 2005/0289372 A1* | 12/2005 | Park | G06F 1/3203 713/300 |
| 2006/0002081 A1* | 1/2006 | Hongo | G06F 1/203 361/691 |
| 2008/0229759 A1* | 9/2008 | Ouyang | H10N 10/00 62/3.3 |
| 2009/0195983 A1* | 8/2009 | Reichert | G06F 1/203 361/695 |
| 2010/0157522 A1* | 6/2010 | Refai-Ahmed | G06F 1/20 361/679.54 |
| 2010/0246128 A1 | 9/2010 | Hernon et al. | |
| 2011/0024086 A1* | 2/2011 | Tan | H01L 23/3735 29/890.032 |
| 2011/0279974 A1* | 11/2011 | Fujiwara | G06F 1/20 361/692 |
| 2012/0073789 A1* | 3/2012 | Bhattacharya | G06F 1/20 165/104.34 |
| 2014/0235156 A1* | 8/2014 | Li | G06F 1/203 454/184 |
| 2014/0262160 A1* | 9/2014 | Vadakkanmaruveedu | F28D 15/02 29/890.035 |
| 2014/0321056 A1* | 10/2014 | Yoshikawa | H05K 7/20818 361/690 |
| 2015/0017905 A1* | 1/2015 | Li | G06F 1/203 454/184 |
| 2015/0060023 A1 | 3/2015 | Herring et al. | |
| 2015/0062805 A1* | 3/2015 | Katsumata | F28F 13/06 361/679.49 |
| 2015/0195952 A1* | 7/2015 | Tsunoda | G06F 1/203 361/690 |
| 2015/0253823 A1* | 9/2015 | Han | G06F 1/203 361/679.52 |
| 2016/0069616 A1 | 3/2016 | Shen | |
| 2016/0085273 A1* | 3/2016 | Delano | G06F 1/203 361/679.48 |
| 2016/0109911 A1* | 4/2016 | Han | H01L 23/427 361/679.46 |
| 2017/0083061 A1* | 3/2017 | Stellman | H01L 23/467 |
| 2017/0277235 A1* | 9/2017 | Delano | H05K 7/20427 |
| 2017/0303433 A1* | 10/2017 | Delano | G06F 1/206 |
| 2018/0164042 A1* | 6/2018 | Stellman | C25D 5/10 |
| 2018/0187978 A1 | 7/2018 | Herring et al. | |
| 2019/0074237 A1* | 3/2019 | Beauchemin | H01L 25/50 |
| 2019/0348345 A1 | 11/2019 | Parida et al. | |
| 2019/0383528 A1* | 12/2019 | Sung | F25B 21/02 |
| 2020/0146178 A1* | 5/2020 | Horng | H05K 5/0213 |
| 2020/0363104 A1* | 11/2020 | MacDonald | G06F 1/20 |
| 2020/0396864 A1* | 12/2020 | Ku | H05K 7/20309 |
| 2021/0072805 A1* | 3/2021 | He | H05K 7/20145 |
| 2021/0173456 A1* | 6/2021 | Kulkarni | H05K 7/20163 |
| 2022/0113092 A1* | 4/2022 | Ku | F28D 15/04 |
| 2022/0225536 A1* | 7/2022 | R. | G06F 1/206 |
| 2022/0256684 A1* | 8/2022 | Gao | H05K 7/20545 |

* cited by examiner

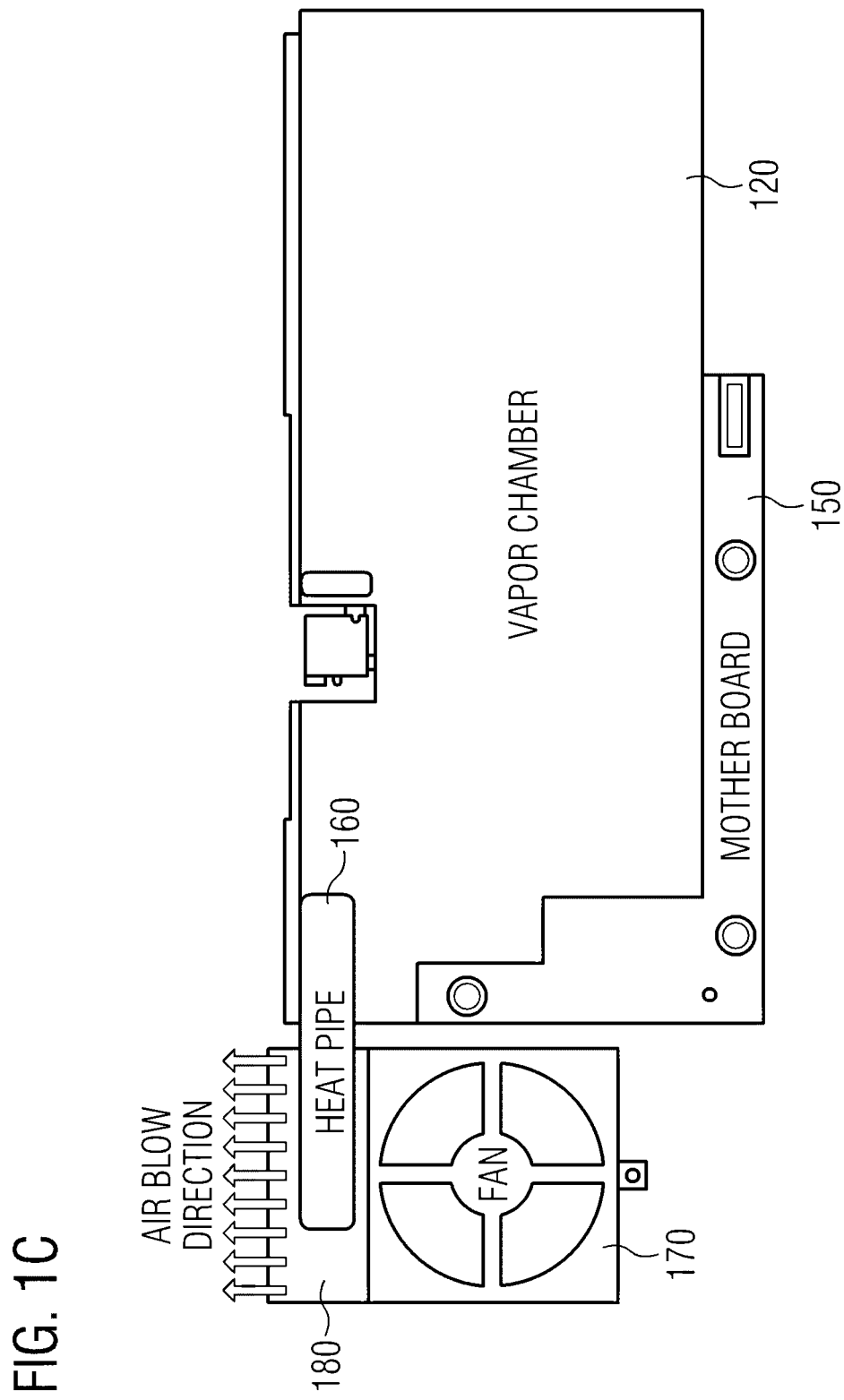

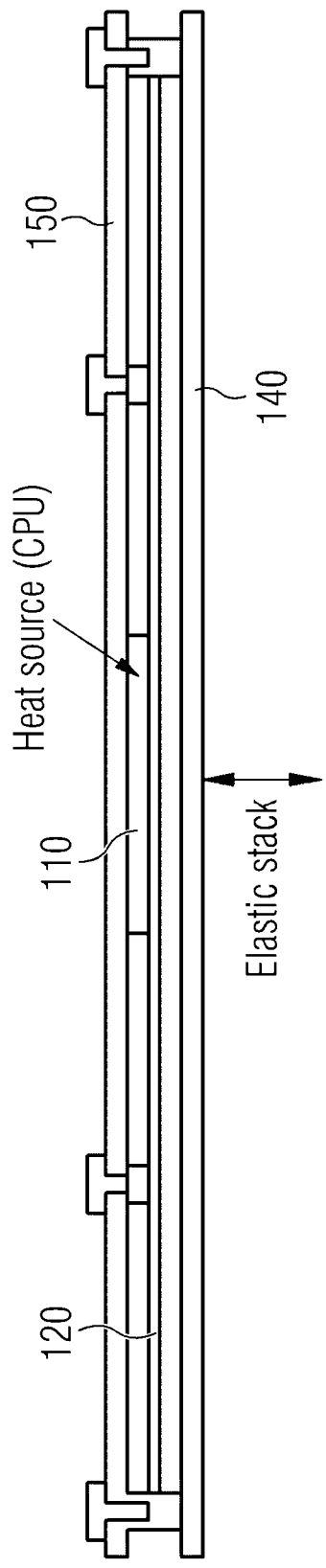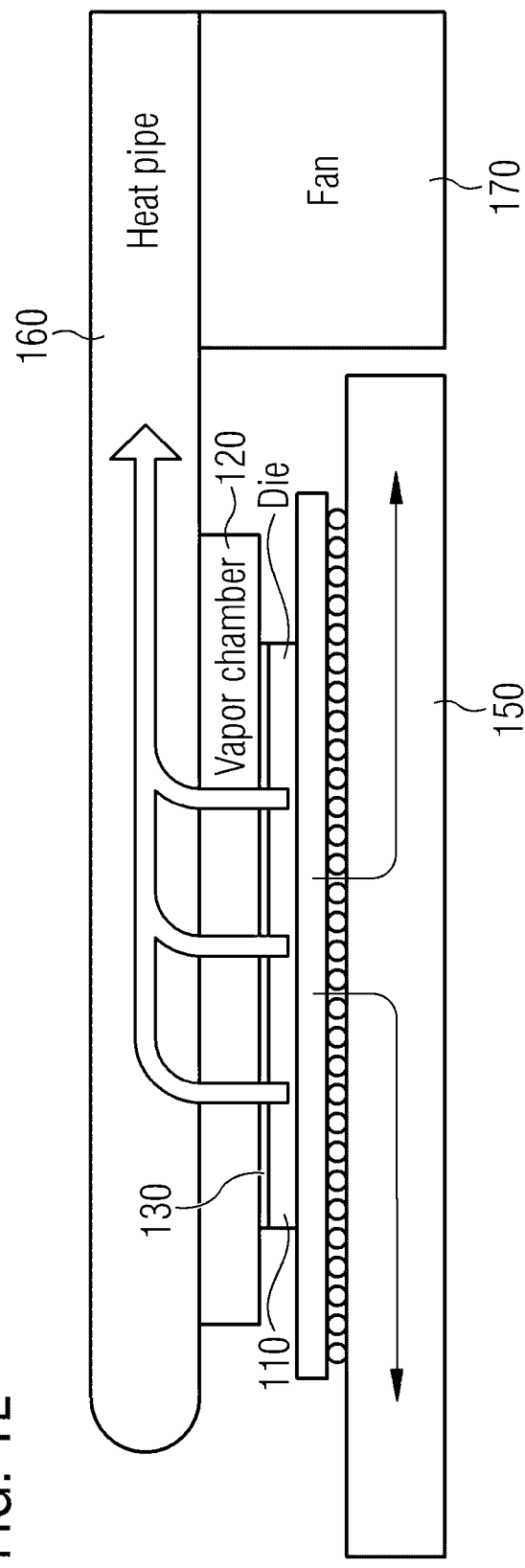

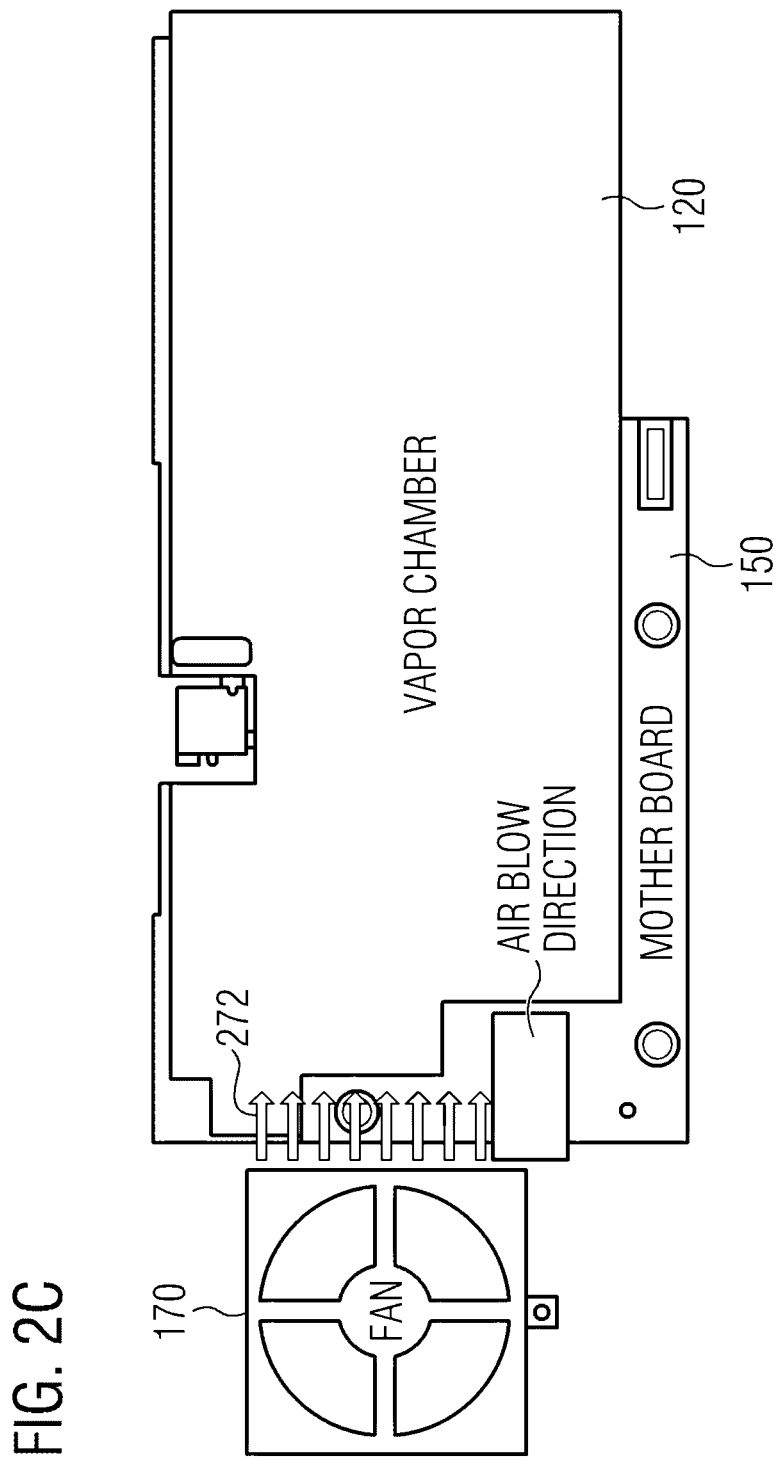

FIG. 2D

|  | Part | Dimension (mm) |
|---|---|---|
| LCD | Glass | 0.4 |
|  | OCA | 0.075 |
|  | Touch + SRF | 0.145 |
|  | OCA | 0.2 |
|  | Panel | 1.95 |
|  | Graphite | 0.1 |
|  | Gap | 0.29 |
| Thermal | VC | 0.6 |
|  | Cu Plate | 0.9 |
|  | TIM | 0.05 |
|  | CPU | 0.97 |
|  | PCB | 0.7 |
|  | Gap | 0.25 |
|  | Graphite | 0.5 |
|  | A cover | 0.81 |
|  | Total | 7.94 |

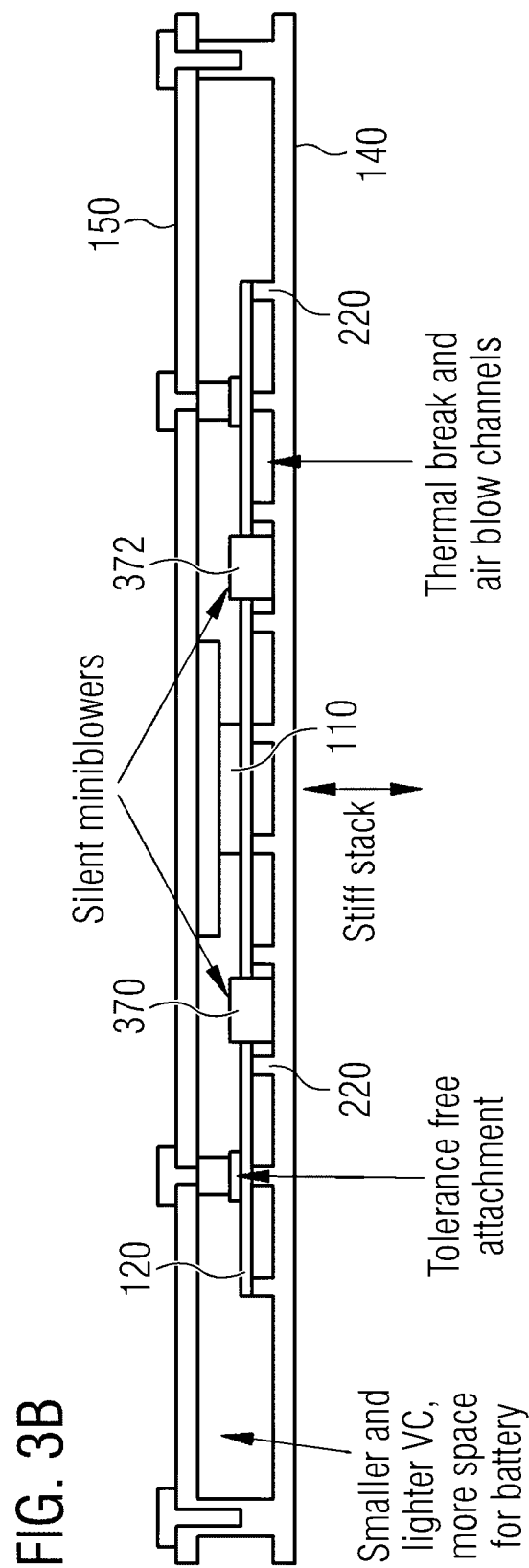

Effect of Flower Over Vapor Chamber

Flow Over Flat Plate Thermal Correlation (150mm x 200mm VC)

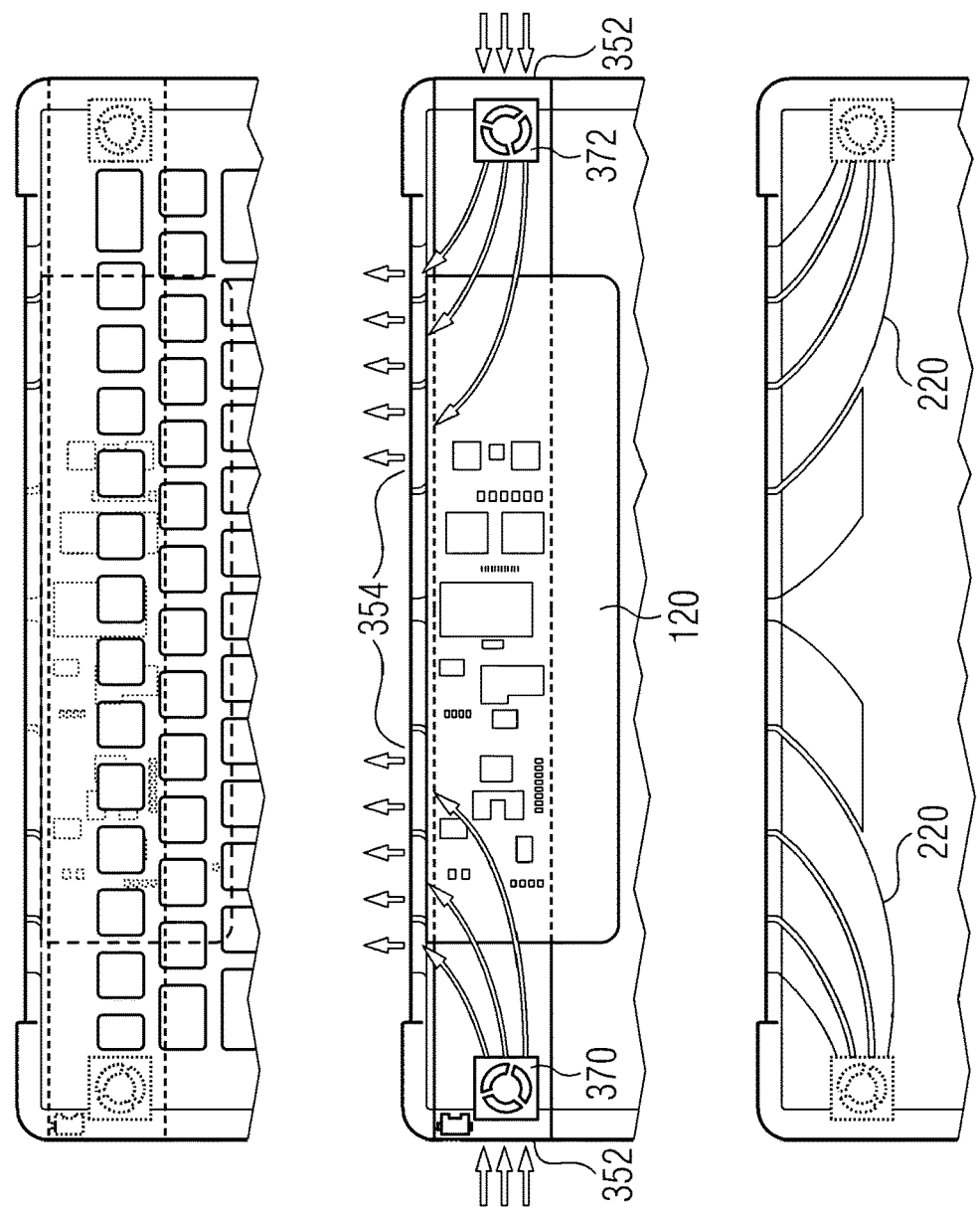
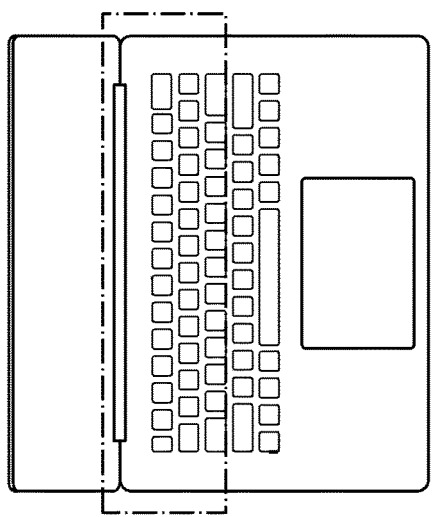
FIG. 3G

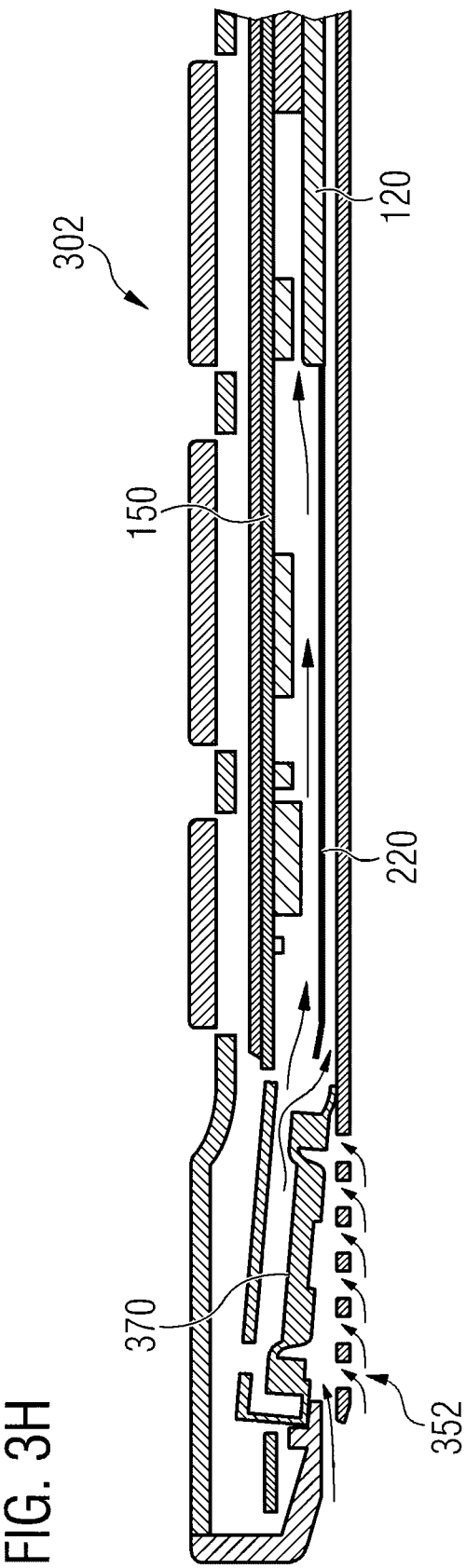

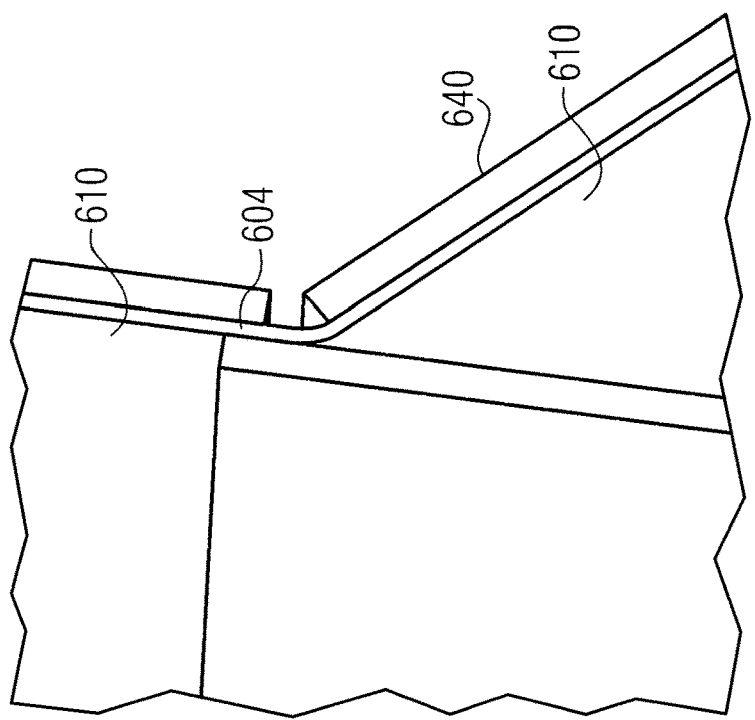
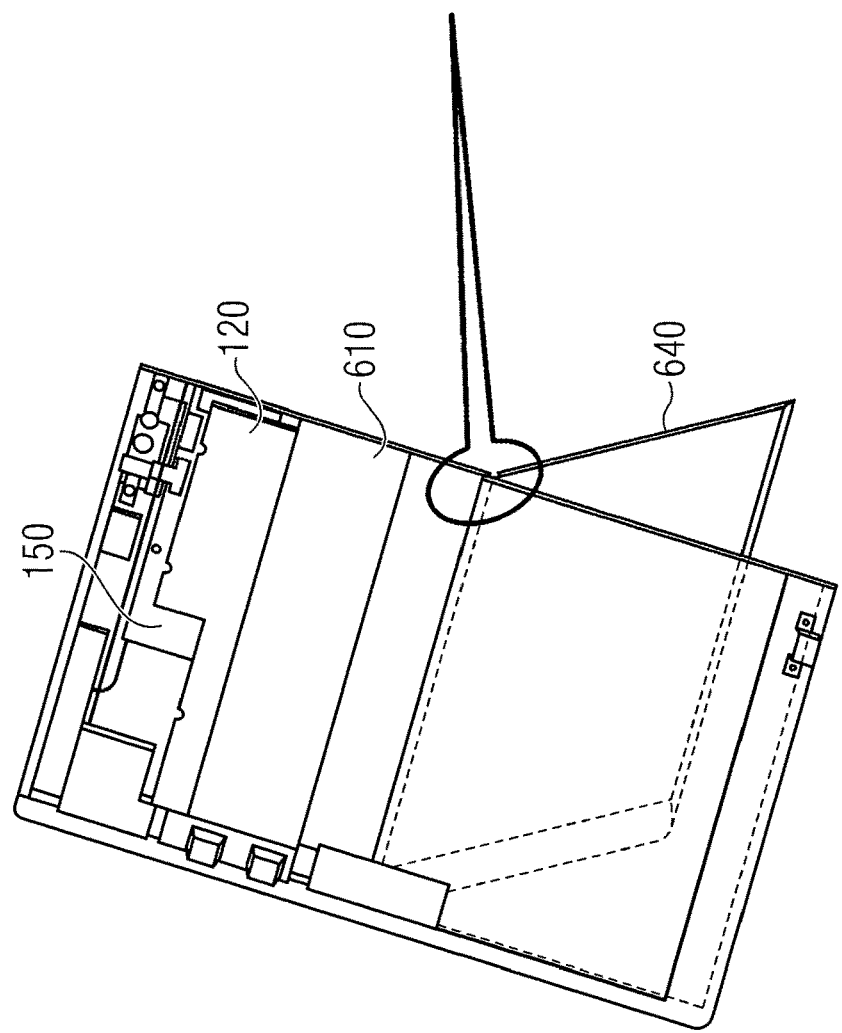
FIG. 6G

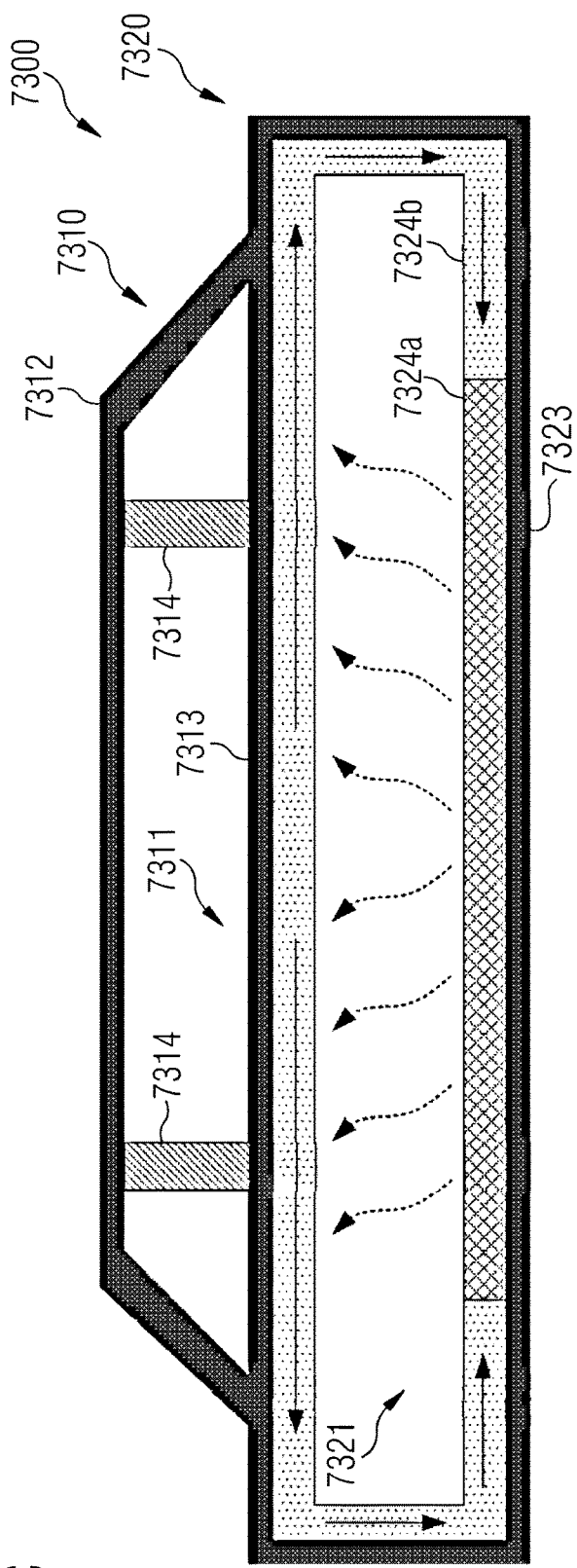

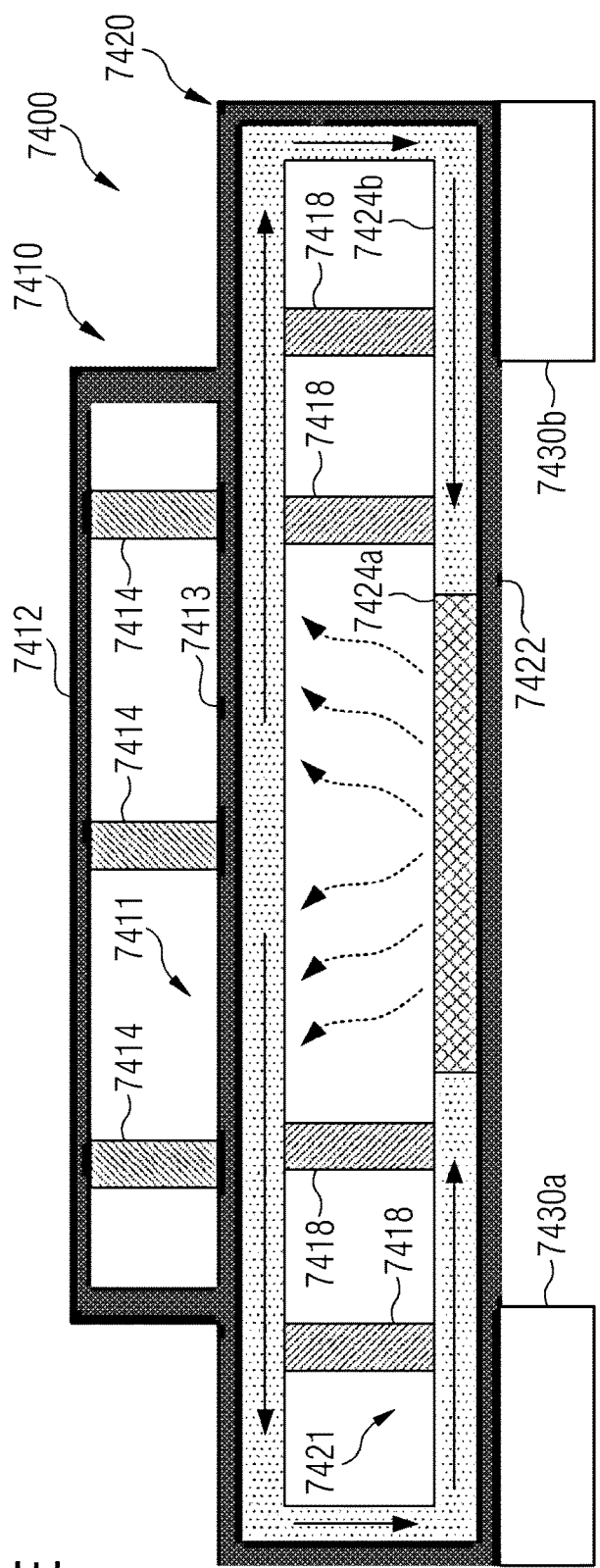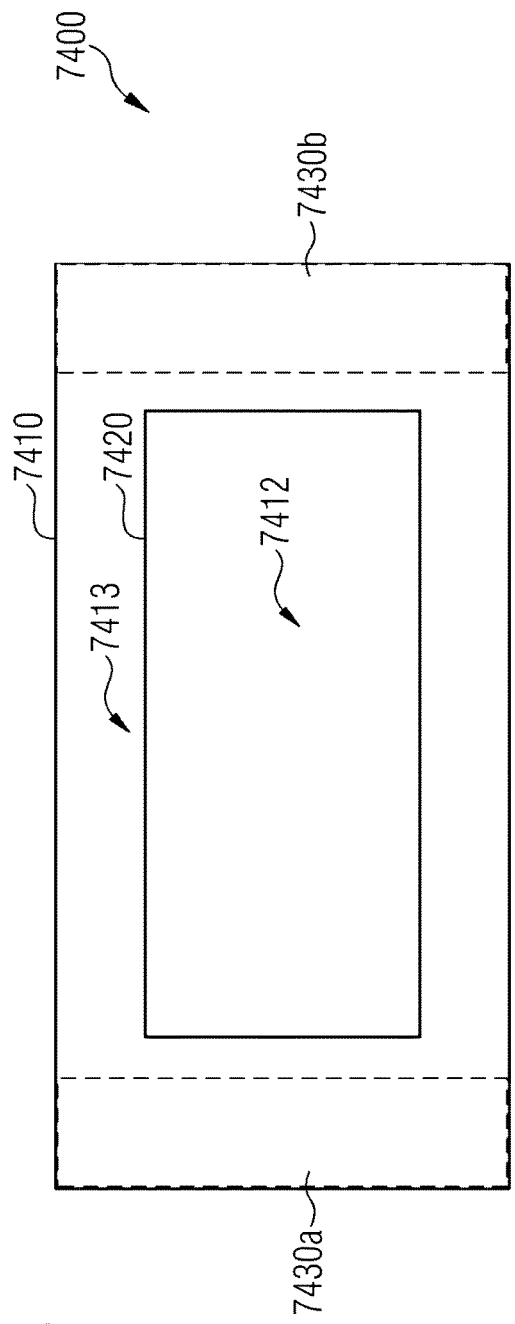
FIG. 7E
FIG. 7F

71100

71100

71112

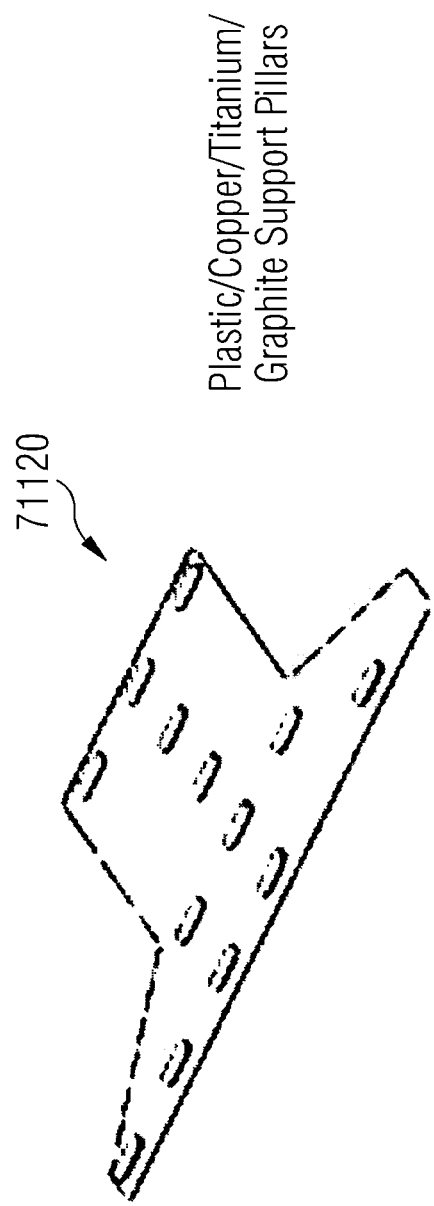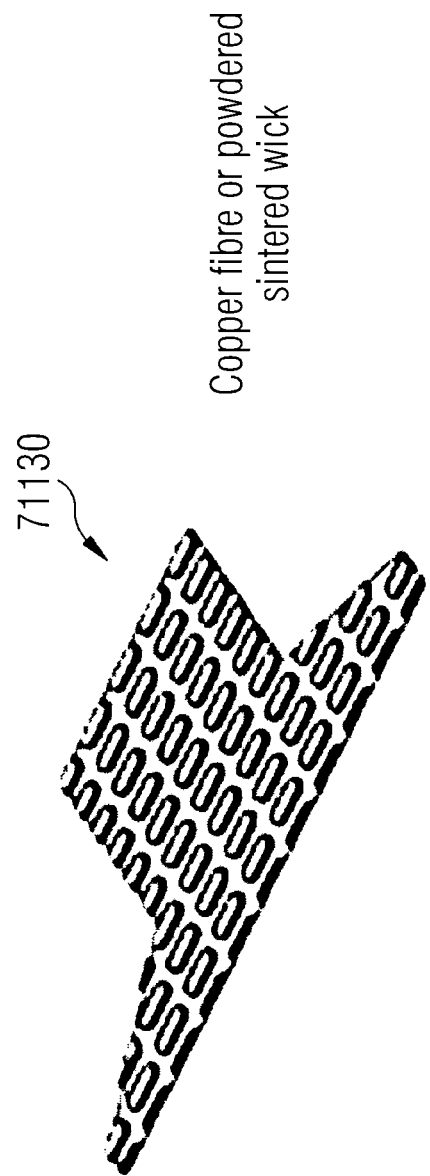

9500

COOLING SYSTEMS, COOLING STRUCTURES AND ELECTRONIC DEVICES AND METHODS FOR MANUFACTURING OR OPERATING COOLING SYSTEMS, COOLING STRUCTURES AND ELECTRONIC DEVICES

CROSS-REFERENCE TO RELATED APPLICATIONS

This application claims priority to U.S. Provisional Application 63/035,025, filed on Jun. 5, 2020, U.S. application Ser. No. 17/033,518, filed on Sep. 25, 2020, U.S. application Ser. No. 16/728,812, filed on Dec. 27, 2019, and U.S. application Ser. No. 16/914,294, filed on Jun. 27, 2020. The contents of these earlier filed applications are incorporated by reference herein in their entirety.

FIELD

Examples relate to cooling concepts for electronic devices.

BACKGROUND

Modern computing systems, especially those with very small feature sizes, draw substantial power and generate large amounts of heat. Because heat accumulation can damage electronic components, heat dissipation is an important concern in system design.

Emerging trends in electronic devices are changing the expected performance and form factor of devices as devices and systems are expected to increase performance and function while having a relatively thin profile. However, the increase in performance and/or function causes an increase in the thermal challenges of the devices and systems. Insufficient cooling can cause a reduction in device performance, a reduction in the lifetime of a device, and delays in data throughput.

BRIEF DESCRIPTION OF THE FIGURES

Some examples of apparatuses and/or methods will be described in the following by way of example only, and with reference to the accompanying figures, in which

FIG. 1c shows a schematic top view of a cooling system of an electronic device;

FIG. 1d shows a schematic cross section of an electronic device;

FIG. 1e shows a schematic cross section of an electronic device;

FIG. 2c shows a schematic top view of a cooling system of an electronic device;

FIG. 2d shows possible thicknesses of various components of an electronic device;

FIG. 3b shows a schematic cross section of a cooling system with a smaller vapor chamber and miniblowers;

FIG. 3g shows schematic illustration of an airflow through an electronic device;

FIG. 3h shows schematic illustration of an airflow through an electronic device;

FIG. 6g shows a schematic illustration of an electronic device;

FIG. 7c-7d illustrate another example of a two-tier vapor chamber apparatus;

FIG. 7e-7f illustrate another example of a two-tier vapor chamber apparatus;

FIG. 7i is a chart illustrating an example relationship between thermal conductivity of air versus pressure;

FIG. 7o-7u illustrate example steps during a manufacturing process for a two-tier vapor chamber cooling apparatus according to examples of the present disclosure;

FIG. 7aa illustrates a computing system that is arranged in a point-to-point (PtP) configuration according to an example;

FIG. 9b is an illustration of a heat transfer assembly that may be used in place of, or in conjunction with, the assembly of FIG. 9a;

FIG. 9o is a top view illustration of a vapor chamber;

FIG. 9r is a cutaway side view illustration of a vapor chamber;

FIG. 9s is a perspective view illustration of heat transfer from an evaporator to a condenser;

FIG. 9t is a cutaway side view illustration of a vapor chamber with selected portions of the wick removed;

FIG. 9u is an illustration of a bottom plate, which may also be referred to as an evaporator plate;

FIG. 9v is an illustration of a patched wick;

FIG. 9w is an illustration of a top plate, which may also be referred to as a condenser plate;

FIG. 9x is an illustration of a finished vapor chamber;

FIG. 9y is a flowchart of a method;

FIG. 9z is a block diagram of a processor that may have more than one core, may have an integrated memory controller, and may have integrated graphics according to one or more examples of the present specification;

Figure 9A:
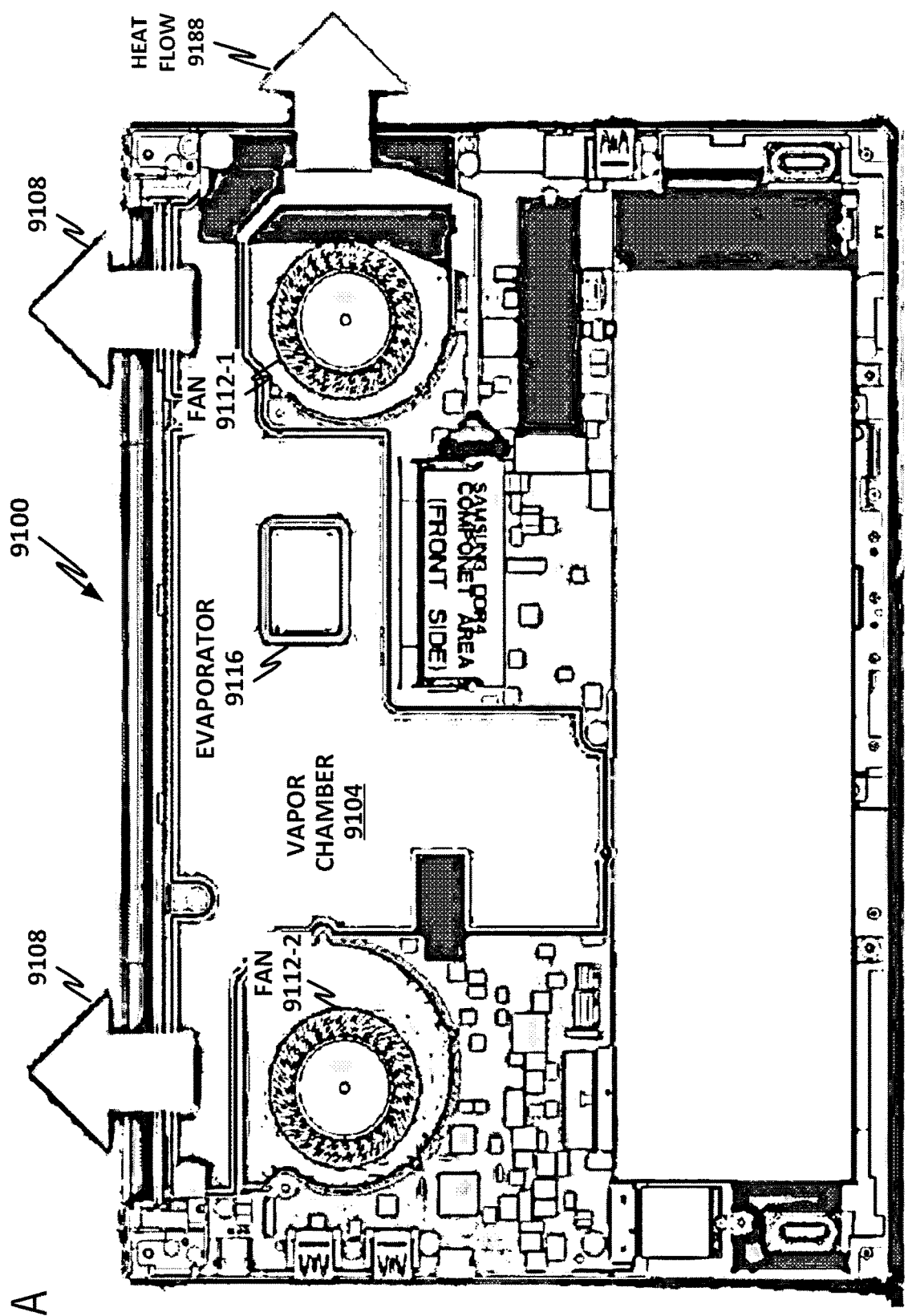
FIG. 9a is a block diagram illustration of internal components of a portable computing system, such as a laptop computer.

FIG. 9aa-9ad are block diagrams of computer architectures according to one or more examples of the present specification; and FIG. 9ae is a block diagram of components of a computing platform.

DETAILED DESCRIPTION

Some examples are now described in more detail with reference to the enclosed figures. However, other possible examples are not limited to the features of these examples described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an 'or', this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Figure 1A:
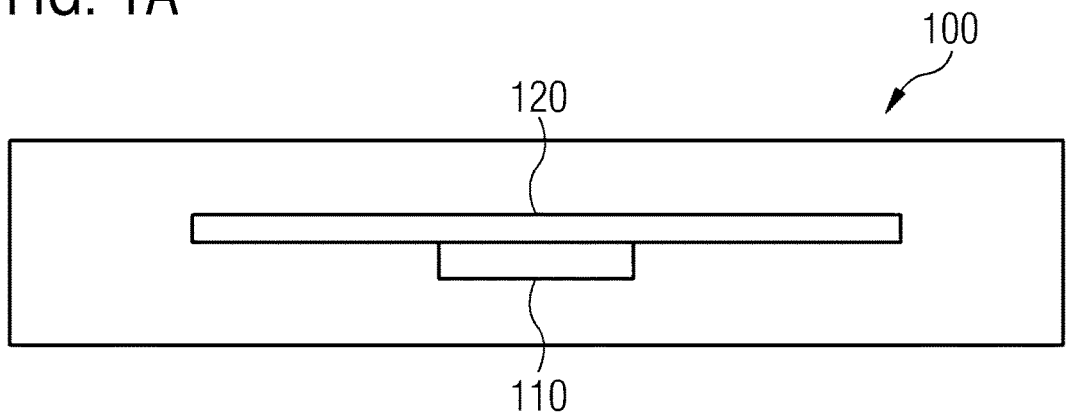
FIG. 1a shows a schematic cross section of an electronic device.

FIG. 1a shows a schematic illustration of an electronic device. The electronic device 100 comprises a heat source 110 and a vapor chamber 120 coupled to the heat source 110 to distribute heat generated by the heat source 110 during operation of the electronic device.

By coupling a vapor chamber to a heat source of an electronic device, heat generated by the heat source may be dissipated fast away from the heat source.

The vapor chamber 120 may be directly or indirectly thermally coupled to the heat source 110 through a thermal interface material TIM (e.g. thermal grease, heat-conducting paste or liquid metal). The TIM may improve the thermal contact between the vapor chamber 120 and the heat source 110. For example, a metal plate (e.g. cold plate or pedestal) may be arranged between the heat source 110 and the vapor chamber 120 or the vapor chamber 120 may be directly coupled to the heat source 110 through a thermal interface material. The metal plate may be a copper plate or an aluminum plate or a plate made of another suitable metal or alloy. For example, the VC 120 may be in contact with the heat source 110 except for TIM in between.

The thermal interface material may compensate unevennesses of the backside surface of the heat source 110 and/or the surface of the vapor chamber 120 in order to enable a good thermal contact over the whole backside surface of the heat source 110. The thermal interface material may comprise a maximal thickness of at most than 0.25 mm (or at most 0.2 mm or at most 0.15 mm).

Two elements may be thermally coupled, if only thermally conductive material is located between the two elements. A material may be thermally conductive, if the thermal conductivity is at least 100 W/mK. Two elements may be directly thermally coupled, if the two elements are in contact with each other or in contact with each other except for TIM in between.

The heat source 110 may comprise or may be a semiconductor die configured to generate heat (e.g. waste heat) during operation. The waste heat may be generated automatically during operation of the semiconductor die. An integrated circuit may be implemented on the semiconductor die. The semiconductor die may be a bare die with uncovered backside or a packaged semiconductor die with a backside covered by package material (e.g. mold or another material).

The heat source 110 may be or may comprise a processor (e.g. a CPU, a microcontroller, a digital signal processor or a graphics processing unit GPU), a transmitter, a receiver, a transceiver, a power supply and/or a voltage converter or another integrated circuit.

The electronic device may be a tablet, a laptop, a notebook, a mobile phone, a computer (e.g. personal computer or server) or another electronic device.

A cooling system of an electronic device may include all elements (e.g. cold plate), structures (e.g. guiding structure for air flow) and/or components (e.g. vapor chamber, heat pipe and/or fan), which help to actively or passively distribute or dissipate heat generated by the heat source 110.

More details, optional features and aspects are mentioned in connection with the examples described below.

Figure 1G:
FIG. 1g shows a flow chart of a method for manufacturing an electronic device.
Figure 1H:
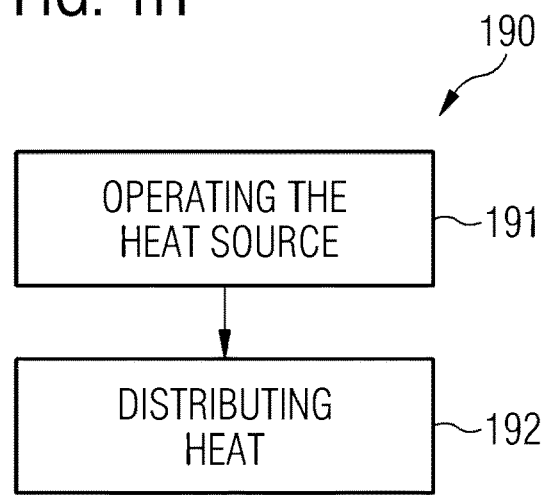
FIG. 1h shows a flow chart of a method for operating an electronic device.
Figure 1B:
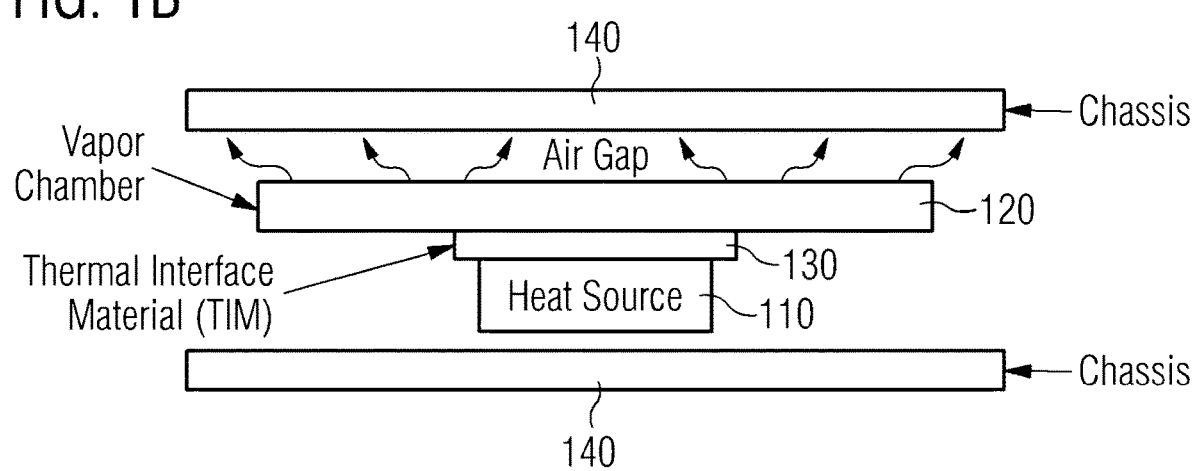
FIG. 1b shows a schematic cross section of an electronic device.

FIG. 1b shows a schematic illustration of an electronic device. The electronic device may be implemented similar to the electronic device described in connection with FIG. 1a. A thermal interface material 130 is arranged between the vapor chamber 120 and the heat source 110. Further, the stack of the heat source 110, the TIM 130 and the vapor chamber 120 is located inside an enclosure or chassis 140 of the electronic device. An air gap is located between the vapor chamber 120 and the chassis 140 of the electronic device so that the temperature of the chassis 140 stays below a temperature limit (e.g. skin temperature limit).

More details, optional features and aspects are mentioned in connection with one or more examples described above or below.

FIG. 1c shows a schematic illustration of an electronic device. The electronic device may be implemented similar to the electronic device described in connection with FIG. 1a or 1b. The heat source is mounted on a circuit board 150 (e.g. mother board) and the vapor chamber 120 is thermally coupled to a heat sink 180 through a heat pipe 160. The heat sink is arranged adjacent to a fan 170 and the fan 170 is configured to blow air through or over the heat sink 180.

FIG. 1c may show an example of a cooling system with heat sink, heat pipe and vapor chamber in a tablet.

More details, optional features and aspects are mentioned in connection with one or more examples described above or below.

FIG. 1d shows a schematic illustration of an electronic device. The electronic device may be implemented similar to the electronic device described in connection with FIG. 1a, 1b or 1c. The heat source 110 is arranged between the vapor chamber 120 and the circuit board 150 (e.g. printed circuit board PCB). The circuit board 150 may carry the heat source 110 and the vapor chamber 120 and may be connected to the enclosure 140. This may provide an elastic stack.

More details, optional features and aspects are mentioned in connection with one or more examples described above or below.

FIG. 1e shows a schematic illustration of an electronic device. The electronic device may be implemented similar to the electronic device described in connection with FIG. 1a or 1c. The heat source 110 is a semiconductor die on a package substrate forming a semiconductor device (e.g. a CPU). The semiconductor device is mounted to a circuit board (e.g. mother board). Heat can be dissipated from the heat source 110 through the vapor chamber 120 and the heat pipe 160 to a region of the heat pipe in proximity of a fan 170.

More details, optional features and aspects are mentioned in connection with one or more examples described above or below.

Figure 1F:
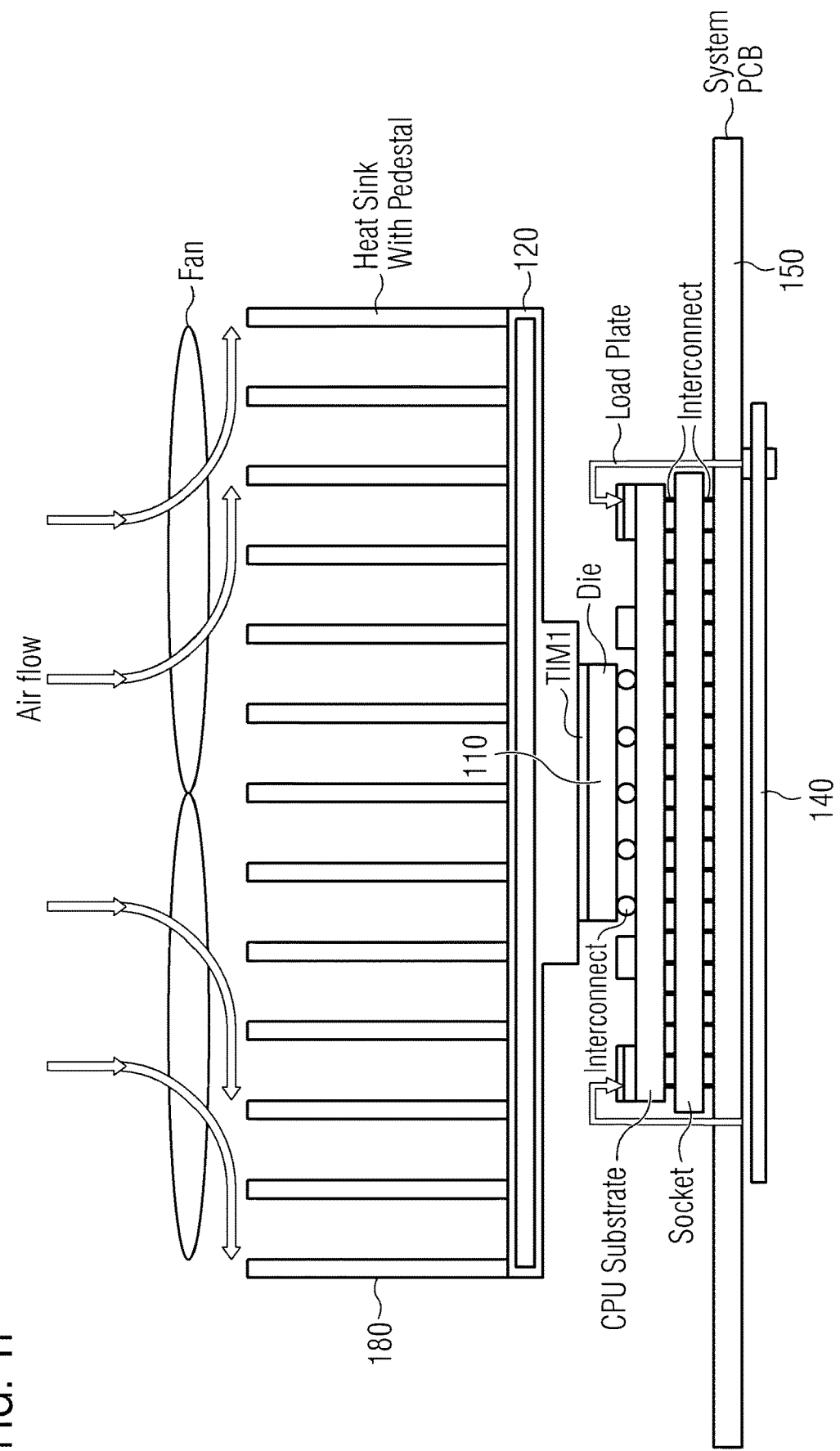
FIG. 1f shows a schematic cross section of an electronic device.

FIG. 1f shows a schematic illustration of an electronic device. The electronic device may be implemented similar to the electronic device described in connection with FIG. 1a. The vapor chamber 120 may be integrated between a heat sink 180 and a pedestal into a heat distribution arrangement. The pedestal is thermally coupled to a backside of a semiconductor die of a heat source 110 through a TIM. The semiconductor die (e.g. CPU) is attached to a substrate (e.g. CPU substrate), which is attached to a socket. Interconnects are located between the semiconductor die and the substrate and between the substrate and the socket. The semiconductor die, the substrate and the socket may form a semiconductor device mounted to a circuit board 150 (e.g. system PCB). The semiconductor device may be secured to the circuit board through a connection structure (e.g. load plate), which may engage at an edge region of the substrate. The circuit board is connected to the enclosure 140 of the electronic device. A fan may be located in proximity to the heat sink 180 in order to blow air through or over the heat sink 180.

The example of FIG. 1f may show a thermal solution for a bare die CPU package.

More details, optional features and aspects are mentioned in connection with one or more examples described above or below.

FIG. 1g shows a flow chart of a method for manufacturing an electronic device. The method 185 comprises thermally coupling 186 a heat distribution structure to a heat source.

The heat distribution structure may be a vapor chamber (or a heat pipe or a metal plate).

More details, optional features and aspects are mentioned in connection with one or more examples described above or below.

FIG. 1h shows a flow chart of a method for operating an electronic device. The method 190 comprises operating 191 the heat source and distributing 192 heat generated by the heat source during operation by a heat distribution structure.

The heat distribution structure may be a vapor chamber (or a heat pipe or a metal plate). Further, the method may comprise blowing air along a surface of the heat distribution structure by at least one ventilation.

More details, optional features and aspects are mentioned in connection with one or more examples described above or below.

Some examples relate to a cooling system comprising a heat distribution structure coupled to a heat source to distribute heat generated by the heat source. Further, the cooling system comprises at least one ventilation comprising a main blow direction, wherein the at least one ventilation is arranged so that the main blow direction is directed towards the heat distribution structure. The heat distribution structure may comprise at least one of a vapor chamber or a heat pipe. The at least one ventilation may be a fan, a blower, a mini blower or a blower fan.

More details, optional features and aspects are mentioned in connection with one or more examples described above or below.

Figure 2A:
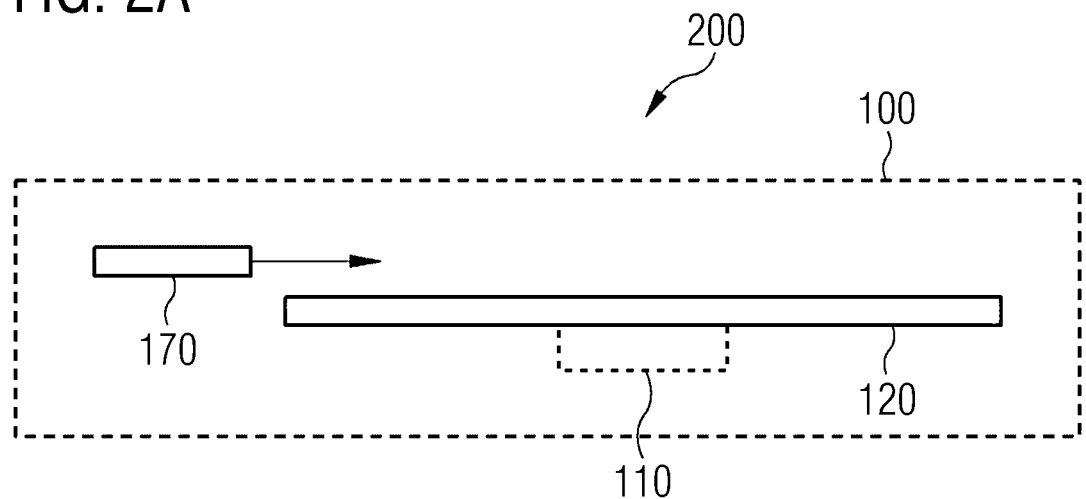
FIG. 2a shows a schematic cross section of a cooling system for an electronic device.

FIG. 2a shows a schematic illustration of a cooling system 200 for an electronic device 100. The cooling system 200 comprises a vapor chamber 120 configured to be coupled to a heat source 110 of an electronic device 100. Further, the cooling system 200 comprises a fan 170 comprising a main blow direction. The fan 170 is arranged so that the main blow direction is directed towards the vapor chamber 120.

By blowing air towards the vapor chamber, the surface temperature of the vapor chamber may be significantly reduced. In this way, the cooling efficiency and/or cooling capacity and/or cooling speed of the vapor chamber may be improved.

The vapor chamber 120 may be configured to be directly or indirectly thermally coupled to the heat source 110 by a thermal interface material. For example, a metal plate (e.g. cold plate) may be arranged between the heat source 110 and the vapor chamber 120 or the vapor chamber 120 may be directly coupled to the heat source 110 through a thermal interface material.

The fan 170 may be configured to blow air along a surface of the vapor chamber 120. The fan 170 may also be called or may be a blower or a blower fan. The fan 170 may be located close or adjacent to an edge of the vapor chamber 120. For example, the fan may be arranged and/or configured so that at least 50% (or at least 80% or at least 90%) of the air flow caused by the fan flows along the surface of the vapor chamber. For example, the fan 170 may be configured to cause an air flow with an average air velocity of at least 0.25 m/s (or at least 0.4 m/s or at least 0.5 m/s) and/or at most 1 m/s (or at most 0.7 m/s or at most 0.5 m/s. In this way, the cooling efficiency and/or cooling capacity and/or cooling speed of the vapor chamber may be significantly improved, while the additional power consumption may be kept low.

The main blow direction may be a direction in which most of the air is blown by the fan 170 or in which the fan 170 is configured to blow most of the air. The fan 170 may be configured to blow more air in the main blow direction than in any other direction.

The fan 170 may be arranged in an electronic device so that more air is blown toward the vapor chamber 120 than anywhere else. For example, the main blow direction points to the vapor chamber 120.

The main blow direction of the fan 170 may be substantially perpendicular to the rotation axis of the fan. For example, an angle between the main blow direction and the rotation axis may be at most 100° and at least 80°. A main air inlet direction of the fan 170 may be substantially in parallel to the rotation axis of the fan 170. For example, an angle between the main air inlet direction and the rotation axis may be at most 10°.

A small fan may be sufficient to reduce the surface temperature of the vapor chamber 120 significantly. For example, the fan 170 may comprise a maximal dimension with respect to height, length and width of at most 50 mm (or at most 40 mm or at most 30 mm). The fan 170 may be a single outlet fan.

The fan 170 may be arranged and/or configured to blow air into a gap extending from the vapor chamber 120 to a component opposite the VC 120 (e.g. a part of an enclosure of the electronic device and/or a backside of a screen of the electronic device). The gap may be thinner than 0.5 mm (or thinner than 0.4 mm or thinner than 0.3 mm).

The electronic device 100 may further comprises a circuit board configured to carry the heat source. The fan 170 may be configured to blow air into a gap extending from the circuit board to a part of an enclosure of the electronic device and/or a backside of a screen of the electronic device. For example, the fan 170 may be arranged and/or configured so that a part of the air is blown into the gap between the vapor chamber 120 and the enclosure or the backside of the screen of the electronic device and another part of the air is blown into the gap between the circuit board and the enclosure or the backside of the screen of the electronic device.

The cooling system 200 may further comprise a guiding structure (or one or more guiding elements) configured to guide the air flow caused by the fan 170 along the surface of the vapor chamber 120. The guiding structure may be arranged on the surface of the vapor chamber, a part of an enclosure of the electronic device and/or a backside of a screen of the electronic device. A main structure of the guiding structure may comprise or may be made of plastic, the material of the part of the enclosure or gasket material. The guiding structure may comprise gasket material to seal a gap between the guiding structure and the opposite element. For example, the guiding structure may be integrally formed on a part of the enclosure or attached to a part of the enclosure and a gasket material may seal the gap between the guiding structure and the vapor chamber 120. The guiding structure may completely surround the vapor chamber except for one or more air inlet openings and one or more air outlet openings.

In contrast to cooling concepts where the heat is transferred to a heat sink, which is cooled by a fan, the fan 170 of the described cooling system 200 blows air to the vapor chamber. In other words, the fan 170 is arranged before the heat source with respect to the direction of motion of the air. Therefore, no heat sink might be arranged adjacent to the fan 170 or directly adjacent to a housing of the fan 170. By using a fan 170 according to the described concept, the electronic device may be implemented without any heat sink. In this way, weight and/or space may be saved.

The vapor chamber 120 may be arranged along an air flow path between the fan and an air outlet. The fan 170 may be configured to cause an air flow from an air inlet through the fan 170 to a surface of the vapor chamber 120 and from the surface of the vapor chamber 120 to an air outlet.

The vapor chamber 120 may be implemented as described above or below. For example, the vapor chamber 120 may have a maximal dimension of at least 150 mm (or at least 200 mm or at least 250 mm).

The fan 170 may be arranged laterally beside the vapor chamber 120. For example, a vertical extension of the fan 170 may overlap a vertical extension of the vapor chamber 120. In this way, a very thin electronic device may be enabled.

For example, the cooling system 200 may be implemented in an electronic device 100 comprising a heat source 110. For example, the electronic device may comprise a thickness of at most 8 mm (or at most 10 mm, at most 9 mm or at most 7 mm).

The electronic device 100 may be implemented without heat pipe and/or without heat sink for the fan 170. The fan 170 may sufficiently improve the cooling so that no heat pipe or heat sink may be necessary.

The electronic device 100 may comprise a thermal design power of at most 10 W (or at most 12 W or at most 15 W) and/or at least 5 W (or at least 6 W or at least 7 W). The fan 170 may sufficiently improve the cooling so that a thermal design power of up to 15 W may be possible without implementing other active cooling elements. For example, the electronic device 100 may comprise only passive cooling elements except for the one fan 170.

The electronic device 100 may comprise an enclosure comprising one or more inlet openings in proximity to the fan, wherein the fan is configured to suck air from outside the electronic device through the one or more inlet openings. For example, the one or more inlet openings may be located on a backside portion or side portion of a cover of a tablet or laptop.

A graphite sheet may be attached to a part of the enclosure (e.g. backside cover and/or display panel) inside the electronic device 100.

The heat source 110 may comprise or may be a semiconductor die configured to generate heat (e.g. waste heat) during operation. The waste heat may be generated automatically during operation of the semiconductor die. An integrated circuit may be implemented on the semiconductor die. The semiconductor die may be a bare die with uncovered backside or a packaged semiconductor die with a backside covered by package material (e.g. mold or another material).

The heat source 110 may be or may comprise a processor (e.g. CPU, microcontroller, digital signal processor or a graphics processing unit GPU), a transmitter, a receiver, a transceiver, a power supply and/or a voltage converter or another integrated circuit.

The electronic device 100 may be a tablet, a laptop, a notebook, a mobile phone, a computer (e.g. personal computer or server) or another electronic device.

More details, optional features and aspects are mentioned in connection with one or more examples described above or below.

Figure 2G:
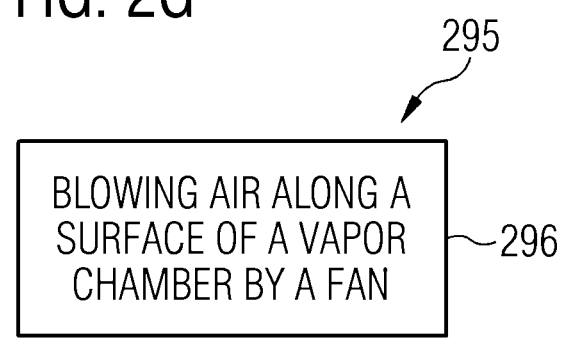
FIG. 2g shows a flow chart of a method for operating an electronic device.
Figure 2B:
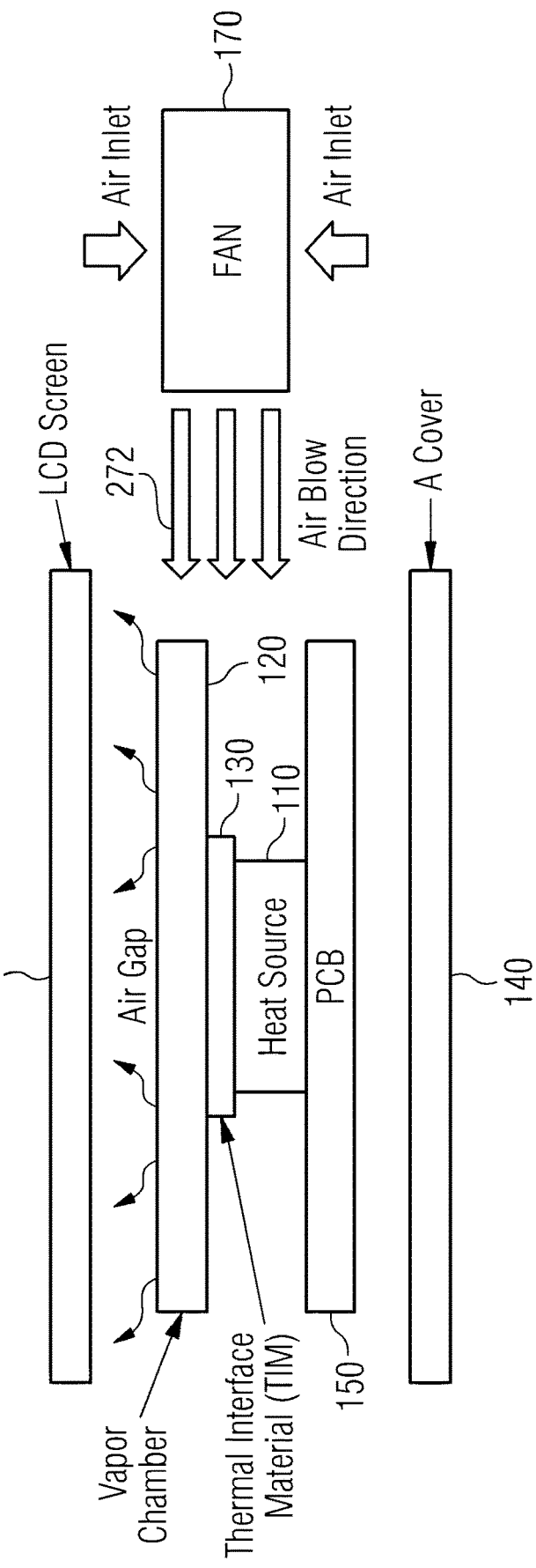
FIG. 2b shows a schematic cross section of an electronic device.

FIG. 2b shows a schematic cross section of an electronic device. The electronic device may be implemented similar to the electronic device described in connection with FIG. 2a. A thermal interface material 130 is arranged between the vapor chamber 120 and the heat source 110. The heat source 110 is mounted on a PCB 150. Further, the stack including the PCB 150, the heat source 110, the TIM 130 and the vapor chamber 120 is located inside an enclosure or chassis 140 of the electronic device. The enclosure 140 includes a backside cover (e.g. A cover of a tablet) at a backside and an LCD screen 210 at the front side of the electronic device. An air gap is located between the vapor chamber 120 and the LCD screen 210 of the electronic device so that the temperature at the outside surface stays below a temperature limit (e.g. skin temperature limit). A fan 170 is located beside the vapor chamber 120 inside the electronic device. The fan 170 is arranged and configured so that an air blow direction 272 (e.g. main blow direction) is oriented towards the vapor chamber 120. The fan 170 has air inlets at top and bottom and an air outlet at a side. The fan 170 blows air into the gap between the vapor chamber 120 and the LCD screen.

More details, optional features and aspects are mentioned in connection with one or more examples described above or below.

FIG. 2c shows a schematic top view of a cooling system of an electronic device. The electronic device may be implemented similar to the electronic device described in connection with FIG. 2b. The outlet from the fan 170 which is in the air flow direction 272 (e.g. main blow direction) is oriented towards the vapor chamber 120 (e.g. thin piece of copper/water construction). No heatsink or fin-like structure is attached to the fan 170.

FIG. 2c may show an example of a cooling system with fan and vapor chamber in a tablet. The tablet may be implemented with vapor chamber but without heat sink and heat pipe. For example, FIG. 2c may be a top view of the device shown in FIG. 2b.

More details, optional features and aspects are mentioned in connection with one or more examples described above or below.

FIG. 2d shows possible thicknesses of various components of an electronic device. The liquid crystal display LCD may comprise a stack including a glass layer, an adhesive layer (e.g. OCA), a touch and Super Retardation Film SRF, an adhesive layer (e.g. OCA) and a panel. A graphite sheet is attached to the backside of the LCD. Further, a gap is located between the LCD and the vapor chamber. The vapor chamber is thermally coupled to the CPU through a metal plate (e.g. copper plate) and TIM. The CPU is mounted to a PCB. A gap is located between the PCB and a graphite sheet attached to a backside cover (e.g. A cover of a tablet) of the electronic device.

For example, the graphite sheet may have a size of 278.6×189.35 mm$^2$, a thickness of 0.1 mm on the display panel and 0.5 mm on the A cover and a thermal conductivity in-plane k=1350 W/mK and through plane k=10 W/mK.

The vapor chamber may have a size of 180×72.65×0.6 mm$^2$ and a thermal conductivity in-plane k=2000 W/mK and through plane k=10 W/mK.

The fan may have a size of 45×45×3 mm$^3$, a P (mmAq) of 8, a Q (CFM) of 0.9 and a P (in_H2O) of 0.315.

For example, a high Thermal Design Power (TDP) with 9 W in a 13" convertible laptop or tablet chassis with Z height 7.94 mm may be achievable.

More details, optional features and aspects are mentioned in connection with one or more examples described above or below.

Figure 2E:
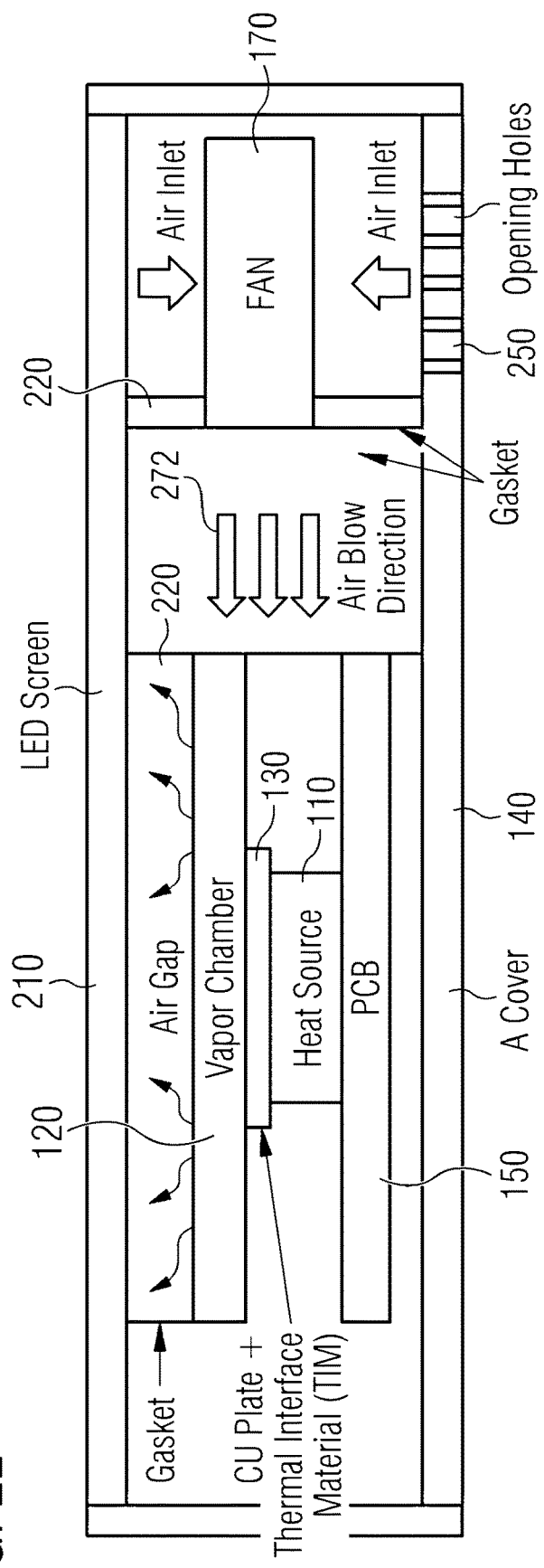
FIG. 2e shows a schematic cross section of an electronic device.

FIG. 2e shows a schematic cross section of an electronic device. The electronic device may be implemented similar to the electronic device described in connection with FIG. 2b. The vapor chamber 120 is thermally coupled to the heat source 110 through a metal plate 230 (e.g. copper Cu plate) and TIM. In addition, the electronic device comprises a guiding structure 220 (e.g. air flow control gasket) configured to guide the air flow caused by the fan along the surface of the vapor chamber 120. A part of the guiding structure 220 may be located along an edge of the vapor chamber 120. Another part of the guiding structure 220 may be located between the vapor chamber 120 and the fan 170. The guiding structure 220 may comprise or may be made of gasket material. The enclosure 140 may comprise a backside cover (e.g. A cover). The backside cover may comprise one or more openings 250 used as air inlet. Further, the backside cover and/or a side cover may comprise one or more openings 250 used as air outlet.

More details, optional features and aspects are mentioned in connection with one or more examples described above or below.

Figure 2F:
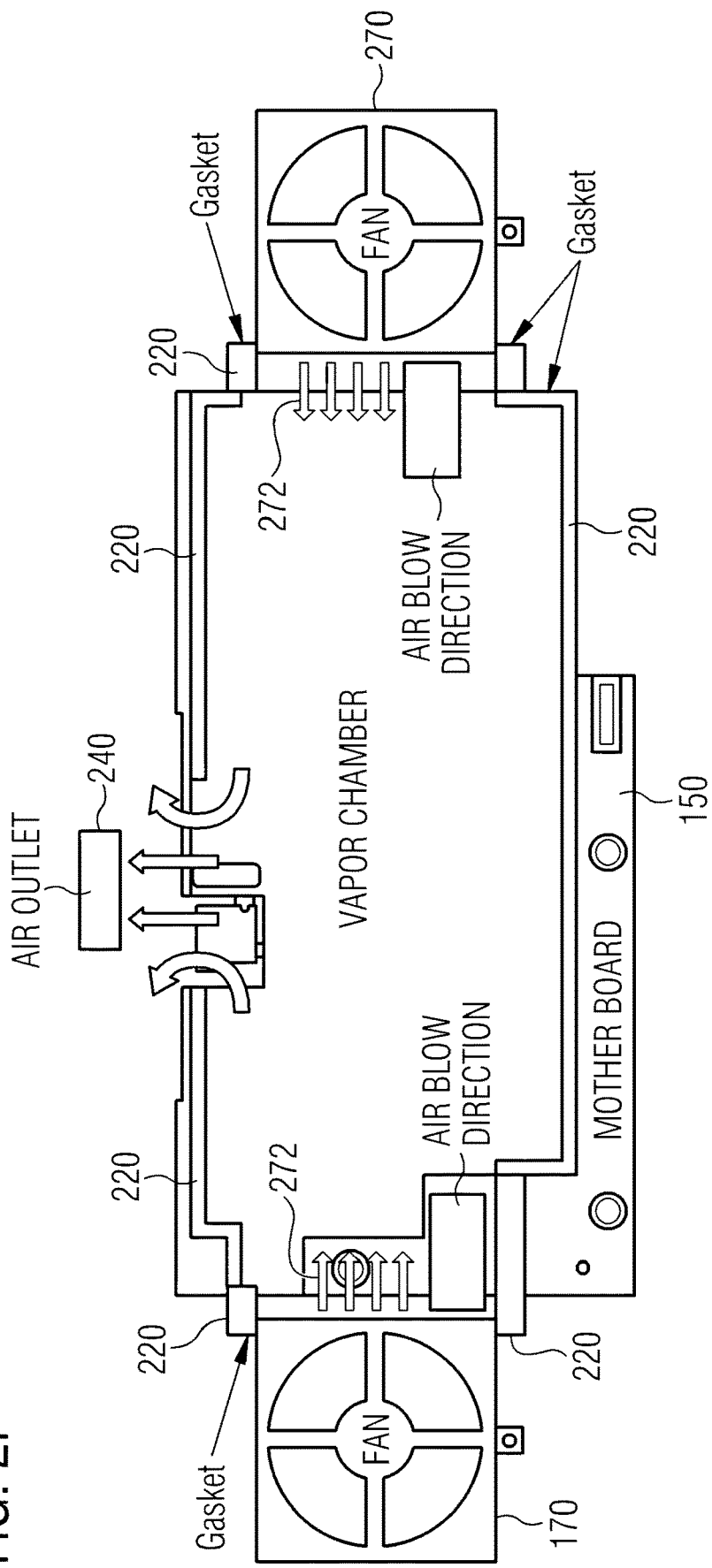
FIG. 2f shows a schematic top view of a cooling system of an electronic device.

FIG. 2f shows a schematic top view of a cooling system of an electronic device. The electronic device may be implemented similar to the electronic device described in connection with FIG. 2e. In addition, the electronic device comprises a second fan 270. The first fan 170 and the second fan 270 are arranged at opposite sides of the vapor chamber 120. The guiding structure 220 encloses the vapor camber 120 at an edge of the vapor chamber 120 except for an air inlet for the first fan 170, an air inlet for the second fan 270 and an air outlet 240.

Alternatively, the second fan 270 or an additional fan may be place in proximity to the air outlet 240 and may be configured to suck air from the gap above the vapor chamber 120 and blows the air through the air outlet 240.

More details, optional features and aspects are mentioned in connection with one or more examples described above or below.

Some examples relate to high thermal performance in thin and light chassis consumer electronic devices. In comparison to other active cooling concepts of forced convection through a heatsink for heat dissipation, forced convection on the vapor chamber surface may be applied instead. By applying this concept, a heat pipe and a heat sink may be eliminated to achieve a thin and light laptop and/or tablet with total system Z-height of 8 mm or less, while the superior cooling capability of active cooling systems may be retained compared to passive cooling systems.

Active cooling systems with fan, heat pipe and heatsink design may be heavy and bulky due to the copper/water heat pipe and copper heatsink, which may have limitations fitting into and meeting the specification of thin and light system. A passive cooling fan-less design, while able to fit into thin and light systems, may be limited by the low Thermal Design Power (TDP) it can cool.

The usage of a fan to blow air along the vapor chamber may eliminate the heat pipe and heat sink and/or achieve high TDP in thin and light systems.

Space saving and optimization for other components or feature assemble in a system may be enabled. Space occupied by the heatsink may be used to grow battery or implement additional features or components. A cycle time reduction in system assembly cell during high volume manufacturing (HVM) may be achievable. A higher performance, thinner and lighter solution compared to other cooling solutions used in such z-height systems may be enabled.

Simulations may show that the proposed concept with fan but without heat sink and heat pipe may cause a similar skin temperature on the LCD or the backside cover (e.g. A cover) of a tablet compared to a system with heat sink and heat pipe.

For example, heat sink and heat pipe may be eliminated to accommodate other components/features in a system. Thin and light systems may be achievable if using the proposed concept which may be a hybrid of a fan and a vapor chamber.

The proposed concept may enable high Thermal Design Power (TDP), cost saving, weight saving and/or improved space consumption in x-y-z (e.g. with eliminated heat sink and heat pipe). For example, a system weight (e.g. weight of the electronic device, for example, a tablet) of at most 900 g (or at most 880 g or at most 850 g) may be enabled.

FIG. 2g shows a flow chart of a method for operating the electronic device. The method 295 comprises blowing air 296 along a surface of a vapor chamber by a fan. The fan is arranged so that the main blow direction is directed towards the vapor chamber.

More details, optional features and aspects are mentioned in connection with one or more examples described above or below.

Figure 3A:
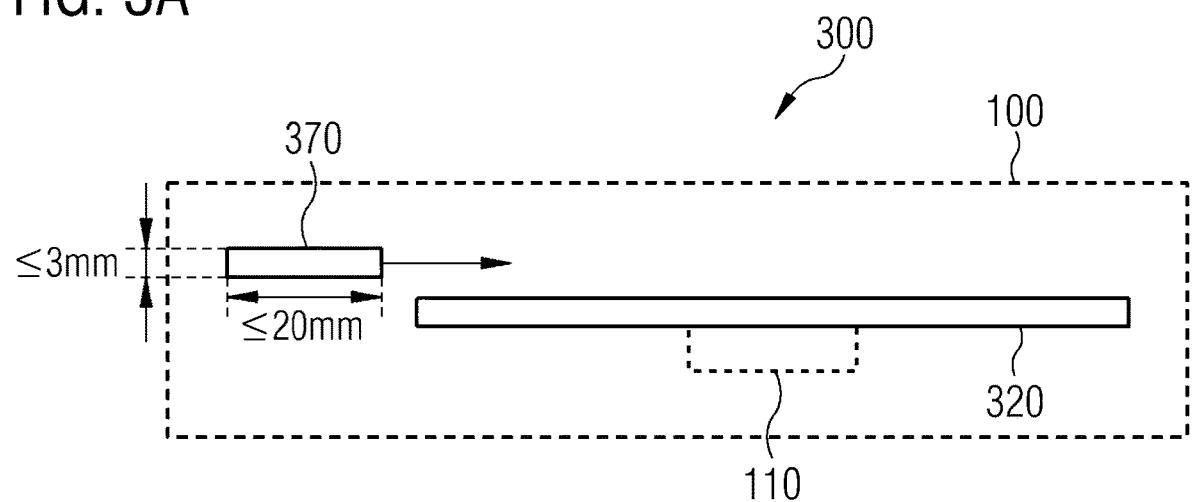
FIG. 3a shows a schematic cross section of a cooling system for an electronic device.

FIG. 3a shows a schematic cross section of a cooling system for an electronic device. The cooling system 300 for the electronic device 100 comprises a heat distribution structure 320 configured to be coupled to a heat source 110 of the electronic device 100. The heat distribution structure 320 comprises a vapor chamber and/or a heat pipe. Further, the cooling system 300 comprises a blower 370 configured to cause an air flow along a surface of the heat distribution structure 320. The blower 370 comprises a maximal length and maximal width of at most 20 mm (or at most 18 mm or at most 15 mm) and/or a maximal thickness of at most 3 mm (or at most 4 mm or at most 2.5 mm).

By using a small blower causing an air flow along the vapor chamber VC or the heat pipe HP, the VC surface temperature or the heat pipe surface temperature can be significantly reduced and the cooling efficiency may be increased. In this way, the size of the VC or HP can be reduced and/or the TDP can be increased in comparison to other concepts.

The blower 370 (or also called miniblower, blower fan or fan) may be arranged and/or configured to blow air (directly) towards the heat distribution structure 320 or guiding structures may be arranged so that air is directed towards the heat distribution structure 320 to cause an air flow along the surface of the heat distribution structure 320. For example, at least 50% of the air flow caused by the blower 370 may flow along the surface of the heat distribution structure 370. The air may be considered to flow along the surface of the heat distribution structure 370, if the air flows in a gap between the surface of the heat distribution structure 370 and an opposite structure (e.g. part of the enclosure). For example, the blower 370 may be configured to cause an air flow with an average air flow velocity of at least 0.25 m/s (or at least 0.4 m/s or at least 0.5 m/s) and/or at most 1 m/s (or at most 0.7 m/s or at most 0.5 m/s. In this way, the cooling efficiency and/or cooling capacity and/or cooling speed of the vapor chamber may be significantly improved, while the additional power consumption may be kept low.

The blower 370 may be arranged laterally beside the heat distribution structure 320. For example, the blower 370 may be arranged directly adjacent to an edge of the heat distribution structure 320 or may be located at a distance of at most 2 cm (or at most 1 cm) to an edge of the heat distribution structure 320. For example, a vertical extension of the blower 370 may overlap with a vertical extension of the heat distribution structure 320. For example, the heat distribution structure 320 may be located laterally beside the blower 370 and vertically between a level of a top surface of the blower 370 and a level of a bottom surface of the blower 370. The blower 370 may have a maximal current consumption of at most 0.08 A (or at most 0.1 A or at most 0.2 A). The blower 370 may be configured to suck air from a bottom side of the blower 370 and blow air at a top side of the blower 370. Alternatively, the blower 370 may suck air from a bottom side and/or a top side and blows air at a side between top side and bottom side. The blower 370 may be aligned horizontally or may be slightly tiled with respect to a horizontal plane. For example, a rotation axis of the blower may be perpendicular to a main surface of the heat distribution structure 320 or a main surface of a circuit board carrying the heat source 110. Alternatively, an angle between the rotation axis of the blower and the main surface of the heat distribution structure 320 or the main surface of a circuit board may be at least 75° (or at least 80° or at least 85°) and/or at most 88° (or at most 85° or at most 82°).

For example, the blower 370 may be configured to blow air into a gap extending from the heat distribution structure 320 to a component opposite to the heat distribution structure 320 (e.g. a part of an enclosure of the electronic device or a backside of a screen of the electronic device). The gap may extend at least over 50% (or at least 70% or at least 90%) of a top surface or bottom surface of heat distribution structure 370. The gap may have a thickness of at most 2 mm (or at most 1.5 mm or at most 1 mm).

For example, the cooling system 300 or the electronic device 100 may further comprise one or more guiding structures configured to guide the air flow caused by the blower 370 along the surface of the heat distribution structure 320. The one or more guiding structures may be arranged on at least one of the surface of the heat distribution structure 320 or a part of an enclosure of the electronic device. For example, the guiding structure may be integrally formed on or attached to an inside surface of the enclosure or may be attached to the surface of the heat distribution structure 320. The guiding structure may comprise the same material as the enclosure or may comprise or may be made of a polymer, plastic or gasket material. For example, the guiding structure may comprise a wall having a height of at most 2 mm (or at most 1.5 mm or at most 1 mm).

In contrast to cooling concepts where a fan is used to blow air over or through a heat sink, the proposed blower 370 causes an air flow directly at the heat distribution structure 320. Therefore, no heat sink may be located adjacent to the blower 370. There might be heat sinks used elsewhere in the electronic device, but not in proximity to the blower 370. For example, no heat sink might be located closer than 2 cm to the blower 370 and/or no heat sink might be located between the blower 370 and the heat distribution structure 320. For example, the electronic device 100 may be implemented without heat spreader for the blower.

The electronic device may further comprise a circuit board (e.g. PCB) configured to carry the heat source 110. The blower 370 may be configured to cause an air flow through a gap between the circuit board and the heat distribution structure 320. The blower 370 may cause the air flow through the gap between the circuit board and the heat distribution structure 320 in addition to the air flow through the gap between the heat distribution structure 320 and the part of the enclosure of the electronic device or the backside of the screen of the electronic device. For example, the circuit board may comprise an opening and the blower 370 may be at least partially located in the opening.

The heat distribution structure 320 may be a flat structure having significantly larger lateral extension than vertical extension. For example, a thickness of the heat distribution structure 320 may be at most 10% (or at most 5%) of a maximal lateral dimension (e.g. length or width) of the heat distribution structure 320. For example, the heat distribution structure 320 may comprise or may be a vapor chamber. The VC may have a maximal dimension of at least 150 mm (or at least 200 mm or at least 220 mm). The maximal dimension may be the largest extension in a characteristic direction of the VC. For example, the maximal dimension for a rectangular VC may be the length of the longer side of the rectangle. However, the VC may have an arbitrary geometry suitable for the specific electronic device with the maximal dimension being the largest distance between two points on the circumference of the VC. Due to the blower 370, the electronic device 100 might not need a heat pipe to transfer heat away from the VC. For example, the electronic device 100 may be implemented without a heat pipe.

Alternatively, the heat distribution structure 320 may comprise or may be an array of heat pipes arranged side by side.

The heat distribution structure 320 may be arranged along an air flow path between the blower 370 and an air outlet. The air flow path may be a path along which air flows to the blower 370 and along which air is blown away from the blower 370. For example, the air flow path extends from an air inlet in the enclosure of the electronic device 100 through the blower 370 to the heat distribution structure 320 and from the heat distribution structure 320 to an air outlet in the enclosure of the electronic device 100.

For example, an enclosure of the electronic device 100 may comprise one or more inlet openings in proximity to the blower 370. The blower may be configured to suck air from outside the electronic device 100 through the one or more inlet openings. The blower 370 may be configured to cause an air flow from an air inlet through the blower 370 to a surface of the heat distribution structure 320 and from the heat distribution structure 320 to an air outlet. The heat distribution structure 320 of the cooling system may be held by the enclosure or chassis of the electronic device.

The blower 370 may be a first blower and the cooling system 300 may comprise one or more further blowers or fans. The cooling system 300 may further comprise a second blower configured to cause an air flow along the surface of the heat distribution structure 320. The second blower may comprise a maximal length and maximal width of at most 20 mm (or at most 18 mm or at most 15 mm) and/or a maximal thickness of at most 3 mm (or at most 4 mm or at most 2.5 mm). The first blower 370 and the second blower may be arranged laterally on opposite sides of the heat distribution structure 320.

The cooling system 300 may be implemented in an electronic device 100. The electronic device 100 may comprise the cooling system 300 and the heat source 110. The electronic device may a low power device using a small blower in addition to a passive cooling concept. For example, the electronic device comprises a thermal design power of at most 25 W (or at most 20 W or at most 15 W) and/or at least 5 W (or at least 10 W or at least 12 W).

For example, the electronic device 100 may be implemented without a blower comprising a maximal dimension with respect to height, length and width of at least 20 mm (or at least 25 mm or at least 30 mm). In this way, noise generation, space consumption and/or power consumption may be kept low.

Alternatively, the electronic device 100 may further comprise a fan. The fan may comprise a maximal length and maximal width of at least 30 mm (or at least 25 mm or at least 35 mm) and/or a maximal thickness of at least 4 mm (or at least 3.5 mm or at least 5 mm). In this way, the cooling capacity of the cooling system may be increased. The blower 370 may be located closer to the heat source 110 than the fan.

The heat source 110 may comprise or may be a semiconductor die configured to generate heat (e.g. waste heat) during operation. The waste heat may be generated automatically during operation of the semiconductor die. An integrated circuit may be implemented on the semiconductor die. The semiconductor die may be a bare die with uncovered backside or a packaged semiconductor die with a backside covered by package material (e.g. mold or another material).

The heat source 110 may be or may comprise a processor (e.g. CPU, microcontroller, digital signal processor or a graphics processing unit GPU), a transmitter, a receiver, a transceiver, a power supply and/or a voltage converter or another integrated circuit.

The electronic device may be a tablet, a laptop, a notebook, a mobile phone, a computer (e.g. personal computer or server) or another electronic device.

More details, optional features and aspects are mentioned in connection with one or more examples described above or below.

FIG. 3b shows a schematic cross section of a cooling system of an electronic device. The electronic device may be implemented similar to the electronic device described in connection with FIG. 3a and/or FIG. 1d. As described above, an aspect of the proposed concept is to combine a vapor chamber with one or more miniblowers. FIG. 1d shows a schematic cross section of a cooling system with a vapor chamber, and FIG. 3b shows a schematic cross section of a cooling system with a (smaller) vapor chamber and miniblowers. In the latter case, the VC may be supported by the chassis, as the temperatures are now lower.

Guiding structures 220 are located between the enclosure 140 (e.g. outer cover) and the VC 120. The guiding structures 220 may guide the air flow caused by the blowers along the surface of the VC 120. The guiding structures 220 may be attached to or integrally formed on the enclosure 140. The guiding structures 220 may be walls arranged in parallel to each other. The guiding structures 220 may be channel walls between the outer cover and the VC 120.

A first blower 370 may be located adjacent to an edge of a first half of the VC 120 and the second blower 372 may be located at an edge of a second half of the VC 120. The first blower 370 and the second blower 372 may be arranged on the same side of the VC 120.

The smaller VC 120 may enable more space for a battery in comparison to the implementation of FIG. 1d.

More details, optional features and aspects are mentioned in connection with one or more examples described above or below.

Figure 3P:
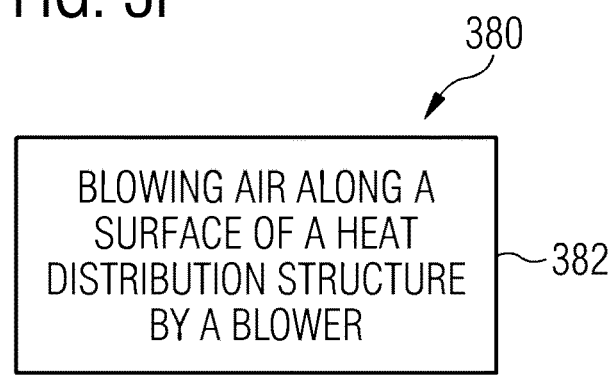
FIG. 3p shows a flow chart of a method for cooling an electronic device.
Figure 3C:
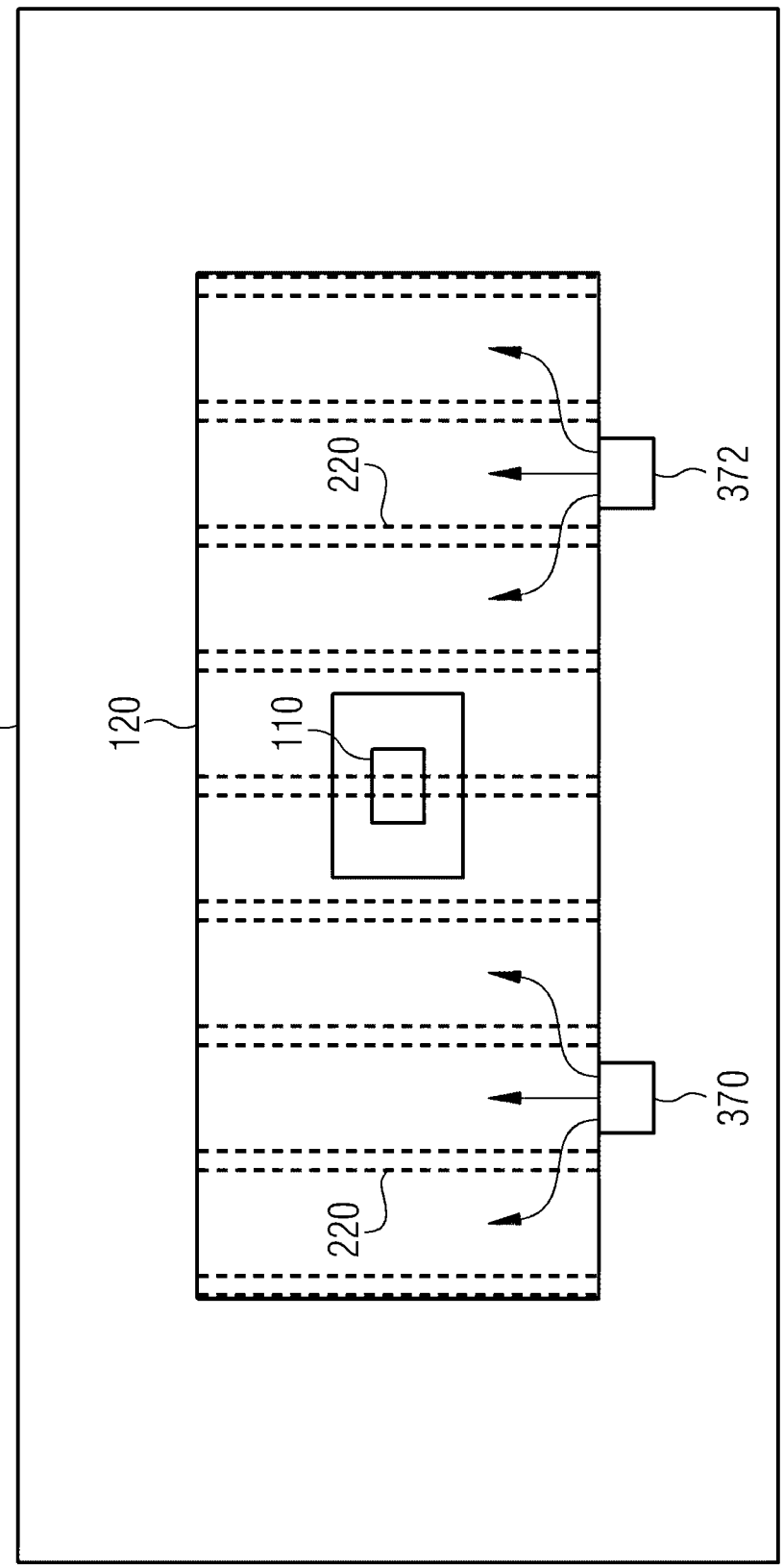
FIG. 3c shows a schematic top view of a cooling system of an electronic device.

FIG. 3c shows a schematic top view of a cooling system of an electronic device. FIG. 3c may show a top view of the electronic device described in connection with FIG. 3b.

More details, optional features and aspects are mentioned in connection with one or more examples described above or below.

Figure 3D:
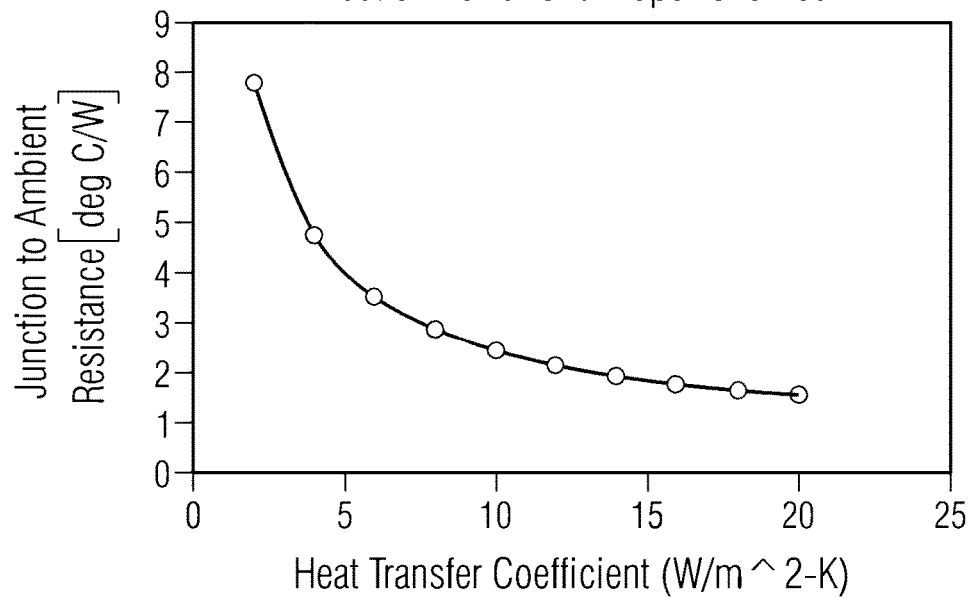
FIG. 3d shows a diagram of an effect of an air flow over the vapor chamber.

FIG. 3d shows a diagram of an effect of an air flow over the vapor chamber. The impact of having an air flow over the vapor chamber can be visualized using computational fluid dynamics CFD modeling as shown in FIG. 3d. FIG. 3d shows a diagram of an effect of an air flow over the vapor chamber. Enhancing the heat transfer coefficient from natural convection (h=2 W/m^2-K) to a h=20 W/m^2-K can improve the junction to ambient resistance $\Theta_{J-HP}$ by 5 times, and even h=5 W/m^2-K can double the performance. The air flow over the VC may reduce the VC temperature significantly.

Figure 3E:
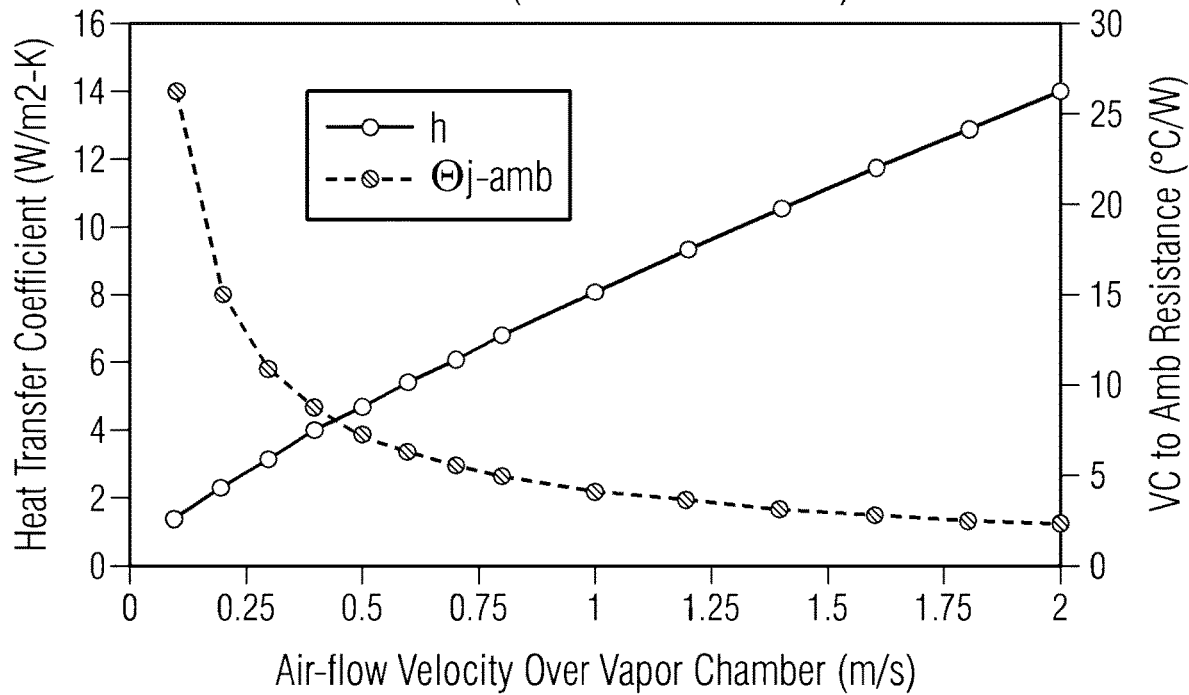
FIG. 3e shows a schematic diagram of an air flow effect over the vapor chamber.

FIG. 3e shows a schematic diagram of an air flow effect over the vapor chamber. FIG. 3e shows the heat transfer coefficient and associated thermal resistance (1/hA) calculated using flow over a flat plate heat transfer correlation. It can be seen that going from nearly zero flow to a little bit of flow (~0.7 m/s) provides a very sharp decrease in the VC thermal resistance. The proposed concept may use this very large sensitivity to improve the passive VC cooling capability by providing just a little bit of flow using miniblowers when needed but turning them off when not needed.

Figure 3F:
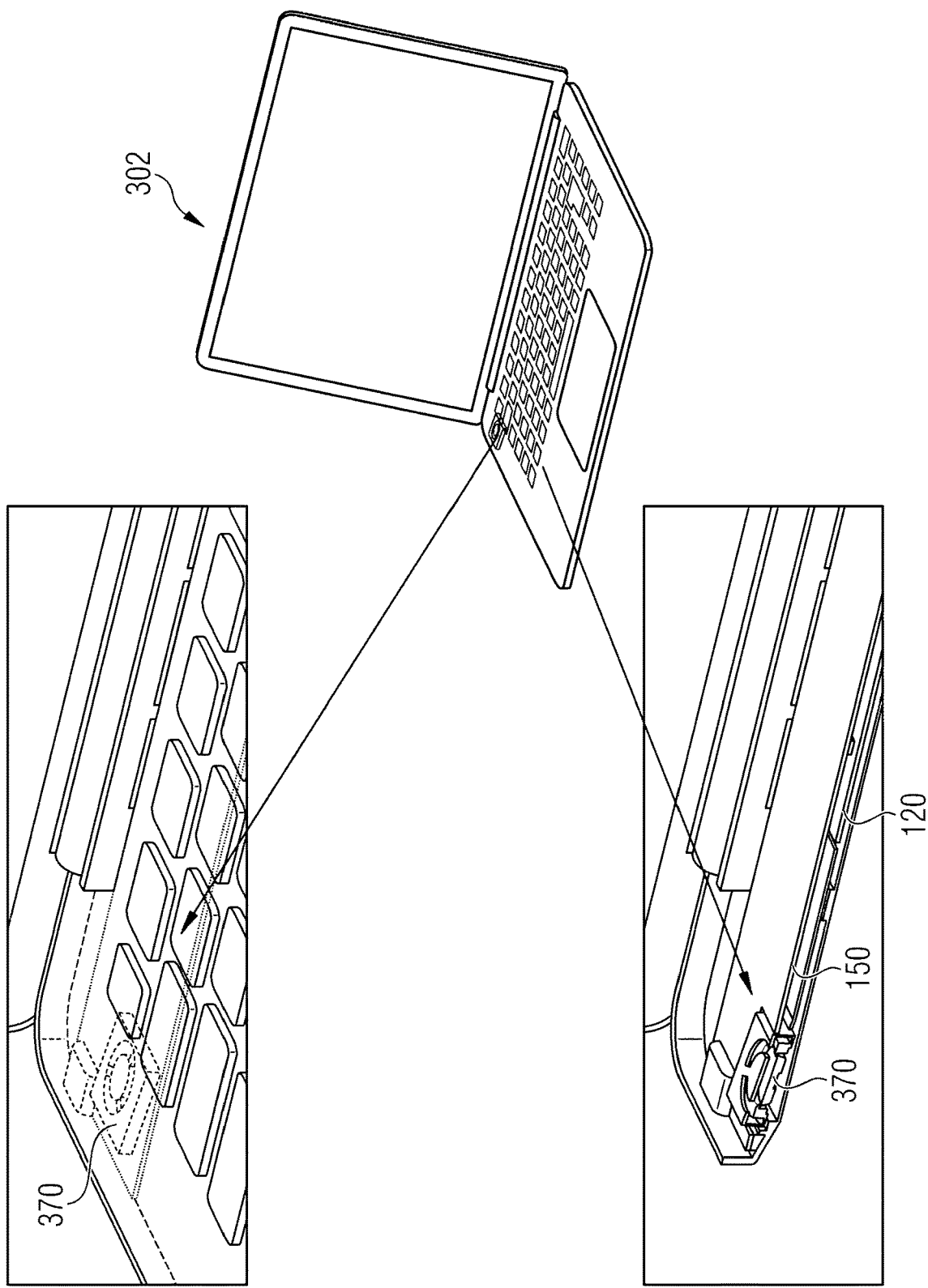
FIG. 3f shows a schematic illustration of a miniblower integration.

FIG. 3f shows a schematic illustration of an electronic device. The electronic device may be implemented similar to the electronic device described in connection with FIG. 3a. The electronic device in FIG. 3f is a laptop 302 with a blower 370 integrated in an opening in the circuit board 150 carrying the heat source (e.g. the CPU).

FIG. 3f may show an example of a miniblower integration. A slightly tilted blower may enable a good air intake, and a good airflow to bottom channels.

More details, optional features and aspects are mentioned in connection with one or more examples described above or below.

FIG. 3g shows a schematic illustration of an electronic device. The electronic device may be implemented similar to the electronic device described in connection with FIG. 3f. The laptop 302 comprises a second blower 372. The first blower 370 and the second blower 372 are arranged on opposite sides of the VC 120. An air inlet 352 (e.g. openings in the chassis) is arranged in proximity to each of the two blowers. Further, guiding structures 220 (e.g. air channel walls) are arranged between the first blower 370 and an air outlet 354 (e.g. openings in the chassis) and the second blower 372 and an air outlet 354 to guide air from the blowers along a surface of the VC 120 to the air outlets 354.

More details, optional features and aspects are mentioned in connection with one or more examples described above or below.

FIG. 3h shows a schematic illustration of an electronic device. The electronic device may be implemented similar to the electronic device described in connection with FIG. 3g. In addition, the laptop 302 comprises a horizontal guiding structure 220 extending from the VC 120 towards the blower 370 in order to laterally extend the gap between the VC 120 and the backside cover of the laptop 302 towards the blower 370 so that air can be better directed into the gap.

More details, optional features and aspects are mentioned in connection with one or more examples described above or below.

FIGS. 3g and 3h may show schematic diagrams of an airflow direction according to examples. Examples may provide, as shown in FIGS. 3f, 3g and 3h, a computing device, such as a laptop computer or a tablet computer, comprising the cooling system and a processing unit, such as a processor, a central processing unit or a graphics processing unit. The heat conduction element (e.g. VC) may be in contact with the processing unit. For example, as shown in FIG. 3h, the at least one blower fan 370 may be arranged at a non-zero angle relative to a main portion of a bottom plate of a chassis of the computing device. For example, the angle of the at least one blower fan 370 relative to the main portion of the bottom plate of the chassis may be between 2° and 15°. The heat conduction element of the cooling system may be held by a chassis of the computing device.

Figure 3I:
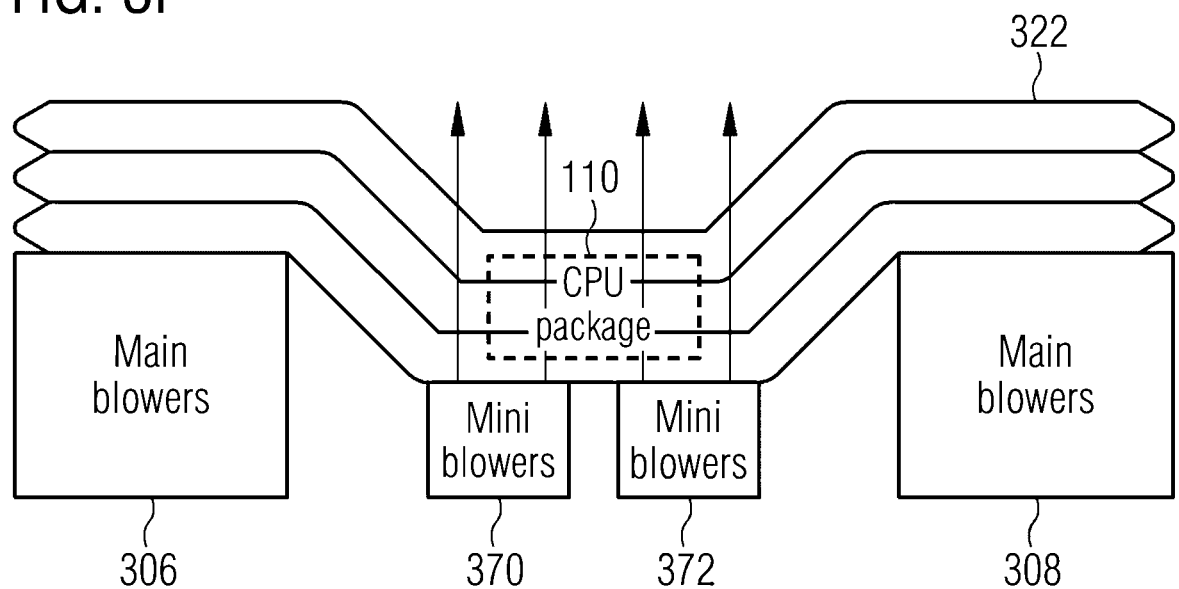
FIG. 3i shows a schematic top view of a cooling system of an electronic device.

FIG. 3i shows a schematic top view of a cooling system of an electronic device. The cooling system may be implemented similar to the cooling system described in connection with FIG. 3a. In the example of FIG. 3i, the heat distribution structure is an array of heat pipes 322. Two miniblowers 370, 372 are located adjacent to the array of heat pipes 322 in a central region of the array of heat pipes 322. The array of heat pipes 322 is thermally coupled to the heat source 110 in the central region of the array of heat pipes 322. Two main blowers 306, 308 are located adjacent to the array of heat pipes 322 at opposite end regions of the array of heat pipes 322. The miniblowers 370, 372 are located closer to the heat source 110 (e.g. CPU package) than the two main blowers 306, 308. The miniblowers 370, 372 are configured to blow air along surfaces of the heat pipes of the array of heat pipes 322. In this way, the cooling efficiency of the heat pipes may be significantly improved. The array of heat pipes 322 may be cheaper than a VC. By using miniblowers, the VC or HP efficiency may get higher so that the number or size of main blowers (e.g. just two main blowers instead of four) may be reduced without reducing the performance.

More details, optional features and aspects are mentioned in connection with one or more examples described above or below.

Figure 3J:
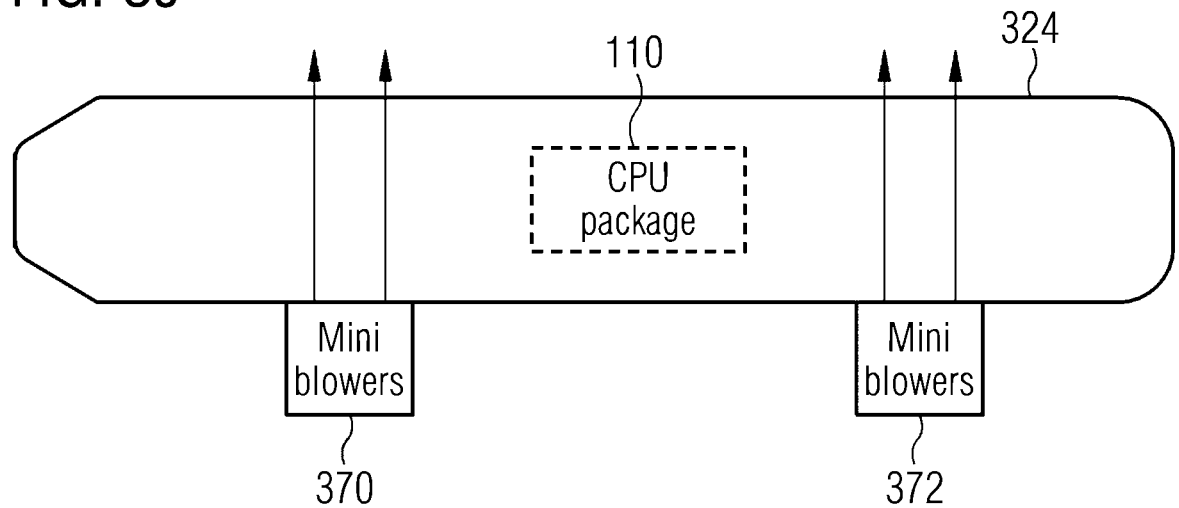
FIG. 3j shows a schematic top view of a cooling system of an electronic device.

FIG. 3*j* shows a schematic top view of a cooling system of an electronic device. The cooling system may be implemented similar to the cooling system described in connection with FIG. 3*a*. In the example of FIG. 3*j*, the heat distribution structure is a flattened-large diameter heat pipe 324. The flattened-large diameter heat pipe 324 is thermally coupled to the heat source 110 (e.g. CPU package) in the central region of the flattened-large diameter heat pipe 324.

A first blower 370 is arranged adjacent to an edge of the flattened-large diameter heat pipe 324 at a first end region of the flattened-large diameter heat pipe 324 and a second blower 372 is arranged adjacent to the edge of the flattened-large diameter heat pipe 324 at a second, opposite end region of the flattened-large diameter heat pipe 324.

The cooling system may be used for mobile systems. An outside dimension OD of the flattened-large diameter heat pipe 324 may be in the range of 10 mm to 50 mm or larger in systems with larger display size.

More details, optional features and aspects are mentioned in connection with one or more examples described above or below.

Figure 3K:
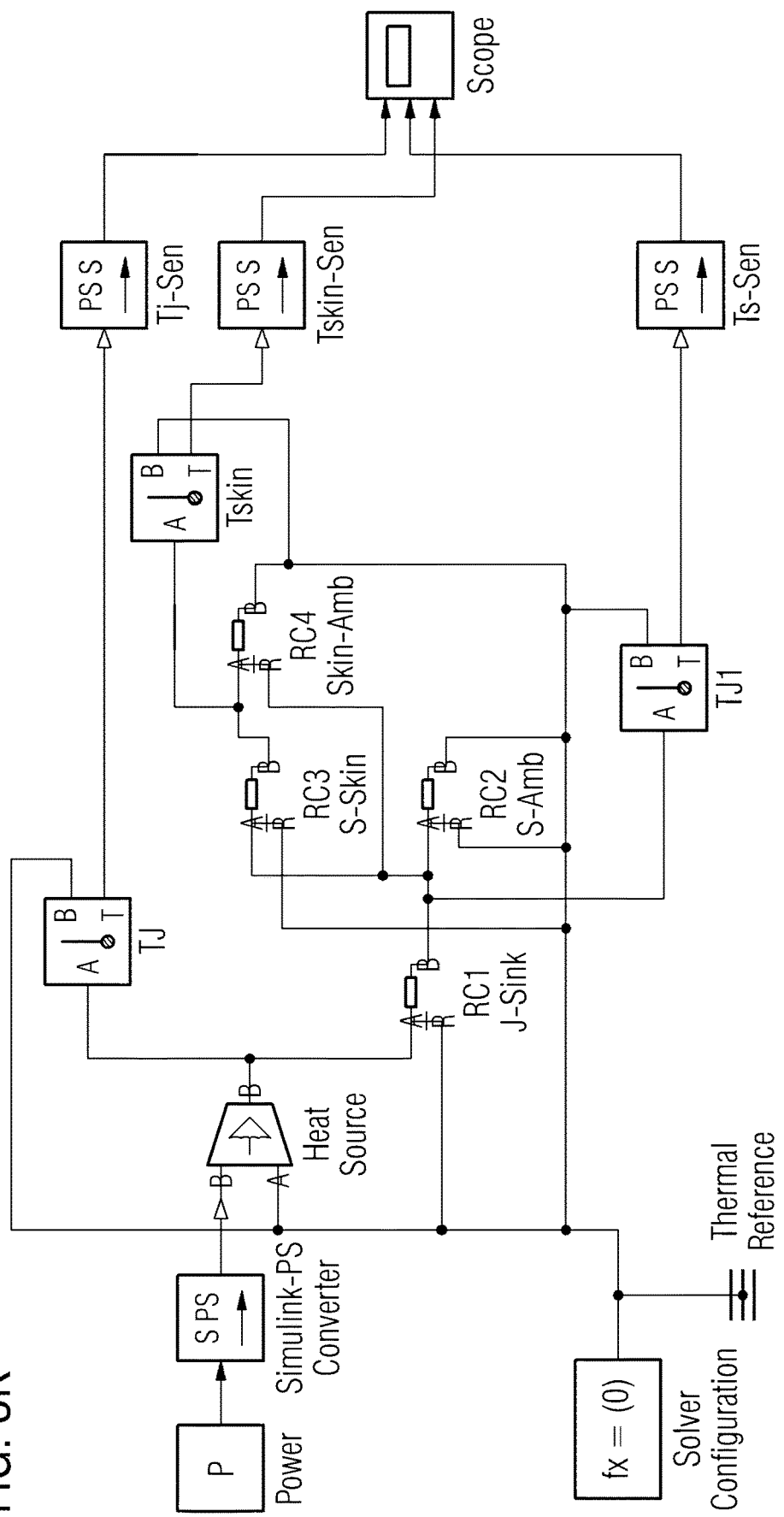
FIG. 3k shows a schematic diagram of a Resistance-Capacitance (R-C) network used for a case study.

FIG. 3*k* shows a schematic diagram of a Resistance-Capacitance (R-C) network used for a case study (e.g. a MATLAB Simulink R-C Network used for Combo-Cooling Case Study). The case study demonstrates the benefits of implementing combo-cooling technology to an otherwise passive device. The RC network includes 4 RC nodes: Junction-to-Sink, Sink-to-Ambient, Sink-to-Skin, and Skin-to-Ambient.

Figure 3L:
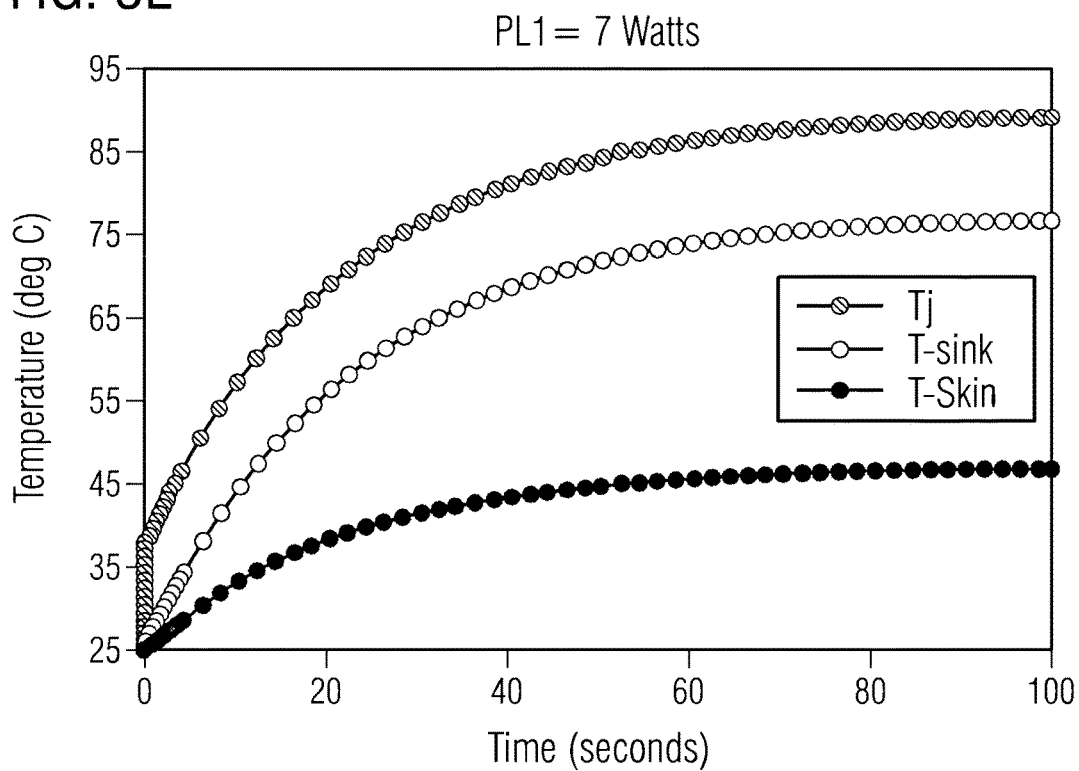
FIG. 3l-3o show diagrams of a transient response for various parameters.
Figure 3M:
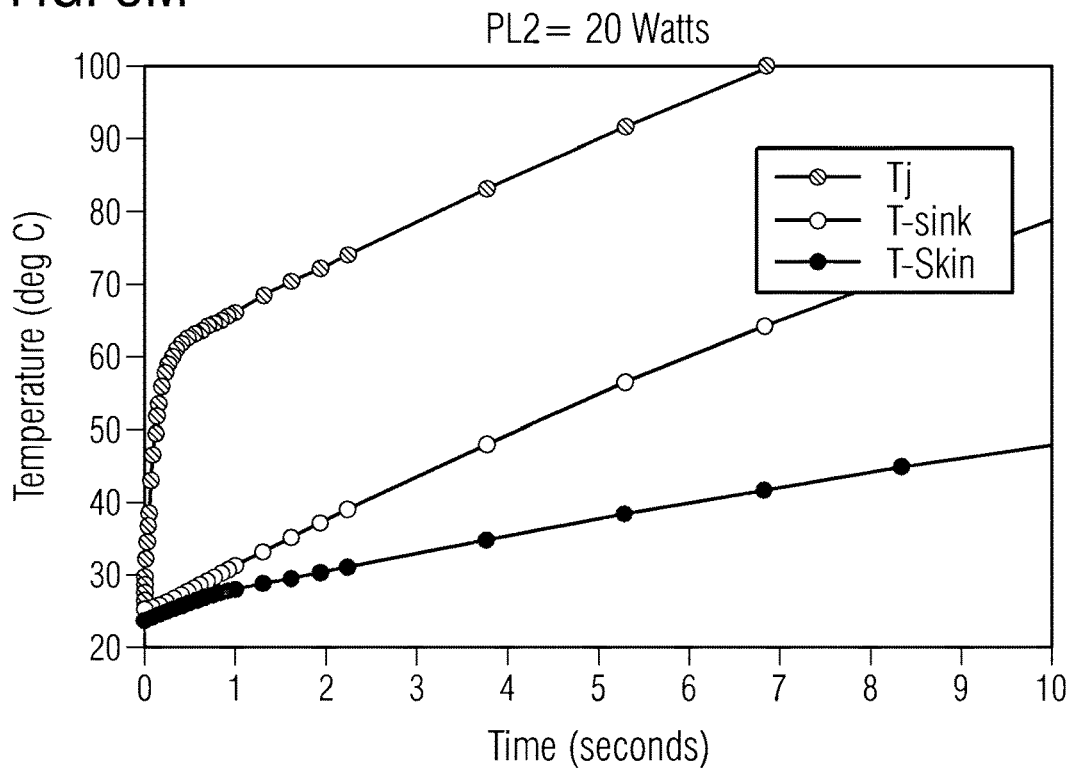
Figure 3N:
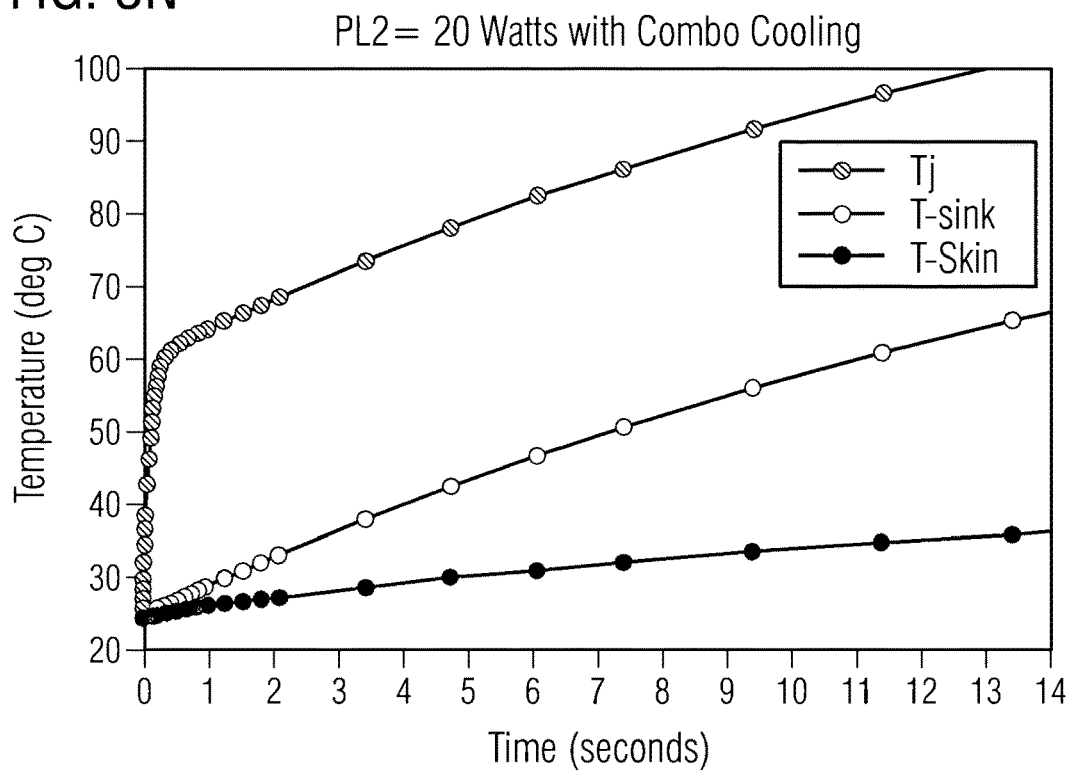
Figure 3O:
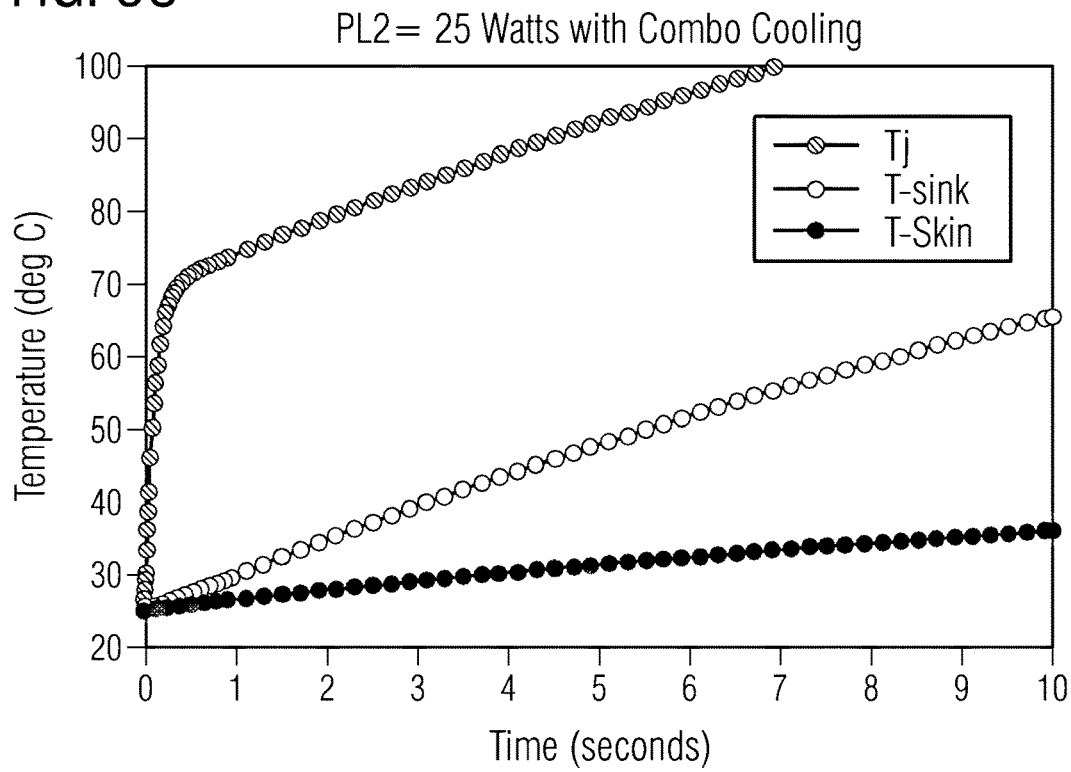

FIGS. 3*l* to 3*o* show diagrams of a transient response for various parameters. The junction temperature Tj, the temperature at a sink T-sink and a skin temperature T-skin (e.g. temperature at outside surface of enclosure) is shown. FIG. 3*l* shows the Passive Device Transient Thermal Response as power goes from 0 to 7 Watts starting at time=0 with purely passive cooling (i.e. no combo cooling active). FIG. 3*m* shows the Passive Device Transient Thermal Response as power goes from 0 to 20 Watts starting at time=0 with purely passive cooling (i.e. no combo cooling active), with a time to Tj-max (maximal junction temperature) of around 7 seconds. FIG. 3*n* shows the Combo-cooling Transient Thermal Response as power goes from 0 to 20 Watts starting at time=0, with a time to Tj-max of around 13 seconds. FIG. 3*o* shows the Combo-cooling Transient Thermal Response as power goes from 0 to 25 Watts starting at time=0, with a time to Tj-max of about 7 seconds.

FIG. 3*l* shows the transient PL1=7 W response of the passive device without combo cooling (e.g. 7 W TDP may be a possible TDP in this segment). PL1 may be the effective long-term expected steady state power consumption. Note that at steady-state (t=100 seconds), all temperature values may be within expected limits: Tj~90° C. (temperature at junction) and T-skin~47° C. (temperature at skin). This shows that this device can operate fully at its TDP with passive cooling. FIG. 3*m* shows the transient PL2=20 W response of this equivalent configuration without combo-cooling (PL2=20 W may be a possible value for this segment). Note that at this PL2 power, this device can only offer ~7 seconds of max performance before becoming Tj-limited (with the assumption of Tj-max=100° C., maximal temperature at junction). In contrast, FIG. 3*n* shows that when Combo-cooling is activated during this PL2 event (sink-to-ambient resistance reduced by half momentarily which based on FIG. 3*e* may be viable by turning on the mini blowers), the time in turbo, and thus the time at max system performance, may be expanded to almost 13 seconds (86% longer time in turbo). Additionally, FIG. 3*o* shows that by using combo-cooling technology, the PL2 power can be increased to 25 Watts (25% increase in PL2 power) without affecting the original time to Tj-max of ~7 seconds. These figures may demonstrate that by using combo-cooling technology during critical parts of a workload, both the time in turbo and/or the turbo power may be increased significantly, thus delivering an enhanced user experience and performance within the same form-factor. Combining this enhanced thermal capability with machine learning predictions of what the user/workload is going to do next may significantly improve the performance.

FIG. 3*p* shows a flow chart of a method for cooling an electronic device. The method 380 comprises blowing 382 air along a surface of a heat distribution structure by a blower. The blower comprises a maximal length and maximal width of at most 20 mm and/or a maximal thickness of at most 3 mm.

More details, optional features and aspects are mentioned in connection with one or more examples described above or below.

Figure 3R:
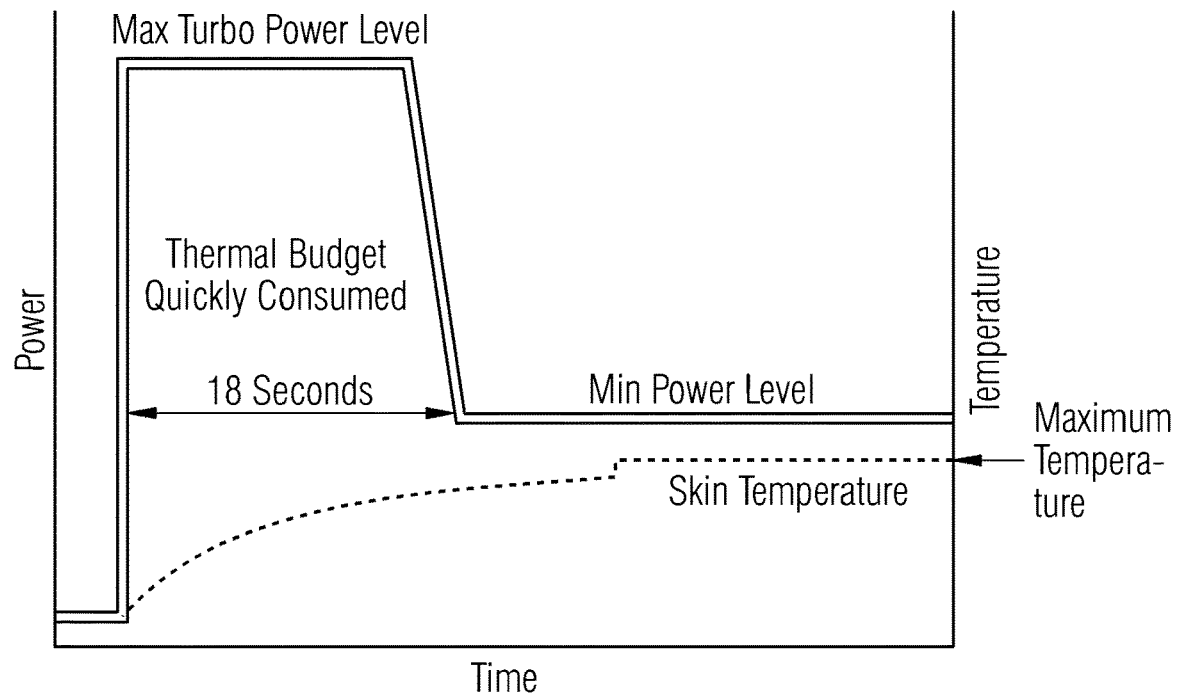
FIG. 3r-3t show diagrams of an effect of a predictive workload determination.
Figure 3S:
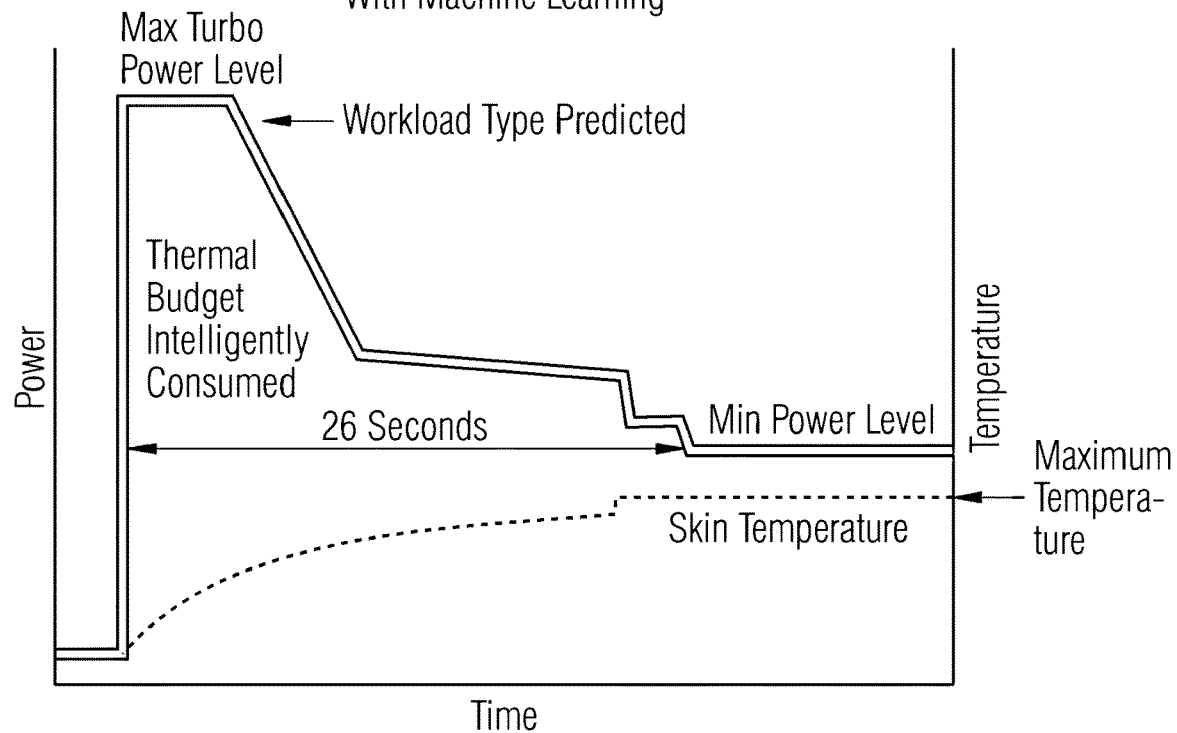
Figure 3T:
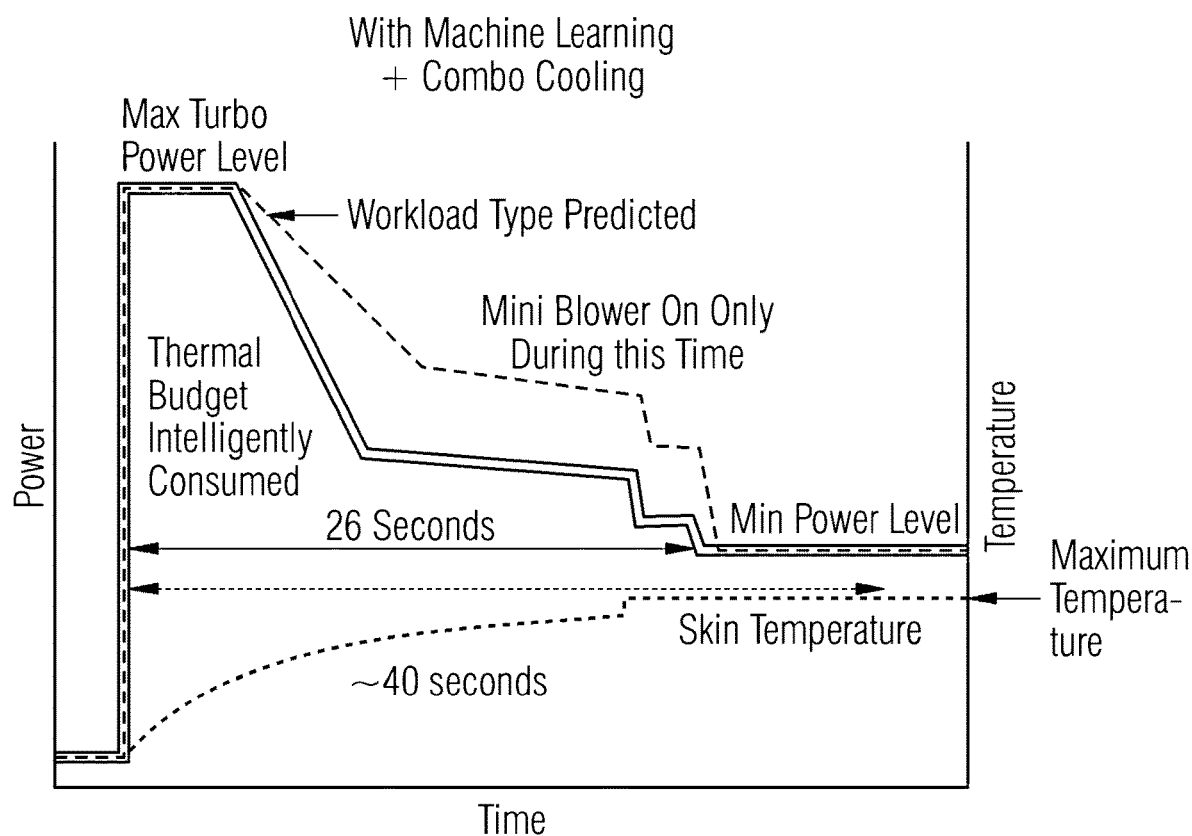
Figure 3Q:
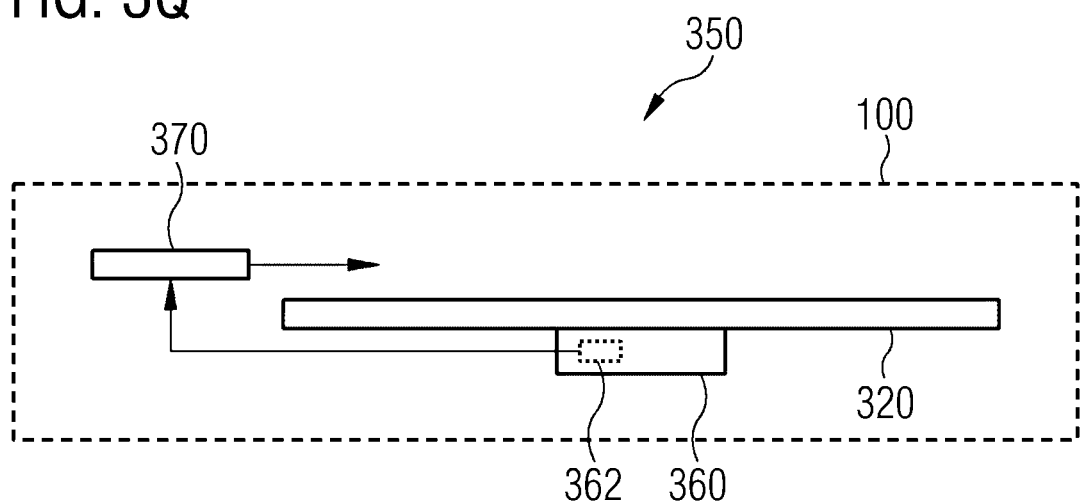
FIG. 3q shows a schematic cross section of a cooling system for an electronic device.

FIG. 3*q* shows a schematic cross section of a cooling system for an electronic device. The cooling system 350 comprises a heat conduction element 320. The heat conduction element 320 is suitable for cooling a processing unit 360 of the electronic device 100 (e.g. computing device). Further, the cooling system 350 comprises at least one blower fan 370 for blowing air across a portion of the heat conduction element 320. Additionally, the cooling system 350 comprises control circuitry 362 configured to activate or deactivate the at least one blower fan 370 based on a heat load of a processing unit 360 of the computing device.

The cooling efficiency of the heat conduction element may be improved by an air flow along the heat conduction element. By activate the blower fan based on the heat load of the processing unit, the performance under high workload conditions of the processing unit may be significantly improved. By deactivate the blower fan based on the heat load of the processing unit, the current consumption can be reduced under low workload conditions of the processing unit.

The heat conduction element 320 (or means for conducting heat) may also be called heat distribution structure. The heat conduction element 320 may comprise or may be a vapor chamber or an array of heat pipes. The heat conduction element 320 may be suitable for cooling a processing unit of the computing device. For example, the heat conduction element 320 may be a passive cooler, e.g. a structural element for cooling the processing unit passively at low heat loads. The heat conduction element 320 may comprise at least one substantially flat major surface. The at least one blower fan 370 may be arranged to blow air along the at least one substantially flat major surface of the heat conduction element 320.

The blower fan 370 (or blower or fan) may be a miniblower. For example, the at least one blower fan 370 may have a fan diameter of at most 30 (or at most 25 mm, or at most 20 mm, or at most 17 mm, or at most 15 mm). The at least one blower fan 370 may have a fan height of at most 5 mm (or at most 4 mm, or at most 3 mm). For example, the height of the fan may be measured orthogonal to the diameter of the blower fan.

The control circuitry 362 may be configured to activate the at least one blower fan 370 if the heat load of the processing unit 360 is above a threshold, and to deactivate the at least one blower fan 370 if the heat load of the processing unit 360 is below the threshold. For example, the control circuitry 362 may be configured to operate the cooling system 350 passively (e.g. no fan of the electronic device is active) if the heat load of the processing unit 362 is below a threshold. For example, the control circuitry 362 may be configured to activate the blower fan 370 if a junction temperature of the processing unit 360 is equal or larger than a first temperature threshold and/or deactivate the blower fan 370 if the junction temperature of the processing unit 360 is equal or lower than a second temperature threshold. The first temperature threshold may be equal to or different from the second temperature threshold.

The control circuitry 362 of the cooling system 350 may be configured to obtain information on the heat load from the processing unit 360 of the computing device or another component (e.g. temperature sensor) of the electronic device. The processing unit 360 may be configured to determine the information on a heat load of the processing unit 360, and to provide the information on the heat load to the control circuitry 362 of the cooling system 350. For example, the information on the heat load may be based on at least one temperature that is measured or estimated within the computing device. The temperature may be measured by a temperature sensor integrated on the processing unit 360 or located in proximity of the processing unit 360. Alternatively or additionally, the information on the heat load may be based on a turbo state of the processing unit 360. Correspondingly, the processing unit 360 may be configured to determine the information on the heat load based on at least one temperature that is measured or estimated within the computing device and/or based on a turbo state of the processing unit 360. Alternatively or additionally, the information on the heat load may be predicted (e.g. the workload may be predicted), for example using machine-learning. For example, the information on the heat load may be based on a predicted development of the heat load. The processing unit 360 may be configured to determine the information on the heat load by predicting the heat load using a machine-learning model.

The control circuitry 362 may be part of the processing unit 360 as indicated in FIG. 3q or circuitry integrated independent from the processing unit 360. For example, the control circuitry 362 and/or the processing unit 360 may be implemented using one or more processing units, one or more processing devices, any means for processing, such as a processor, a computer or a programmable hardware component being operable with accordingly adapted software. In other words, the described function of the control circuitry 362 or processing unit 360 may as well be implemented in software, which is then executed on one or more programmable hardware components. Such hardware components may comprise a general-purpose processor, a Digital Signal Processor (DSP), a micro-controller or other processing circuitry.

The cooling system 350 may comprise one or more blower fans (e.g. miniblowers). For example, the cooling system 350 may comprise two blower fans, the two blower fans being arranged at either lateral side of the heat conduction element 320 or adjacent to the same side or opposite sides of the heat conduction element 320.

The cooling system 350 may comprise at least one air flow conductor (or also called guiding structure or guiding element) for conducting the air blown by the at least one blower fan towards the heat conduction element.

The computing device may comprise the cooling system 350 and the processing unit. The heat conduction element 320 may be in direct contact with the processing unit 360 through a TIM or a metal plate (e.g. cold plate) may be located between the heat conduction element 320 and the processing unit 360.

For example, the cooling system 350 and/or the electronic device 100 may comprise more features described in connection with the cooling system and/or electronic device described in connection with FIG. 2a or 3a.

More details, optional features and aspects are mentioned in connection with one or more examples described above or below.

FIG. 3r-3t show diagrams of an effect of a predictive workload determination. FIGS. 3r to 3t show that predictive workload use cases may use Machine learning. Combo cooling may leverage these machine learning prediction capabilities to help decide when to turn on the mini blower and whether the turbo power should momentarily increase. As shown in FIGS. 3l to 3o, the proposed concept may increase the time in turbo by 85% or PL2 power by 25% in small passive devices.

Figure 3U:
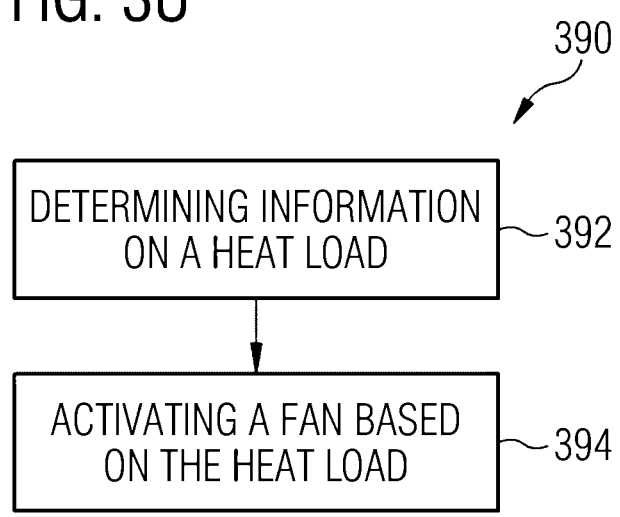
FIG. 3u shows a flow chart of a method for operating a computing device.

FIG. 3u shows a flow chart of a method for operating a computing device. The method 390 comprises determining 392 information on a heat load of the processing unit and providing 394 the information on the heat load to a control circuitry of the cooling system. For example, a method for a computing device may be provided.

More details, optional features and aspects are mentioned in connection with one or more examples described above or below.

Some examples relate to light and small passive-active combo cooling for low power devices (e.g. to give same or similar user experience UX than other passive cooling systems). Examples provide a proposal for a cooling method for light mobile computers. Silent mini blowers (e.g. blower fans) may be combined with a passive cooling system (e.g. a vapor chamber).

The results may be a lighter and more powerful cooling system than the pure passive cooling, but which may be extremely silent so that the user might not be able to hear it. The cooling system of various examples may provide a reduction of weight of a passive cooling system, while giving more space for batteries.

Other active cooling or passive cooling may be used for cooling a CPU (Central Processing Unit). In active cooling, heat may be transferred to a heat exchanger, and a blower or blowers may be used for cooling the heat exchanger. In passive cooling, heat may be divided (distributed) to a large area, e.g. using a vapor chamber. The heat may be transferred passively to the open air by radiation, conduction, and light convection (or thermal radiation). Active cooling may be powerful, but it needs blower(s) which may cause noise and require space, which may lead to a smaller battery volume and capacity. In some cases, a vapor chamber may be combined with a blower. In other systems, large fans and vapor chambers may be combined, with the vapor chamber being attached to the heat sink. Such a concept may be really thick and not usable in laptops. A similar concept may be used in laptops, with large, but thin fans. This concept may be thin, but noisy and blowers may take a large amount of battery space. Passive cooling may be silent, but the large thermal distributor may need a lot of (lateral) space and may have a large weight.

Examples may use the proposed concept by reducing the size of the vapor chamber, reducing the size of the active blower, and/or using the system in passive cooling mode under low thermal loads.

For example, the size of the vapor chamber may be reduced since the outer areas of the VC often are not very efficient. This may reduce the total weight of the device and yield more battery space. The cooling capability of the VC may be increased by adding miniblower(s) (i.e. blower fans with a fan diameter of at most 30 mm) to cool the VC. Miniblowers may be so silent that those can be considered noiseless. The thermal solution may be cooled 100% passively when the heat load is low such as idle or low power workloads. However, in periods when the heat load is high, such as a PL2 (e.g. short-term maximal power mode) workload, the miniblowers may be turned on to assist with power dissipation.

One aim in computing device design may be to reduce the weight of the device in the low-power category. This may be achieved by providing a thermal concept with a reduced weight. Another aim may be to increase battery capacity. The concept presented in the present disclosure may increase the available battery space. Such a user-friendly and noiseless CPU cooling solution may see an increased adaptation in the low power (e.g. <15 W) category.

In the following, some examples of miniblowers that can be used with examples are shown. A first example of a miniblower has dimensions of 15 mm×15 mm×3 mm, with a maximal speed of 13800 rounds per minute (rpm), a maximal airflow of 0.17 CFM (cubic-feet per minute), a maximal air pressure (inch H20) of 0.154, a voltage of 3.0 V, a current of 0.05 A and a maximal noise of 30.0 (dB-a) at 0.3 meters. A second example of a miniblower has dimensions of 15 mm×15 mm×3 mm, with a maximal speed of 14500 rpm, a maximal airflow of 0.28 CFM, a maximal air pressure (inch H20) of 0.075, a voltage of 3.0 V, a current of 0.05 A and a maximal noise of 31.0 (dB-a) at 0.3 meters. A third example of a miniblower has dimensions of 17 mm×17 mm×3 mm, with a maximal speed of 12000 rpm, a maximal airflow of 0.23 CFM, a maximal air pressure (inch H20) of 0.182, a voltage of 3.0 V, a current of 0.05 A and a maximal noise of 26.5 (dB-a) at 0.3 meters. 1 CFM=1.7 cubic meter/hour=0.47 l/s In the following table, examples of possible noise levels are given.

| Noise source | dB level | dB effect |
| --- | --- | --- |
| Passenger car at 65 mph at 25 ft (77 dB); freeway at 50 ft from pavement edge 10 a.m. (76 dB). Living room music (76 dB). radio or TV-audio, vacuum cleaner (70 dB). | 70 | Arbitrary base of comparison. Upper 70s are annoyingly loud to some people |
| Conversation in restaurant, office, background music, air conditioning unit at 100 feet. | 60 | Half as loud as 70 dB. Fairly quiet. |
| Quiet suburb, conversation at home. Large electrical transformers at 100 feet. | 50 | One-fourth as loud as 70 dB. |
| Library, bird calls (44 dB), lowest limit of urban ambient sound. | 40 | One-eighth as loud as 70 dB. |
| Quiet rural area. | 30 | One-sixteenth as loud as 70 dB. Very quiet. |
| Whisper, rustling leaves. | 20 | |
| Breathing. | 10 | Barely audible |

A laptop noise level may be about 40-45 dB. For example, a laptop based on the proposed concept may cause a maximal noise level of at most 40 dB (or at most 30 dB).

The weight of the electronic device can be significantly reduced based on the proposed concept. For example, a VC size reduction from 150 mm×250 mm to 100 mm×200 mm (i.e. only 25 mm per side) may be enabled, which may reduce the total mass of the device (e.g. laptop) from 1000 g to 910 g. Reducing the VC size from 150 mm×250 mm to 100 mm×200 mm (1" on every side) may reduce the VC mass more than 40% (e.g. by 46.7%) and the total device mass by more than 5% or more than 8% (e.g. 9.0%). A significantly lighter vapor chamber may also be cheaper, which may mean lower device bill of materials (BOM).

As shown in the present disclosure, even a weak airflow can improve the VC heat exchange significantly. The weak airflow may be operated by almost silent miniblowers, so the presented concept may be comparable with passive cooling systems. The weak airflow may enable reducing or minimizing the size of VC, which may lead to lighter and cheaper device, and which may give more space for battery and thereby increase the battery life. An airgap between VC and chassis, which may be required to insulate the skin in order to have lower skin temperature, may now be used as heat transfer channel. This might not increase the total thickness, but may improve the total stiffness since VC and chassis can be combined by air channel walls. The presented concept may be different from hybrid cooling, as it might not use "full power" fans. Although the presented concept may be an active cooling system using fans, it may be almost silent as a passive cooling system. Therefore, the presented concept may be called "Passive—Active Combo Cooling".

In examples, vapor chambers are combined with mini blowers. In addition to combining these two concepts, additional system level design optimizations such as really thin channeling in chassis may be proposed in order to increase the convection on the VC surface very effectively for a momentary time period. The mini blowers might only be used in high power turbo cases, and the device may otherwise be fully passive. The prosed concept may use workload and user predictive information to adapt the cooling strategy, which might be different to other active cooling concepts.

Examples may also be more efficient than hyperbaric designs, even with the reduced fan size and without the use of heat exchange fins, as heat exchangers may have a small surface area, which needs really high blowing in order to transfer the heat. Furthermore, the heat transfer via fins may be less efficient than heat transfer from the VC skin. The proposed concept may exclude heat exchanger (fins), and utilize the large surface area of the VC. The fan size may be reduced since the heat exchange performed in examples might not need high blowing. In other systems, a two heat pipe HP active cooling solution may be used, with a fin area of 9 mm×18 mm×70×2=22680 mm$^2$ that is about same than reduced VC area per side. Furthermore, hyperbaric designs may be from the beginning intended as the main means of cooling. Combo-cooling might only be utilized during turbo events to increase power/turbo duration, and may return to passive cooling afterwards.

The assembly and integration examples described above and below may be merely examples, as a final design may further depend on details, such as the package thermal design power (TDP), VC dimensions and others. In various examples, miniblowers are arranged on both sides, and blow a low airflow on both sides of the VC through the air channels (conductors). For example, the cooling system may comprise two blower fans, which are arranged at either lateral side of the heat conduction element. The cooling system may comprise at least one air flow conductor for conducting the air blown by the at least one blower fan towards the heat conduction element. The heat conduction element may comprise at least one substantially flat major surface (e.g. a surface without ridges, and a surface that provides at least 30% of the surface area of the heat conduction element). The at least one blower fan may be arranged to blow air across the at least one substantially flat major surface.

In some other cooling systems, additional fans may be used in an active cooling system to cool the board. In such systems, the heat may be transferred by heat exchangers without any channeling in chassis. Channeling in chassis might not be effective in active cooling, since it should be relatively tall and therefore a heat exchanger may be better. Such a cooling system may be used in high-powered systems with a 45 W or more TDP for CPU and additional TDP for the Graphics Processing Unit (GPU). Examples of the proposed concepts, on the other hand, are targeted at computing devices with a TDP of 15 W or less, with small 15 mm×15 mm fans for ultimate thermal case cooling.

Examples of the present disclosure may provide a combo active-passive cooling system with a vapor chamber and a blower fan. Examples may enable building a cooling system that is smaller and lighter than other passive systems, with the same TDP or even a little bit higher, and with similar user experience than in a pure passive cooling system.

Figure 4A:
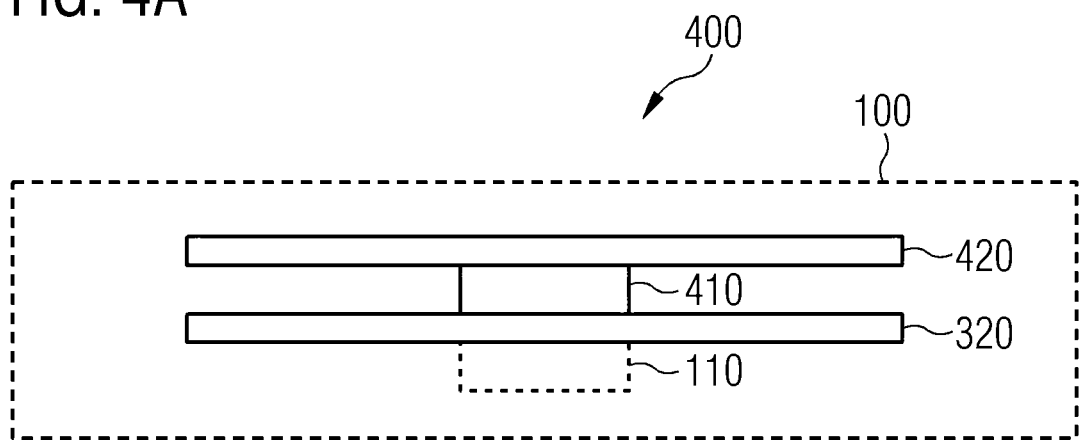
FIG. 4a shows a schematic cross section of a cooling system for an electronic device.

FIG. 4a shows a schematic cross section of a cooling system for an electronic device 100. The cooling system 400 comprises a first heat distribution structure 320 configured to be coupled to a heat source 110. Further, the cooling system 400 comprises a thermal electric cooler TEC 410 and a second heat distribution structure 420. A first surface of the thermal electric cooler 410 is thermally coupled to the first heat distribution structure 320 and a second surface of the thermal electric cooler 410 is thermally coupled to the second heat distribution structure 420.

By implementing a TEC between two heat distribution structures, heat can be transferred very fast from one heat distribution structure to the other heat distribution structure. In this way, the cooling of the heat source may be improved.

The thermal electric cooler 410 may have a thickness of at most 3 mm (or at most 2.5 mm or at most 2 mm, for example, between 1.5 mm and 2 mm). In this way, the stack height may be kept low and thin electronic devices may be enabled.

The thermal electric cooler TEC 410 may use the Peltier effect to create a heat flux at the junction of two different types of materials (e.g. n-type and p-type semiconductor material). When operated as a cooler, a voltage may be applied across the TEC, and as a result, a difference in temperature will build up between the two opposite sides of the TEC.

The first heat distribution structure 320 may be a flat structure having significantly larger lateral extension than vertical extension. For example, a thickness of the first heat distribution structure 320 may be at most 10% (or at most 5%) of a maximal lateral dimension (e.g. length or width) of the first heat distribution structure 320. A thickness of the thermal electric cooler 410 may be larger than a thickness of the first heat distribution structure 320. The first heat distribution structure 320 may have a thickness of at most 1 mm (or at most 0.8 mm or at most 0.6 mm, for example 0.5 mm). The first heat distribution structure 320 may be a metal plate (e.g. cold plate) or a vapor chamber.

The second heat distribution structure 420 may be a flat structure having significantly larger lateral extension than vertical extension. For example, a thickness of the second heat distribution structure 420 may be at most 10% (or at most 5%) of a maximal lateral dimension (e.g. length or width) of the second heat distribution structure 420. The second heat distribution structure 420 may be a metal plate (e.g. cold plate) or a vapor chamber.

For example, a distance between the first heat distribution structure 320 and the second heat distribution structure 420 may be at most 3 mm (or at most 2.5 mm or at most 2 mm). In this way, the stack height may be kept low and thin electronic devices may be enabled.

An adhesive (e.g. thermally conductive adhesive) and/or TIM may be used to attach and thermally couple the TEC 410 to the first heat distribution structure 320 and the second heat distribution structure 420 to the TEC 410.

The cooling system 400 may further comprise a (first) heat pipe arranged adjacent to the thermal electric cooler 410 on the first heat distribution structure 320. For example, a side of the heat pipe may be in contact with a side of the TEC 410 or a small gap (e.g. of at most 5 mm or at most 2 mm) may be between the heat pipe and the TEC 410. The heat pipe may have a thickness of at most 3 mm (or at most 2.5 mm or at most 2 mm).

The (first) heat pipe may be thermally coupled to the first heat distribution structure 320 in an area opposite to a center of the heat source 110. For example, the thermal electric cooler 410 may be located at least in one direction closer to an edge of the first heat distribution structure 320 than the heat pipe. The heat pipe may be used continuously to cool an area of the first heat distribution structure 320, which is close to the heat source 110, while the TEC 410 may only be activated for additional cooling, if necessary (e.g. in high workload situations of the heat source).

The heat pipe may extend to a fan of the cooling system 400. For example, an evaporator region (e.g. first end region) of the heat pipe may be thermally coupled to the first heat distribution structure 320 and an evaporator region (e.g. second end region) of the heat pipe may be located in proximity or adjacent to the fan.

The heat pipe may be arranged between the first heat distribution structure 320 and the second heat distribution structure 420. For example, a first surface of the heat pipe may be thermally coupled to the first heat distribution structure 320 and a second surface of the heat pipe may be thermally coupled to the second heat distribution structure 420. The heat pipe and the TEC 410 may be vertically arranged or sandwiched between the first heat distribution structure 320 and the second heat distribution structure 420.

Figure 4K:
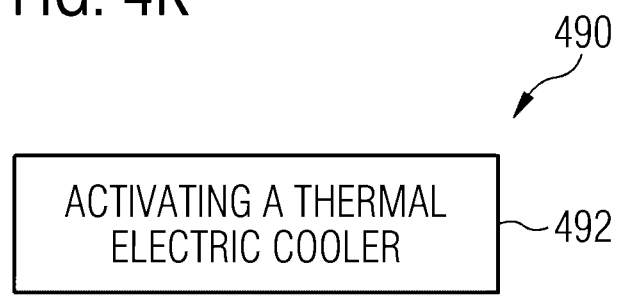
FIG. 4k shows a flow chart of a method for operating an electronic device.
Figure 4B:
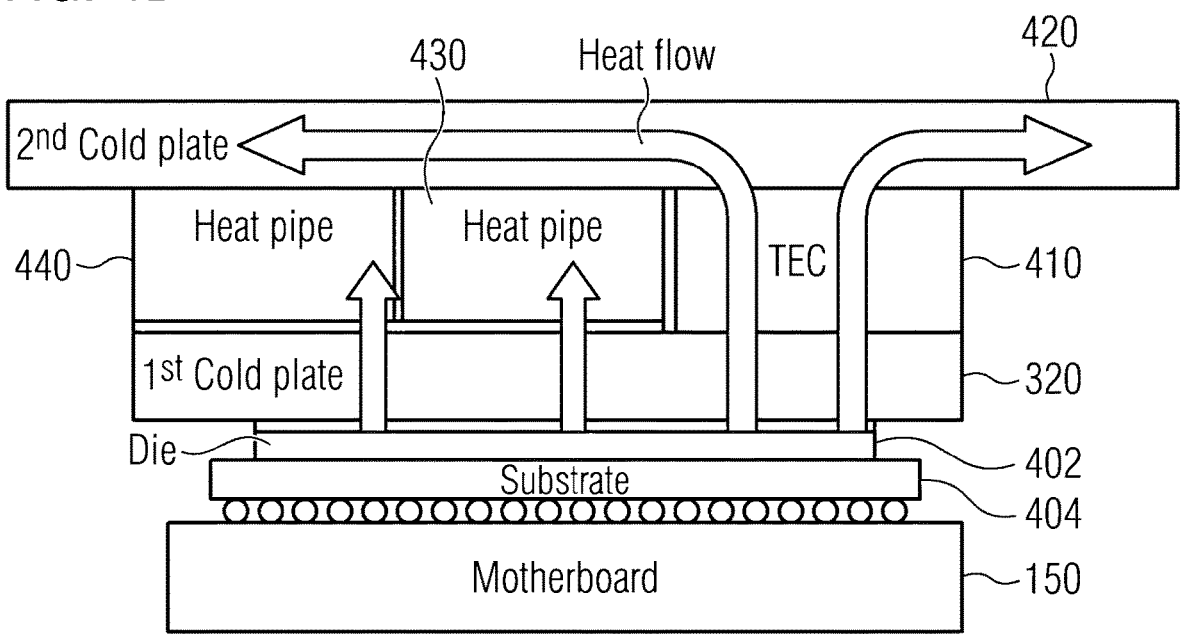
FIG. 4b shows a schematic cross section of a cooling system for an electronic device.

Alternatively, the second heat distribution structure 420 may only extend laterally over a part of the first heat distribution structure 320 so that the TEC 410 is sandwiched between the first heat distribution structure 320 and the second heat distribution structure 420, while the first heat pipe is located laterally beside the second heat distribution structure 420 on the first heat distribution structure 320. For example, a thickness of the thermal electric cooler 410 may be smaller than a thickness of the first heat pipe. A thickness of the heat pipe may be larger than a thickness of the first heat distribution 320 and/or larger than a distance between the first heat distribution 320 and the second heat distribution structure 420. By extending the second heat distribution structure 420 only over the TEC 410, but not the heat pipe, the total vertical dimension of the stack may be reduced (e.g. as shown in FIG. 4d).

Additionally, the cooling system 400 may further comprise a second heat pipe. The first heat pipe may be arranged laterally between the thermal electric cooler 410 and the second heat pipe (e.g. as shown in FIG. 4b). For example, a side of the first heat pipe may be in contact with a side of the second heat pipe or a small gap (e.g. of at most 5 mm or at most 2 mm) may be between the first heat pipe and the second heat pipe. The second heat pipe may be arranged between the first heat distribution structure 320 and the second heat distribution structure 420 as well. For example, a first surface of the second heat pipe may be thermally coupled to the first heat distribution structure 320 and a second surface of the second heat pipe may be thermally coupled to the second heat distribution structure 420. The first heat pipe, the second heat pipe and the TEC 410 may be vertically arranged or sandwiched between the first heat distribution structure 320 and the second heat distribution structure 420.

Additionally, the cooling system 400 may further comprise a third heat pipe. The third heat pipe may be thermally coupled to the second heat distribution structure 420. The third heat pipe may be laterally spaced apart from the first heat distribution structure 320 (e.g. as shown in FIG. 4d). Alternatively, the third heat pipe may be replaced by a metal plate (e.g. cold plate), a heat exchanger, a VC or another kind of thermal spreading material for heat transfer.

The electronic device 100 may comprise the cooling system 400 and the heat source 110. The electronic device 100 may be configured to activate and/or deactivate the thermal electric cooler based on one or more device parameters (e.g. by control circuitry). A device parameter of the one or more device parameters may indicate a junction temperature of the heat source, a charging status of the electronic device, a workload of the heat source 110 or the electronic device 100 and/or a heat load of the heat source 110 or the electronic device 100. In this way, the cooling capacity and/or efficiency may be increased by activating the TEC, if necessary. On the other hand, the TEC can be deactivated, if less cooling is sufficient in order to reduce the power consumption. For example, if the electronic device 100 is a mobile device (e.g. laptop, tablet or mobile phone), the TEC 410 might not be activated continuously for at least 1 min (or at least 40 s or at least 30 s), if the electronic device 100 is battery powered (e.g. not charging). In this way, the power consumption can be kept low while the electronic device 100 is battery powered. The electronic device 100 may be configured to operate the TEC 410 at a working current of the TEC 410 of at least 10% (or at least 20%) and/or at most 30% (or at most 40% or at most 25%) of a maximum current of the TEC 410. In this way, the TEC may be operated under efficient operating conditions.

A distance or a gap between the second heat distribution structure 420 and a part of an enclosure of the electronic device 100 or a backside of a screen of the electronic device 100 may be at most 2 mm (or at most 1.5 mm or at most 1 mm, for example between 0.5 mm and 1 mm). The temperature of the enclosure (e.g. skin temperature) may be significantly reduced, if a gap is located between the heat distribution structure and the enclosure.

Alternatively, the second heat distribution structure 420 may be thermally coupled to a part of an enclosure of the electronic device 100. In this way, the cooling capability of the heat distribution structure 420 may be increased as heat may be transferred from the second heat distribution structure 420 to the part of the enclosure. For example, a thermal pad may be arranged on the part of the enclosure for thermally coupling the second heat distribution structure 420 to the part of the enclosure (e.g. as shown in FIG. 4e).

For example, the heat source 110 (e.g. CPU) may comprise a thermal design power of at least 15 W (or at least 25 W or at least 40 W), if a heat pipe is used in addition to the TEC 410.

Alternatively, the heat source 110 (e.g. CPU) may comprise a thermal design power of at most 15 W (or at most 12 W or at most 10 W), if the electronic device is implemented without a heat pipe and/or implemented without a fan. For example, the electronic device may be implemented with pure passive cooling supported by the TEC.

The heat source 110 may comprise or may be a semiconductor die configured to generate heat (e.g. waste heat) during operation. The waste heat may be generated automatically during operation of the semiconductor die. An integrated circuit may be implemented on the semiconductor die. The semiconductor die may be a bare die with uncovered backside or a packaged semiconductor die with a backside covered by package material (e.g. mold or another material).

The heat source 110 may be or may comprise a processor (e.g. CPU, microcontroller, digital signal processor or a graphics processing unit GPU), a transmitter, a receiver, a transceiver, a power supply and/or a voltage converter or another integrated circuit.

The electronic device 100 may be a tablet, a laptop, a notebook, a mobile phone, a computer (e.g. personal computer or server) or another electronic device.

More details, optional features and aspects are mentioned in connection with one or more examples described above or below.

FIG. 4b shows a schematic cross section of a cooling system for an electronic device. The cooling system may be implemented similar to the cooling system described in connection with FIG. 4a. The first heat distribution structure 320 is implemented as a first metal plate ($1^{st}$ cold plate) and the second heat distribution structure 420 is implemented as a second metal plate ($2^{nd}$ cold plate). The first heat distribution structure 320 is arranged on top of a semiconductor package (e.g. SOC package) including a substrate 404 and a semiconductor die 402. The semiconductor package is attached to a circuit board 150 (e.g. a motherboard). A first heat pipe 430, a second heat pipe 440 and a TEC 410 are arranged on a surface of the first heat distribution structure 320 and the second heat distribution structure 420 is arranged on top of the first heat pipe 430, the second heat pipe 440 and the TEC 410. Heat can be transferred from the semiconductor die 402 through the first cold plate directly to the heat pipes and indirectly through the TEC 410 and the second cold plate to the heat pipes.

For example, the TEC 410 may be introduced into the system design to improve the transient response. The TEC 410 may be used for an instant response behavior to spread SOC transient power. The die 402 may generate heat and may be the hot spot area, while the die size is smaller than the SOC package. As shown in FIG. 4b, the 1st cold plate may cover the whole SOC area to dissipate SOC die heat.

For example, the TEC 410 is in direct contact with the 1st cold plate (e.g. through a TIM), which may be similar to the heat pipe 430. The TEC 410 partially uses the 1st cold plate. The other area of the 1st cold plate is still covered by heat pipes. The Tj temperature may be monitored and if Tj temperature increases quickly, which may indicate an increase of the SOC transient power, the TEC 410 can be enabled to instantly cool the SOC and transfer the power to the 2nd cold plate and from the 2nd cold plate to the heat pipe 430. The 1st cold plate can transfer a lot of or most power to the heat pipe area (area thermally coupled to the first and second heat pipe). Both the TEC 410 and the 1st cold plate may work together to transfer power into the heat pipes. As a result, both normal power and transient high power may be transferred into the heat pipes.

For example, two heat pipes with uncompressed diameter ø8 and compressed thickness of 1.8 mm, a 0.5 mm $1^{st}$ cold plate and a TEC with 10.1 W cooling capability and 1.2 COP may be used.

For example, one side of the TEC 410 can cool the SOC and the other side needs to be cooled. The 2nd cold plate may be pressed to the TEC 410 and transfers TEC heat to the heat pipe area. The 2nd cold plate may enable the heat pipes going into working mode quickly.

The TEC 410 can release more SOC performance if a suitable TEC module, system stack up and/or SW control mechanism may ensure that the TEC 410 instantly responses with low power consumption. The control mechanism may be integrated together with DTT tuning (dynamic tuning technology).

The proposed cooling system may be able to reduce or minimize the transient temperature rise and instantly transfer SOC generated power to the heat pipe area.

The TEC 410 may only be enabled at certain times, when the Tj temperature quickly rises. The TEC 410 may be disabled at almost all times to save power and avoid a skin temperature increase. The 2nd cold plate may occupy 0.5 mm Z height in this stack. Simulation may show that the 2nd cold plate area has a higher temperature at both sides. So, 0.2~0.3 mm additional space (e.g. gap between $2^{nd}$ cold plate and cover) may be implemented to ensure that the skin temperature can be kept low with this stack and the selected TEC 410.

The example of FIG. 4b may be a cooling system for an electronic device with fan (e.g. an active cooling notebook).

More details, optional features and aspects are mentioned in connection with one or more examples described above or below.

Figure 4C:
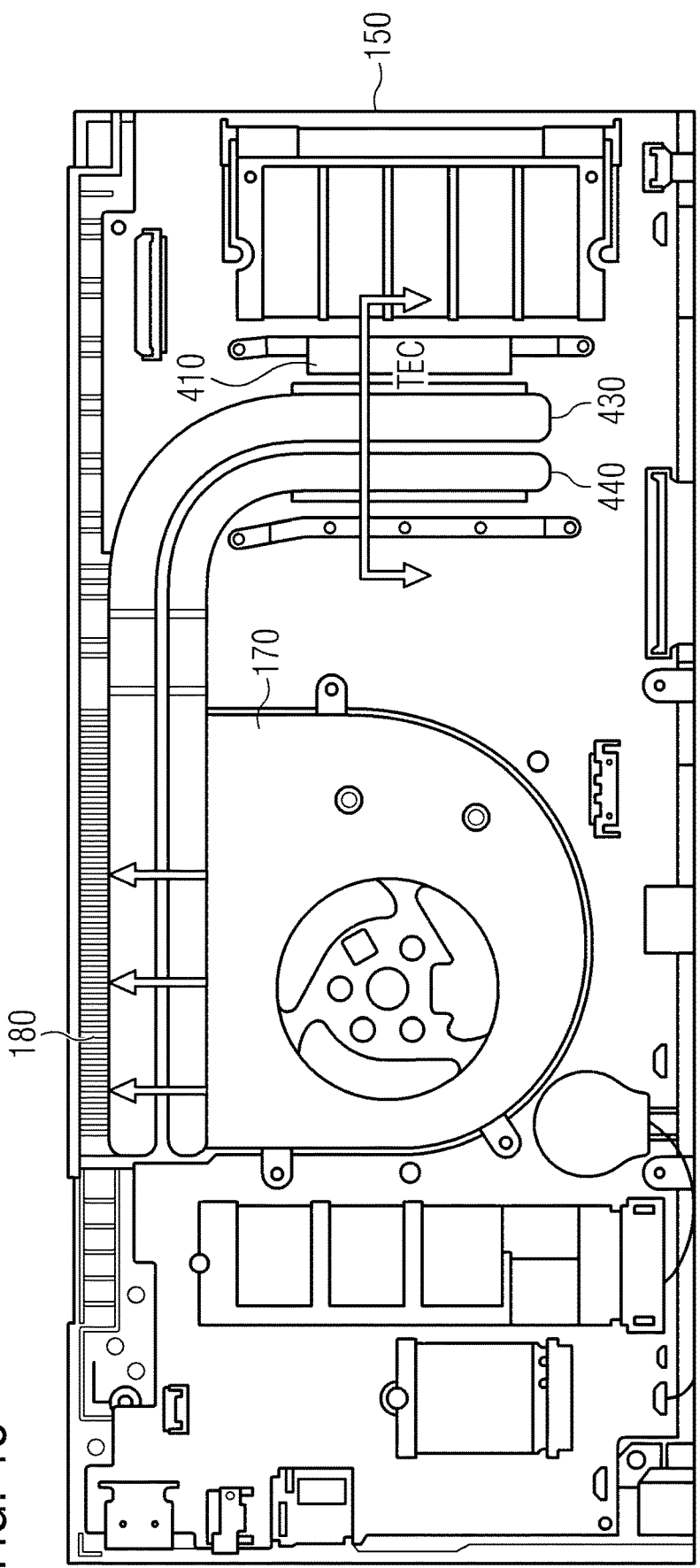
FIG. 4c shows a schematic top view of a cooling system of an electronic device.
Figure 4D:
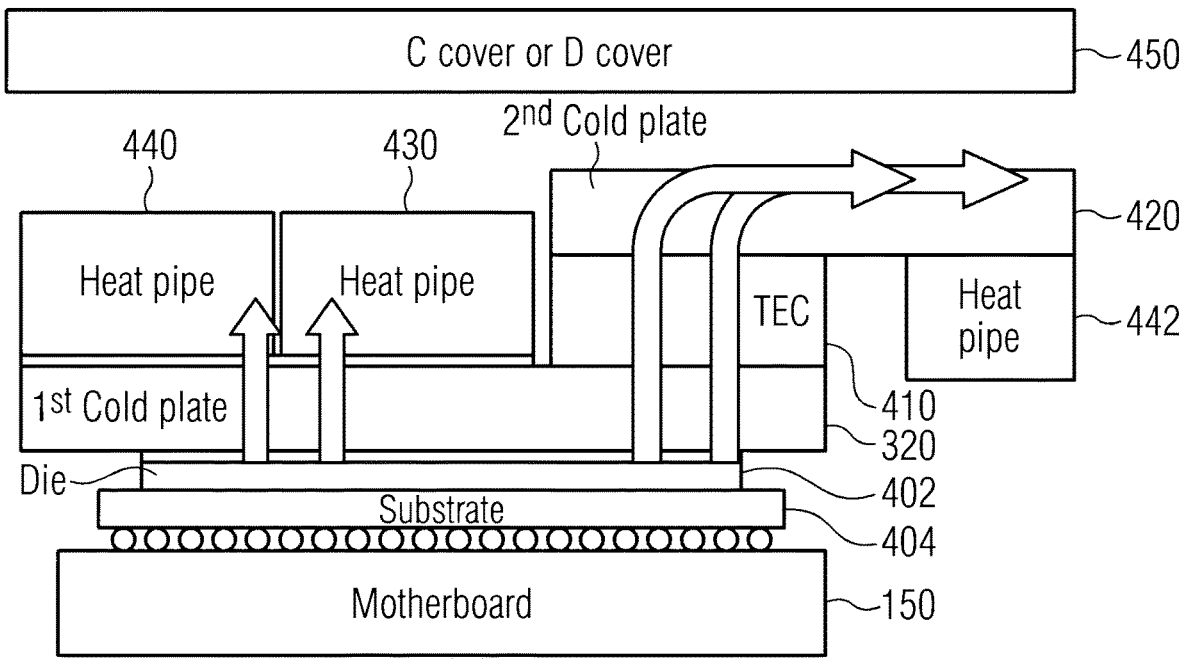
FIG. 4d shows a schematic cross section of a cooling system for an electronic device.
Figure 4E:
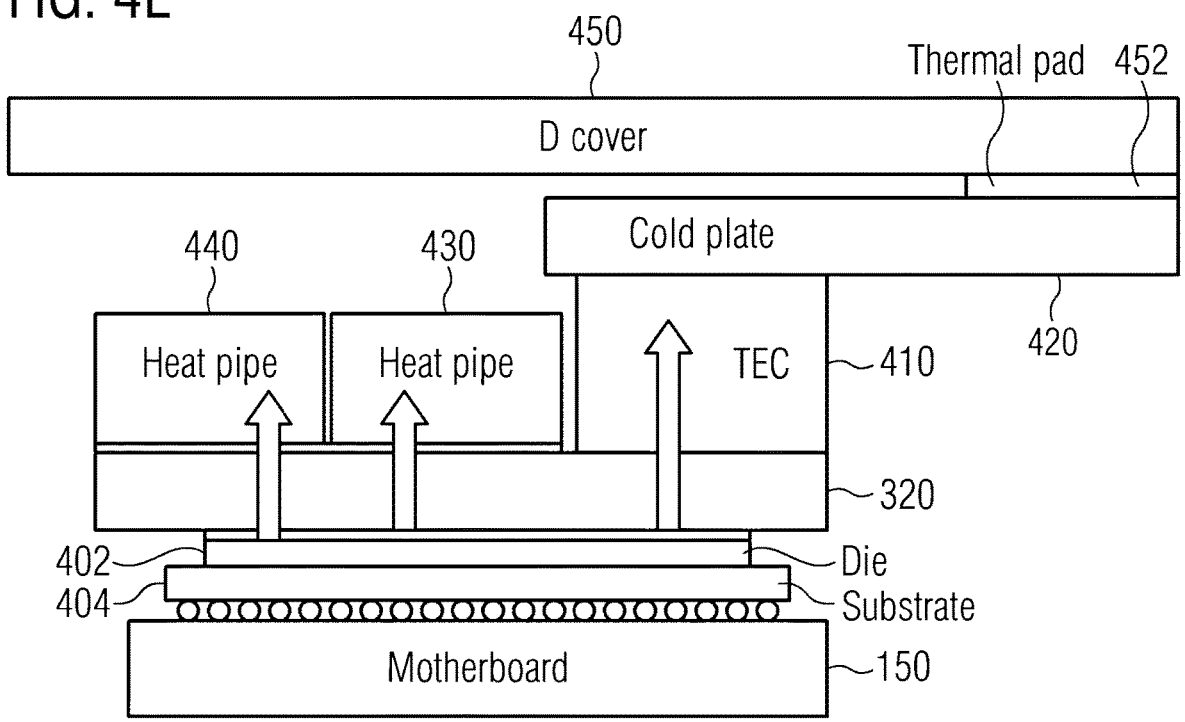
FIG. 4e shows a schematic cross section of a cooling system for an electronic device.

FIG. 4c shows a schematic top view of a cooling system of an electronic device. The cooling system may be implemented similar to the cooling system described in connection with FIG. 4b. The first heat pipe 430 and the second heat pipe 440 extend from the $1^{st}$ cold plate to a heat sink 180. The first heat pipe 430 and the second heat pipe 440 may be thermally coupled to the heat sink 180. Further, a fan 170 is located adjacent to the heat sink 180. The fan 180 is configured to blow air through or over the heat sink 180.

Various additional components of the electronic device may be located on the circuit board 150.

More details, optional features and aspects are mentioned in connection with one or more examples described above or below.

FIG. 4d shows a schematic cross section of a cooling system for an electronic device. The cooling system may be implemented similar to the cooling system described in connection with FIG. 4b. However, the second heat distribution structure 420 is arranged on top of the TEC 410, but not on top of the first heat pipe 430 and the second heat pipe 440. The thickness of the TEC 410 is smaller than the thickness of the first heat pipe 430 and the second heat pipe 440. In this way, the total stack height may be reduced. A third heat pipe 442 is thermally coupled to the second heat distribution structure 420. The third heat pipe 442 is laterally spaced apart from the first heat distribution structure 320. A gap is located between an enclosure 450 (e.g. C cover or D cover) of the electronic device and the second heat distribution structure 420. In this way, the surface temperature of the enclosure may be kept low.

More details, optional features and aspects are mentioned in connection with one or more examples described above or below.

FIG. 4e shows a schematic cross section of a cooling system for an electronic device. The cooling system may be implemented similar to the cooling system described in connection with FIG. 4d. However, the thickness of the TEC 410 is larger than the thickness of the first heat pipe 430 and the second heat pipe 440. Further, instead of implementing the third heat pipe, the second heat distribution structure 420 is thermally coupled to the enclosure 450 (e.g. the D cover) through a thermal pad 452. In this way, the cooling capacity may be improved. The thermal pad 452 may comprise thermally conductive adhesive or TIM or any other material suitable for thermally coupling the second heat distribution structure 420 to the enclosure 450.

The first heat distribution structure 320 may be a cold plate (e.g. $1^{st}$ cold plate) and the second heat distribution structure 420 may be a cold plate (e.g. $2^{nd}$ cold plate).

More details, optional features and aspects are mentioned in connection with one or more examples described above or below.

Figure 4F:
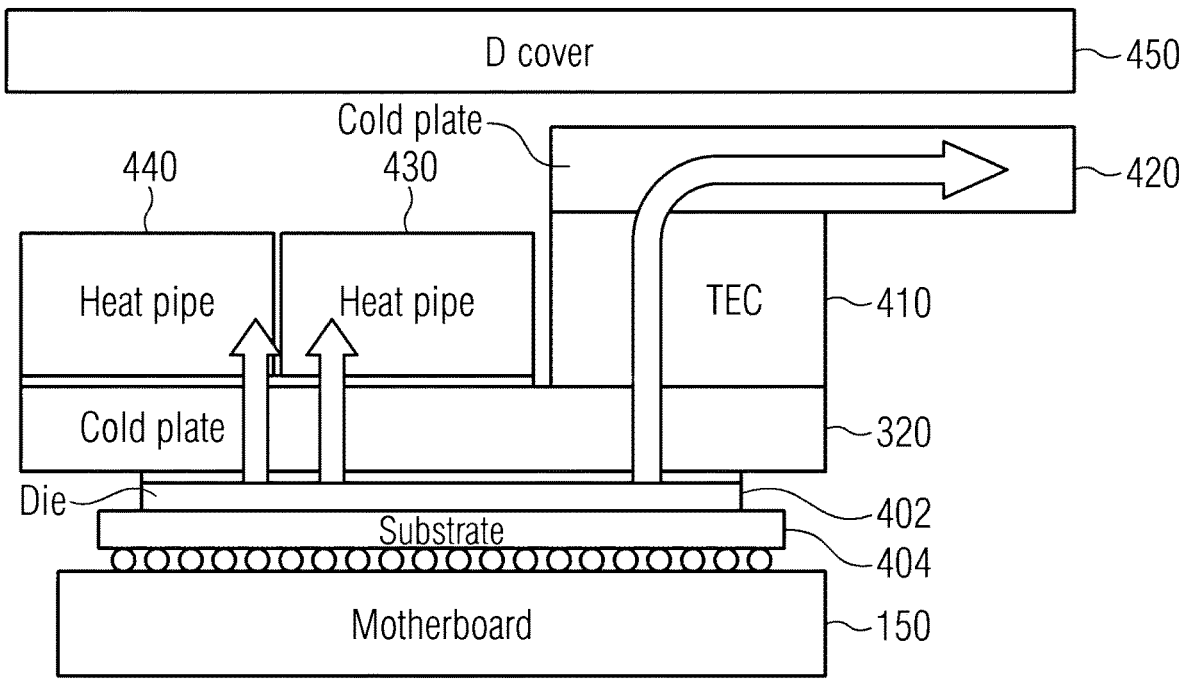
FIG. 4f shows a schematic cross section of a cooling system for an electronic device.

FIG. 4f shows a schematic cross section of a cooling system for an electronic device. The cooling system may be implemented similar to the cooling system described in connection with FIG. 4e. However, the second heat distribution structure 420 is not thermally coupled to the enclosure 450. A gap is located between the enclosure 450 of the electronic device and the second heat distribution structure 420. In this way, the surface temperature of the enclosure may be kept low.

The first heat distribution structure 320 may be a cold plate (e.g. $1^{st}$ cold plate) and the second heat distribution structure 420 may be a cold plate (e.g. $2^{nd}$ cold plate).

More details, optional features and aspects are mentioned in connection with one or more examples described above or below.

Figure 4G:
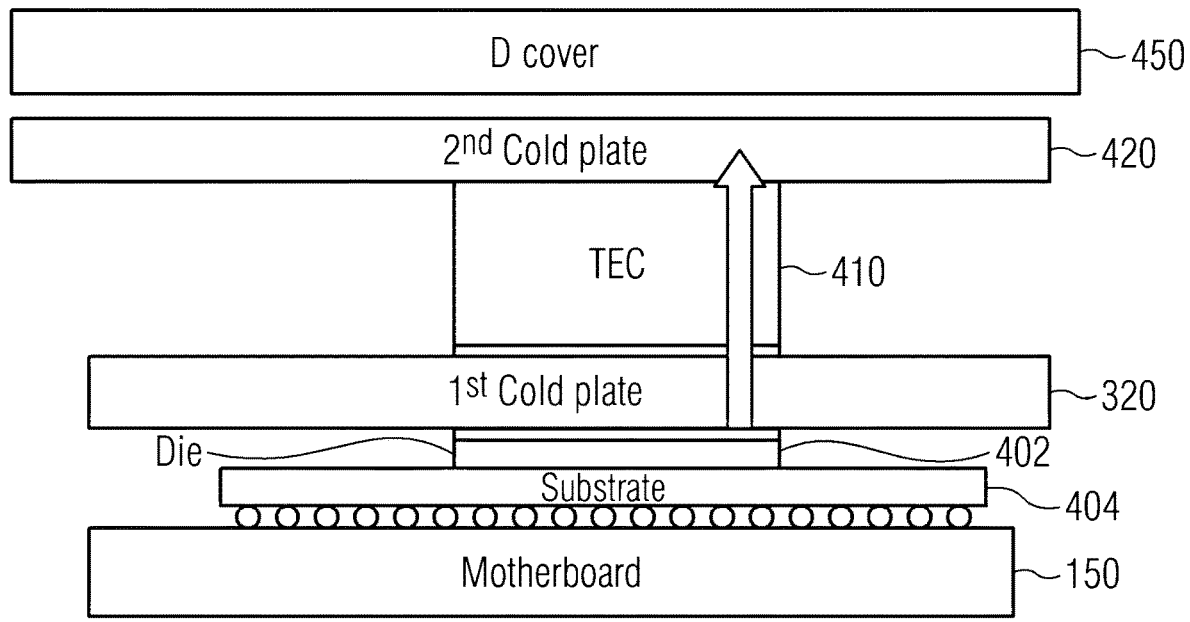
FIG. 4g shows a schematic cross section of a cooling system for an electronic device.

FIG. 4g shows a schematic cross section of a cooling system for an electronic device. The cooling system may be implemented similar to the cooling system described in connection with FIG. 4a. The cooling system of FIG. 4g may be a passive cooling system without fan. The first heat distribution structure 320 is implemented as a first metal plate ($1^{st}$ cold plate) and the second heat distribution structure 420 is implemented as a second metal plate ($2^{nd}$ cold plate). The first heat distribution structure 320 is arranged on top of a semiconductor package (e.g. SOC package) including a substrate 404 and a semiconductor die 402 (e.g. the die may have a length of 10.6 mm or any other length). The semiconductor package is attached to a circuit board 150 (e.g. a motherboard). A TEC 410 is arranged on a surface of the first heat distribution structure 320 and the second heat distribution structure 420 is arranged on top of the TEC 410. Heat can be transferred from the semiconductor die 402 through the first cold plate and the TEC 410 to the second cold plate. A gap is located between the enclosure 450 (e.g. D cover) of the electronic device and the second heat distribution structure 420.

The example of FIG. 4g may be a cooling system for low power SOCs without fan. The electronic device (e.g. a passive cooling notebook) may have a TDP of at most 12 W (or at most 10 W).

More details, optional features and aspects are mentioned in connection with one or more examples described above or below.

Figure 4H:
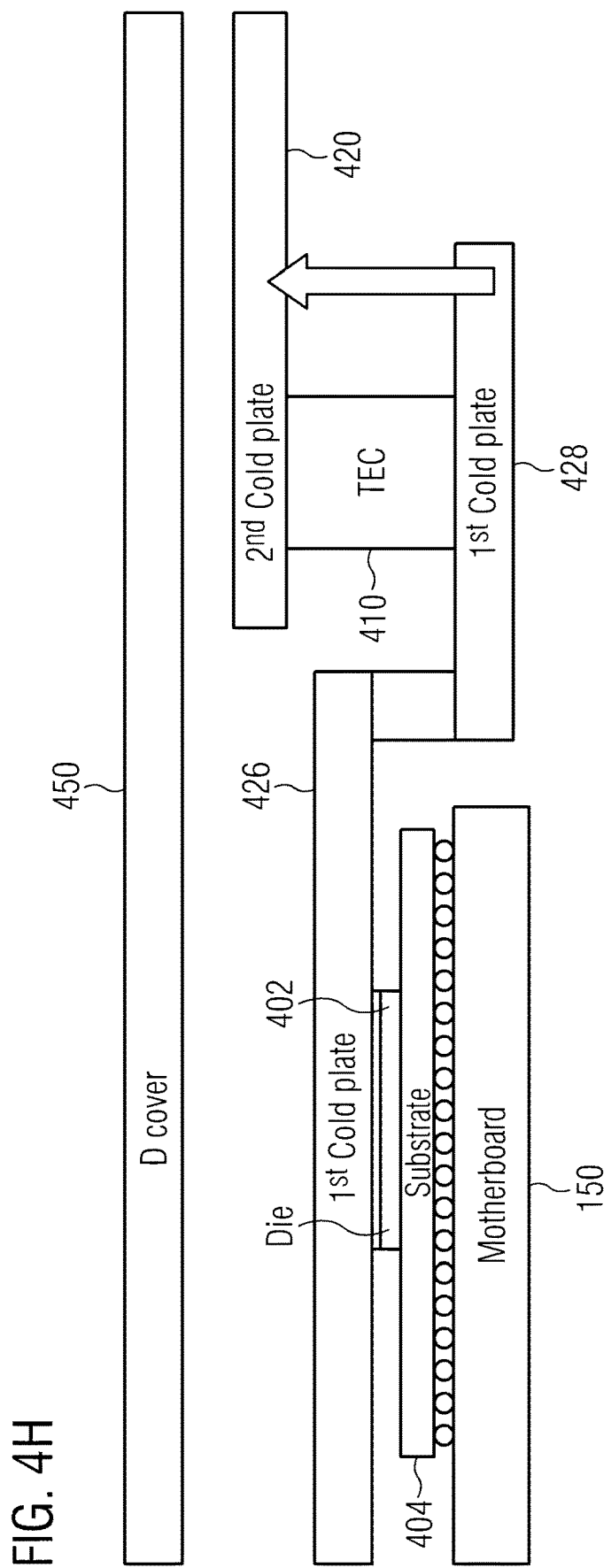
FIG. 4h shows a schematic cross section of a cooling system for an electronic device.

FIG. 4h shows a schematic cross section of a cooling system for an electronic device. The cooling system may be implemented similar to the cooling system described in connection with FIG. 4a. The cooling system of FIG. 4g may be a passive cooling system without fan. The first heat distribution structure is implemented as a first metal plate ($1^{st}$ cold plate) and the second heat distribution structure 420 is implemented as a second metal plate ($2^{nd}$ cold plate). A part of the first heat distribution structure is arranged on top of a semiconductor package (e.g. SOC package) including a substrate 404 and a semiconductor die 402 (e.g. the die may have a length of 10.6 mm or any other length). The semiconductor package is attached to a circuit board 150 (e.g. a motherboard). The first heat distribution structure comprises a first part 426 thermally coupled to the semiconductor package 402 and a second part 428 thermally connected to the first part 426. The second part 428 of the first heat distribution structure is arranged laterally beside the semiconductor package 402. The semiconductor package 402 is located vertically between the first part 426 and the second part 428 of the first heat distribution structure. A TEC 410 is arranged on a surface of the second part 428 of the first heat distribution structure and the second heat distribution structure 420 is arranged on top of the TEC 410. A vertical extension of the thermal electric cooler 410 overlaps with a vertical extension of the semiconductor package 402. In this way, a very thin electronic device may be enabled. Heat can be transferred from the semiconductor die 402 through the first cold plate and the TEC 410 to the second cold plate. A gap is located between the enclosure 450 (e.g. D cover) of the electronic device and the second heat distribution structure 420.

More details, optional features and aspects are mentioned in connection with one or more examples described above or below.

Figure 4I:
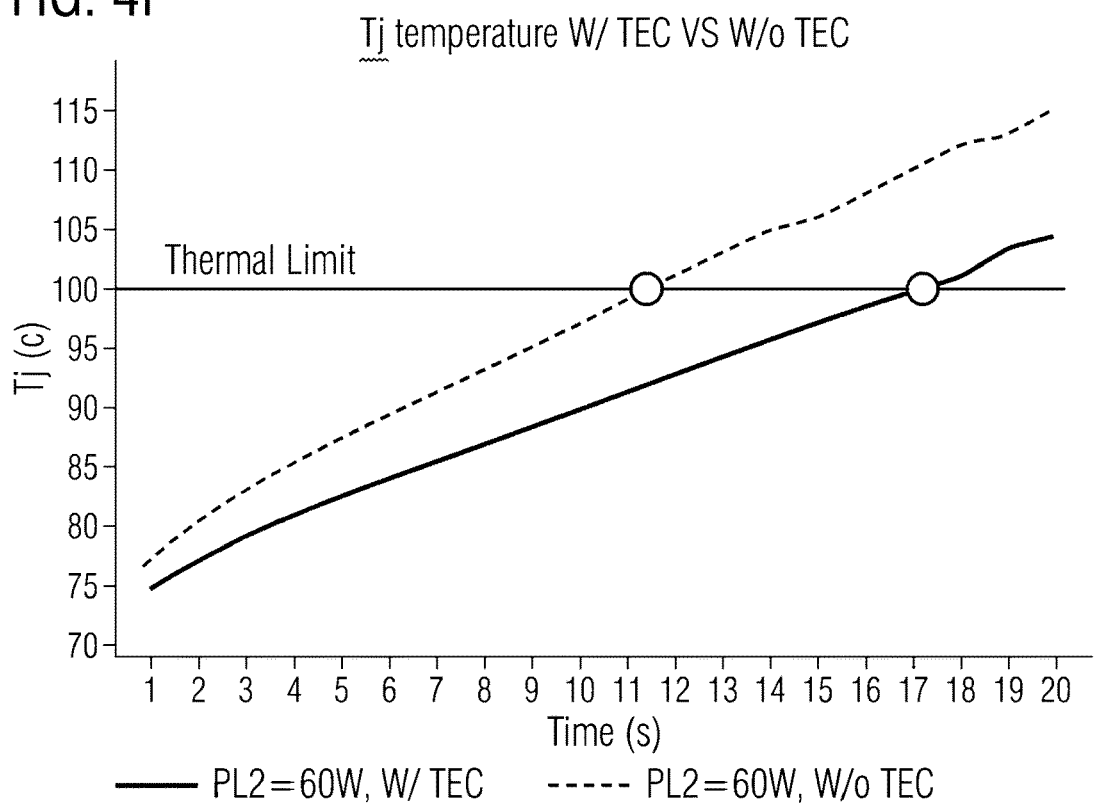
FIG. 4i shows a diagram indicating the junction temperature over time.
Figure 4J:
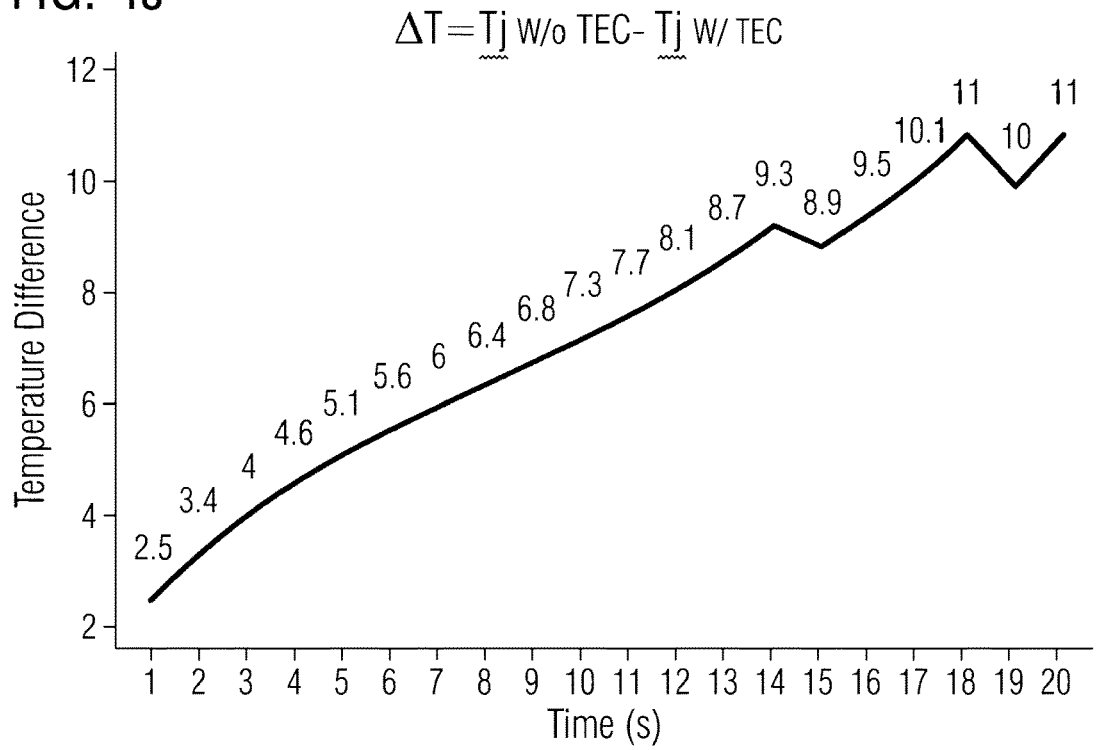
FIG. 4j shows a diagram indicating a temperature difference over time.

Simulations may show that systems with TEC may reach a maximal junction temperature Tj later than systems without TEC. The TEC may be placed close to the die to be more helpful to sustain transient power. FIG. 4i shows a diagram indicating the junction temperature over time. The simulation may be based on a system as shown in FIG. 4b. Two heat pipes (e.g. uncompressed diameter 08, 1.8 mm), a 0.5 mm cold plate and a TEC (e.g. 10.1 W cooling capability, 1.2 COP) may be used. The thermal solution configuration may impact the full turbo budget. With variation in different systems, the thermal solution's sustained and transient capabilities may vary. The simulation result shows that other designs (without TEC) may reach 100 degree after 11 second, while the system with TEC solution may reach 100 degree after 18 second. The TEC can slow down the Tj temperature rise and increase 7 seconds turbo time. The TEC may decrease the risk of Tj throttling. FIG. 4j shows a diagram indicating a temperature difference over time corresponding to the diagram shown in FIG. 4i.

FIG. 4k shows a flow chart of a method for cooling an electronic device. The method 490 comprises activating 492 a thermal electric cooler based on a device parameter of the electronic device. A first surface of the thermal electric cooler is thermally coupled to a first heat distribution structure and a second surface of the thermal electric cooler is thermally coupled to a second heat distribution structure. The first heat distribution structure is coupled to a heat source.

More details, optional features and aspects are mentioned in connection with one or more examples described above or below.

Some examples relate to a dynamic thermal spreading solution by enabling a Thermal Electronic Cooler (TEC) on personal computers PCs.

As customers demand more performance, CPU may need to increase the power limit for PL1 (for sustain performance) and PL2 (for burst performance). However, the amount of time, which the CPU can spend in the PL2 higher performance mode may be within 10 second. It may be because other thermal solutions may have difficulties to transfer CPU generated power to thermal solutions, such as heat pipe and fin cold point area immediately. As a result, the CPU Tj temperature (junction temperature) can be reached quickly which triggers CPU throttling which reduces the CPU performance. It may become more and more important to transfer transient power and minimize transient temperature rise. It may be difficult for system and thermal design to sustain system-on-chip SOC performance.

Cold plate, vapor chamber, heat pipe and fan may be used for thermal spreading. Heat from the die may transferred to the cold plate or the vapor chamber firstly, then transfers to the heat pipe, finally transferred to the fin and then cooled by a fan. The closer to the die, the more effective the thermal solution may be.

An increase of the thickness of the cold plate (e.g. metal plate) may improve thermal spreading and may increase the heat capacitance. But it may increase the z height and may impact the heat pipe performance. The cold plate size may be very small, like the SOC size. As a result, the thermal capability is low which might not significantly support the PL2 transient power. Some designs may use a vapor chamber instead of a cold plate. The thermal spreading and heat capacitance may be better compared to the cold plate. The response speed may be fast and the thermal capacity may be fine for slightly higher PL2 power, but the vapor chamber may impact the heat pipe response time and the costs may be high. A heat pipe may increase the z height and only may increase the maximum heat carrying capacity (Qmax), but the response time might not be improved. A fan may be located far from the CPU die area. Early activation may be required. The response speed may be the slowest one among the mentioned solutions as it sits furthest away from the SOC die.

A Thermal Electronic Cooler TEC may be able to instantly response within 1 second. Therefore, it may be used for transient response Tj temperature rise. It may also have high capability to support high transient power. It may be controlled by a software SW algorithm to balance the heat dissipation and the power consumption. The TEC response time may be the fastest thermal solution. It may instantly transfer SOC generated power into the heat pipes cold point. The TEC may increase the system heat capacitance to longer sustain PL1 or PL2. The TEC may reduce or minimize the transient temperature rise and may put the SOC into longer sustainable PL2, even power above PL2 to maximize CPU performance. The TEC may be integrated in a dynamic tuning concept (e.g. dynamic tuning technology DTT).

According to an aspect of the proposed concept, a TEC may be implemented into a PC system to support high transient power to unleash more SOC performance. The same approach may apply to desktop computers as well as notebooks.

Other SOC thermal spreading solutions may use a cold plate plus a heat pipe to transfer SOC generated power, then cooling the heat pipe by a fan and a fin, but the SOC generated power might not be instantly transferred into the heat pipe due to the slow response time. The fan and the fin may have very little impact below –10 seconds. The SOC transient performance may be largely impacted by the distance between the thermal spreading components and the SOC die. The components closest to the SOC die may be most useful for transient response. For example, a thicker cold plate and better TIM material may be used to improve the transient performance.

A TEC may have some limitations (e.g., efficiency, power consumption, thickness, etc.) and, for example, notebook systems may have limited space and power supply. Therefore, suitable TECs may be selected for system integration. TEC's power consumption may be pretty high so that it might not be possible to only rely on a TEC to cool a SOC in notebook system. A TEC and heat pipes working together may be a good choice to transfer SOC heat. So TEC's cooling capability could be selected lower than SOC PL1 power.

The efficiency may be an important factor for system design. The working current and the maximum temperature difference may be considered to get higher Coefficient of Performance (COP). A COP higher than 1.0 may be achievable when the maximum temperature difference is less than approximately 30° C. and the working current is 10-30% of a TEC maximum current. A suitable TEC with higher COP may save much power.

For example, notebook systems might not have much space to integrate a TEC, but the TEC may share SOC space with the heat pipe. Lower than 1.0 mm TEC modules may be used. The working temperature of the TEC may be selected so that the hot side working temperature is higher than a heat pipe temperature (e.g. 55 degree). So, once the TEC is enabled, it can work together with the 2nd cold plate to transfer heat to heat pipe (e.g. as shown in FIG. 4b).

In order to improve or optimize the power consumption and improve the performance, a software SW control algorithm and policy may be used. This policy may manage platform power, enable/disable TEC and/or adjust the current at different working conditions. For example, the TEC can be enabled at a significant Tj temperature increase condition with a certain time (e.g. 10-30 second) to ensure PL2 performance. The TEC can also be enabled in charging condition and low workload status to cool the inner side of the system to get more high system thermal capacity.

Figure 5A:
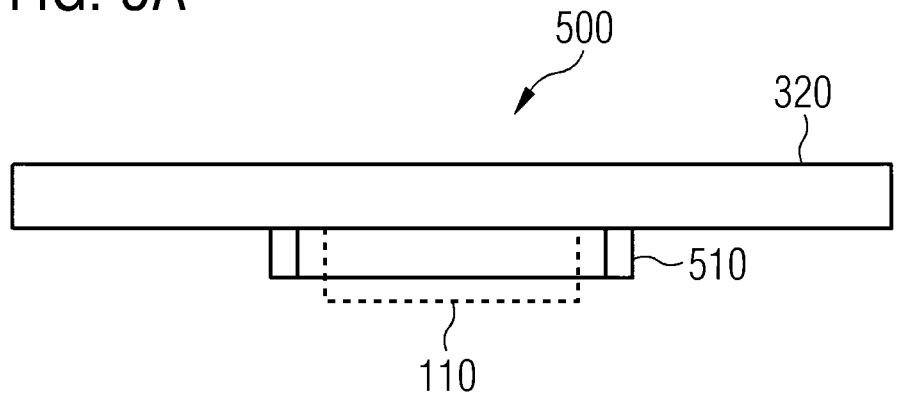
FIG. 5a shows a schematic cross section of a cooling structure for an electronic device.

FIG. 5a shows a schematic cross section of a cooling structure for an electronic device. The cooling structure 500 comprises a heat distribution structure 320 configured to spread heat caused by a heat source 110 from a center region (or a central region) to an edge region of the heat distribution structure 320. The heat distribution structure 320 is configured to be thermally coupled to the heat source 110 in the center region at a first side of the heat distribution structure 320. Further, the cooling structure 500 comprises a border 510 located on the heat distribution structure 320. The border 510 surrounds the center region of the heat distribution structure 320 at the first side of the heat distribution structure 320.

By providing a border around the center region, a cavity for the heat source can be formed. TIM arranged between the heat source and the cooling structure during thermally coupling the heat source and the cooling structure might not be able to escape or leak from the cavity so that a good long-term contact may be ensured between the heat source and the cooling structure. Further, the border may help to dissipate heat from the heat source.

The heat distribution structure 320 may be configured to be coupled with the heat source 110 by having a sufficiently large center region to accommodate the heat source. The heat distribution structure 320 may comprise a planar surface in the center region. In this way, the heat source 110 with flat surface (e.g. a semiconductor die or semiconductor package) can be easily thermally coupled with the heat distribution structure 320. The first side of the heat distribution structure 320 may be a planar surface except for the border 510 or may comprise additional structure protruding from a level of the center region outside the center region.

The border 510 (or also called sidewalls or frame) may have any geometry as long as it protrudes from the center region of the heat distribution structure 320 and surrounds the center region of the heat distribution structure 320. For example, the border 510 may protrude from the surface of the center region by at most 1 mm (or at most 0.8 mm or at most 0.5 mm) as the heat source 110 may be thin (e.g. a semiconductor die or semiconductor package). For example, the region enclosed by the border 510 may comprise a maximal dimension with respect to length and width of at most 30 mm (or at most 40 mm or at most 20 mm or at most 15 mm) and/or at least 10 mm (or at least 15 mm or at least 20 mm). The border 510 may form walls laterally enclosing the center region. The walls may extend perpendicular to a surface of the center region or an angle between the surface of the center region and the walls may be at most 110° (or at most 100°).

The boarder 510 may be integrally formed with the heat distribution structure 320 on the first side of the heat distribution structure 320. For example, the heat distribution structure 320 may comprise or may be a vapor chamber and the border 510 may be integrally formed on the surface of the chamber wall. Alternatively, the border 510 may be attached (e.g. adhered or soldered) to or formed on (e.g. deposited) the first side of the heat distribution structure 320.

The heat distribution structure 320 may also be called thermal bus or thermal bus structure. The heat distribution structure 320 may comprise a thermal conductivity at least in one direction from the center region to the edge region of at least 100 W/mK (or at least 500 W/mK, at least 1000 W/mK or at least 1500 W/mK). For example, the heat distribution structure 320 may be or may comprise a vapor chamber, a plurality of heat pipes (e.g. embedded in a metal plate) or a metal plate (e.g. copper plate or aluminum plate). For example, the heat distribution structure 320 may comprise a thickness of at most 4 mm (or at most 3 mm, at most 2.5 mm or at most 2 mm). The heat distribution structure 320 may comprise a maximal dimension with respect to length and width of at least 60 mm (or at least 80 mm or at least 100 mm) and/or at most 150 mm (or at most 120 mm or at most 100 mm).

The edge region of the heat distribution structure 320 may extend along an edge of the of the heat distribution structure. For example, the border 510 is located on the first side of the heat distribution structure 320 laterally between the edge region and the center region.

The cooling structure 500 may further comprise a seal ring attached to the border. The seal ring may be configured to seal a gap between the border and a carrier structure of the heat source 110. The carrier structure may be a package substrate of a semiconductor die or a circuit board or another structure on which the heat source 110 is mounted. In this way, a sealed cavity may be obtained for the heat source 110. For example, TIM used for thermally coupling the heat source 110 and the heat distribution structure 320 might not be able to escape the sealed cavity.

The cooling structure 500 may further comprise a heat sink mounted to a second side of the heat distribution structure 320. The heat sink may be attached (e.g. adhered or soldered) to the second side of the heat distribution structure 320. For example, a TIM may be located between the heat sink and the heat distribution structure 320 to improve the thermal coupling. The heat sink may comprise fins at a side opposite to the heat distribution structure 320.

The CPU TIM may be kept in place and a good contact with the CPU via the CPU die cavity may be ensured. Further, the heat from CPU die may be spread via the vapor chamber base so that the heat enters the whole heat sink base and not just the small area contacting the CPU die. In this way, the heat may dissipate more efficiently to the ambient. The thermal bus may be made of other good heat conducting materials such as heat pipes, copper, etc. depending on the power level.

The heat source 110 may comprise or may be a semiconductor die configured to generate heat (e.g. waste heat) during operation. The waste heat may be generated automatically during operation of the semiconductor die. An integrated circuit may be implemented on the semiconductor die. The semiconductor die may be a bare die with uncovered backside or a packaged semiconductor die with a backside covered by package material (e.g. mold or another material).

The heat source 110 may be or may comprise a processor (e.g. CPU, microcontroller, digital signal processor or a graphics processing unit GPU), a transmitter, a receiver, a transceiver, a power supply and/or a voltage converter or another integrated circuit.

The electronic device 100 may be a tablet, a laptop, a notebook, a mobile phone, a computer (e.g. personal computer or server) or another electronic device.

More details, optional features and aspects are mentioned in connection with one or more examples described above or below.

Figure 5K:
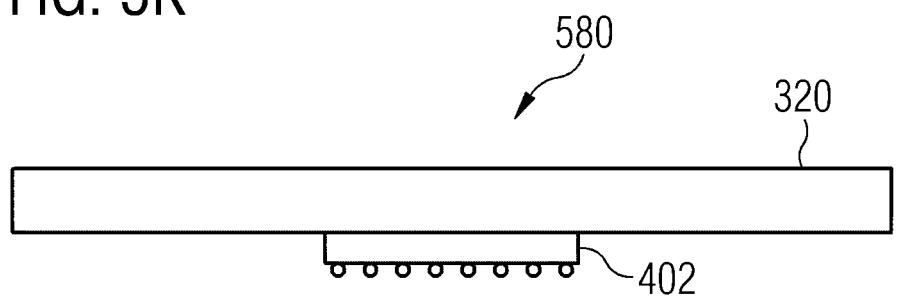
FIG. 5k shows a schematic cross section of an electronic device.
Figure 5L:
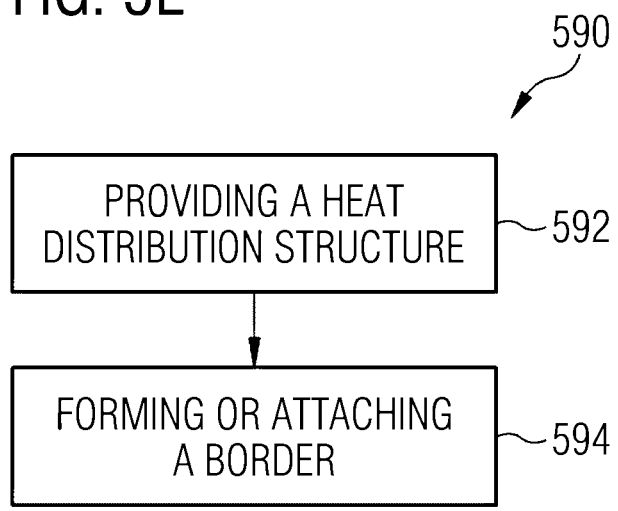
FIG. 5l shows a flow chart of a method for forming a cooling structure.
Figure 5B:
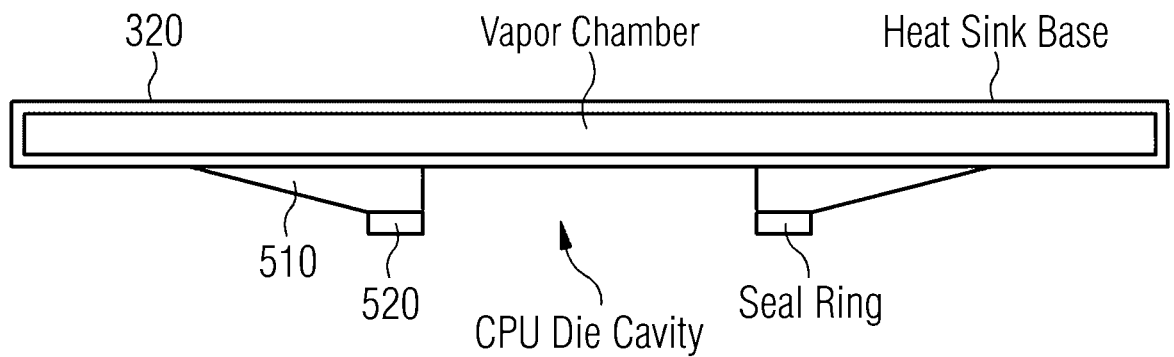
FIG. 5b shows a schematic cross section of a cooling structure for an electronic device.

FIG. 5b shows a schematic cross section of a cooling structure for an electronic device. The cooling structure may be implemented similar to the cooling structure described in connection with FIG. 5a. The heat distribution structure 320 (thermal bus) is a vapor chamber. The vapor chamber comprises a border 510 laterally surrounding a central region at a first side of the vapor chamber. The surface of the vapor chamber in the central region and the border confine together a recess or cavity for housing a heat source. For example, the heat source may be a CPU and the recess may be a cavity for the CPU die. The border may have vertical sidewalls bordering the central region, a horizontal top surface and an inclined surface extending from the top surface to the surface of an edge region of the vapor chamber. Further, a seal ring (e.g. gasket material) is attached on top of the border. The seal ring may seal the cavity after coupling the cooling structure with the heat source. The second side of the vapor chamber may be used as a heat sink base for attaching a heat sink.

FIG. 5 b may show an example of a thermal bus with vapor chamber or being a vapor chamber. Different heat sinks or similar (e.g. metal heat sink, heat pipe, another vapor chamber, a liquid cooling system or a TEC) can be carried by the thermal bus or be attached to the top surface of the thermal bus. The thermal bus can be attached to a bare die CPU. The thermal spreading may be better than with IHS (Integrated Heat Spreader). The CPU die cavity with seal ring may be used to eliminate a TIM leakage. The thermal bus might not be integrated to the CPU package. The thermal bus may be flexible, removeable and may be customized.

More details, optional features and aspects are mentioned in connection with one or more examples described above or below.

Figure 5C:
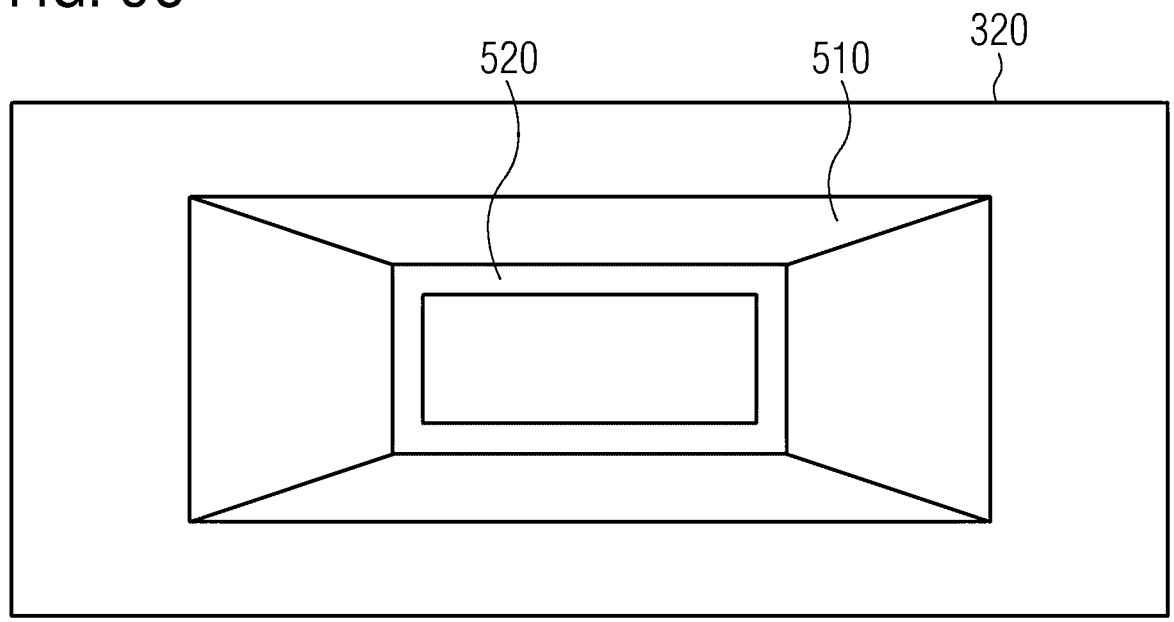
FIG. 5c shows a schematic bottom view of a cooling structure of an electronic device.

FIG. 5c shows a schematic bottom view of a cooling structure of an electronic device. The cooling structure may show a bottom view of the cooling structure described in connection with FIG. 5b.

FIG. 5c may show the usage of a thermal bus with a bare-die package and a heatsink assembly. The CPU cavity on the thermal bus may be able to keep the CPU TIM in place, especially for the liquid metal TIM, and may ensure a good contact between the thermal bus and the CPU die surface. Further, the thermal path via the sides of CPU die may slightly improve the cooling.

More details, optional features and aspects are mentioned in connection with one or more examples described above or below.

Figure 5D:
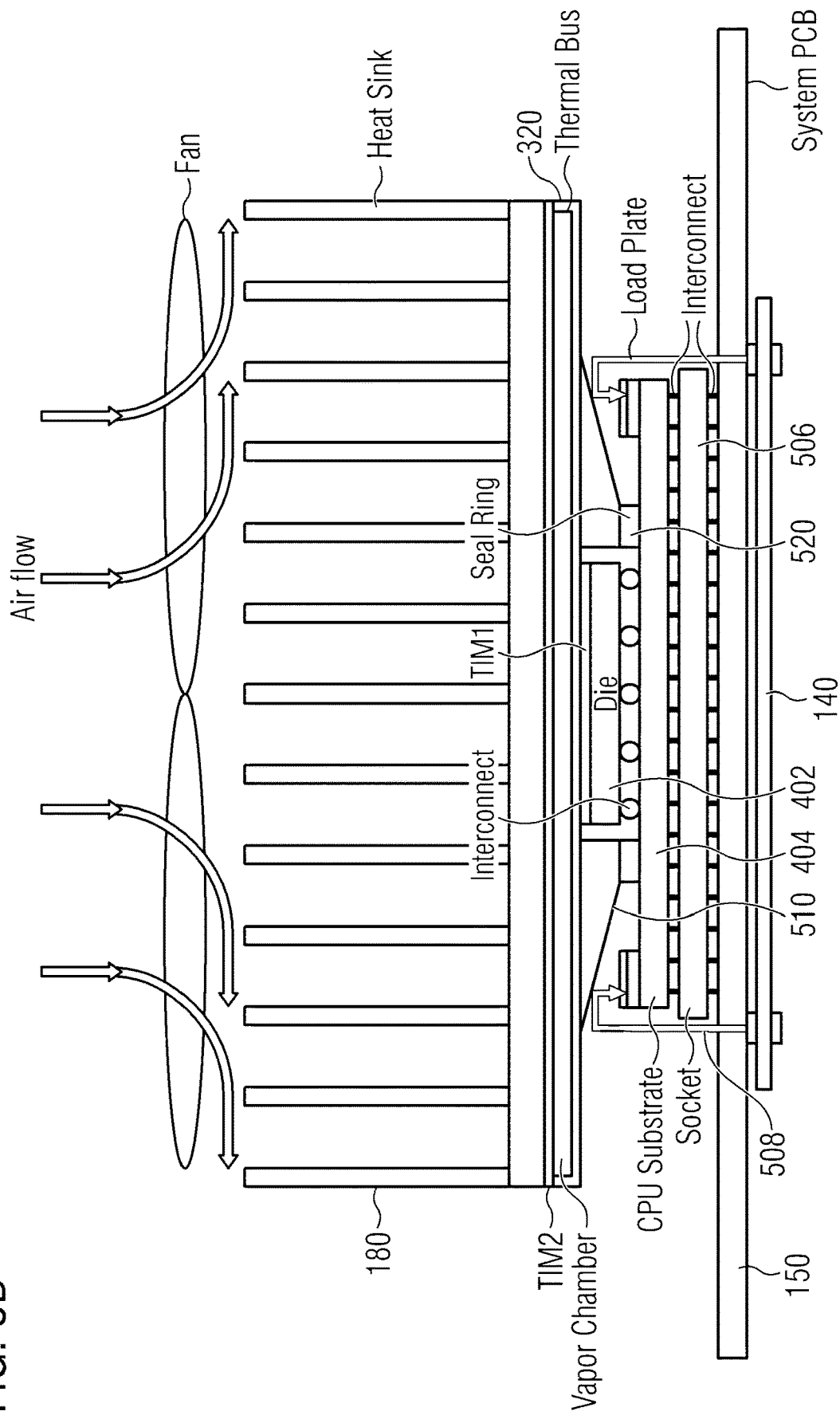
FIG. 5d shows a schematic cross section of a cooling system for an electronic device.

FIG. 5d shows a schematic cross section of a cooling system for an electronic device. The cooling structure may be implemented similar to the cooling structure described in connection with FIGS. 1f and/or 5a. The vapor chamber is integrated between a heat sink 180 and the semiconductor die 402. The vapor chamber is thermally coupled to a backside of a semiconductor die 402 through a TIM. The semiconductor die (e.g. CPU) is attached to a substrate (e.g. CPU substrate), which is attached to a socket 506. Interconnects are located between the semiconductor die 402 and the substrate 404 and between the substrate 404 and the socket 506. The semiconductor die 402, the substrate 404 and the socket 506 may form a semiconductor device mounted to a circuit board 150 (e.g. system PCB). The semiconductor device may be secured to the circuit board through a connection structure 508 (e.g. load plate), which may engage at an edge region of the substrate. The circuit board 150 is connected to the enclosure 140 of the electronic device. A fan may be located in proximity to the heat sink 180 in order to blow air through or over the heat sink 180.

For example, the vapor chamber may be a heat distribution structure 320 of a cooling structure as described in connection with FIGS. 5a and/or 5b.

More details, optional features and aspects are mentioned in connection with one or more examples described above or below.

Figure 5E:
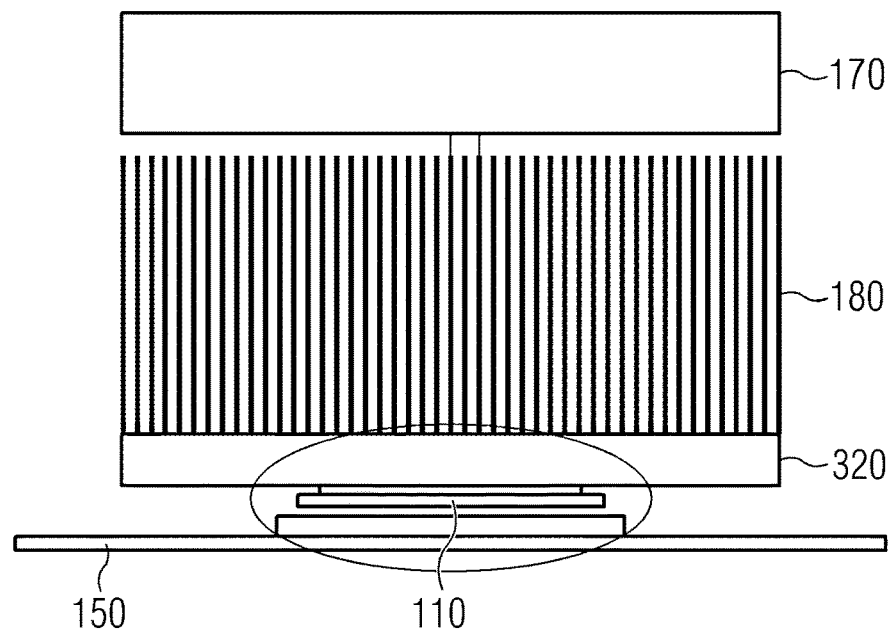
FIG. 5e shows a schematic cross section of a cooling system for an electronic device.

FIG. 5e shows a schematic cross section of a cooling structure for an electronic device. The cooling structure may be implemented similar to the cooling structure described in connection with FIG. 5a. The heat distribution structure 320 comprises a heat sink 180 attached to a top side of the heat distribution structure 320. A bottom side of the heat distribution structure 320 is thermally coupled to the heat source 110. Further, a fan 170 is mounted on top of the heat sink 180. The heat source 110 as well as the heat distribution structure 320, the heat sink 180 and the fan 170 are carried by a circuit board 150.

More details, optional features and aspects are mentioned in connection with one or more examples described above or below.

Figure 5F:
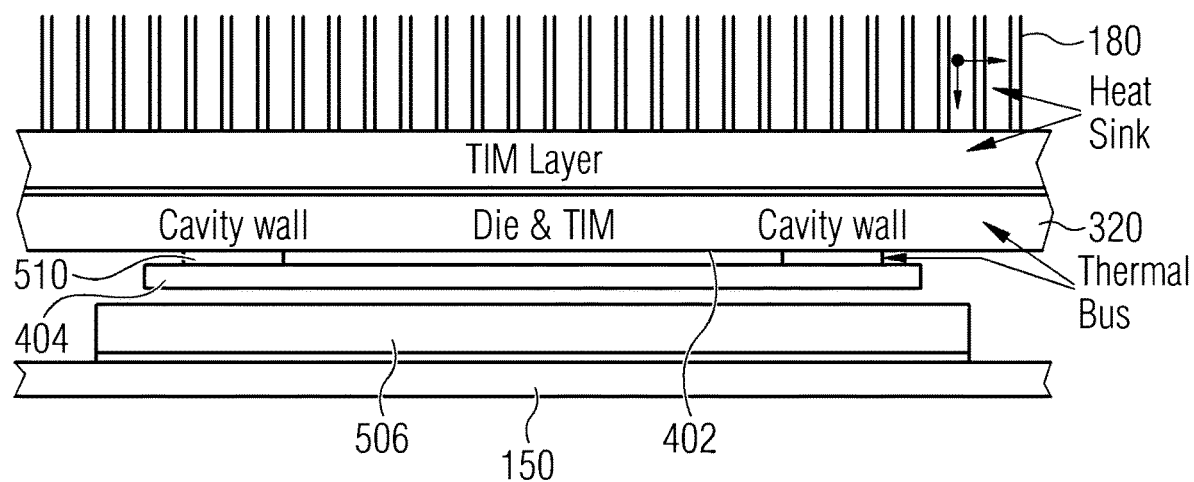
FIG. 5f shows a schematic cross section of a cooling structure for an electronic device.

FIG. 5f shows a schematic cross section of a cooling structure for an electronic device. FIG. 5f may show an enlarged cross section of a part of the cooling structure of FIG. 5e. The heat sink 180 is thermally coupled to the top side of the heat distribution structure 320 by a TIM layer.

Cavity walls (e.g. border) are located at the bottom side of the heat distribution structure 320 laterally enclosing a semiconductor die 402 thermally coupled to the heat distribution structure 320 by TIM. The die 402 is mounted to a substrate 404 and the substrate is mounted to a socket 506. The socket 506 is attached to a circuit board 150.

More details, optional features and aspects are mentioned in connection with one or more examples described above or below.

Figure 5G:
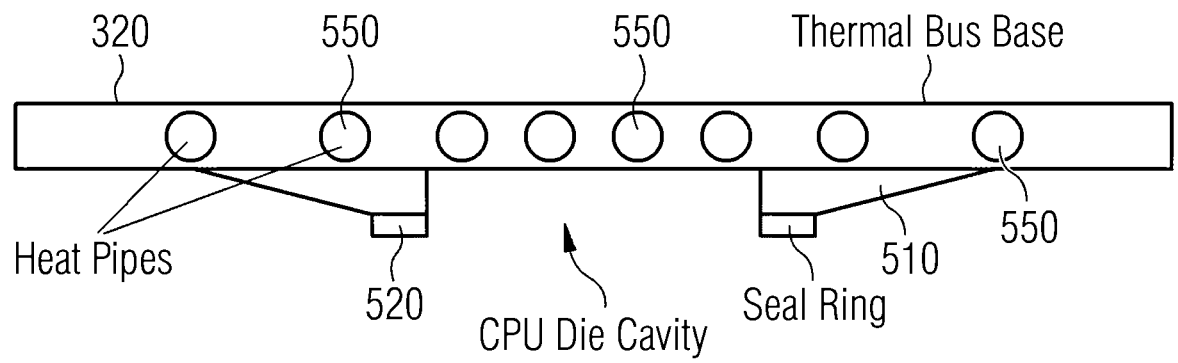
FIG. 5g shows a schematic cross section of a cooling structure for an electronic device.

FIG. 5g shows a schematic cross section of a cooling structure for an electronic device. The cooling structure may be implemented similar to the cooling structure described in connection with FIG. 5a and/or 5b. In comparison to FIG. 5b, the heat distribution structure 320 is implemented by a plurality of heat pipes embedded in a metal plate. The heat pipes are arranged in parallel to each other. The heat pipes extend from a first edge region of the heat distribution structure 320 at one side to a second end region of the heat distribution structure 320 at an opposite side.

FIG. 5g may show an example of a thermal bus with heat pipes. The top side of the heat distribution structure 320 may provide a thermal bus base for attaching a heat sink.

More details, optional features and aspects are mentioned in connection with one or more examples described above or below.

Figure 5H:
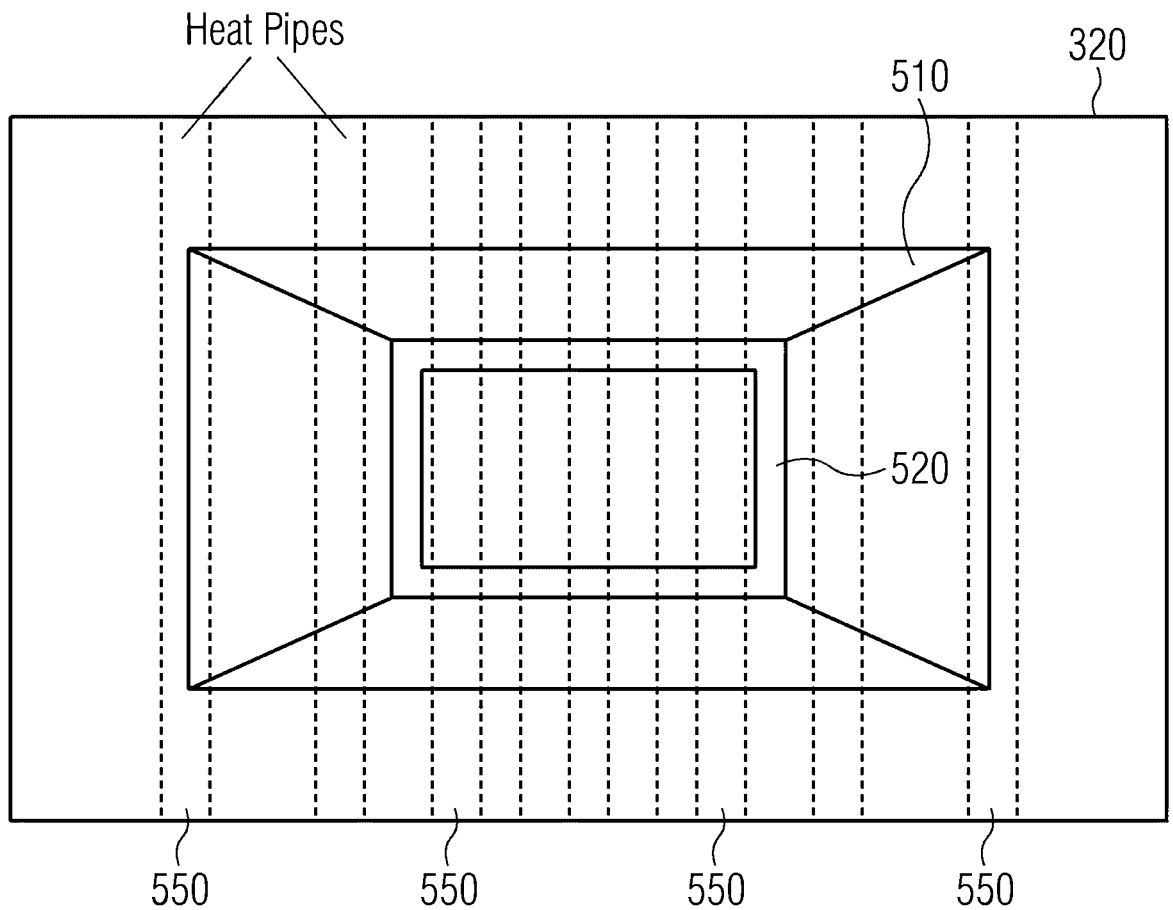
FIG. 5h shows a schematic bottom view of a cooling structure of an electronic device.

FIG. 5h shows a schematic bottom view of a cooling structure of an electronic device. The cooling structure of FIG. 5h may show a bottom view of the cooling structure described in connection with FIG. 5g.

More details, optional features and aspects are mentioned in connection with one or more examples described above or below.

Figure 5I:
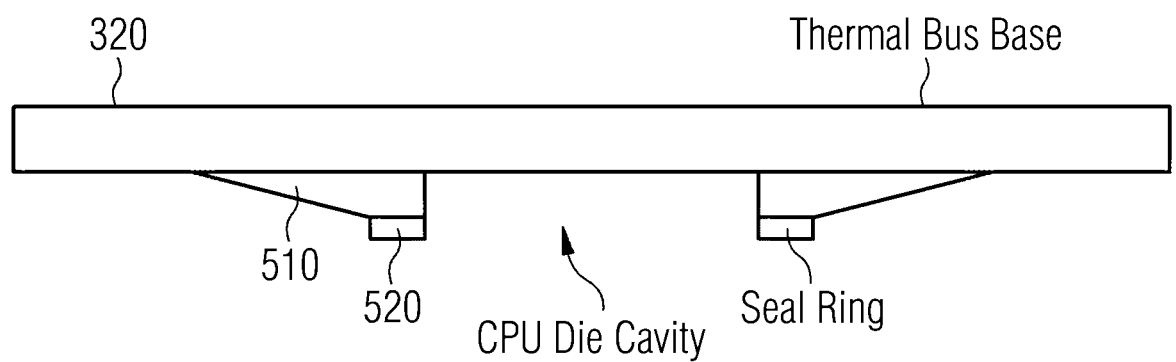
FIG. 5i shows a schematic cross section of a cooling structure for an electronic device.

FIG. 5i shows a schematic cross section of a cooling structure for an electronic device. The cooling structure may be implemented similar to the cooling structure described in connection with FIG. 5a and/or 5b. In comparison to FIG. 5b, the heat distribution structure 320 is implemented by a metal plate (e.g. cold plate).

FIG. 5i may show an example of a thermal bus concept with metal plate. The top side of the heat distribution structure 320 may provide a thermal bus base for attaching a heat sink.

More details, optional features and aspects are mentioned in connection with one or more examples described above or below.

Figure 5J:
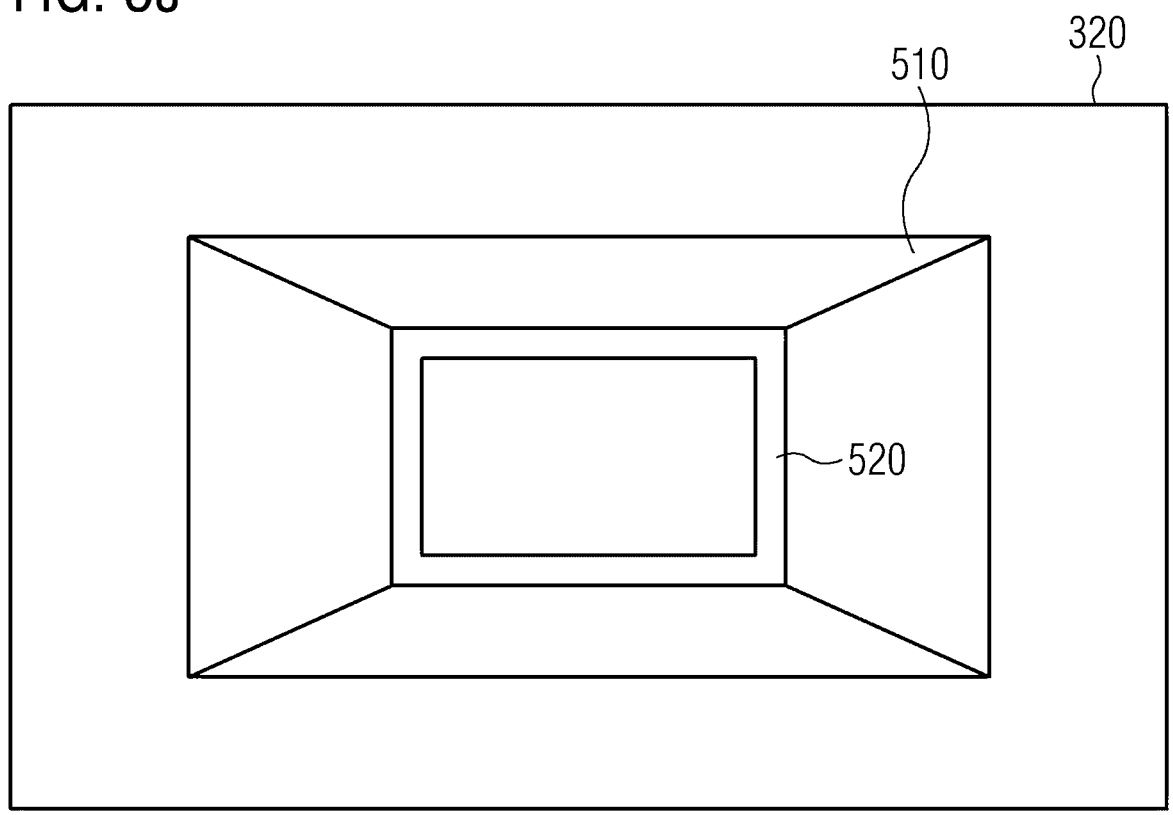
FIG. 5j shows a schematic bottom view of a cooling structure of an electronic device.

FIG. 5j shows a schematic bottom view of a cooling structure of an electronic device. The cooling structure of FIG. 5j may show a bottom view of the cooling structure described in connection with FIG. 5i.

More details, optional features and aspects are mentioned in connection with one or more examples described above or below.

FIG. 5k shows a schematic cross section of an electronic device. The electronic device 580 comprises a semiconductor die 402 and a cooling structure comprising a heat distribution structure 320 configured to spread heat caused by the semiconductor die 402 from a center region to an edge region of the heat distribution structure 320. The heat distribution structure 320 is thermally coupled to the semiconductor die 402 in the center region at a first side of the heat distribution structure 320. Further, the bare semiconductor die 402 is thermally directly coupled to the heat distribution structure 320 through a thermal interface material.

By directly coupling the bare die to the heat distribution structure (e.g. a vapor chamber), the stack height may be very low and/or the heat transfer may be improved. In this way, very thin devices may be enabled.

For example, the heat distribution structure 320 may be a vapor chamber and a distance between a backside surface of the semiconductor die 402 and a cavity of the vapor chamber may be at most 1 mm (or at most 0.8 mm or at most 0.6 mm, for example 0.1 mm TIM and 0.5 mm chamber wall of VC).

For example, the semiconductor die 402 may be or may comprise a central processing unit, a graphics processing unit or another microprocessor. The semiconductor die 402 may comprise a thermal design power and/or a maximal power consumption of at least 60 W (or at least 100 W, at least 120 W or at least 150 W). For example, if the heat distribution structure 320 is just a metal plate, the semiconductor die 402 may comprise a thermal design power and/or a maximal power consumption of at least 60 W and/or at most 100 W. If the heat distribution structure 320 comprises a plurality of heat pipes, the semiconductor die 402 may comprise a thermal design power and/or a maximal power consumption of at least 90 W and/or at most 140 W. If the heat distribution structure 320 comprises a vapor chamber, the semiconductor die 402 may comprise a thermal design power and/or a maximal power consumption of at least 120 W (or at least 140 W or at least 160 W).

The thermal interface material may be thermal grease or a liquid metal. The thermal interface material may compensate unevennesses of the backside surface of the semiconductor die 402 and/or the surface of the heat distribution structure 320 in order to enable a good thermal contact over the whole backside surface of the semiconductor die 402. The thermal interface material may comprise a maximal thickness of at most 0.25 mm (or at most 0.2 mm or at most 0.15 mm).

The cooling structure may be implemented as described in connection with FIG. 5a and/or may comprise a heat distribution structure 320 as described with one of the examples mentioned above or below.

For example, the heat distribution structure 320 may comprise a border and a seal ring attached to the border. The seal ring may seal a gap between the border and a package substrate of the semiconductor die 402.

Further, the electronic device 580 may comprise a circuit board. The semiconductor die 402 may be arranged on the circuit board.

In addition, the electronic device 580 may comprise a fan configured to blow air towards a heat sink mounted on the heat distribution structure 320.

The electronic device 100 may be a tablet, a laptop, a notebook, a mobile phone, a computer (e.g. personal computer or server) or another electronic device.

More details, optional features and aspects are mentioned in connection with one or more examples described above or below.

FIG. 5l shows a flow chart of a method for forming a cooling structure. The method 590 comprises providing 592 a heat distribution structure configured to spread heat caused by a heat source from a center region to an edge region of the heat distribution structure. The heat distribution structure is configured to be thermally coupled with the heat source in the center region at a first side of the heat distribution structure. Further, the method 590 comprises forming or attaching 594 a border on the heat distribution structure. The border surrounds the center region of the heat distribution structure at the first side of the heat distribution structure.

Further, the method 590 may comprise attaching a heat sink on a second side of the heat distribution structure.

More details, optional features and aspects are mentioned in connection with one or more examples described above or below.

Some examples relate to a split-stack thermal solution with thermal bus for a bare die CPU. For example, a thermal bus (e.g. a VC, an array of heat pipes or a metal plate) may be used to improve the contact of the thermal solution with the bare die, which may result in higher performance of the silicon. The thermal bus may provide a bridge between the die and the heatsink. A seal ring may be incorporated that prevents TIM from leaking (e.g. as shown in FIG. 5c). The thermal bus may provide the flexibility to attach different heatsink thermal solutions depending on the silicon performance goals and cost. The performance of thermal solution may be enhanced with better contact resulting in higher performance.

For example, a bare die may be implemented with direct attach of a high performance thermal solution. The thermal bus may perform like an adapter between the bare-die and the heatsink. The thermal bus may provide proper contact to the die and a better thermal spreading from the die to the heatsink than IHS. The thermal bus may be made of different materials like Aluminum, Copper, embedded with a heat pipe or a vapor chamber (e.g. as shown in FIG. 5c). A seal ring may prevent TIM from leaking. Heatsinks of different types and size with material choices may be attached to the thermal bus. This flexibility may provide options for different performance levels, system stack-ups and costs. Simulations can show that an implementation with a thermal bus comprising a VC and a flat heat sink (flat backside) for thermal bus usage, but without pedestal, may provide improved cooling in comparison to a vapor chamber heat sink with pedestal. If liquid metal is used as TIM instead of thermal grease, the cooling performance may be further improved. The usage of the thermal bus may improve the temperature difference between the junction temperature and the ambient temperature by more than 10% for CPU TIM being thermal grease or more than 15% for CPU TIM being liquid metal.

Other desktop CPUs with IHS (Integrated Heat Spreader) may run into bottlenecks achieving high performance using heat pipes and vapor chamber. Some solutions may need a pedestal to make proper contact with the silicon die and to avoid interference with adjoining components around the silicon and loading mechanism. The pedestal may make the thermal spreading from the die to heatsink base less efficient. Such solutions might not remove the heat from the silicon die effectively, leading to lower performance. Also higher costs due to additional components, like the pedestal, and less flexibility for component placement around the silicon may be undesired.

Some examples relate to a cooling system comprising a heat distribution structure thermally coupled to a heat source inside an enclosure of an electronic device. The heat distribution structure extends from the inside of the enclosure to the outside of the enclosure.

The heat distribution structure may be a laminar heat spreader or a vapor chamber, a heat pipe or a metal plate. The laminar heat spreader may be or comprise a graphite sheet, a graphene sheet or a metal foil. The enclosure may comprise an opening and the heat distribution structure extends from the inside through the opening to the outside.

More details, optional features and aspects are mentioned in connection with one or more examples described above or below.

Figure 6A:
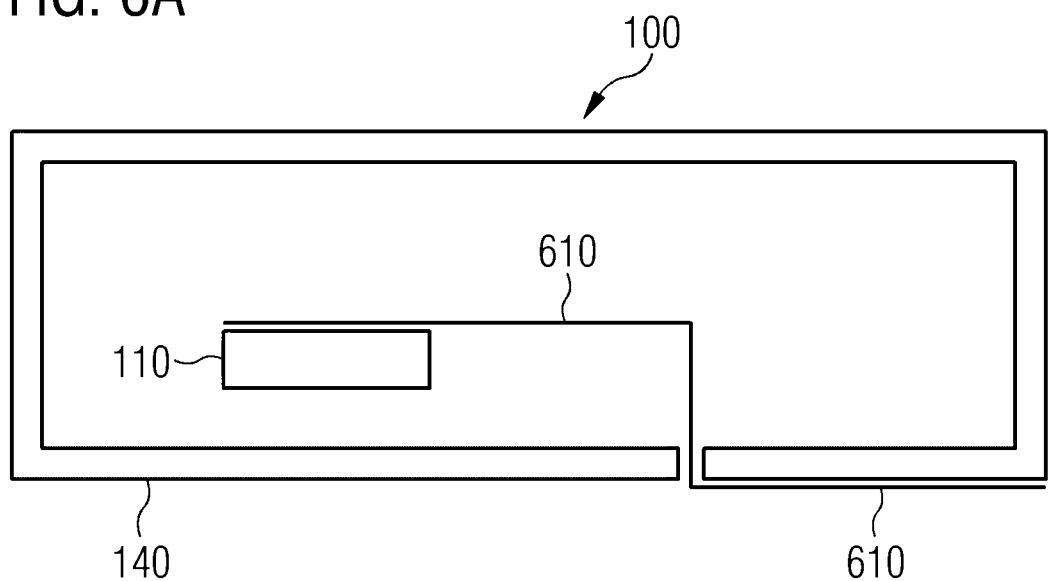
FIG. 6a shows a schematic cross section of an electronic device.

FIG. 6a shows a schematic cross section of an electronic device. The electronic device 100 comprises an enclosure 140 and a laminar heat spreader 610 thermally coupled to a heat source 110 inside the enclosure 140. The laminar heat spreader 610 extends from the inside of the enclosure 140 to the outside of the enclosure 140.

By using a laminar heat conducting structure, which extends from inside the device to the outside, heat may be efficiently transferred from inside to outside. In this way, the cooling capability of the electronic device may be significantly increased.

The laminar heat spreader 610 may be a thin layer or a plurality of thin layers of a material or compound with high thermal conductivity. The laminar heat spreader 610 may comprise a lateral extension significantly larger than a thickness. For example, a length and/or width may be at least 100 times (or at least 500 times or at least 1000 times) larger than a maximal or average thickness of the laminar heat spreader 610. For example, a maximal or average thickness of the laminar heat spreader 610 may be at most 1 mm (or at most 0.6 mm or at most 0.2 mm). The laminar heat spreader 610 may be flexible, bendable and/or elastic deformable to a sufficient degree so that the laminar heat spreader 610 can run from inside the device to the outside. The laminar heat spreader 610 may have a thermal conductivity of at least 100 W/mK (or at least 500 W/mK or at least 1000 W/mK) in at least one direction along the laminar heat spreader 610. The laminar heat spreader 610 may have isotropic or anisotropic thermal conductivity depending on the used material. For example, the laminar heat spreader 610 may comprises one or more graphite sheets, or one or more metal foils (e.g. aluminum foil or copper foil).

The enclosure 140 (or chassis) may be the housing or a part of the housing of the electronic device 100. For example, the enclosure 140 may comprise a backside cover, a side cover and/or a frontside cover of the electronic device. For example, the enclosure 140 may comprise a back cover including side cover parts of a tablet or mobile phone, while the frontside is covered by a touch screen. The touch screen may be identified as a part of the enclosure 140 or may be connected to the enclosure 140 to form a part of the housing of the electronic device 100 at the frontside of the electronic device 100.

The enclosure 140 may comprise an opening (e.g. a slot or slit) and the laminar heat spreader 610 may extend from the inside through the opening to the outside. The opening may be implemented at a part of the enclosure 140 located at the backside of the electronic device 100 or a side of the electronic device 100 or between a backside part (e.g. back cover) and a side part of the enclosure 140. The opening may comprise a length of at least 290 mm (or at least 5 cm, at least 20 cm, at least 10 cm or at least 15 cm) and/or a width of at most 2 mm (or at most 1.5 mm or at most 1 mm).

Depending on the implementation, integration or connection of the laminar heat spreader 610 at the outside, the laminar heat spreader 610 may be deformed repeatedly in the region of the opening and/or outside the electronic device. In order to protect the laminar heat spreader 610 against damages due to the repeated deformation, one or more additional layers may be attached to the laminar heat spreader 610 at least in the region of the opening. For example, the laminar heat spreader 610 may be covered by a protective layer in the region of the opening. The protective layer may be a plastic or metal layer (e.g. aluminum layer or nickel-titanium-alloy layer) or may comprises plastic or a metal. The protective layer may be attached to the laminar heat spreader 610 by an adhesive. The protective layer may cover the laminar heat spreader 610 at least from 5 mm before the opening to at least 5 mm after the opening or may cover the laminar heat spreader 610 only in the opening. Additionally or alternatively, the protective layer may cover the laminar heat spreader 610 at regions outside the electronic device 100, which are accessible to the user to protect the laminar heat spreader 610 against damages.

Further, the protective layer may be covered by a cover layer in the region of the opening. The cover layer may be a microfiber layer or may comprise microfiber material. The cover layer may additionally protect the laminar heat spreader 610. The cover layer may be implemented in addition to the protective layer or alternatively to the protective layer. Additionally or alternatively, the cover layer may cover the protective layer or the laminar heat spreader 610 at regions outside the electronic device 100, which are accessible to the user to protect the laminar heat spreader 610 against damages and/or to protect the user against touching the laminar heat spreader 610, when the laminar heat spreader 610 gets hot.

The laminar heat spreader 610 may be directly thermally coupled to the heat source 110 (e.g. through a thermally conductive adhesive or a TIM) or indirectly with a heat distribution structure in between. The heat distribution structure may be thermally coupled to the heat source 110 at a first side and the laminar heat spreader 610 may be thermally coupled to a second side of the heat distribution structure. The heat distribution structure may comprise or may be at least one of a metal plate, a heat pipe or a vapor chamber. The heat distribution structure may comprise a thickness of at most 4 mm (or at most 3 mm, at most 2.5 mm or at most 2 mm). For example, the heat distribution structure may comprise a maximal dimension with respect to length and width of at least 60 mm (or at least 100 mm or at least 150 mm).

An outside part of the laminar heat spreader 610 extending outside of the enclosure 140 may be attached to an outside surface of the enclosure. The outside part of the laminar heat spreader 610 may be covered by a protective layer and/or a cover layer and/or a soft cover.

For example, the electronic device 100 may further comprise a kickstand connected to the enclosure 140. The outside part of the laminar heat spreader 610 may extend between the enclosure 140 and the kickstand. For example, the outside part of the laminar heat spreader 610 may be attached to the enclosure 140 behind the kickstand or may be attached to the kickstand (e.g. a backside of the kickstand). In this way, the laminar heat spreader 610 may be protected against damages in the space between the enclosure 140 and the kickstand. Further, it might be unlikely that a user may grab in the space between the enclosure 140 and the kickstand.

Additionally or alternatively, a part of the laminar heat spreader 610 located outside the enclosure 140 may extend along a backside of a keyboard. For example, a part of the laminar heat spreader 610 may be sandwiched between a keyboard and a protective layer and/or a cover layer and/or a soft cover.

The laminar heat spreader 610 may extend inside the electronic device 100 from the opening in the enclosure to the proximity of one or more heat sources of the electronic device 100, which are thermally coupled to the laminar heat spreader 610. For example, a part of the laminar heat spreader 610 located inside the enclosure extends between the enclosure 140 and a battery of the electronic device 100 towards the heat source 110.

The heat source 110 may comprise or may be a semiconductor die configured to generate heat (e.g. waste heat) during operation. The waste heat may be generated automatically during operation of the semiconductor die. An integrated circuit may be implemented on the semiconductor die. The semiconductor die may be a bare die with uncovered backside or a packaged semiconductor die with a backside covered by package material (e.g. mold or another material).

The heat source 110 may be or may comprise a processor (e.g. CPU, microcontroller, digital signal processor or a graphics processing unit GPU), a transmitter, a receiver, a transceiver, a power supply and/or a voltage converter or another integrated circuit.

The electronic device 100 may be a tablet, a mobile phone, a detachable electronic device or another electronic device.

The integration of a laminar heat spreader 610 may enable the improvement of the cooling capability of low power devices with passive cooling system significantly. For example, the electronic device 100 may comprise a thermal design power of at most 25 W (or at most 20 W, at most 15 W or at most 30 W) and/or at least 5 W (or at least 10 W or at least 15 W). The electronic device 100 may be implemented without a fan (e.g. as passively cooled device).

More details, optional features and aspects are mentioned in connection with one or more examples described above or below.

Figure 6I:
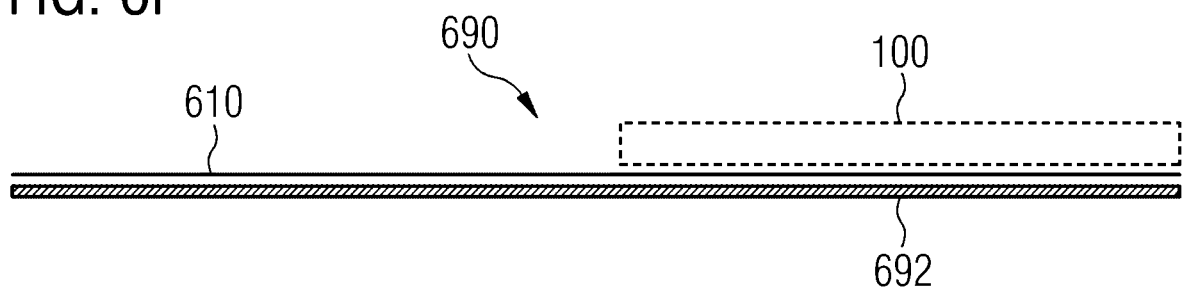
FIG. 6i shows a schematic cross section of a cover for an electronic device.
Figure 6B:
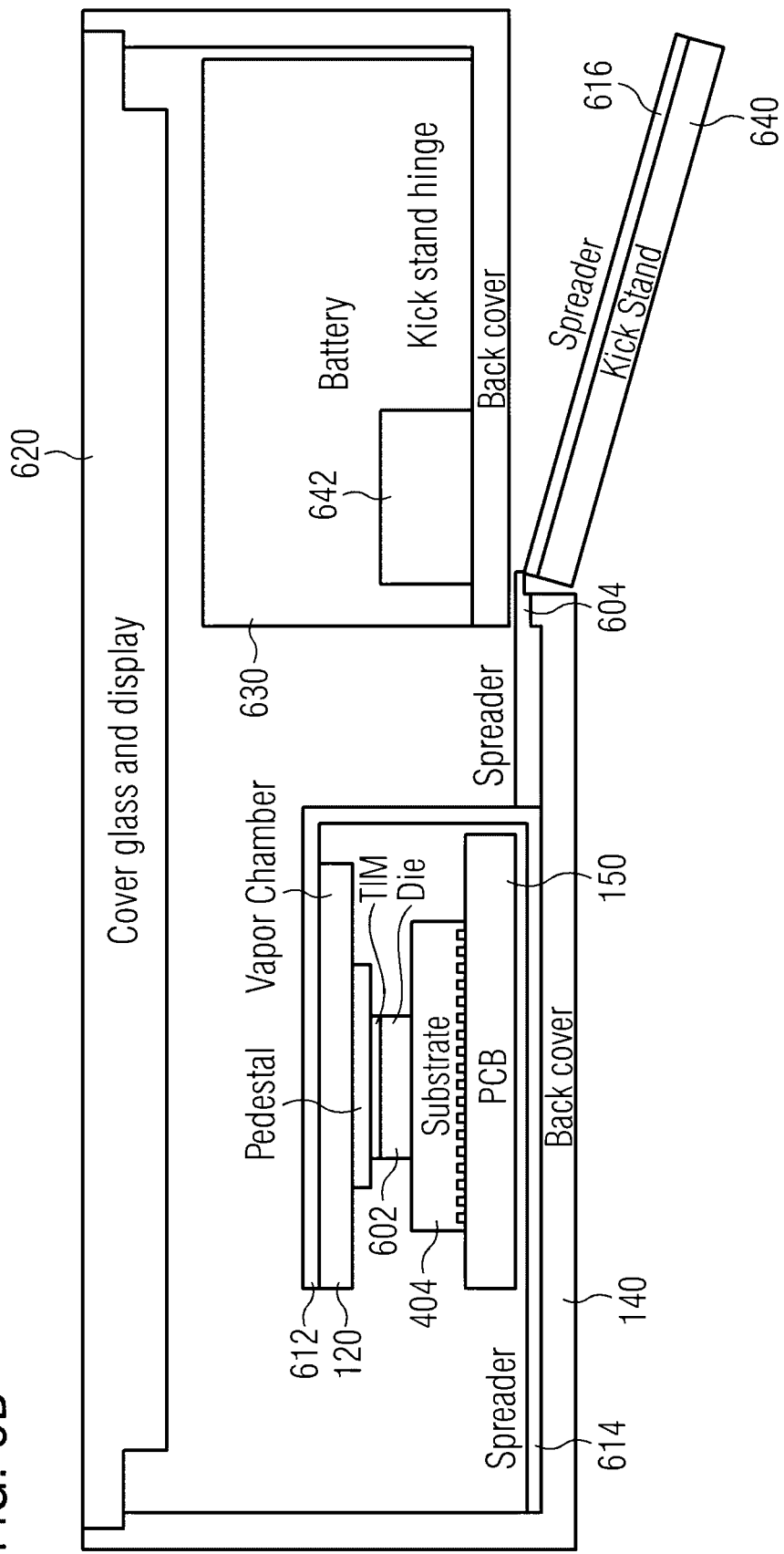
FIG. 6b shows a schematic cross section of an electronic device.

FIG. 6b shows a schematic cross section of an electronic device. The electronic device may be implemented similar to the electronic device described in connection with FIG. 6a. The vapor chamber 120 comprises or is thermally coupled with a pedestal at a first side of the vapor chamber 120. The pedestal may be a metal part integrally formed on the chamber wall at the first side of the vapor chamber 120 or may be a metal plate attached to the chamber wall of the vapor chamber 120. The pedestal is thermally coupled with a backside of a semiconductor package 602 (or a semiconductor die) through a TIM. The semiconductor package is attached to a substrate 404, which is mounted to a circuit board 150 (e.g. PCB). The circuit board 150 is connected to the enclosure 140 (e.g. the back cover) of the electronic device. A first part 612 of the laminar heat spreader is attached to a second side of the vapor chamber 120 and extends from the vapor chamber 120 to an opening 604 in the enclosure 140. A second part 614 of the laminar heat spreader is attached to an inside surface of the enclosure 140 and extends from in between the enclosure 140 and the circuit board 150 to the opening 604. A third part 616 of the laminar heat spreader is attached to a backside of the kickstand 640 and extends from the kickstand 640 to the opening 604. In this way, heat can be transferred from the first part 612 of the laminar heat spreader to the second part 614 and the third part 616 of the laminar heat spreader or from the first and the second part 612, 614 of the laminar heat spreader to the third part 616 of the laminar heat spreader (e.g. depending on the temperature distribution along the laminar heat spreader).

Further, a kickstand hinge 642 may be configured to enable the kickstand to be opened and closed. The kickstand hinge 642 is located in proximity of the opening 604. Additionally, a battery is located inside the electronic device.

The enclosure 140 comprises a backside cover and integrally formed side walls of the housing of the electronic device. The front side of the housing is formed by cover glass and display 620 (e.g. a touch screen).

The laminar heat spreader 610 may be implemented by graphite sheets. For example, a first graphite sheet may extend from in between the enclosure 140 and the circuit board 150 to the kickstand 640 through the opening 604. A second graphite sheet may extend from the vapor chamber 120 to the first graphite sheet and is thermally coupled to the first graphite sheet (e.g. by a thermally conductive adhesive).

For example, a synthetic graphite sheet spread may extend from the top of the thermal solution to the kickstand 640 and may be secured by a fabric from external contact.

More details, optional features and aspects are mentioned in connection with one or more examples described above or below.

Figure 6C:
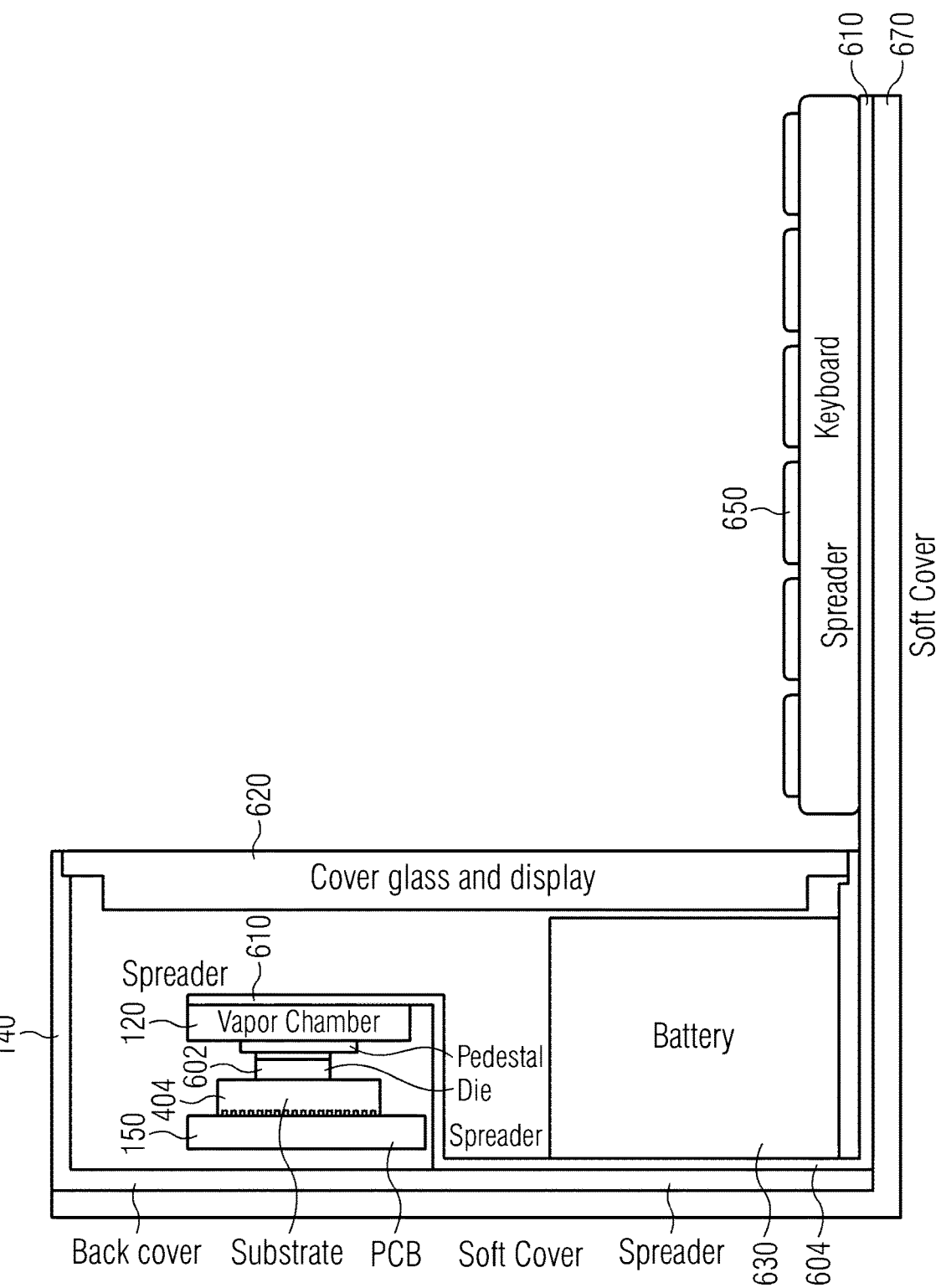
FIG. 6c shows a schematic cross section of an electronic device.

FIG. 6c shows a schematic cross section of an electronic device. The electronic device may be implemented similar to the electronic device described in connection with FIG. 6a. The vapor chamber 120 comprises or is thermally coupled with a pedestal at a first side of the vapor chamber 120. The pedestal may be a metal part integrally formed on the chamber wall at the first side of the vapor chamber 120 or may be a metal plate attached to the chamber wall of the vapor chamber 120. The pedestal is thermally coupled with a backside of a semiconductor package 602 (or a semiconductor die) through a TIM. The semiconductor package is attached to a substrate 404, which is mounted to a circuit board 150 (e.g. PCB). The circuit board 150 is connected to the enclosure 140 (e.g. the back cover) of the electronic device. A first part of the laminar heat spreader 610 is attached to a second side of the vapor chamber 120 and extends from the vapor chamber 120 to an opening 604 in the enclosure 140. A second part of the laminar heat spreader 610 is attached to a cover 670 (e.g. soft cover) outside the electronic device. The second part of the laminar heat spreader 610 extends from the opening 604 along the cover 670 to a part located between a keyboard 650 and the cover 670.

The enclosure 140 comprises a backside cover and integrally formed side walls of the housing of the electronic device. The front side of the housing is formed by cover glass and display 620 (e.g. a touch screen). The opening is located at an edge between the backside cover and a side wall.

For example, FIG. 6c may show a 12.3" tablet device. The graphite is spread from the top of the thermal solution to the added accessory (e.g. a keyboard). For example, a synthetic graphite sheet spread extends from the top of the thermal solution to the keyboard on the soft cover. For example, the soft cover is attached to the tablet and cannot be detached.

In comparison to a tablet with the same thermal solution except for the cross spreading by the graphite, the cooling capability for the SOC may be improved by more than 15%. For example, a SOC with 10.5 W TDP can be used instead of a SOC with 9 W TDP.

More details, optional features and aspects are mentioned in connection with one or more examples described above or below.

Figure 6D:
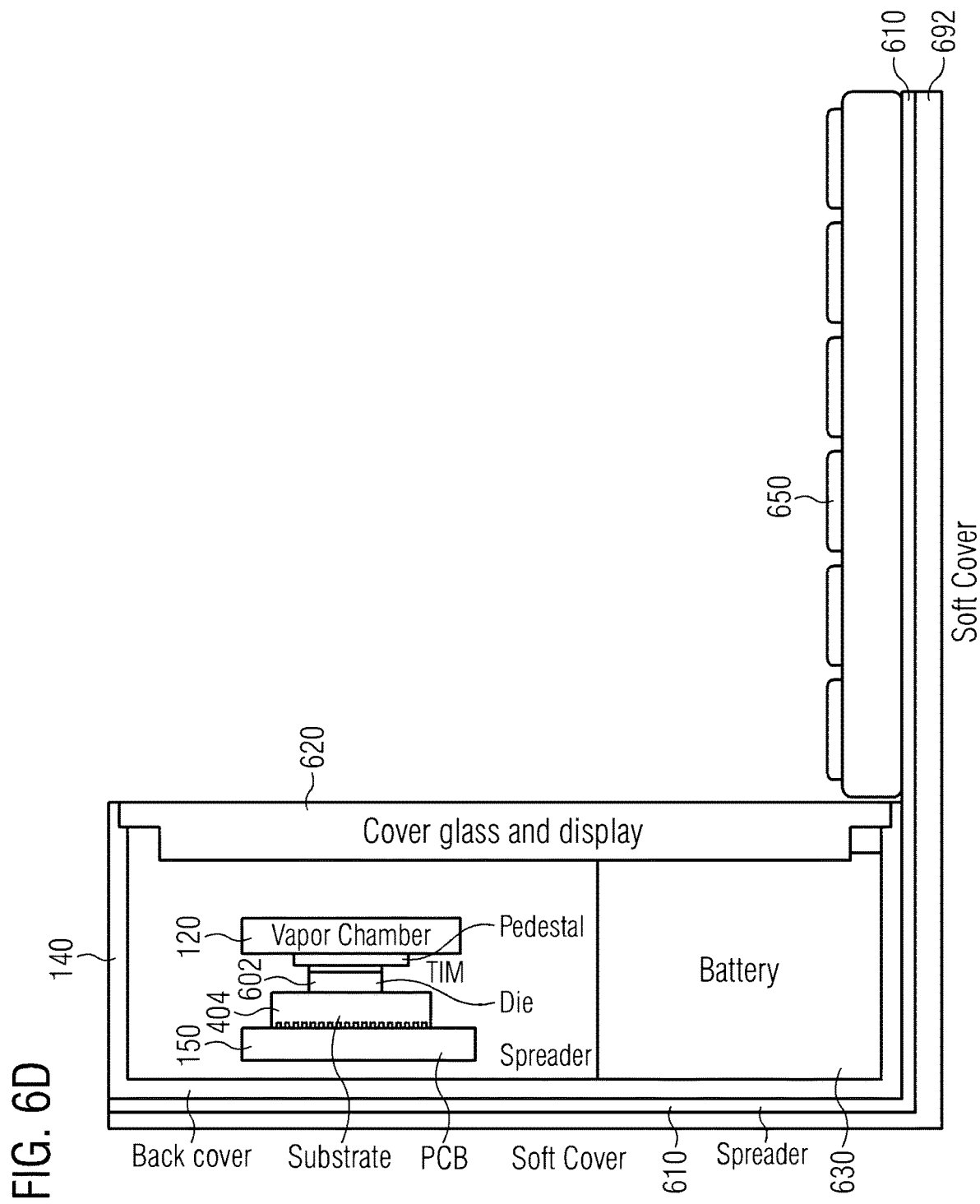
FIG. 6d shows a schematic cross section of an electronic device.

FIG. 6d shows a schematic cross section of an electronic device. The cover may be implemented similar to the cover described in connection with FIG. 6i. The cover comprises a laminar carrier 692 (e.g. soft cover) attached to a first side of the laminar heat spreader 610. A keyboard 650 is attached to a first part of the laminar heat spreader 610 on a second side of the of the laminar heat spreader 610. An electronic device (e.g. a tablet) is attachable to a second part of the of the laminar heat spreader 610 on the second side of the of the laminar heat spreader 610.

In comparison to the implementation shown in FIG. 6c, the electronic device can be detached from the cover, since the laminar heat spreader 610 is part of the cover and does not extend to the inside of the electronic device.

For example, FIG. 6d may show a 12.3" tablet device. The graphite is spread on the soft cover (e.g. the soft cover is detachable). For example, a synthetic graphite sheet spread may be arranged on the soft cover with the keyboard. The tablet can be easily detached from the soft cover.

In comparison to a tablet with the same thermal solution, but without a soft cover with cross spreading by the graphite, the cooling capability for the SOC may be improved by more than 10%. For example, a SOC with 10 W TDP can be used instead of a SOC with 9 W TDP.

More details, optional features and aspects are mentioned in connection with one or more examples described above or below.

Figure 6E:
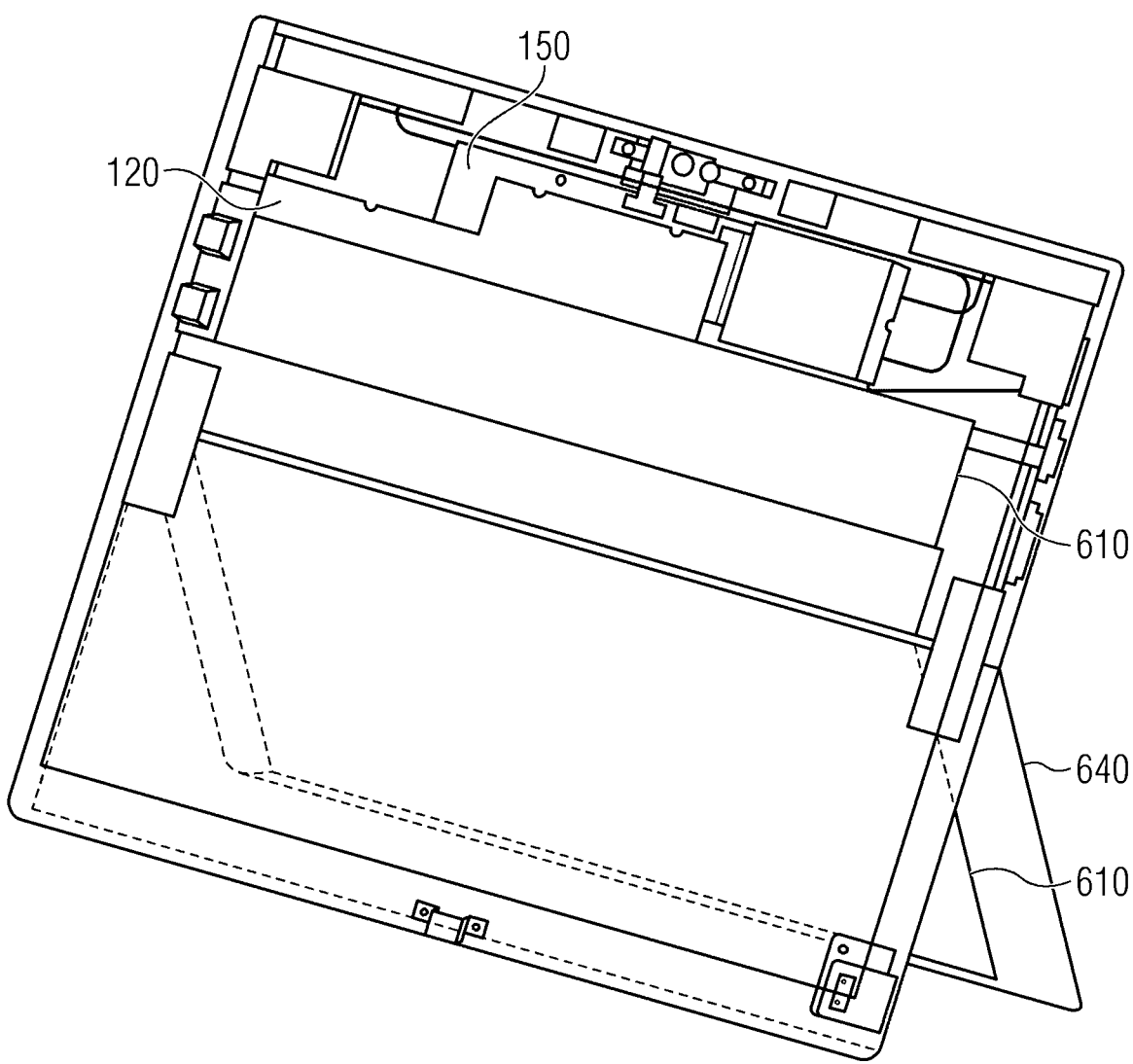
FIG. 6e shows a schematic illustration of an electronic device.

FIG. 6e shows a schematic illustration of an electronic device. The electronic device may be implemented similar to the electronic device described in connection with FIG. 6b. The laminar heat spreader 610 extends from the vapor chamber 120 to a backside of the kickstand 640.

For example, FIG. 6e may show a 12.3" tablet device. The graphite is spread from top of thermal solution to the kick stand.

In comparison to a tablet with the same thermal solution except for the cross spreading by the graphite, the cooling capability for the SOC may be improved by more than 20%. For example, a SOC with 11 W TDP can be used instead of a SOC with 9 W TDP.

More details, optional features and aspects are mentioned in connection with one or more examples described above or below.

Figure 6F:
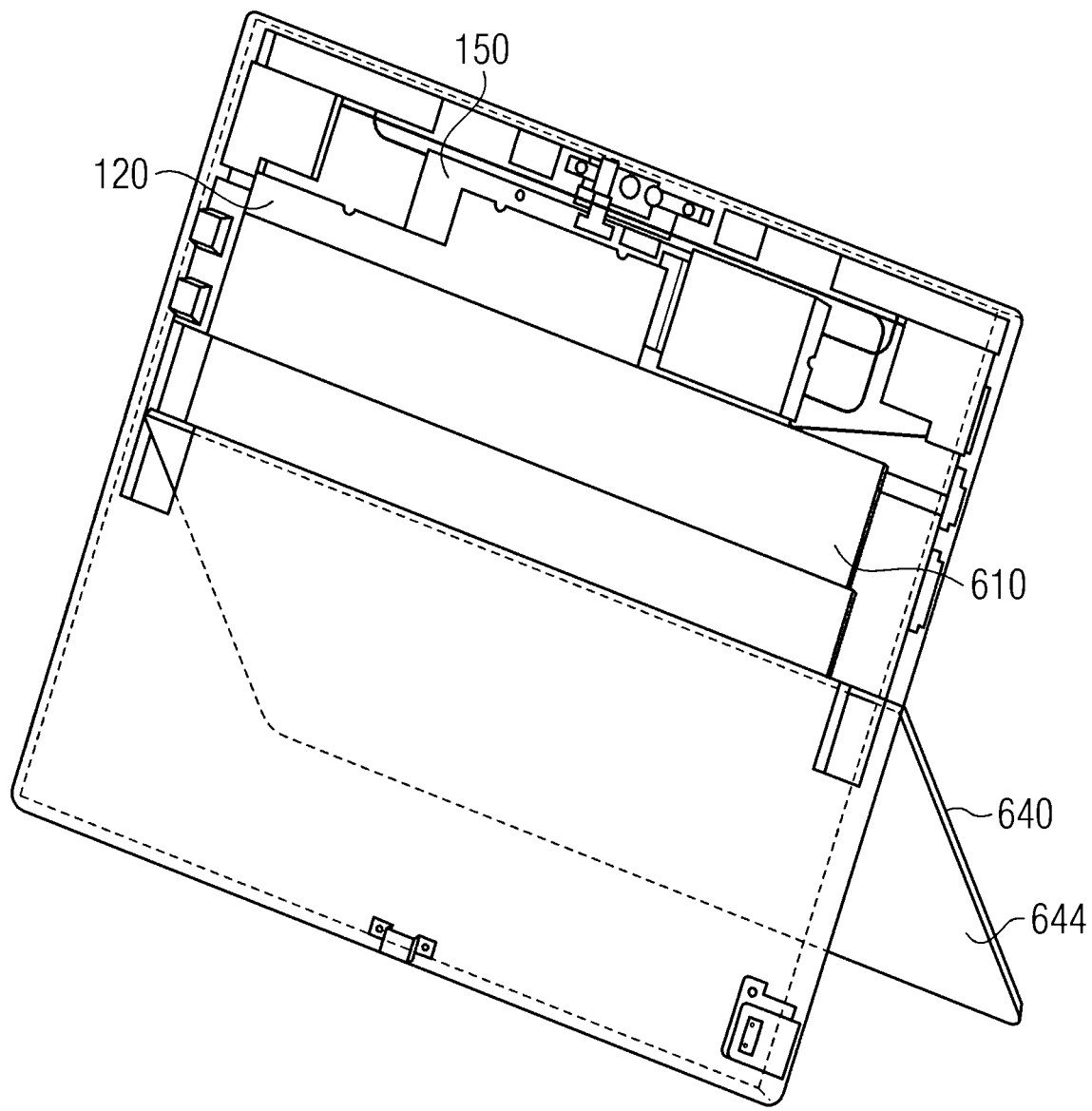
FIG. 6f shows a schematic illustration of an electronic device.

FIG. 6f shows a schematic illustration of an electronic device. The electronic device may be implemented similar to the electronic device described in connection with FIG. 6e. In addition, the laminar heat spreader 610 is covered by a protective layer and/or a cover layer 644 at the backside of the kickstand 640.

More details, optional features and aspects are mentioned in connection with one or more examples described above or below.

FIG. 6g shows a schematic illustration of an electronic device. The electronic device may be implemented similar to the electronic device described in connection with FIG. 6e. FIG. 6g shows a detailed cross section of the part of the enclosure comprising the opening 604. The enclosure comprises a recess for the kickstand so that the backside of the electronic device is substantially flat if the kickstand is closed. The opening 604 is located at an edge of the recess between a part of the enclosure forming a bottom of the recess and a part of the enclosure forming a part of the backside of the electronic device being in plane with the kickstand 640, if the kickstand 640 is closed.

More details, optional features and aspects are mentioned in connection with one or more examples described above or below.

Figure 6H:
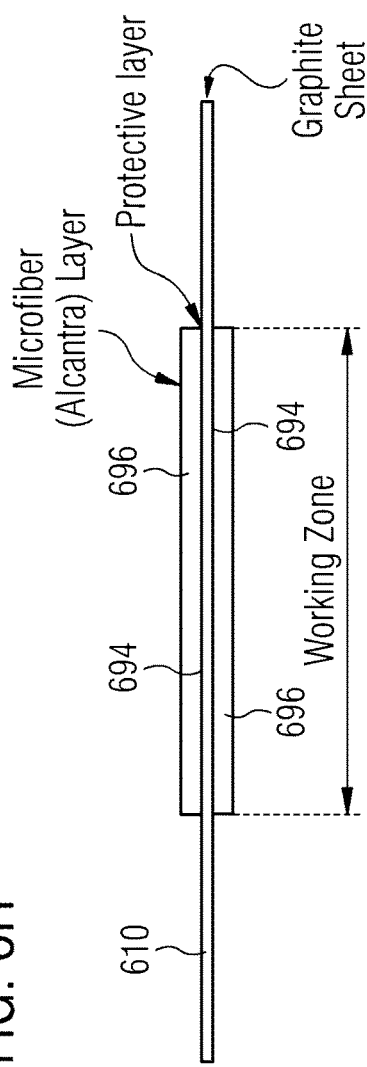
FIG. 6h shows a schematic cross section of a part of a laminar heat spreader.

FIG. 6h shows a schematic cross section of a part of a laminar heat spreader. The laminar heat spreader 610 may be integrated in an electronic device as described in connection with FIG. 6a or a cover as described in connection with FIG. 6i.

The laminar heat spreader 610 may be a graphite sheet and a part (e.g. working zone) of the laminar heat spreader 610 or the whole laminar heat spreader 610 is covered by a protective layer 694 and a cover layer 696. The cover layer 696 may be a microfiber layer (e.g. alcantra).

The implementation shown in FIG. 6h may be used to avoid damages due to repeated deformation.

For example, the spreading mechanism may involve a graphite sheet of about 0.1 mm thickness with conductivity >700 W/mK, which is bonded in the working zone with protective layers with 0.15 mm maximal thickness that may be either Nitinol (e.g. Nickel Titanium alloy) or a thin plastic layer (e.g. polypropylene), for example used for living hinges. This area is covered with microfiber material (e.g. Alcantra), which may provide durability and stain resistance, The protective layers may protect the spreader from physical damage as well as may ensure the hot surface does not come in contact with the user.

More details, optional features and aspects are mentioned in connection with one or more examples described above or below.

FIG. 6i shows a schematic cross section of a cover for an electronic device. The cover 690 comprises a laminar heat spreader 610 having a thermal conductivity at least in one direction of at least 100 W/mK. Further, the cover 690 comprises a laminar carrier 692. The laminar heat spreader 610 is attached to the laminar carrier 692.

By implementing a laminar heat spreader in a cover for an electronic device, the cooling of the electronic device may improved. In this way, the current consumption may be reduced and/or a maximal time available for operating in a high performance mode may be increased.

The laminar heat spreader 610 may be a thin layer or a plurality of thin layers of a material or compound with high thermal conductivity. The laminar heat spreader 610 may comprise a lateral extension significantly larger than a thickness. For example, a length and/or width may be at least 100 times (or at least 500 times or at least 1000 times) larger than a maximal or average thickness of the laminar heat spreader 610. For example, a maximal or average thickness of the laminar heat spreader 610 may be at most 1 mm (or at most 0.6 mm or at most 0.2 mm). The laminar heat spreader 610 may be flexible, bendable and/or elastic deformable to a sufficient degree so that the cover 690 can be opened and closed repeatedly. The laminar heat spreader 610 may have a thermal conductivity of at least 100 W/mK (or at least 500 W/mK or at least 1000 W/mK) in at least one direction along the laminar heat spreader 610. For example, the laminar heat spreader 610 may comprises one or more graphite sheets, one or more graphene sheets or one or more metal foils (e.g. aluminum foil or copper foil).

The laminar carrier 692 may cover the whole surface at a first side of the laminar heat spreader 610. The laminar carrier 692 may comprise one or more layers. For example, the laminar carrier 692 may comprise a protective layer and/or a cover layer. For example, the laminar heat spreader 610 may be covered by a protective layer of the laminar carrier 692. The protective layer may be a plastic (e.g. polypropylene) or metal layer (e.g. aluminum layer or nickel-titanium-alloy layer) or may comprises plastic or a metal (e.g. aluminum or nickel-titanium-alloy). The protective layer may be attached to the laminar heat spreader 610 by an adhesive.

Further, the protective layer may be covered by a cover layer of the laminar carrier 692. The cover layer may be a microfiber layer or may comprise microfiber material. The cover layer may be implemented in addition to the protective layer or alternatively to the protective layer.

The laminar heat spreader 610 may be uncovered in a contact region, which is intended to be in contact with a backside of an electronic device 100. A second protective layer and/or a cover layer may be attached to the second side of the laminar heat spreader 610 opposite the laminar carrier 692 in a region outside the contact region. For example, the laminar heat spreader 610 may be covered everywhere except for the contact region.

The cover 690 may further comprise a keyboard connectable to the electronic device 100. For example, a part of the laminar heat spreader 610 may extend between the laminar carrier 692 and the keyboard.

The cover 690 may be a hard cover or a soft cover. The cover 690 may detachably house the electronic device 100. The electronic device 100 may be a tablet or a mobile phone.

A proposed soft cover may provide the opportunity of induction charging space for the keyboard and may also be used for smart covers.

More details, optional features and aspects are mentioned in connection with one or more examples described above or below.

Figure 6J:
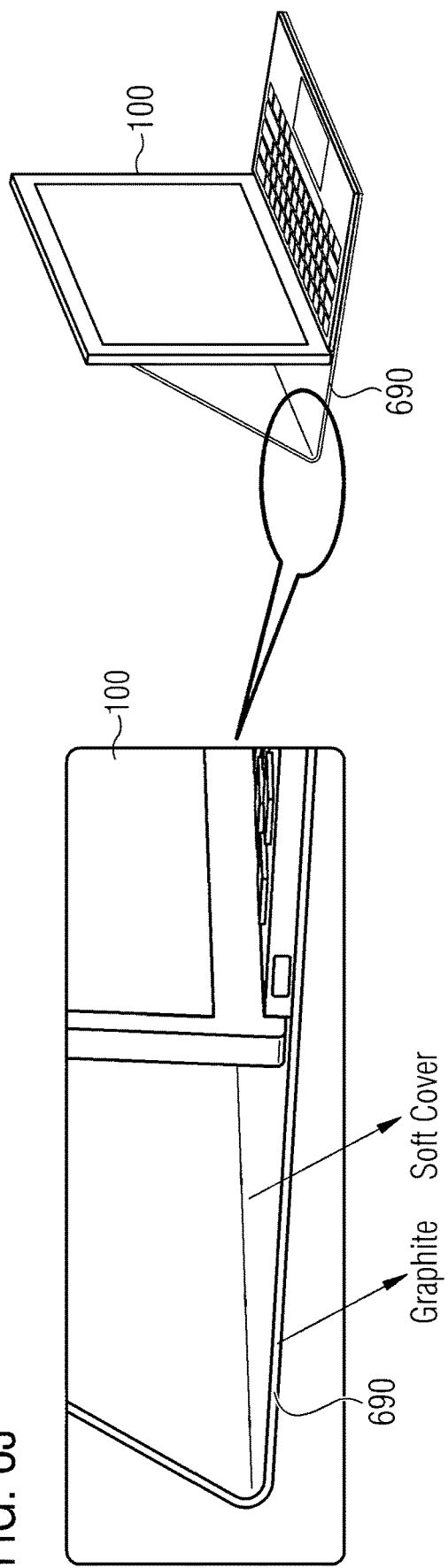
FIG. 6j shows a schematic illustration of a cover for an electronic device.

FIG. 6j shows a schematic illustration of a cover for an electronic device. The cover 690 may be implemented similar to the cover described in connection with FIG. 6i. The cover 690 is a soft cover detachable from the electronic device. The laminar heat spreader of the cover 690 is a graphite sheet, which is completely covered on both sides by a cover layer or may be uncovered in a contact region, which is in contact with the backside of the electronic device 100.

More details, optional features and aspects are mentioned in connection with one or more examples described above or below.

Some examples relate to a cross spreading thermal technology to enhance the performance by possibly 20-30% in various handheld devices. From generation to generation the total system power as well as the power density of SoCs is increasing to a significant percentage. Challenges are to design thin and light systems with improved or maximized SoC performance. In small form factor devices like tablets, which are growing thinner and thinner, these challenges are increasing. Display power and its temperature may play a major role for tablets in meeting the ergonomic limits.

According to an aspect, the heat may be transferred from the top of the thermal solution (e.g. HP or VC) to the kick stand of a tablet or to additional accessory like a keyboard KB or soft cover. In this way, the skin temperature, which is an important parameter, may be reduced. The tablet performance may be improved significantly if the heat spreading can be extended from the top of the thermal solution to the kickstand or to an extended additional cover or a keyboard.

For example, the thermal solution may spread heat from the top of thermal attach to the other side. Transferring heat from the thermal attach to the kickstand or an additional accessory by sticking thin synthetic graphite may reduce the display and back cover temperature without impacting the weight. This may help to increase the thermal budget significantly.

The proposed concept may also address a protection of the graphite sheet against getting damaged due to repeated closing and opening of the kickstand. Further, the proposed thermal solution might not compromise the space available for the PCB, the battery and/or other components.

The proposed concept may enable a performance enhancement. Further, a cooler skin temperature for thin form factor FF devices may be achievable and hence ergonomic comfort requirements associated with the skin temperatures may be enhanced.

During the designing of thermal solutions for thin form factor devices meeting the ergo limits of skin temperatures may be challenging. More emphasize may be given to spread heat below the display as well as on the back cover. The back cover may have a larger surface area with less resistance to spread heat as compared to the display. The proposed cooling concept may cross spread the heat from top of the thermal attach (e.g. VC) to the cooler area and may put the skin temperatures in ergonomic limits and may increase the performance of system.

Tablets may use mostly passive (cooling) systems which work on the principle of natural conduction and convection, where weight, stack and performance may be the major driving factors for customers.

Due to the thin form factor design, the air gap between the thermal solution and the display and between the PCB and the back cover may be significantly decreasing, which may cause challenges in cooling skins. Adding one layer of graphite at the top of thermal solution may enable decreasing the temperature at the top of thermal solution (e.g. for Vapor Chamber systems, the temperature of the condenser section may be decreased), which may increase the ΔT and the heat transfer. Further, the display hot spot temperature may be reduced and the performance may be increased.

Computer systems may utilize vapor chambers for thermal cooling of processors or chip packages containing processors (e.g., a system-on-chip (SoC) that includes a central processing unit (CPU), graphics processing unit (GPU), and/or another type of processor). Vapor chambers may utilize phase change phenomena inside a chamber to spread heat and reduce a junction temperature. In thin mobile devices, current vapor chamber designs may lead to higher than desired temperatures on an exterior surface of the device due to the relatively thin vertical stack dimension. In some cases, processor throttling may be needed to reduce such temperatures. However, this also causes reduced compute performance in the device.

For certain computing devices, such as mobile computing devices (laptops, mobile phones, tablets, etc.), thin and light designs may be highly desired. Sustained performance of these systems can be limited by the "skin" temperature limits (e.g., ~45-46 C), while the "turbo" performance (e.g., heavy compute scenarios) may be limited by the junction temperature of the chip package (e.g., a system-on-chip (SoC) or other type of chip that includes a processor device such as a central processing unit (CPU) or graphics processing unit (GPU)) (e.g., ~100 C). Due to the thinner vertical stack heights of these devices, the "skin" may be heated beyond its limit before the junction temperature (Tj) limit is reached for sustained workloads (e.g., the thermal design power (TDP)). As used herein, "skin" may refer to an outer layer of a vertical device stack, such as, for example, a top glass layer or back cover layer of a mobile device (e.g., mobile phone or tablet). Further, sustained performance may refer to performance during long-term expected steady state power consumption (e.g., PL1), while turbo performance may refer to performance during short-term maximum power consumption (e.g., PL2).

Further, in thinner devices, a skin hot spot might not much depend on the type of thermal spreader (e.g., copper vs. heat pipe vs. vapor chamber) on the chip package, since in thinner systems, heat may travel toward the skin irrespective of spreading. Skin heating may be avoided by providing a thermal air gap between the thermal solution on top of the chip package and over the skin (e.g., glass/back cover). However, thicker air gaps increase the stack of the system (i.e., overall height) and may increase the Tj, which reduces the turbo performance capability of the package.

Vapor chambers may be utilized as effective solutions in passive device junction temperature cooling. Vapor chambers may utilize phase change phenomena inside the chamber to spread the heat and reduce the junction temperature (Tj). However, in some designs, the skin temperature (Tskin) may be approximately the same as with other solutions, such as copper spreaders or heat pipes.

Accordingly, examples of the present disclosure include a two-tier vapor chamber (2T-VC) structure, which may provide one or more benefits over current cooling solutions, including reduction of skin hotspots. A two-tier vapor chamber design may include two layers or tiers: (1) a thin vacuum layer (e.g., ~0.1-0.2 mm thick) in a top region of the vapor chamber and (2) a second layer below the vacuum layer in which liquid charging is utilized. The two regions may be separated by a thin copper layer. In some examples, the top layer may be filled with an insulating material having a thermal conductivity less than air (e.g., an aerogel) rather than vacuum. The top chamber of the 2T-VC structure may help to reduce the skin temperature and thus increase the sustained capability (PL1 limits) of a system (in some cases by ~15-20%). In examples utilizing an aerogel insulating material in the top chamber, PL1 performance may be increased by 13% when compared to copper plate solutions, and by 11% compared to other vapor chamber structures. Further, for short bursts (e.g., ~5-10 sec), the turbo performance of the product with a 2T-VC structure may be increased by approximately 15-20% compared to mainstream copper spreader solutions, and may remain approximately the same as other vapor chamber structures.

Some examples relate to a cooling system comprising a first portion coupled to a heat source to distribute heat generated by the heat source and a second portion coupled to the first portion to prevent the heat from distributing to outer of the second portion.

For example, the first portion may be a sealed first cavity and the second portion of a vapor chamber may be a sealed second cavity of the vapor chamber.

More details, optional features and aspects are mentioned in connection with one or more examples described above or below.

Figure 7A:
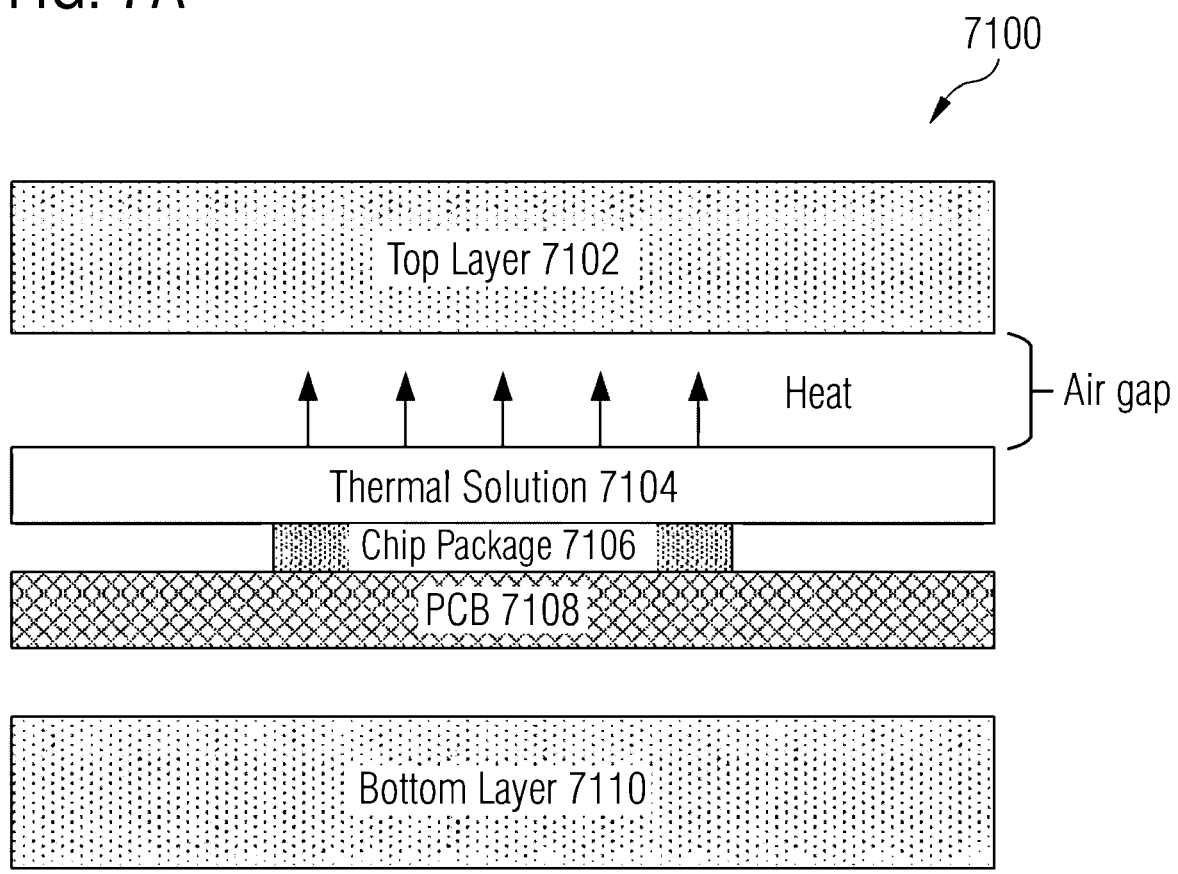
FIG. 7a illustrates a simplified view of an example stack for a mobile device.

FIG. 7a illustrates a simplified view of an example stack 7100 for a mobile device. The example stack 7100 includes a top layer 7102, thermal solution 7104, chip package 7106, printed circuit board (PCB) 7108, and a bottom layer 7110. The stack 7100 may include additional layers than those shown. The top layer 7102 and bottom layer 7110 may be outer layers of the device. The top layer 7102 may be formed of or include glass or another suitable material to provide an outer layer interface with a user, while the bottom layer may be formed of or include metal, plastic, or another suitable material for packaging the mobile device. The PCB 7108 may be formed of an electrically insulating material and may include one or more traces or other electrical components. The PCB 7108 may house one or more chip packages (e.g., 7106) that include processors, memory, or other computer components. In the example shown, the chip package 7106 includes one or more processors (e.g., CPUs or GPUs). In some cases, the chip package 7106 is a system-on-chip (SoC).

The thermal solution 7104 removes heat generated by the chip package 7106 during operation. In some systems, the thermal solution 7104 may include a single-tier vapor chamber, heat pipe, or heat sink. However, in certain examples of the present disclosure, the thermal solution 7104 includes a two-tier vapor chamber design as described herein. As shown, while the thermal solution 7104 removes heat from the chip package 7106, some of the heat may be dissipated from the thermal solution 7104 into the air gap between the thermal solution 7104 and the top layer 7102, causing the top layer 7102 to rise in temperature. The temperature in the top layer 7102 may be referred to herein as the skin temperature (Tskin), while the temperature at the junction between the chip package 7106 and the thermal solution 7104 may be referred to as the junction temperature (Tj).

In certain systems (e.g., thin/light form factor devices, such as laptops or tablets, or high-performance computer systems, such as gaming systems), the sustained power capability may be limited by the skin temperature. As an example, the skin temperature limit of these systems may be approximately 45-48 C while the junction temperature limit may be approximately 100 C. A popular solution for reducing skin temperature is providing an air gap between the thermal solution 7104 and the top layer 7102 (due to low conductivity of air, which is ~0.026 W/mK). The total air gap in the stack consists of two components, one is needed to maintain nominal air gap due to mechanical tolerance of the parts inside and another component is thermal requirement to meet the skin temperature limit (i.e., the air gap insulates the heat from the thermal solution 7104 to reduce the skin temperature). While the air gap may provide an insulation layer and trap heat, thicker air gaps can undesirably increase the stack thickness and can increase the junction temperature, reducing the turbo performance capability of the chip package. In some cases, PL1 performance limitations of a device may be due to Tskin and might not depend much on the type of the thermal solution, while PL2 limitations may be due to junction temperature and may be dependent mainly on the effectiveness of the thermal solution used.

Figure 7B:
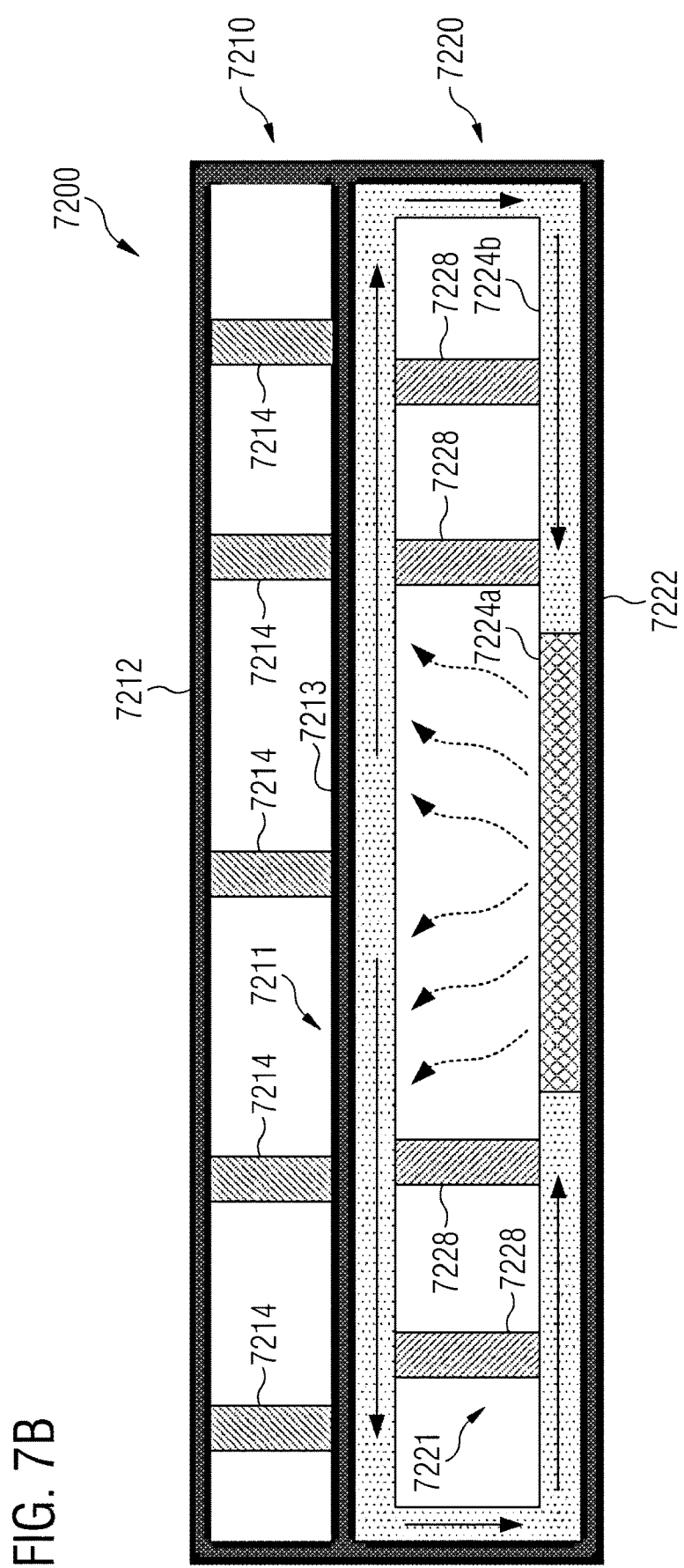
FIG. 7b illustrates an example of a two-tier vapor chamber apparatus.

FIG. 7b illustrates an example of a two-tier vapor chamber apparatus 7200. In particular, FIG. 7b illustrates a cross-sectional view of the apparatus. The example apparatus 7200 includes two tiers 7210, 7220. The first tier 7210 includes a sealed cavity 7211 that is defined by the walls 7212, 7213. In some examples, the walls 7212, 7213 may be metal (e.g., copper, titanium, aluminum, alloy, or another thermally conductive metal). The first tier 7210 also includes support structures 7214 that are in contact with, and orthogonal to, the walls 7212, 7213 and may provide structural support for the cavity 7211. The support structures 7214 may be made of metal, plastic, graphite, or any other suitable material for providing structural support to the cavity 7211. Further, the support structures 7214 may be shaped or positioned in another manner than shown in FIG. 7b.

The cavity 7211 may be evacuated so that its internal pressure is less than the ambient pressure. For example, in some examples, the cavity 7211 is evacuated to vacuum or near vacuum pressures, such as pressures less than 0.1 torr (e.g., 0.05-0.1 torr). In other examples, the cavity 7211 is filled with a thermally insulating material having a thermal conductivity less than air, such as an aerogel. The vacuum or thermally insulating material in the cavity 7211 may provide thermal insulation from other layers in a device stack (e.g., the top layer 7102 of FIG. 7a), which may reduce skin temperatures and provide one or more advantages as described above or otherwise herein.

The second tier 7220 of the apparatus 7200 includes a sealed cavity 7221 that is defined by the walls 7213, 7222. In the example shown, the wall 7222 is flat so that it may be positioned proximate to (or coupled to, via a thermal interface material (TIM)) a chip package to cool the chip package. The walls 7212, 7213 may be flat in certain areas, as shown in FIG. 7b, or may have another shape. In certain examples, the components in the cavity 7221 may function as a vapor chamber, whereby a liquid in the cavity 7221 is heated by the chip package through wall 7222 and evaporates into a vapor and then condenses as heat is dissipated from the vapor into the wall 7213.

In the example shown, the interior surfaces of the cavity 7221 (i.e., interior surfaces of walls 7213, 7222) include a wick material 7224. The wick material 7224 may include sintered metal (e.g., copper) or another type of material. The example wick material 7224 includes two regions 7224a, 7224b. The region 7224a may be considered as an evaporation/evaporator wick (e.g., may be the region of the wick in which evaporation of the liquid occurs), while the region 7224b may be considered as a condensation/condenser wick (e.g., may be the region of the wick in which condensation (and flow as indicated by arrows in FIG. 7b) of the liquid occurs). In some examples, the regions 7224a, 7224b may both be sintered metal, but may have different structures or porosities.

For example, in some examples, the region 7224a may include a coarse graded mesh (e.g., with a porosity of between 40-70%, such as, for example, ~50-60%), while the region 7224b may include a fine graded mesh (e.g., with a porosity between 30-50%, such as, for example, ~40-45%). The coarse graded mesh not only creates additional liquid-vapor interfaces for liquid vaporization, but also disturbs the temperature gradient in the liquid film to reduce the thermal resistance of saturated wicking structures and increases the evaporation rate across the interface. The total heat flux of the vapor chamber may accordingly be given by $$Q_{max} = \dot{m} h_{fg}$$

where $\dot{m}$ is mass of evaporated liquid directly proportional to the interfacial surface area. Thus, the coarse graded mesh may help to increases the critical heat flux (CHF) capability of the two-tier vapor chamber. Further, fine graded mesh structure at the condenser wick area may produce higher capillary pressure for condensate flow back to evaporator portion. The capillary pressure of the evaporator wick may be given by $$\Delta P_c = \frac{2\sigma}{R_{eff}}$$

where σ is the surface tension of the working fluid, and Reff is the radius of curvature of the meniscus in the wick. Increasing the heat load to the evaporator increases the mass flow rate and the total pressure drop in the system which increase the overall HTC of the 2T-VC. With the above hybrid wick proposal (i.e., using wick portions having different porosities), based on the above equations, the thermal performance of the 2T-VC apparatus can be increased by 5-10% compared to a uniform wick material throughout the vapor chamber.

In the example shown, the cavity 7221 also includes support structures 7228, which may provide structural support to the cavity 7221. The support structures 7228 may be formed similar to the structures 7214 in the cavity 7211 or may be formed in a different manner.

In the example shown, the cross-sectional areas of both cavities 7211, 7221 are rectangular. However, the cross-sectional areas of the cavities 7211, 7221 may be shaped in another manner (e.g., as shown in FIG. 3A or 4A). Further, in the example shown, the cross-sectional areas of the cavities 7211, 7221 are substantially similar. However, the cross-sectional areas of the cavities 7211, 7221 may be different (e.g., as shown in FIGS. 7c-7d).

FIGS. 7c-7d illustrate another example of a two-tier vapor chamber apparatus 7300. In particular, FIG. 7c illustrates a cross-sectional view of the apparatus, while FIG. 7d illustrates a top view of the apparatus. Like the apparatus 7200, the example apparatus 7300 includes two tiers 7310, 7320. The first tier 7310 includes a sealed cavity 7311 that is defined by the walls 7312, 7313. In some examples, the walls 7312, 7313 may be metal (e.g., copper, titanium, aluminum, alloy, or another thermally conductive metal). The first tier 7310 also includes support structures 7314 that are in contact with, and orthogonal to, the walls 7312, 7313 and may provide structural support for the cavity 7311. The support structures 7314 may be made of metal, plastic, graphite, or any other suitable material for providing structural support to the cavity 7311. Further, the support structures 7314 may be shaped or positioned in another manner than shown in FIG. 7c.

The cavity 7311 may be evacuated so that its internal pressure is less than the ambient pressure. For example, in some examples, the cavity 7311 is evacuated to vacuum or near vacuum pressures, such as pressures less than 0.1 torr (e.g., 0.05-0.1 torr). In other examples, the cavity 7311 is filled with a thermally insulating material having a thermal conductivity less than air, such as an aerogel. The vacuum or thermally insulating material in the cavity 7311 may provide thermal insulation from other layers in a device stack (e.g., the top layer 7102 of FIG. 7a), which may reduce skin temperatures and provide one or more advantages as described above or otherwise herein.

The second tier 7320 of the apparatus 7300 includes a sealed cavity 7321 that is defined by the walls 7313, 7322. In the example shown, the wall 7322 is flat so that it may be positioned proximate to (or coupled to, via a TIM) a chip package to cool the chip package. The walls 7312, 7313 may be flat in certain areas, as shown in FIG. 7c, or may have another shape. In certain examples, the components in the cavity 7321 may function as a vapor chamber, whereby a liquid in the cavity 7321 is heated by the chip package through wall 7322 and evaporates into a vapor and then condenses as heat is dissipated from the vapor into the wall 7313.

In the example shown, the interior surfaces of the cavity 7321 (i.e., interior surfaces of walls 7313, 7322) include a wick material 7324. The wick material 7324 may include sintered metal (e.g., copper) or another type of material. The example wick material 7324 includes two regions 7324a, 7324b. The region 7324a may be considered as an evaporation/evaporator wick (e.g., may be the region of the wick in which evaporation of the liquid occurs), while the region 7324b may be considered as a condensation/condenser wick (e.g., may be the region of the wick in which condensation (and flow as indicated by arrows in FIG. 7c) of the liquid occurs). In some examples, the regions 7324a, 7324b may both be sintered metal, but may have different structures or porosities. For example, in some examples, the region 7324a may include a coarse graded mesh (e.g., with a porosity of ~50-60%), while the region 7324b may include a fine graded mesh (e.g., with a porosity of ~40-45%).

In the example shown, the cross-sectional area of the first cavity 7311 is trapezoidal and the cross-sectional area of the second cavity 7321 is rectangular. However, the cross-sectional areas of the cavities 7311, 7321 may be shaped in another manner. Further, in the example shown, the cross-sectional area of the cavity 7311 is less than the cross-sectional area of the cavity 7321.

FIGS. 7e-7f illustrate another example of a two-tier vapor chamber apparatus 7400. In particular, FIG. 7e illustrates a cross-sectional view of the apparatus, while FIG. 7f illustrates a top view of the apparatus. Like the apparatuses 7200 and 7300, the example apparatus 7400 includes two tiers 7410, 7420. The first tier 7410 includes a sealed cavity 7411 that is defined by the walls 7412, 7413. In some examples, the walls 7412, 7413 may be metal (e.g., copper, titanium, aluminum, alloy, or another thermally conductive metal). The first tier 7410 also includes support structures 7414 that are in contact with, and orthogonal to, the walls 7412, 7413 and may provide structural support for the cavity 7411. The support structures 7414 may be made of metal, plastic, graphite, composite material (e.g., carbon fiber) or any other suitable material for providing structural support to the cavity 7411. Further, the support structures 7414 may be shaped or positioned in another manner than shown in FIG. 7e.

The cavity 7411 may be evacuated so that its internal pressure is less than the ambient pressure. For example, in some examples, the cavity 7411 is evacuated to vacuum or near vacuum pressures, such as pressures less than 0.1 torr (e.g., 0.05-0.1 torr). In other examples, the cavity 7411 is filled with a thermally insulating material having a thermal conductivity less than air, such as an aerogel. The vacuum or thermally insulating material in the cavity 7411 may provide thermal insulation from other layers in a device stack (e.g., the top layer 7102 of FIG. 7a), which may reduce skin temperatures and provide one or more advantages as described above or otherwise herein.

The second tier 7420 of the apparatus 7400 includes a sealed cavity 7421 that is defined by the walls 7413, 7422. In the example shown, the wall 7422 is flat so that it may be positioned proximate to (or coupled to, via a TIM) a chip package to cool the chip package. The walls 7412, 7413 may be flat in certain areas, as shown in FIG. 7e, or may have another shape. In certain examples, the components in the cavity 7421 may function as a vapor chamber, whereby a liquid in the cavity 7421 is heated by the chip package through wall 7422 and evaporates into a vapor and then condenses as heat is dissipated from the vapor into the wall 7413.

In the example shown, the interior surfaces of the cavity 7421 (i.e., interior surfaces of walls 7413, 7422) include a wick material 7424. The wick material 7424 may include sintered metal (e.g., copper) or another type of material. The example wick material 7424 includes two regions 7424a, 7424b. The region 7424a may be considered as an evaporation/evaporator wick (e.g., may be the region of the wick in which evaporation of the liquid occurs), while the region 7424b may be considered as a condensation/condenser wick (e.g., may be the region of the wick in which condensation (and flow as indicated by arrows in FIG. 7e) of the liquid occurs). In some examples, the regions 7424a, 7424b may both be sintered metal, but may have different structures or porosities. For example, in some examples, the region 7424a may include a coarse graded mesh (e.g., with a porosity of ~50-60%), while the region 7424b may include a fine graded mesh (e.g., with a porosity of ~40-45%).

In the example shown, the cavity 7421 also includes support structures 7428, which may provide structural support to the cavity 7421. The support structures 7428 may be formed similar to the structures 7414 in the cavity 7411 or may be formed in a different manner.

In the example shown, the cross-sectional areas of the cavities 7411, 7421 are rectangular. However, the cross-sectional areas of the cavities 7411, 7421 may be shaped in another manner. Further, in the example shown, the cross-sectional area of the cavity 7411 is less than the cross-sectional area of the cavity 7421.

In some examples, the two-tier apparatus may be used in a passive cooling configuration where no other heat exchangers are used for cooling. However, in other examples, the two-tier apparatus may be used in an active cooling configuration that uses a heat exchanger (e.g., a fan) to aid in further cooling. For example, the open area across the vacuum chamber on the two-tier-apparatus may act to cool the vapor back to saturated liquid or sub cooled vapors while heat exchangers (e.g., 7430) may be mounted on the back of the vapor chamber used for active cooling as condensers. For instance, in the example shown, heat exchangers 7430 are positioned proximate to the vapor chamber of the tier 7420. In particular, the heat exchangers 7430 are positioned proximate to the outer portion of the exterior surface of the wall 7422. In some examples, the heat exchangers may be positioned in an area of the exterior surface of the wall 7422 that is outside the area of the wall 7422 in which a chip package may be coupled (which may be, for example, vertically below the area of the top tier 7410). The heat exchangers 7430 may be positioned in another area of the apparatus 7400 in other examples.

Figure 7G:
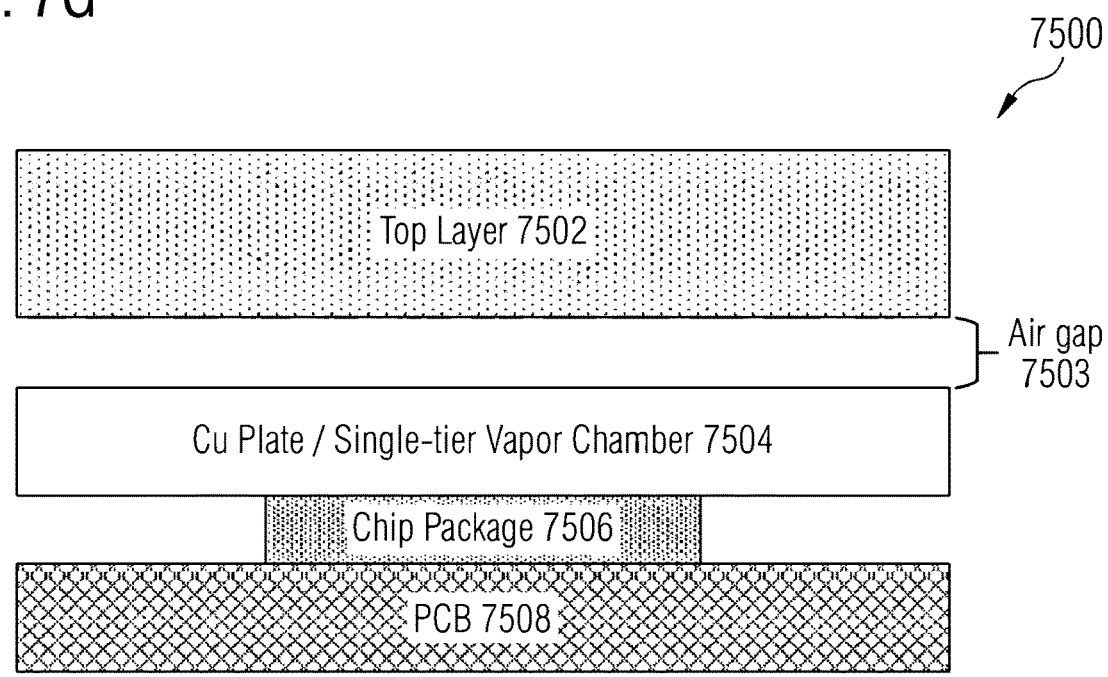
FIG. 7g-7h illustrate simplified views of example mobile device stacks with air gaps between the cooling solution and the top layer.
Figure 7H:
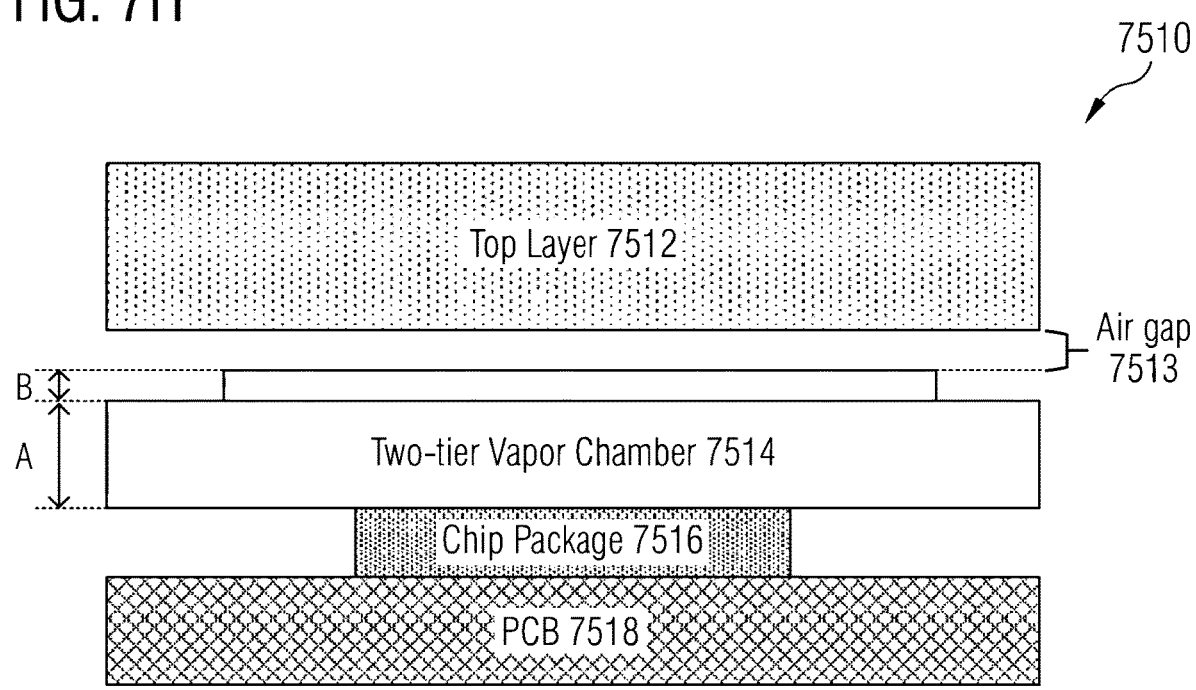
Figure 71:
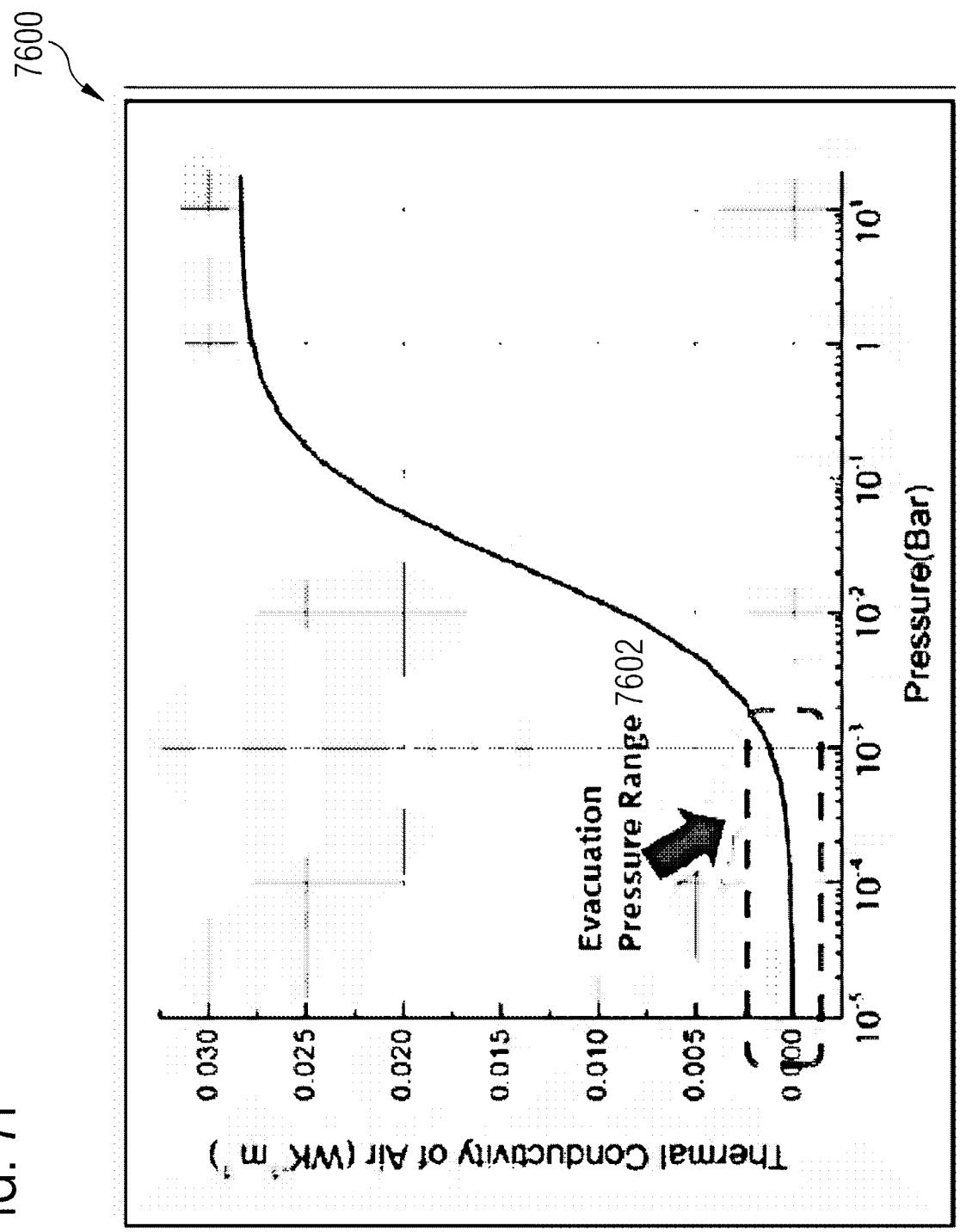

FIGS. 7g-7h illustrate simplified views of example mobile device stacks with air gaps between the cooling solution and the top layer. The stacks may include additional layers than those illustrated (e.g., may include one or more of the layers described in examples below). Referring to FIG. 7g, the example mobile device stack 7500 includes a top layer 7502, cooling apparatus 7504, chip package 7506, and PCB 7508, which may all be similar to the top layer 7102, thermal solution 7104, chip package 7106, and PCB 7108 of FIG. 7a, respectively. In the example shown in FIG. 7g, the cooling apparatus 7504 is either a copper plate or single-tier vapor chamber cooling apparatus.

Referring to FIG. 7h, the example mobile device stack 7510 includes a top layer 7512, cooling apparatus 7514, chip package 7516, and PCB 7518, which may all be similar to the top layer 7102, thermal solution 7104, chip package 7106, and PCB 7108 of FIG. 7a, respectively. In the example shown in FIG. 7h, the cooling apparatus 7514 is a two-tier vapor chamber apparatus, which may be formed similar to the example apparatuses described above with respect to FIGS. 7b, 7c-7d, and 7e-7f, or otherwise as described herein.

In the examples shown in FIGS. 7g-7h, the space between the chip package and the top layer may be the same. However, the total thickness of the cooling apparatuses may be different. For instance, in one example, the air gap 7503 may have a thickness of approximately 0.8 mm and the cooling apparatus 7504 may have a thickness of approximately 0.5 mm, while the air gap 7513 may have a thickness of approximately 0.5 mm and the cooling apparatus 7514 may have a thickness (A+B in FIG. 7h) of approximately 0.8 mm. The thicknesses of each tier of the two-tier cooling apparatus (i.e., the thicknesses A and B in FIG. 7h) may be the same or different. For instance, in the example described above, each tier of the two-tier cooling apparatus may be approximately 0.4 mm. In some instances, the two-tier cooling apparatus may be formed such that the lower tier has a total thickness of 0.4 mm (i.e., the thickness A in FIG. 7h), while the top tier has top metal wall thickness of 0.2 mm and a cavity thickness of 0.2 mm. Thus, in some examples, the total stack height may remain the same as with conventional cooling techniques, as the increased thickness of the two-tier cooling apparatus may be compensated for by a reduced air gap thickness (while still meeting thermal requirements).

Simulation and Testing

In the following models, the vacuum is modeled as low conductivity object with radiation. The conductivity value depends on the evacuation pressure maintained in the chamber before liquid charging phase. In the modeling used herein, conductivity values are taken form 0.005 W/mk to 0.001 W/mK based on an evacuation range of 0.05-0.1 torr of air pressure, while emissivity is taken as 0.9 to capture radiation in vacuum. FIG. 7i is a chart 7600 illustrating an example relationship between thermal conductivity of air versus pressure. In some examples, the evacuation pressure for the top tier cavity may be selected in the example evacuation pressure range 7602 indicated in FIG. 7i.

The following example device stacks are used in the models described below. The example stack layers are listed in Tables 1-2 in their vertical order, whereby the first item listed is the top layer of the stack and the last item listed is the bottom layer of the stack. As is shown by Tables 1-2, the total stack thickness is the same in each case, but the top air gap and cooling apparatus thicknesses differ.

TABLE 1

First Example Device Stack

| Component | Thickness (mm) |
|---|---|
| Glass (top layer) | 0.4 |
| OCA | 0.2 |
| Display | 1.65 |
| Aluminum LCD plate | 0.3 |
| Graphite | 0.09 |
| Air gap (top) | 0.8 |
| Copper Plate/ Single-tier vapor chamber apparatus | 0.5 |
| TIM | 0.15 |
| Chip package | .08 |
| Solder paste | 0.1 |
| PCB | 0.6 |
| Graphite | 0.09 |
| Air Gap (bottom) | 0.5 |
| Graphite | 0.09 |
| Aluminum enclosure (bottom layer) | 0.8 |
| Total | 7.07 |

TABLE 2

Second Example Device Stack

| Component | Thickness (mm) |
|---|---|
| Glass (top layer) | 0.4 |
| OCA | 0.2 |
| Display | 1.65 |
| Aluminum LCD plate | 0.3 |
| Graphite | 0.09 |
| Air gap (top) | 0.5 |
| Two-tier vapor chamber apparatus | 0.8 |
| TIM | 0.15 |
| Chip package | .08 |
| Solder paste | 0.1 |
| PCB | 0.6 |
| Graphite | 0.09 |
| Air Gap (bottom) | 0.5 |
| Graphite | 0.09 |
| Aluminum enclosure (bottom layer) | 0.8 |
| Total | 7.07 |

The simulation results shown in Table 3 are based on PL1=7 W (TDP) and PL2=10 W (1CT) for 5 sec. The thermal simulations were performed for three different thermal solutions i.e. (A) 0.5 mm copper plate with 0.8 mm air gap, (B) 0.5 mm single-tier vapor chamber (VC) apparatus with 0.8 mm air gap, (C) 0.8 mm two-tier VC (2T-VC) with 0.5 mm air gap, and (D) 0.8 mm 2T-VC with 0.5 mm air gap, but where the area of the top tier vacuum chamber is reduced by 15% from (C).

TABLE 3

Example Simulation Results

|  | Copper Plate (A) | Single-Tier VC (B) | Two-Tier VC (C) | Two-Tier VC with reduced vacuum region (D) |
|---|---|---|---|---|
| $T_{top}$, glass | 43.1 | 43.1 | 40.3 | 40.6 |
| $T_j$ | 96.5 | 78.7 | 84.13 | 79.82 |
| $T_{chassis}$ | 39.6 | 40.6 | 40.4 | 40.2 |
| PL1 capability | 7.6 | 7.7 | 8.9 | 8.8 |
| % change | Base | 2.2 | 21.7 | 19 |
| $T_j$ (5 sec) | 57.2 | 50.4 | 51.1 | 51.2 |
| PL2 capability | 16.3 | 20.7 | 20.1 | 20 |
| % change | Base | 26.8 | 23.4 | 22.9 |

As shown in Table 3, the PL1 capability of the copper plate is slightly less than a single-tier VC of the same size and thickness, since the system is limited by skin temperature. However, the Tj is reduced by ~18 C in the single-tier VC case and spreads the hot spot on its surface which gives ~0.4 C reduction in top cover temperature for VC. In the case of the first 2T-VC (C), the skin temperature is reduced by ~3 C due to resistance created by vacuum layer in the path of heat transfer from 2T-VC to the skin, which helps to increase PL1 limit by ~15% compared to the copper plate and single-tier VC. Turning to the second 2T-VC (D), the increase in Tj may be mitigated by optimizing the system, e.g., providing thicker graphite below the PCB and/or using vacuum chamber only above the core region (e.g., reducing the vacuum size by 15%).

Figure 7J:
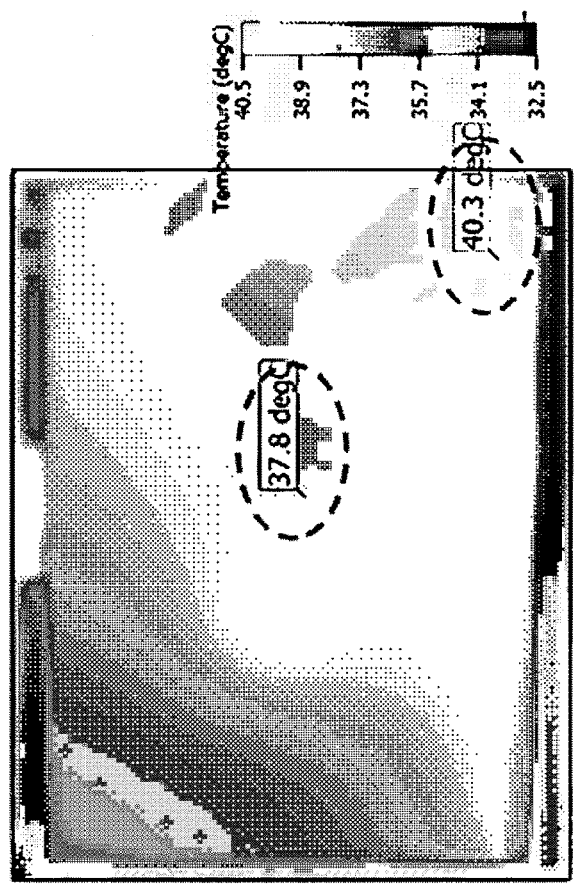
FIG. 7j-7k Illustrate example hot spots for single- and two-tier cooling apparatuses, respectively.
Figure 7K:
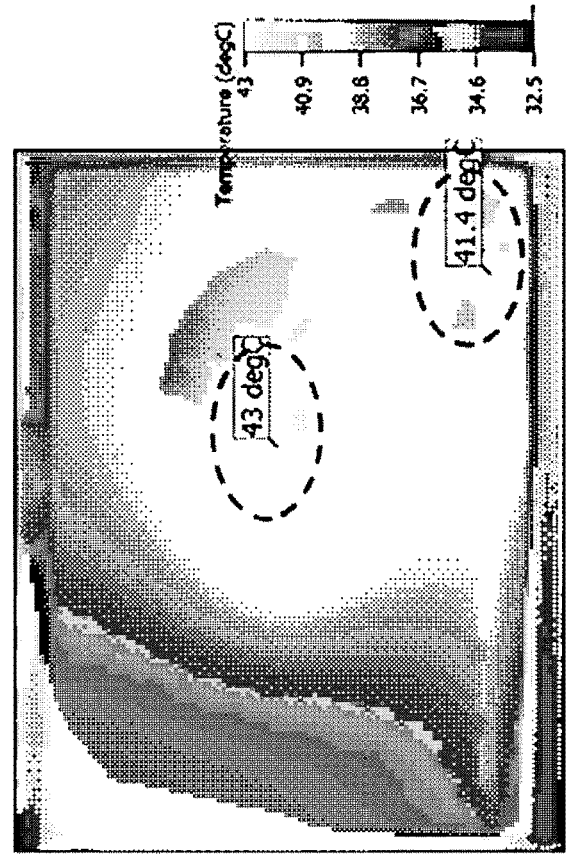

FIGS. 7j-7k Illustrate example hot spots for single- and two-tier cooling apparatuses, respectively. As shown in FIGS. 7j-7k, the main hotspot location is shifted to the bottom-right side of the chart (as indicated by the dotted ovals), where heat is emitted from an LED panel rather than a chip package, since the hotspot related to the chip package (in the relative middle of the charts) is reduced. In the example shown, PL1 capability is increased approximately 20-25%.

Figure 7L:
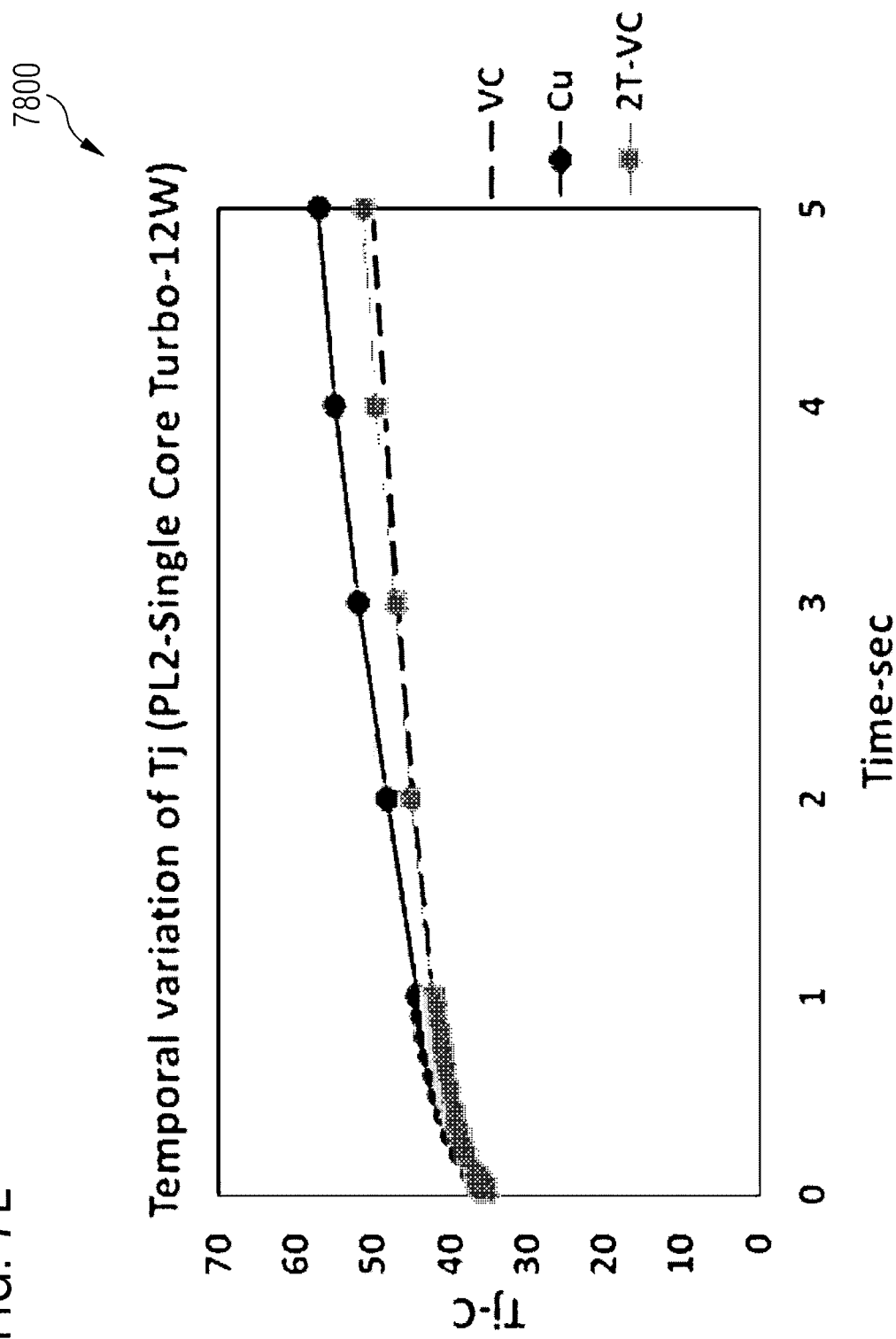
FIG. 7l is a chart showing example performance differences for copper heat plate, single-tier vapor chamber, and two-tier vapor chamber cooling apparatuses.

FIG. 7l is a chart 7800 showing example performance differences for copper heat plate apparatus ("Cu" in the chart), single-tier vapor chamber apparatus ("VC" in the chart), and two-tier vapor chamber cooling apparatus ("2T-VC" in the chart). As shown, the PL2 capability for 5 sec is almost the same for single-tier VC and 2T-VC configurations, which are increased by ~23% compared to the copper plate configuration (e.g., due to better capacitance of phase change inside in the vapor chamber).

Figure 7M:
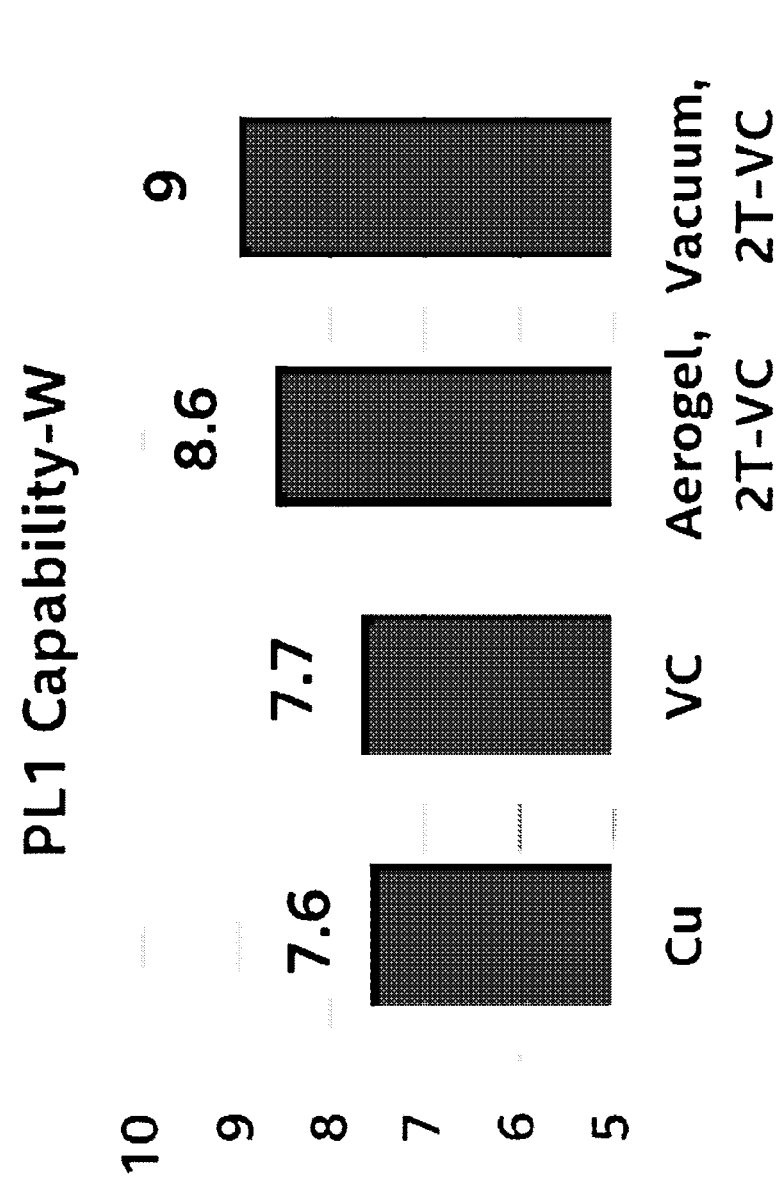
FIG. 7m is a chart showing example performance differences for vacuum- and aerogel-based two-tier vapor chamber apparatuses.

FIG. 7m is a chart 7900 showing example performance differences for vacuum- and aerogel-based two-tier vapor chamber apparatuses. Table 4 also illustrates such performance differences, based on aerogel properties of k=0.017 W/mK and e=0.9 (GORE data).

TABLE 4

Performance differences for vacuum- and aerogel-based 2T-VCs

| Thermal Solution | $T_{skin}$ (C) | PL1 Capability |
|---|---|---|
| Copper heat plate | 43.5 | 7.6 |
| Single-tier VC | 43.1 | 7.7 |
| Aerogel-based 2T-VC | 41.9 | 8.6 |
| Vacuum-based 2T-VC | 40.3 | 9.2 |

In some examples, the Aerogel conductivity may lie in the range of 0.016-0.018 W/mK, so the thermal resistance may be less for aerogel-based 2T-VCs as compared to vacuum-based 2T-VCs, but still more than air. As shown, the top glass temperature is 41.9 C for the aerogel-based 2T-VC as compared to 40.5 C for the vacuum-based 2T-VC. The PL1 performance of the aerogel-based 2T-VC increased by 13% compared to the copper plate and by 11% compared to the single-tier VC.

In some examples, the walls of each tier may be composed of different metals. In some examples, the top wall of the apparatus (e.g., 212 of FIG. 7b) may be the same metal as the bottom tier walls (e.g., 213, 222 of FIG. 7b). However, in other examples, the top wall of the apparatus (e.g., 212 of FIG. 7b) may be a different metal as the bottom tier walls (e.g., 213, 222 of FIG. 7b). The metal choice may depend on implementation details, including cost constraints or thickness constraints. Example junction temperatures (Tj), skin temperatures (Tskin), apparatus thicknesses, and relative costs are shown below in Table 5. As shown, use of Titanium in certain walls may provide a lower overall apparatus thickness and lower Tj, but at a higher cost and with higher Tskin. Another type of metal, such as aluminum or alloy, may be used in other examples.

TABLE 5

Example Measurements for Copper and Titanium Wall Metal Choices

|  | Top wall: Copper Bottom tier walls: Copper | Top wall: Titanium Bottom tier walls: Titanium | Top wall: Titanium Bottom tier walls: Copper |
|---|---|---|---|
| Thermal performance ($T_j/T_{skin}$) | 40.7 C./93.4 C. | 40.3 C./96 C. | 40.3 C./95 C. |
| Thickness of 2T-VC | 0.5-0.8 mm | 0.3-0.5 mm | 0.3-0.5 mm |
| Relative cost | Base | Higher | Higher |

Figure 7N:
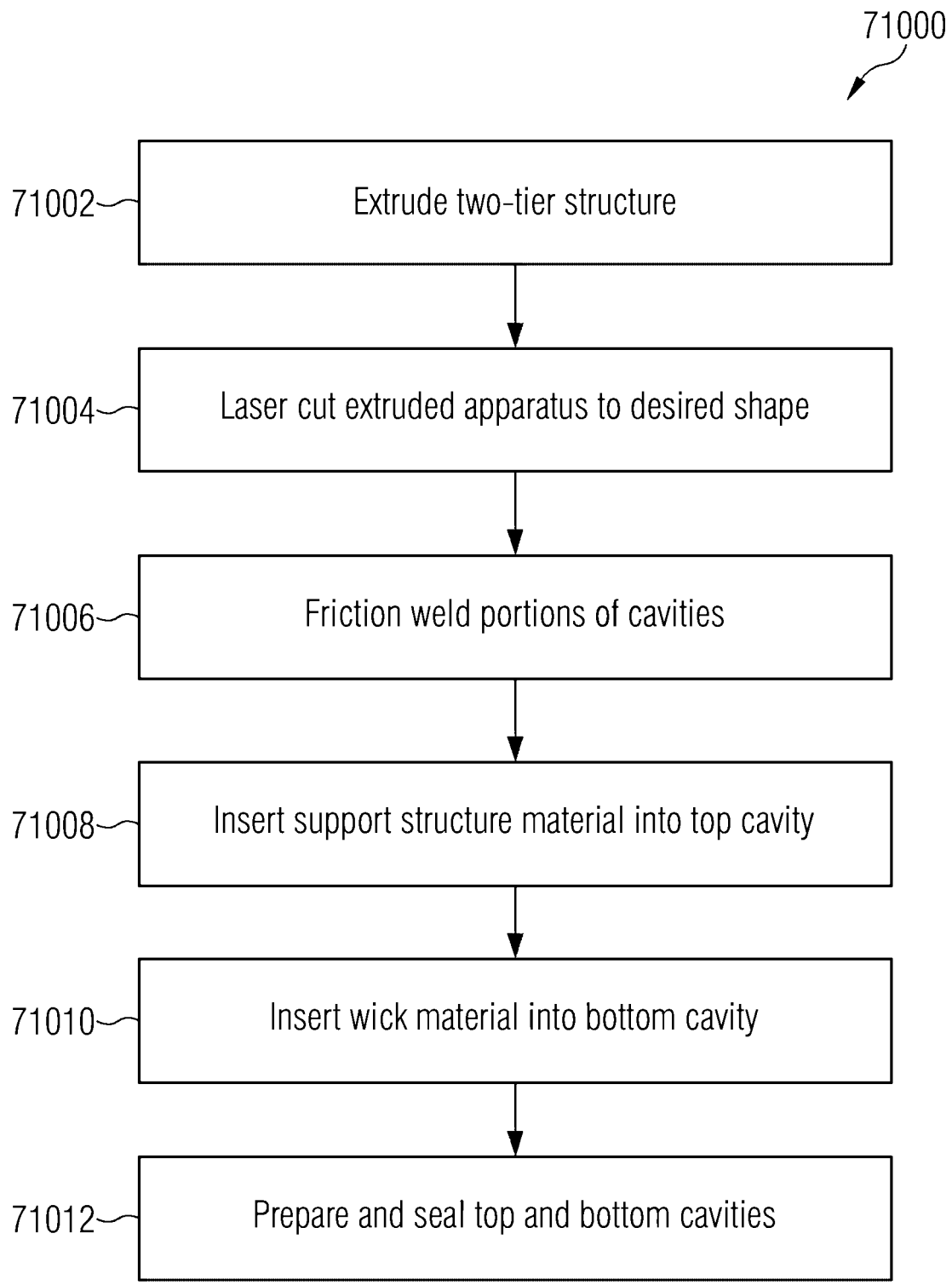
FIG. 7n is a flow diagram showing an example process for manufacturing a two-tier vapor chamber cooling apparatus according to examples of the present disclosure.
Figure 7O:
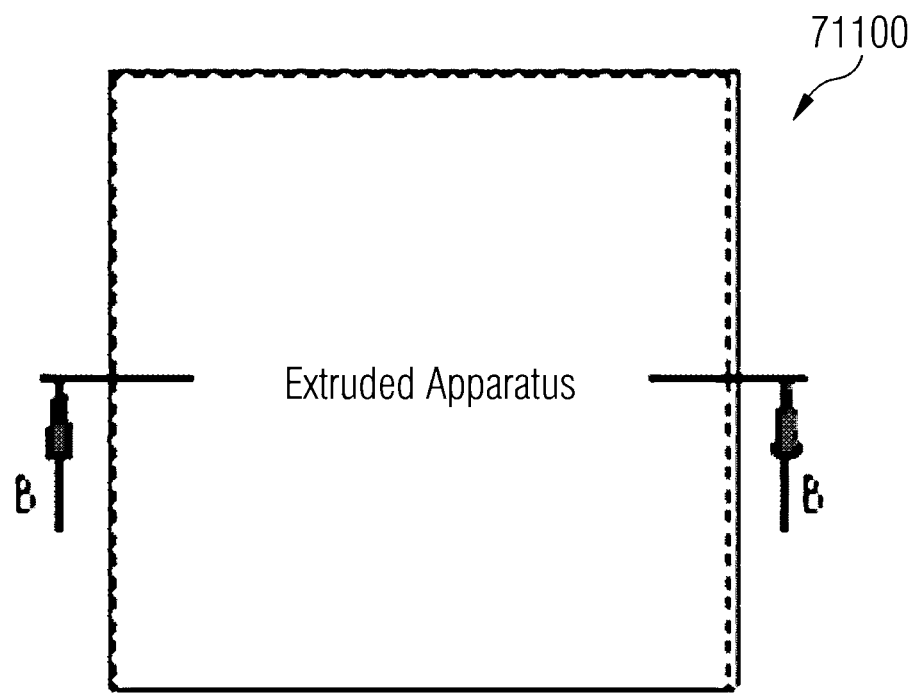

FIG. 7n is a flow diagram showing an example process 71000 for manufacturing a two-tier vapor chamber cooling apparatus according to examples of the present disclosure, and FIGS. 7o-7r illustrate example steps during the manufacturing process 71000. The example process may include additional or different operations, and the operations may be performed in the order shown or in another order. In some cases, one or more of the operations shown in FIG. 7n are implemented as processes that include multiple operations, sub-processes, or other types of routines. In some cases, operations can be combined, performed in another order, performed in parallel, iterated, or otherwise repeated or performed another manner.

Figure 7P:
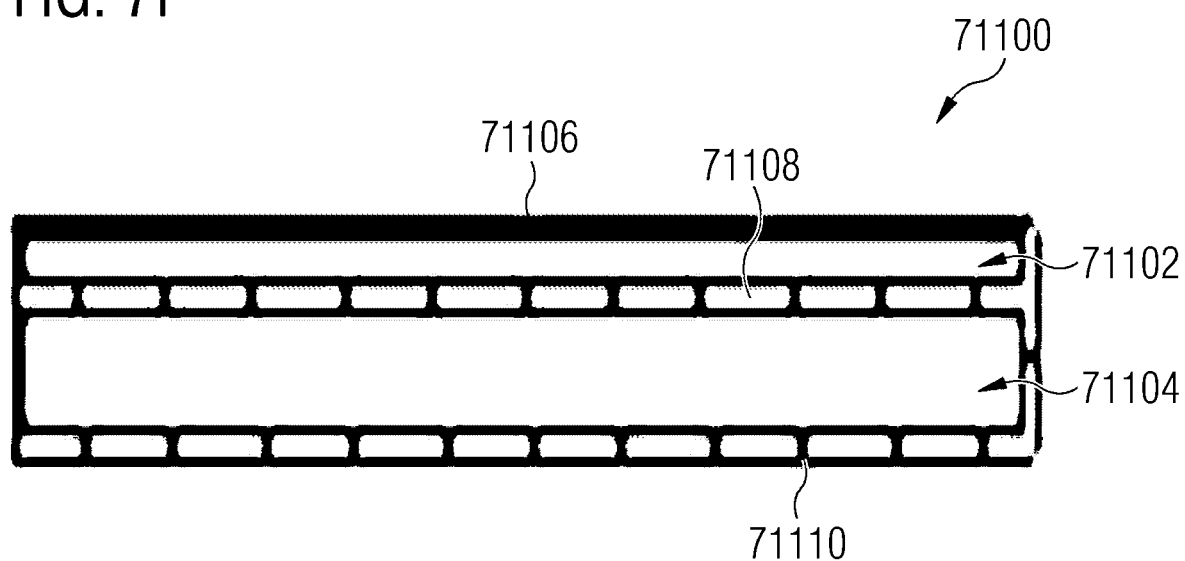
Figure 7Q:
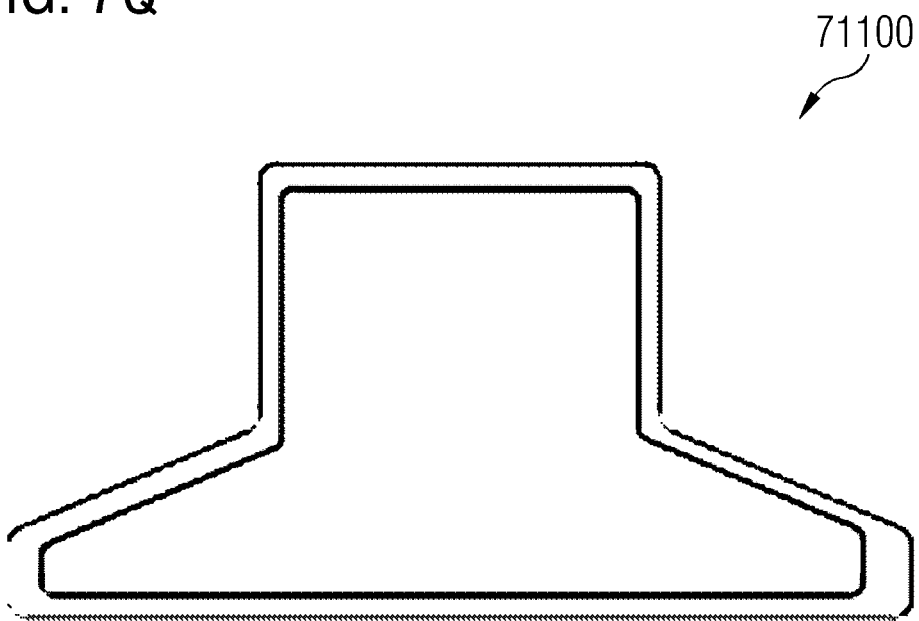
Figure 7R:
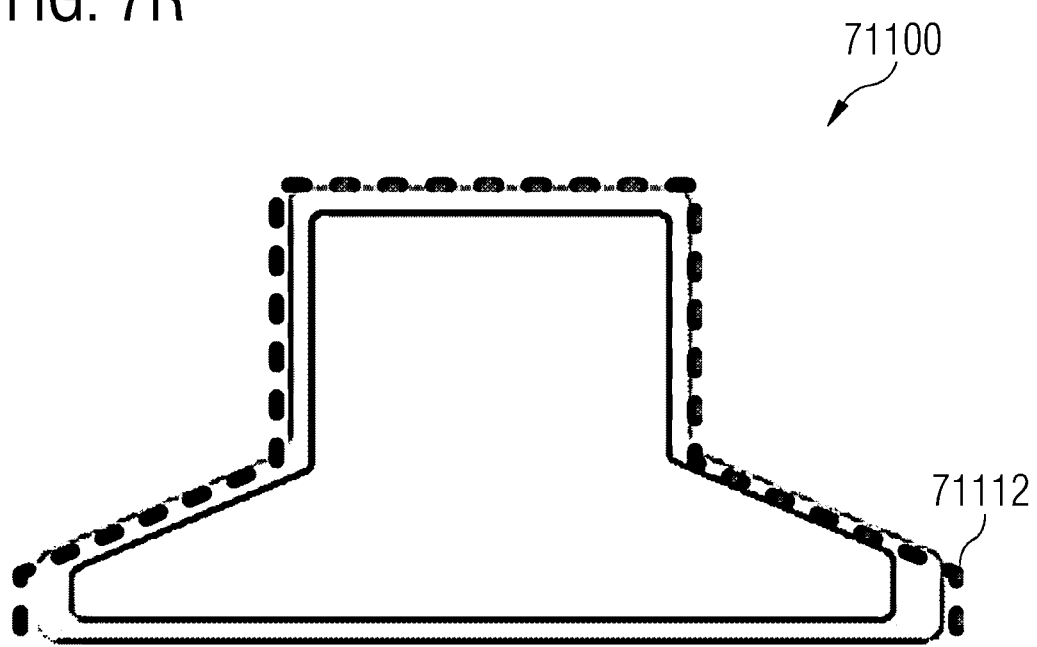

At 71002, a metal is extruded to form an apparatus that includes a first cavity defined (at least partially) by a first wall and a second wall, and a second cavity defined (at least partially) by the second wall and a third wall. For example, referring to FIGS. 7o-7p, the extruded apparatus 71100 includes a first cavity 71102 and a second cavity 71104. The first cavity 71102 is defined by the wall 71106 and wall 71108, while the second cavity is defined by the wall 71108 and the wall 71110. Although a particular cross-sectional profile is shown in FIG. 7p, other cross-sectional profiles may be extruded (e.g., those shown in FIGS. 7b, 7d, and 7f).

At 71004, the extruded apparatus is cut to the desired shape. For instance, referring to the example shown in FIG. 7q (a top view of the apparatus 71100), the apparatus 71100 is cut to the shape shown. The cutting may be performed using a laser cutting process, in some examples.

At 71006, the cavities of the apparatus are partially sealed, e.g., via friction welding. For instance, referring to the example shown in FIG. 7r, the apparatus 71100 is welded along the dotted line 71112 to partially seal the cavities of the apparatus.

At 71008, a support structure apparatus is inserted into a first cavity of the apparatus. The support structure apparatus may be formed of plastic, graphite, metal, composite material (e.g., carbon fiber) or another type of material. As an example, the support structure apparatus may be formed similar to the example support structure apparatus 71120 shown in FIG. 7s, which may be inserted into the top cavity of the cut and welded apparatus 71100 shown in FIG. 7r.

At 71010, wick material is inserted into a second cavity of the apparatus. The wick material may include sintered metal, copper fiber, or other types of wick material. In some cases, the wick material may be formed on a prefabricated wick structure that is to be inserted into the cut and welded extruded apparatus. For example, the wick material may be formed on a prefabricated structure similar to the example apparatus 71130 shown in FIG. 7t, which may be inserted into the bottom cavity of the cut and welded apparatus 71100 shown in FIG. 7r. In some cases, additional preparation steps (e.g., heating) may be needed to prepare the wick material once the apparatus 71130 is inserted.

Figure 7U:
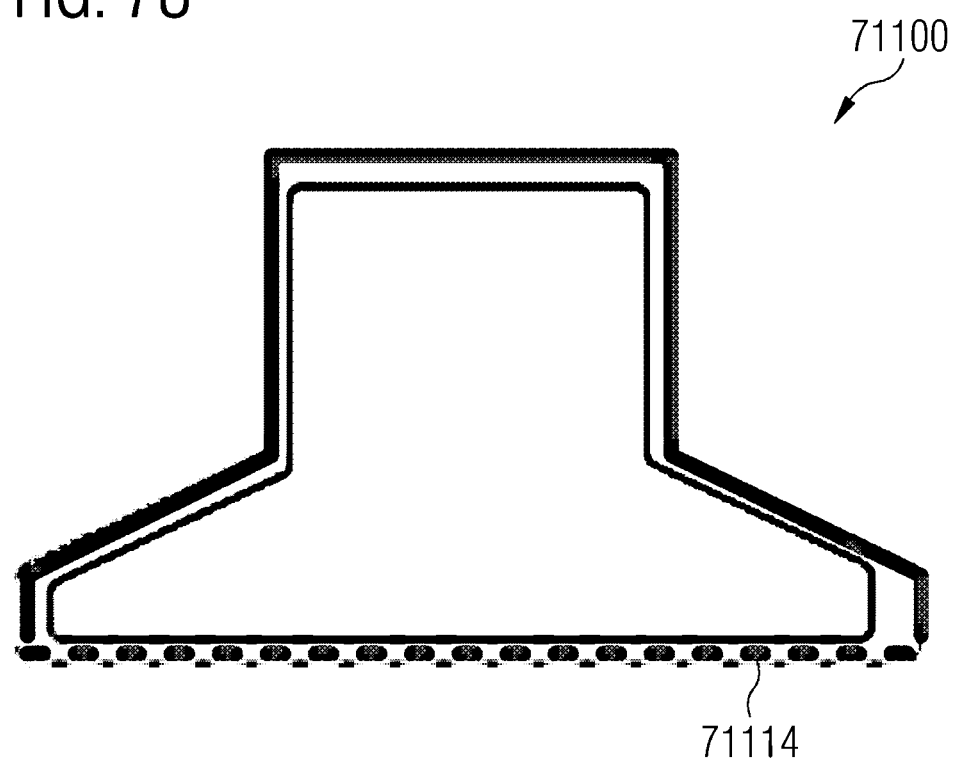

At 71012, the top and bottom cavities of the apparatus are prepared and sealed. In some cases, preparation of the top cavity may include aerogel insertion or air evacuation (to create a vacuum), while preparation of the bottom cavity may include insertion of a liquid to be used in the vapor chamber. Once the cavities are prepared, they may be fully sealed, such as, via further friction welding. For instance, referring to the example shown in FIG. 7u, the apparatus 71100 may be welded along the dotted line 71114 to fully seal the cavities of the apparatus. Following the sealing process, the apparatus may be tested, inspected, and/or quality checked prior to use (e.g., mounting in a device stack to cool a chip package).

Figure 7V:
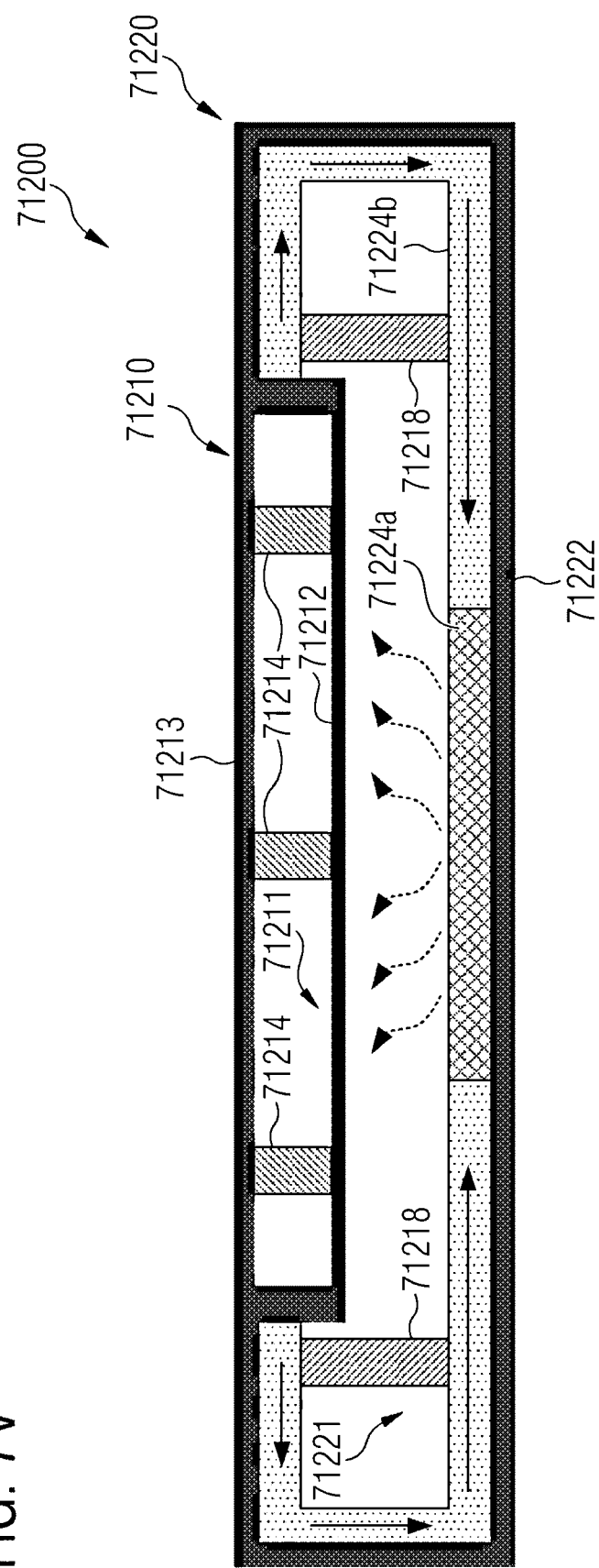
FIG. 7v illustrates an example of an embedded two-tier vapor chamber apparatus.

FIG. 7v illustrates an example of an embedded two-tier vapor chamber apparatus 71200. In particular, FIG. 7v illustrates a cross-sectional view of the apparatus 71200. Like the apparatus 400 of FIG. 7e, the example apparatus 71200 includes two tiers 71210, 71220. However, the sealed cavity 71211 of the tier 71210 is disposed within the cavity 71221 of the tier 71220, whereas the cavity 411 is outside the cavity 7421 in the example apparatus 7400.

The sealed cavity 71211 is defined by the walls 71212, 71213. In some examples, the walls 71212, 71213 may be metal (e.g., copper, titanium, aluminum, alloy, or another thermally conductive metal). The sealed cavity includes support structures 71214 that are in contact with, and orthogonal to, the walls 71212, 71213 and may provide structural support for the cavity 71211. The support structures 71214 may be made of metal, plastic, graphite, composite material (e.g., carbon fiber) or any other suitable material for providing structural support to the cavity 71211. Further, the support structures 71214 may be shaped or positioned in another manner than shown in FIG. 7v.

The cavity 71211 may be evacuated so that its internal pressure is less than the ambient pressure (either within the cavity 71221 or outside the apparatus 71200). For example, in some examples, the cavity 71211 is evacuated to vacuum or near vacuum pressures, such as pressures less than 0.1 torr (e.g., 0.05-0.1 torr). In other examples, the cavity 71211 is filled with a thermally insulating material having a thermal conductivity less than air, such as an aerogel. The vacuum or thermally insulating material in the cavity 71211 may provide thermal insulation from other layers in a device stack (e.g., the top layer 7102 of FIG. 7a), which may reduce skin temperatures and provide one or more advantages as described above or otherwise herein.

The second tier 71220 of the apparatus 71200 includes a sealed cavity 71221 that is defined by the walls 71213, 71222. In the example shown, the wall 71222 is flat so that it may be positioned proximate to (or coupled to, via a TIM) a chip package to cool the chip package. The walls 71212, 71213 may be flat in certain areas, as shown in FIG. 7v, or may have another shape. In certain examples, the components in the cavity 71221 may function as a vapor chamber, whereby a liquid in the cavity 71221 is heated by the chip package through wall 71222 and evaporates into a vapor and then condenses as heat is dissipated from the vapor into the wall 71213.

In the example shown, the interior surfaces of the cavity 71221 (i.e., interior surfaces of walls 71213, 71222) include a wick material 71224. The wick material 71224 may include sintered metal (e.g., copper) or another type of material. The example wick material 71224 includes two regions 71224a, 71224b. The region 71224a may be considered as an evaporation/evaporator wick (e.g., may be the region of the wick in which evaporation of the liquid occurs), while the region 71224b may be considered as a condensation/condenser wick (e.g., may be the region of the wick in which condensation (and flow as indicated by arrows in FIG. 7v) of the liquid occurs). In some examples, the regions 71224a, 71224b may both be sintered metal, but may have different structures or porosities. For example, in some examples, the region 71224a may include a coarse graded mesh (e.g., with a porosity of ~50-60%), while the region 71224b may include a fine graded mesh (e.g., with a porosity of ~40-45%).

In the example shown, the cavity 71221 also includes support structures 71228, which may provide structural support to the cavity 71221. The support structures 71228 may be formed similar to the structures 71214 in the cavity 71211 or may be formed in a different manner. In the example shown, the cross-sectional areas of the cavities 71211, 71221 are rectangular. However, the cross-sectional areas of the cavities 71211, 71221 may be shaped in another manner. Further, in the example shown, the cross-sectional area of the cavity 71211 is less than the cross-sectional area of the cavity 71221.

Figure 7W:
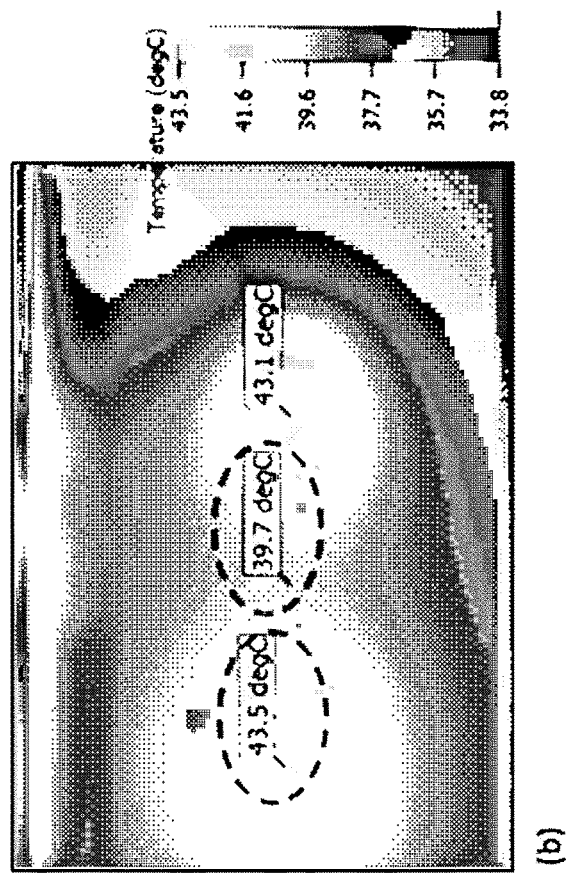
FIG. 7w-7x illustrate example hot spots for single- and embedded two-tier cooling apparatuses, respectively.
Figure 7X:
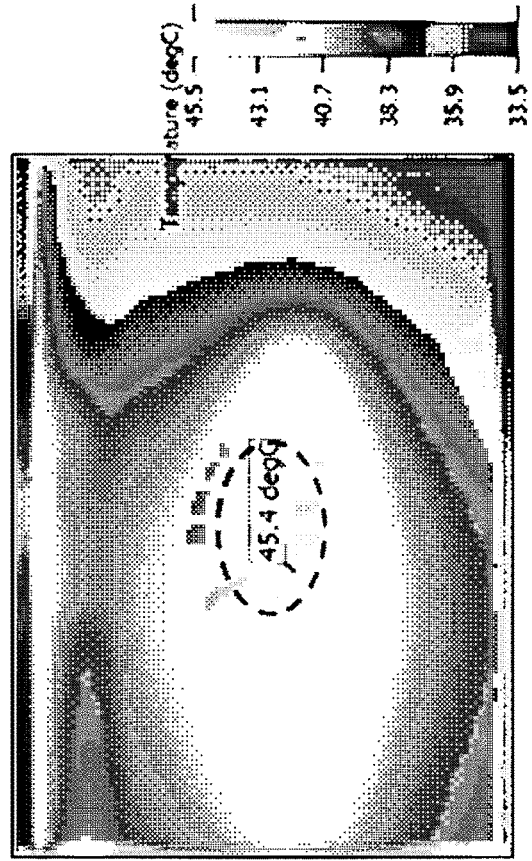

FIGS. 7w-7x Illustrate example hot spots for single- and embedded two-tier cooling apparatuses, respectively. As shown in FIGS. 7w-7x, the main hotspot location is shifted (as indicated by the dotted ovals), since the hotspot related to the chip package (in the relative middle of the charts) is reduced. In the example shown, PL1 capability is increased approximately 15-20%.

An embedded structure as shown in FIG. 7v may be utilized to gain one or more of the advantages of the two-tier apparatus described above while maintaining a similar or the same stack height as a single tier cooling apparatus. Example simulation results for the two scenarios are shown below in Table 6.

TABLE 6

Example Simulation Results

|  | Protruded 2T-VC | | Embedded 2T-VC | |
| --- | --- | --- | --- | --- |
|  | 1VC | 2T-VC | 1VC | 2T-VC |
| Ttop, glass | 43.1 | 40.6 | 45.4 | 43.3 |
| Tj | 78.7 | 79.9 | 82.2 | 86.9 |
| Tchassis | 40.6 | 40.2 | 45.2 | 45.4 |
| PL1 Capability | 7.7 | 9.0 | 10.3 | 11.5 |
| % Change | Base | 16.0 | Base | 11.5 |
| Tj | 50.4 | 51.1 | 94.2 | 94.9 |
| PL2 Capability | 20.7 | 20.1 | 21.7 | 21.5 |
| % Change | Base | 2.7 | Base | 1.1 |

Figure 7Y:
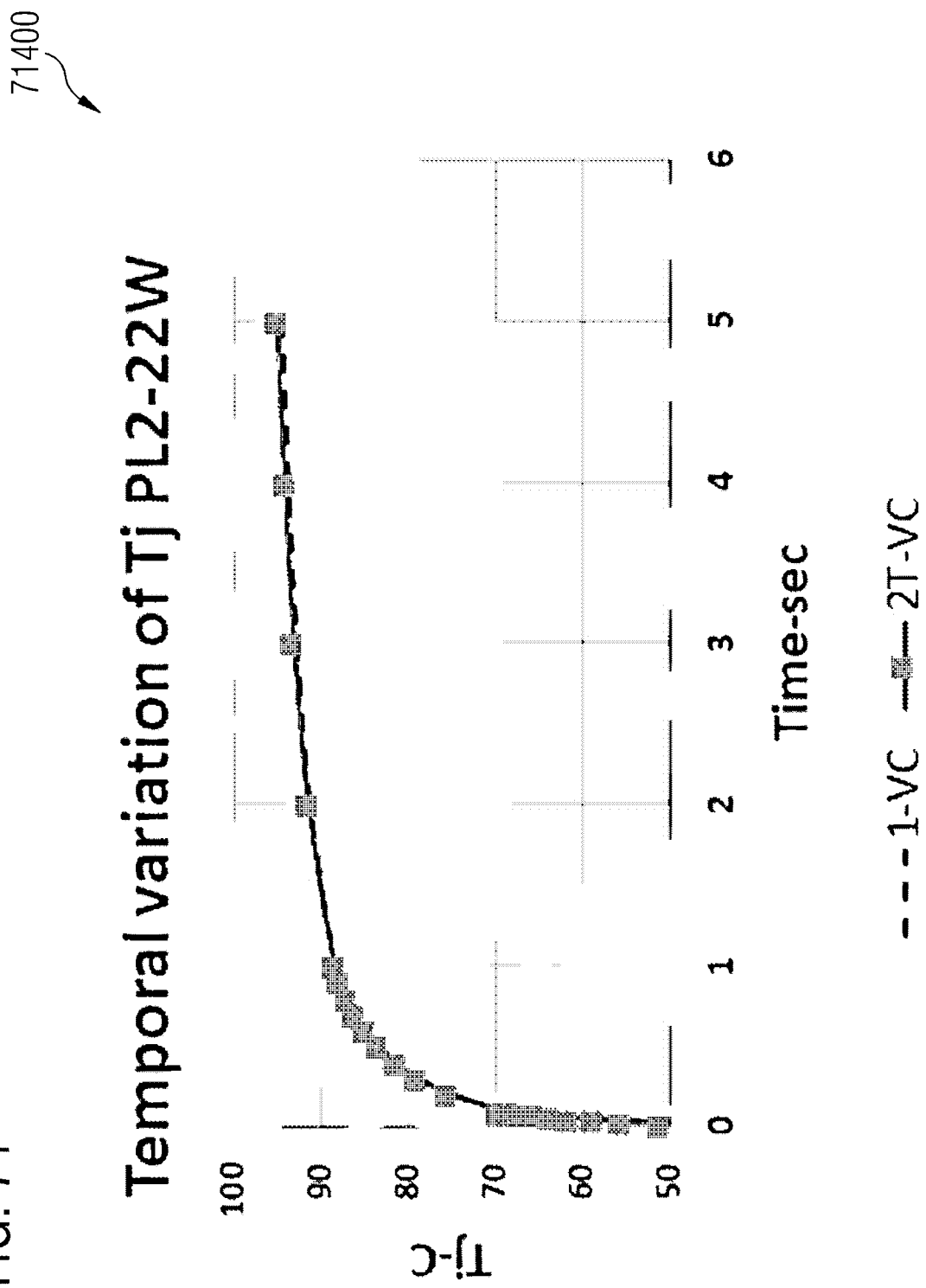
FIG. 7y is a chart showing example performance differences for a single-tier vapor chamber apparatus and an embedded two-tier vapor chamber cooling apparatus.

FIG. 7y is a chart 71400 showing example performance differences for a single-tier vapor chamber apparatus ("1-VC" in the chart) and an embedded two-tier vapor chamber cooling apparatus ("2T-VC" in the chart). As shown, the PL2 capability for 5 sec is almost the same for single-tier VC and embedded 2T-VC configurations.

A similar process to that described above with respect to FIGS. 7v-7x may be used to manufacture an embedded two-tier VC apparatus.

Figure 7Z:
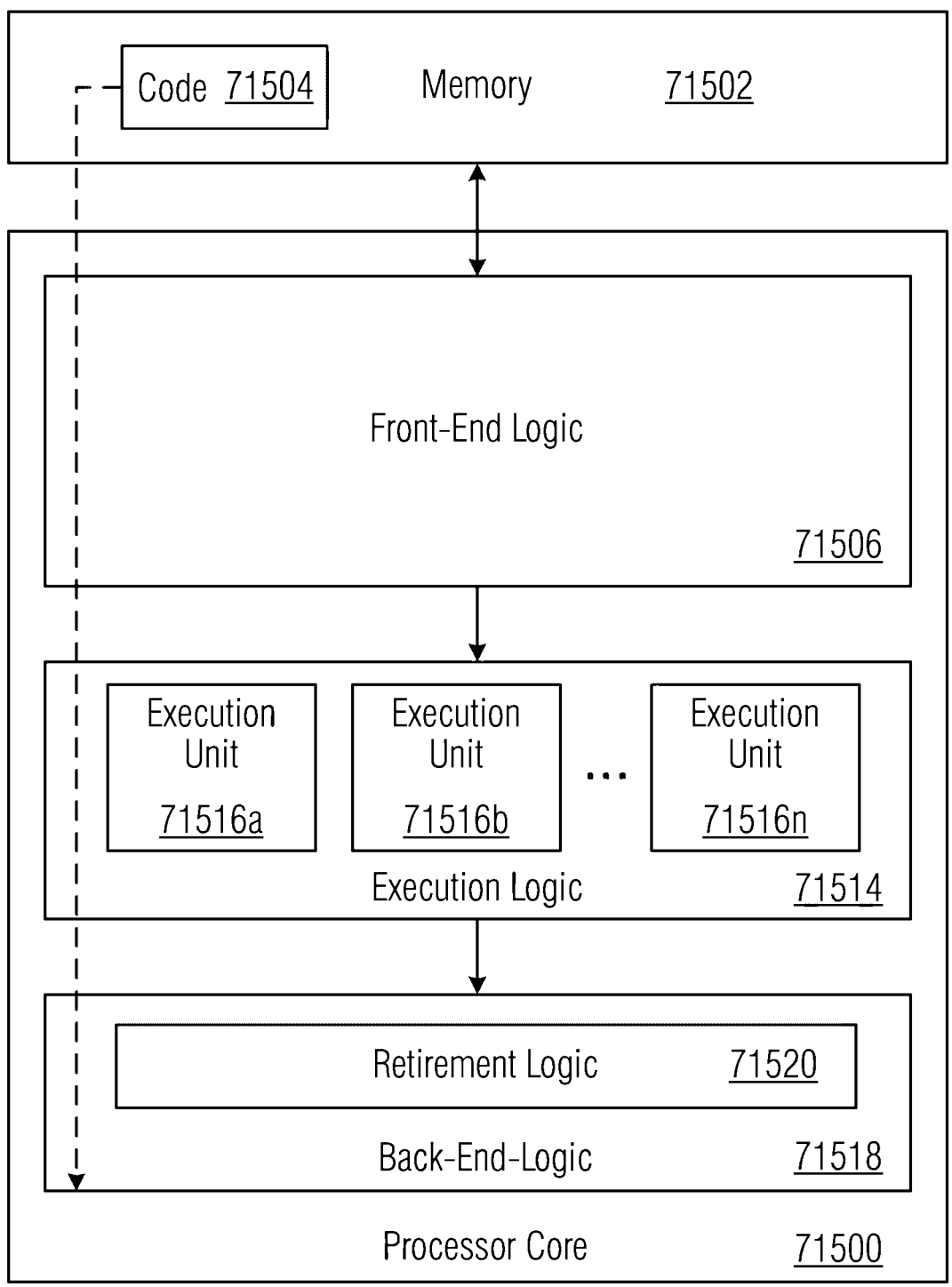
FIG. 7z is an example illustration of a processor according to an example.
Figure 7A:
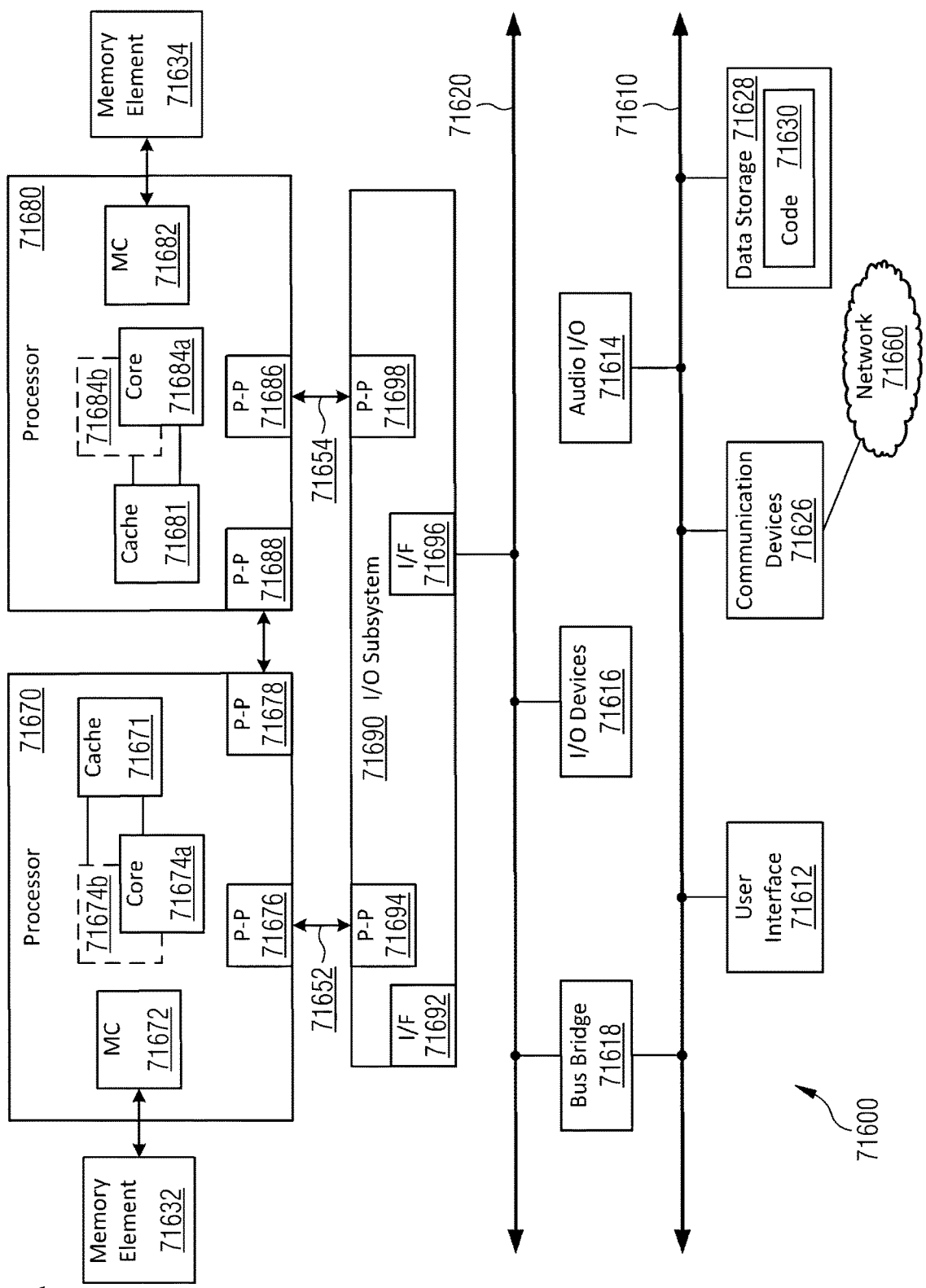

FIGS. 7z-7aa are block diagrams of example computer architectures that may be used in accordance with examples disclosed herein. For example, in some examples, a two-tier vapor chamber apparatus as described above may be used to cool a chip package, such as a SoC, containing one or more aspects shown in FIGS. 7z-7aa (e.g., the processor core 71500 of FIG. 7z or one or both of processors 71670, 71680 of FIG. 7aa). In some examples, the computer architecture may be implemented within a mobile device system, such as a mobile phone or table computer system. Other computer architecture designs known in the art for processors and computing systems may also be used. Generally, suitable computer architectures for examples disclosed herein can include, but are not limited to, configurations illustrated in FIGS. 7z-7aa.

FIG. 7z is an example illustration of a processor according to an example. Processor 71500 is an example of a type of hardware device that can be used in connection with the implementations above. Processor 71500 may be any type of processor, such as a microprocessor, an embedded processor, a digital signal processor (DSP), a network processor, a multi-core processor, a single core processor, or other device to execute code. Although only one processor 71500 is illustrated in FIG. 7z, a processing element may alternatively include more than one of processor 71500 illustrated in FIG. 7z. Processor 71500 may be a single-threaded core or, for at least one example, the processor 71500 may be multi-threaded in that it may include more than one hardware thread context (or "logical processor") per core.

FIG. 7z also illustrates a memory 71502 coupled to processor 71500 in accordance with an example. Memory 71502 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 71500 can execute any type of instructions associated with algorithms, processes, or operations detailed herein. Generally, processor 71500 can transform an element or an article (e.g., data) from one state or thing to another state or thing.

Code 71504, which may be one or more instructions to be executed by processor 71500, may be stored in memory 71502, or may be stored in software, hardware, firmware, or any suitable combination thereof, or in any other internal or external component, device, element, or object where appropriate and based on particular needs. In one example, processor 71500 can follow a program sequence of instructions indicated by code 71504. Each instruction enters a front-end logic 71506 and is processed by one or more decoders 71508. The decoder may generate, as its output, a micro operation such as a fixed width micro operation in a predefined format, or may generate other instructions, microinstructions, or control signals that reflect the original code instruction. Front-end logic 71506 also includes register renaming logic 71510 and scheduling logic 71512, which generally allocate resources and queue the operation corresponding to the instruction for execution.

Processor 71500 can also include execution logic 71514 having a set of execution units 71516a, 71516b, 71516n, etc. Some examples may include a number of execution units dedicated to specific functions or sets of functions. Other examples may include only one execution unit or one execution unit that can perform a particular function. Execution logic 71514 performs the operations specified by code instructions.

After completion of execution of the operations specified by the code instructions, back-end logic 71518 can retire the instructions of code 71504. In one example, processor 71500 allows out of order execution but requires in order retirement of instructions. Retirement logic 71520 may take a variety of known forms (e.g., re-order buffers or the like). In this manner, processor 71500 is transformed during execution of code 71504, at least in terms of the output generated by the decoder, hardware registers and tables utilized by register renaming logic 71510, and any registers (not shown) modified by execution logic 71514.

Although not shown in FIG. 7z, a processing element may include other elements on a chip with processor 71500. For example, a processing element may include memory control logic along with processor 71500. The processing element may include I/O control logic and/or may include I/O control logic integrated with memory control logic. The processing element may also include one or more caches. In some examples, non-volatile memory (such as flash memory or fuses) may also be included on the chip with processor 71500.

FIG. 7aa illustrates a computing system 71600 that is arranged in a point-to-point (PtP) configuration according to an example. In particular, FIG. 7aa shows a system where processors, memory, and input/output devices are interconnected by a number of point-to-point interfaces. Generally, one or more of the computing systems described herein may be configured in the same or similar manner as computing system 71500.

Processors 71670 and 71680 may also each include integrated memory controller logic (MC) 71672 and 71682 to communicate with memory elements 71632 and 71634. In alternative examples, memory controller logic 71672 and 71682 may be discrete logic separate from processors 71670 and 71680. Memory elements 71632 and/or 71634 may store various data to be used by processors 71670 and 71680 in achieving operations and functionality outlined herein.

Processors 71670 and 71680 may be any type of processor, such as those discussed in connection with other figures. Processors 71670 and 71680 may exchange data via a point-to-point (PtP) interface 71650 using point-to-point interface circuits 71678 and 71688, respectively. Processors 71670 and 71680 may each exchange data with a chipset 71690 via individual point-to-point interfaces 71652 and 71654 using point-to-point interface circuits 71676, 71686, 71694, and 71698. Chipset 71690 may also exchange data with a co-processor 71638, such as a high-performance graphics circuit, machine learning accelerator, or other co-processor 71638, via an interface 71639, which could be a PtP interface circuit. In alternative examples, any or all of the PtP links illustrated in FIG. 7*aa* could be implemented as a multi-drop bus rather than a PtP link.

Chipset 71690 may be in communication with a bus 71620 via an interface circuit 71696. Bus 71620 may have one or more devices that communicate over it, such as a bus bridge 71618 and I/O devices 71616. Via a bus 71610, bus bridge 71618 may be in communication with other devices such as a user interface 71612 (such as a keyboard, mouse, touchscreen, or other input devices), communication devices 71626 (such as modems, network interface devices, or other types of communication devices that may communicate through a computer network 71660), audio I/O devices 71616, and/or a data storage device 71628. Data storage device 71628 may store code 71630, which may be executed by processors 71670 and/or 71680. In alternative examples, any portions of the bus architectures could be implemented with one or more PtP links.

The computer system depicted in FIG. 7*aa* is a schematic illustration of an example of a computing system that may be utilized to implement various examples discussed herein. It will be appreciated that various components of the system depicted in FIG. 7*aa* may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

In some examples, a system includes a chip package and a cooling apparatus coupled to the chip package. The chip package includes one or more processors, and the cooling apparatus includes a first cavity defined at least partially by a first metal wall and a second metal wall and a second cavity defined at least partially by a flat third metal wall and the second metal wall. An internal pressure of the first cavity is lower than an ambient pressure outside the sealed first cavity. The second cavity includes a liquid disposed therein and wick material coupled to an interior surface of the third wall, and the chip package is positioned such that it coupled to the flat third metal wall of the cooling apparatus.

Further, it should be appreciated that the examples presented above are non-limiting examples provided merely for purposes of illustrating certain principles and features and not necessarily limiting or constraining the potential examples of the concepts described herein. For instance, a variety of different examples can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

In general, one aspect of the subject matter described in this specification can be embodied in methods and executed instructions that include or cause the actions of identifying a sample that includes software code, generating a control flow graph for each of a plurality of functions included in the sample, and identifying, in each of the functions, features corresponding to instances of a set of control flow fragment types. The identified features can be used to generate a feature set for the sample from the identified features.

These and other examples can each optionally include one or more of the following features. The features identified for each of the functions can be combined to generate a consolidated string for the sample and the feature set can be generated from the consolidated string. A string can be generated for each of the functions, each string describing the respective features identified for the function. Combining the features can include identifying a call in a particular one of the plurality of functions to another one of the plurality of functions and replacing a portion of the string of the particular function referencing the other function with contents of the string of the other function. Identifying the features can include abstracting each of the strings of the functions such that only features of the set of control flow fragment types are described in the strings. The set of control flow fragment types can include memory accesses by the function and function calls by the function. Identifying the features can include identifying instances of memory accesses by each of the functions and identifying instances of function calls by each of the functions. The feature set can identify each of the features identified for each of the functions. The feature set can be an n-graph.

Further, these and other examples can each optionally include one or more of the following features. The feature set can be provided for use in classifying the sample. For instance, classifying the sample can include clustering the sample with other samples based on corresponding features of the samples. Classifying the sample can further include determining a set of features relevant to a cluster of samples.

Classifying the sample can also include determining whether to classify the sample as malware and/or determining whether the sample is likely one of one or more families of malware. Identifying the features can include abstracting each of the control flow graphs such that only features of the set of control flow fragment types are described in the control flow graphs. A plurality of samples can be received, including the sample. In some cases, the plurality of samples can be received from a plurality of sources. The feature set can identify a subset of features identified in the control flow graphs of the functions of the sample. The subset of features can correspond to memory accesses and function calls in the sample code.

While this specification contains many specific implementation details, these should not be construed as limitations on the scope of any inventions or of what may be claimed, but rather as descriptions of features specific to particular examples of particular inventions. Certain features that are described in this specification in the context of separate examples can also be implemented in combination in a single example. Conversely, various features that are described in the context of a single example can also be implemented in multiple examples separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the examples described above should not be understood as requiring such separation in all examples, and it should be understood that the described program components and systems can generally be integrated together in a single software product or packaged into multiple software products.

The following detailed description sets forth examples of apparatuses, methods, and systems may relate to enabling a vapor chamber and means of attachment.

The terms "over," "under," "below," "between," and "on" as used herein may refer to a relative position of one layer or component with respect to other layers or components. For example, one layer or component disposed over or under another layer or component may be directly in contact with the other layer or component or may have one or more intervening layers or components. Moreover, one layer or component disposed between two layers or components may be directly in contact with the two layers or components or may have one or more intervening layers or components. In contrast, a first layer or first component "directly on" a second layer or second component is in direct contact with that second layer or second component. Similarly, unless explicitly stated otherwise, one feature disposed between two features may be in direct contact with the adjacent features or may have one or more intervening layers.

Implementations of the examples disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the examples disclosed herein. In some implementations, the semiconductor substrate (e.g. semiconductor die) may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the examples disclosed herein.

In the detailed description, reference is made to the accompanying drawings that form a part hereof wherein like numerals designate like parts throughout, and in which is shown, by way of illustration, examples that may be practiced. It is to be understood that other examples may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one example" or "an example" in the present disclosure means that a particular feature, structure, or characteristic described in connection with the example is included in at least one example. The appearances of the phrase "in one example" or "in an example" are not necessarily all referring to the same example. The appearances of the phrase "for example," "in an example," or "in some examples" are not necessarily all referring to the same example.

Figure 8A:
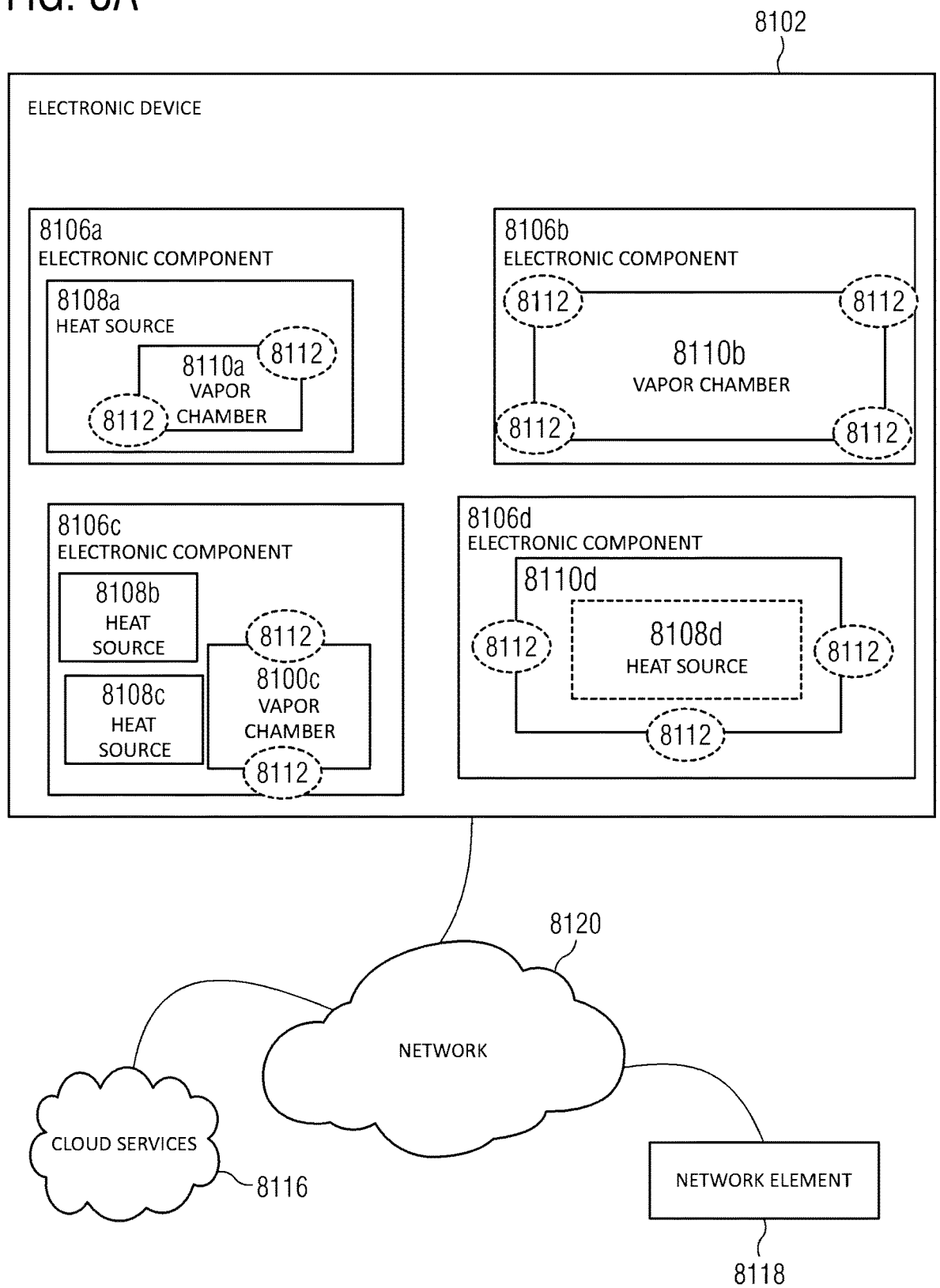
FIG. 8a is a simplified block diagram of a system to enable a vapor chamber and means of attachment, in accordance with an example of the present disclosure.

Turning to FIG. 8*a*, FIG. 8*a* is a simplified block diagram of an electronic device 8102 configured with a vapor chamber and means of attachment, in accordance with an example of the present disclosure. In an example, electronic device 8102 can include one or more electronic components 8106. For example, as illustrated in FIG. 8*a*, electronic device 8102 includes electronic components 8106*a*-8106*d*. Electronic component 8106*a* can include heat source 8108*a* and vapor chamber 8110*a*. Vapor chamber 8110*a* can be coupled to heat source 8108*a* using vapor chamber securing means 8112. Electronic component 8106*b* can include vapor chamber 8110*b*. Vapor chamber 8110*b* can be coupled to electronic component 8106*b* using vapor chamber securing means 8112. Electronic component 8106*c* can include heat sources 8108*b* and 8108*c* and vapor chamber 8110*c*. Vapor chamber 8110*c* can be coupled to electronic component 8106*c* using vapor chamber securing means 8112. Vapor chamber 8110*c* can be thermally coupled to heat source 8108*c*. Heat source 8108*b* may not be coupled to a vapor chamber. Electronic element 8106*d* can include heat source

8108*d* and vapor chamber 8110*d*. Vapor chamber 8110*d* can be over heat source 8108*d* and coupled to electronic component 8106*d* using vapor chamber securing means 8112. Each of heat sources 8108*a*-8108*d* may be a heat generating device (e.g., processor, logic unit, field programmable gate array (FPGA), chip set, integrated circuit (IC), a graphics processor, graphics card, battery, memory, or some other type of heat generating device).

Each of vapor chambers 8110*a*-8110*d* can include one or more braided column structures and/or one or more braided wick structures. To create the vapor chamber, columns and/or wicks in the vapor chamber can be made using a braided fiber where fiber strands are braided together. In a specific example, the braided fiber is a braided copper fiber. In other example, the braided fiber is a braided titanium fiber or some other braided thermal conductivity fiber material. The fiber strands in the braided fiber help to provide a capillary path for the liquid in the vapor chamber and help to provide support for the top and bottom plates of the vapor chamber. Using braided fiber can help to reduce the vapor chamber manufacturing time by using premade columns and wicks that include fiber strands. In addition, the braided fiber helps to reduce the weight of the columns to the vapor chamber.

Each of vapor chambers 8110*a*-8110*d* can be coupled to an electronic component (e.g., vapor chamber 8110*b* coupled to electronic component 8106*b*) and/or an electronic element (e.g., vapor chamber 8110*a* coupled to heat source 8108*a*) using vapor chamber securing means 8112. For example, as illustrated in FIG. 8*a*, vapor chamber 8110*a* is coupled to heat source 8108*a* using two (2) vapor chamber securing means 8112, vapor chamber 8110*b* is coupled to electronic component 8106*b* using four (4) vapor chamber securing means 8112, vapor chamber 8110*c* is coupled to electronic component 8106*c* using two (2) vapor chamber securing means 8112, and vapor chamber 8110*d* is coupled to electronic component 8106*d* using three (3) vapor chamber securing means 8112.

Each of vapor chamber securing means 8112 may be a helicoidal washer that can limit a maximum axial load and help to prevent overtightening. Because of the design of vapor chamber securing means 8112, vapor chamber securing means 8112 starts to yield when the required load is achieved as a vapor chamber is secured to an electronic component (e.g., electronic component 8106*b*) and/or an electronic element (e.g., heat source 8108*a*). In addition, the configuration of vapor chamber securing means 8112 can allow for the accommodation of flatness variations of the electronic component and/or an electronic element. In an example, an outer edge of vapor chamber securing means 8112 can be soldered to the vapor chamber in a dimple, cavity, recess, etc. that can help to reduce system thickness, or Z-stack height. The term "Z stack height," "Z height," "Z location," etc. refers to the height along the "Z" axis of an (x, y, z) coordinate axis or cartesian coordinate system.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one example" or "an example" in the present disclosure means that a particular feature, structure, or characteristic described in connection with the example is included in at least one example. The appearances of the phrase "in one example" or "in an example" are not necessarily all referring to the same example.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance and form factor of devices as devices and systems are expected to increase performance and function while having a relatively thin profile. However, the increase in performance and/or function causes an increase in the thermal challenges of the devices and systems. For example, in some devices, it can be difficult to cool a particular heat source. One way to cool a heat source is to use a vapor chamber. A vapor chamber may be a planar heat pipe that includes a hermetically sealed hollow vessel, a working fluid, and a closed-loop capillary recirculation system. The vapor chamber works on the principle of phase change of liquid which helps in increasing the heat transfer.

The vapor chamber may be made from a top copper plate and a bottom copper plate with an internal wick structure. As heat is applied to the vapor chamber from a heat source, water, or some other fluid inside the vapor chamber, boils and turns to a gas, which then travels to the colder region of the vapor chamber. From the colder region of the vapor chamber, the heat is dissipated where it condenses back to a liquid. The heat is dissipated through an external heat exchanger, heat pipe, or some other thermal system for dissipating heat. The evaporating and condensing of the water forms a pumping action to move the water or other fluid (and thus the heat) from the area of the heat source to other areas of the vapor chamber. There are various types of wick structure that can be used within the vapor chamber but often vapor chambers are classified as powder or mesh. In both cases, the powder or mesh line copper plate surfaces to allow water to flow within the area of the vapor chamber. Typically, copper columns are used throughout the vapor chamber to support the plates that act as the top and bottom of the vapor chamber.

The columns may be pillar like structures that are attached to a top plate and/or a bottom plate through a sintering process. This requires high sintering time and increases manufacturing time of vapor chamber because the sintering process generally takes a relatively long time and must be done slowly. In addition, the process of forged or sintered columns adds weight to the vapor chamber as the columns may be relatively thick copper blocks.

Vapor chambers, like heat pipes, might not actually dissipate the heat to the environment but serve to move heat efficiently within a thermal system. Typical thermal conductivity of a vapor chamber may range from 3000-10000 W/m-K. However, the cost of a vapor chamber can be relatively high due to the multiple steps involved in the manufacturing process of vapor chambers (e.g., plate cutting per need followed by wick sintering, pillar sintering, end welds, liquid charging, and vacuum sealing, etc.).

For example, thin vapor chambers are manufactured using the two-plate approach where two copper plates 0.1-0.2 mm thick with wicks attached to the copper plates are placed on top of each other and separated by columns. These columns provide mechanical strength to the vapor chamber as well as capillary action for the liquid to return towards the heat source. The columns are made from powdered copper sintered on the thin plates and both the plates are then sprayed or filled with copper powder or mesh and sintered. This forms the capillary path for the fluid on the top and bottom plate. These columns can be made as a corrugated sheet of columns or from powdered copper sintered to one of the plates. The corrugated sheet of columns adds weight to the vapor chamber and powdered copper columns increases manufacturing time due to the long sintering operation.

The sintering process takes around twenty-four (24) hours which can be a relatively long time in a mass production manufacturing process. This also increases the cost and manufacturing time of the vapor chamber. In general, the vapor chamber cost can be split as material being about twenty-five percent (25%) of the total cost, labor being about twenty-five percent (25%) of the total cost, manufacturing being about twenty percent (20%) of the total cost, amortization and others-factors being about fifteen percent (15%) of the total cost, and yield loss being about fifteen percent (15%) of the total cost. Yield losses are due to flatness variations, leakage, cosmetics issues (e.g., dents and bends), brazing issues, etc. Yield loss can be around twenty percent (20%) of the total cost for a one (1) mm vapor chamber and about thirty percent (30%) of the total cost for a 0.6 mm vapor chamber. What is needed is a means, system, apparatus, method, etc. to help reduce the manufacturing time of the vapor chamber as well as help to reduce the weight of the vapor chamber.

In addition, while use of the vapor chamber as a passive cooling system in mobile products is rising, the vapor chamber manufacturing tolerances are quite big, and therefore there is a risk that the vapor chamber bondline will be unloaded which can cause poor thermal performance, or will be loaded uneven or too high which can cause cracks in the structure that is bonded to the vapor chamber. In some examples, a separate soldered pedestal is used to help secure the vapor chamber to a printed circuit board (PCB) and/or over the heat source. A separate soldered pedestal is not a good solution, because it can increase die area thickness and thereby the device total thickness. In addition, soldered pedestal tolerances are not tight and often are +/−0.05 mm after milling and +/−0.10 mm after soldering. The pedestal cannot be milled after soldering because it will break the weak mesh and skin bonding of the vapor chamber. Further, due to tolerance variations, all parts have to be measured manually and that can be an expensive process and cause low yields which is not good for mass production. Also, the pedestal can increase the stiffness locally, which makes the required tolerance window even tighter. In addition, separate soldered parts between the heat source and the vapor chamber can decrease thermal performance. In some examples, there may be tall components between the PCB and screw attachment. In these examples, the pedestal and the standoff support frame have to be different elements, which makes the Z-tolerance even worst and can be about +/−0.20 mm. What is needed is a means, system, apparatus, method, etc. of securing the vapor chamber to a PCB that can help to limit the maximum axial load and help prevent overtightening.

A system to enable a vapor chamber and means of attachment, as outlined in FIG. 8*a*, can resolve these issues (and others). In an example, a vapor chamber with a braided structure can help to reduce the vapor chamber cost by reducing the manufacturing time. Fiber strands may be used to create one or more braided column structures and/or one or more braided wick structures of the vapor chamber. The one or more braided column structures and/or one or more braided wick structures can be attached to the vapor chamber top and bottom plates. The one or more braided column structures and/or one or more braided wick structures can be premade separately before the vapor chamber manufacturing process, thereby reducing manufacturing time of the vapor chamber. Also, the vapor chamber can be coupled to a PCB using a helicoidal washer that can limit the maximum axial load and help to prevent damage from overtightening. Because of the design of the washer, the washer starts to yield when the required load is achieved. In addition, the configuration of the washer can allow for the accommodation of flatness variations.

In an example, to create the vapor chamber, wick and columns in the vapor chamber can be made using copper fiber where copper fiber strands are braided together. In some examples, titanium fiber strands are braided together or some other thermally conductivity fiber material may be braided together. This braided structure can be brazed to the top plates and bottom plates of the vapor chamber. The term "brazed" includes attaching of the fiber braid strands through welding, soldering, sintering the copper fiber strand to the top plate of vapor chamber. In another example, the pillar structure can also be manufactured through a punching process, a forging process, a forming process, or a metal etching process. The fiber strands can provide a capillary path for the vapor chamber and add stiffness to the top and bottom plates and help to keep the vapor chamber from collapsing.

Using braided copper fiber can help to reduce the vapor chamber manufacturing time by using already available columns and wicks in form of a fiber braid. In addition, the braided copper fiber helps to reduce the weight of the copper columns. Also, the fiber wick structure shows better thermal performance compared to sintered and composite wick structures.

More specifically, the column structure and wick structure can be made in the form of fiber braids. For the columns, the fiber braids can be pre-made before the vapor chamber is manufactured and cut into required height as per thickness of vapor chamber. The fiber braids can then be placed in between the two plates of the vapor chamber and brazed together. The fiber braids can be made into long strands and cut into smaller elements as per need. This helps reduce the manufacturing time of the vapor chamber because during high volume manufacturing, the fiber braids can be cut to a desired height as per vapor chamber thickness. Also, the capillary performance of a fiber braid-based heat pipe can perform better than the capillary performance of a composite or sintered heat pipe.

In another example, an integrated column and wick structure can be made through the use of weaving copper fiber strands using the concept of knitting or through a process that is similar to what is done in cloth weaving. During the weaving process, knots can be provided at predetermined locations to act as columns. This process can integrate columns and wicks together and remove the sintering process involved in bonding copper columns to the wick. In yet another example, a perforated copper pillar can be achieved by various manufacturing techniques like chemical etching, stamping, forging, and/or punching operations in one of the plates of the vapor chamber.

The vapor chamber can be coupled to an electronic component, (e.g., electronic component 8106*b*), an electronic element (e.g., heat source 8108*a*), a PCB, motherboard, etc. using a vapor chamber securing means (e.g., vapor chamber securing means 8112). The vapor chamber securing means can be configured to limit the maximum axial load and help to prevent overtightening. The vapor chamber securing means may be a helicoidal washer with cutouts in order to mitigate the effects of high vertical loads and high tightening torque. The cutouts can be located in a transition area between a middle portion of the vapor chamber securing means and an outside portion of the vapor chamber securing means. In a specific example, the middle portion can include a screw boss that receives a threaded attachment means and the outside portion can include a flange that is soldered to the vapor chamber. The cutout can be radial or curved. If the cutout is curved, it can help to prevent screw/thread failure in an overtightening case. For example, if the cutout is curved, when the maximum tightening moment is achieved, the screw boss starts to lift to decrease load which can help to prevent a screw/thread failure.

In a specific example for a 0.20 mm and 0.40 mm copper washer construction of the vapor chamber securing means, the nominal axial target deformation is 0.25 mm, which leads to minimum tolerance deformation of 0.05 mm and maximum deformation of 0.45 mm. The force difference between minimum and maximum is 0.5 newtons (or about 0.112 pound force) for 0.20 mm thickness and two (2) newtons (or about 0.45 pound force) for 0.40 mm thickness. Thus, the variation force range is about ten percent (10%) of the total axial screw force. A thickness of 0.30 mm gives the total package load of about eight (8) pound force (or 35.59 newtons) to about nine (9) pound force (or about 40.03 newtons) with four screws and the maximum load is about ten (10) pound force (or about 44.48 newtons). The ultimate moment for an M1.2 screw is slightly over thirty (30) newton-mm, which can be achieved relatively easily in normal cases and the configuration of the vapor chamber securing means can help keep that moment from being be achieved. Overtightening up to twenty-five (25) newton-mm will cause some permanent deformation to the vapor chamber securing means, which can decrease axial load by about thirty percent (30%).

Vapor chamber securing means is not limited to only use with a vapor chamber. Similar elastic, plastic, or some other material with the configuration as the vapor chamber securing means can be milled or stamped to a heat pipe, cold plate, some other thermal element, or other component. If vapor chamber securing means is used with a cold plate, separate leaf springs are not needed. This allows for more freedom for board design, because screw locations for the cold plate can be determined relatively freely and do not have to be at the end of the leaf spring.

In an example implementation, electronic device 8102, is meant to encompass a computer, a personal digital assistant (PDA), a laptop or electronic notebook, a cellular telephone, an iPhone, a tablet, an IP phone, network elements, network appliances, servers, routers, switches, gateways, bridges, load balancers, processors, modules, or any other device, component, element, or object that includes a heat source. Electronic device 8102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 8102 may include virtual elements.

In regards to the internal structure, electronic device 8102 can include memory elements for storing information to be used in operations. Electronic device 8102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of nontransitory computer-readable media. In some of these instances, memory elements can store data used for operations described herein. This includes the memory elements being able to store software, logic, code, or processor instructions that are executed to carry out activities or operations.

Additionally, heat source 8104 may be or include one or more processors that can execute software or an algorithm. In one example, the processors can transform an element or an article (e.g., data) from one state or thing to another state or thing. In another example, activities may be implemented with fixed logic or programmable logic (e.g., software/computer instructions executed by a processor) and the heat elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Electronic device 8102 may be a standalone device or in communication with cloud services 8116 and/or one or more network elements 8118 using network 8120. Network 8120 represents a series of points or nodes of interconnected communication paths for receiving and transmitting packets of information. Network 8120 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 8120, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

Figure 8B:
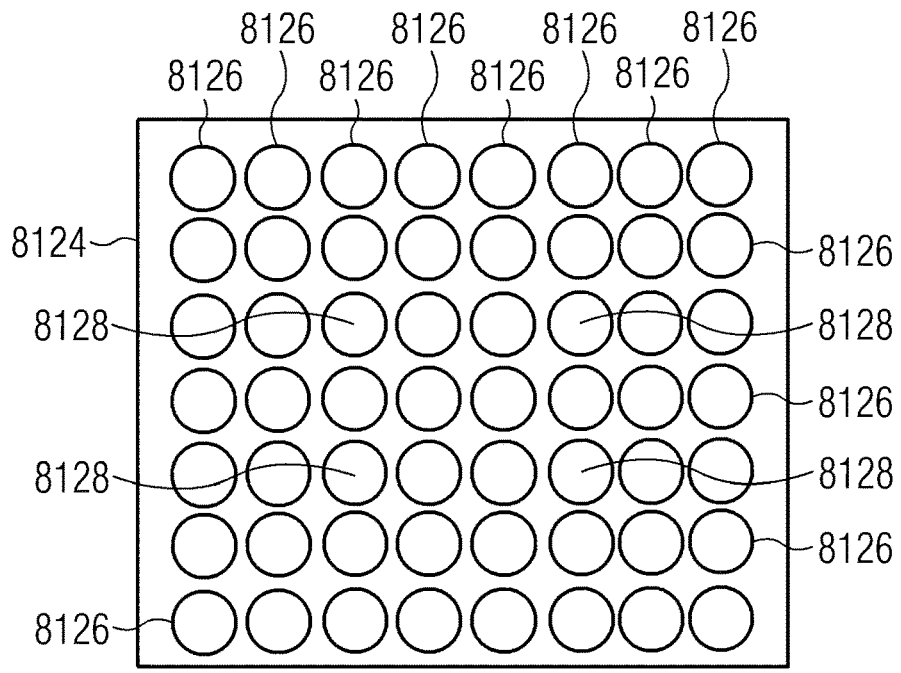
FIG. 8b is a simplified block diagram of a partial view of a system to enable a vapor chamber, in accordance with an example of the present disclosure.

Turning to FIG. 8*b*, FIG. 8*b* is a simplified block diagram of a portion of vapor chamber 8110*e*. Vapor chamber 8110*e* can include a bottom plate 8124 and one or more columns 8126. Columns 8126 are pillar or column like structures that help to provide mechanical strength to vapor chamber 8110*e* as well as provide capillary action for the liquid inside vapor chamber 8110*e*. Columns 8126 can be made of braided copper, braided titanium or some other braided material that can help to provide mechanical strength to vapor chamber 8110*e* as well as capillary action for the liquid inside vapor chamber 8110*e*. In an example, a plurality of columns 8126 can be arranged in a grid like pattern, for example as illustrated in FIG. 8*b*. In some examples, one or more support columns 8128 can be added to provide additional support. Support columns 8128 may be non-braided fiber columns that provide additional support for vapor chamber 8110*e*. In other examples, the plurality of columns 8126 and optionally one or more support columns 8128 can be arranged according to design constraints and/or other factors.

Figure 8C:
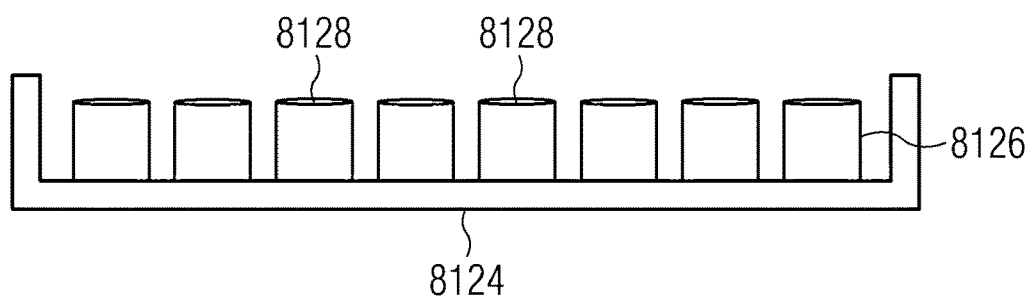
FIG. 8c is a simplified block diagram of a partial view of a system to enable a vapor chamber, in accordance with an example of the present disclosure.

Turning to FIG. 8*c*, FIG. 8*c* is a simplified block diagram cut away side view of a portion of vapor chamber 8110*e*. Vapor chamber 8110*e* can include a bottom plate 8124 and one or more columns 8126. In some examples, one or more support columns 8128 can be added to provide additional support to vapor chamber 8110*e*.

Figure 8D:
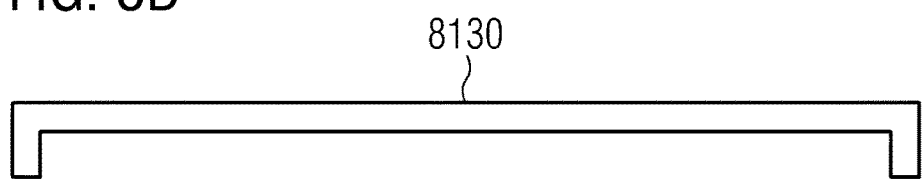
FIG. 8d is a simplified block diagram of a partial view of a system to enable a vapor chamber, in accordance with an example of the present disclosure.

Turning to FIG. 8*d*, FIG. 8*d* is a simplified block diagram of a portion of vapor chamber 8110*e*. Vapor chamber 8110*e* can include a top plate 8130. In some examples, instead of bottom plate 8124 including one or more columns 8126, as illustrated in FIGS. 8*b* and 8*c*, one or more columns 8126 may be on top plate 8130. In addition, top plate 8130 can include one or more support columns 8128 to provide additional support to vapor chamber 8110*e*.

Figure 8E:
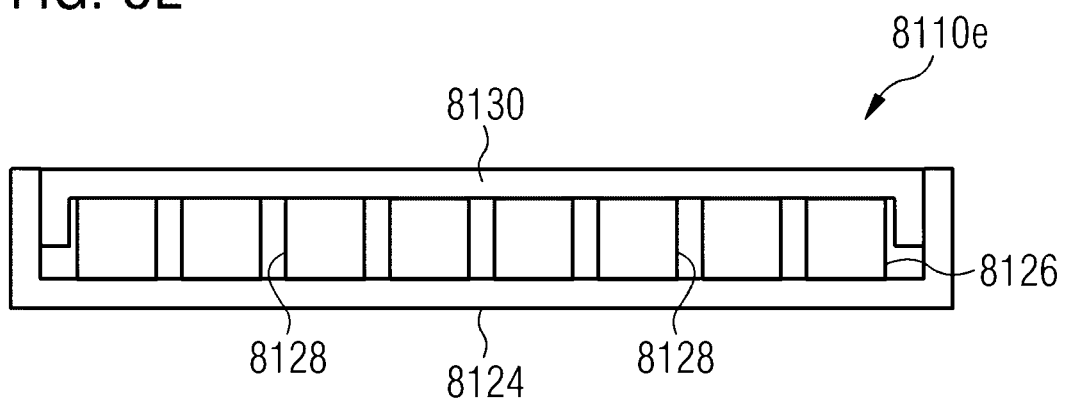
FIG. 8e is a simplified block diagram of a partial view of a system to enable a vapor chamber, in accordance with an example of the present disclosure.

Turning to FIG. 8*e*, FIG. 8*e* is a simplified block diagram of vapor chamber 8110*e*. Vapor chamber 8110*e* can include bottom plate 8124, one or more columns 8126, and top plate 8130. Vapor chamber 8110*e* can be created by securing bottom plate 8124 to top plate 8130.

In an example, bottom plate 8124 is secured to top plate 8130 using a brazing process, soldering process, sintering process, or by direct punching, forming, or forging methods. In some examples, one or more support columns 8128 can be added to provide additional support to vapor chamber 8110*e*.

Figure 8F:
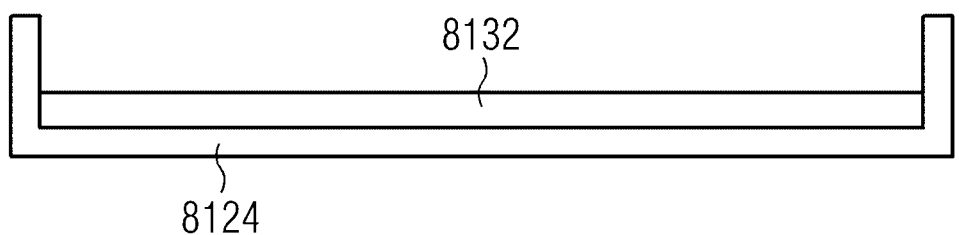
FIG. 8f is a simplified block diagram of a partial view of a system to enable a vapor chamber, in accordance with an example of the present disclosure.

Turning to FIG. 8*f*, FIG. 8*f* is a simplified block diagram of a portion of vapor chamber 8110*f*. Vapor chamber 8110*f* can include bottom plate 8124 and wick 8132. Wick 8132 can be made using copper fiber where copper fiber strands are braided together, titanium fiber where titanium fibers are braided together, or some other some other conductivity fiber strands that are braided together. In other examples, wick 8132 may be made of a mesh structure.

Figure 8G:
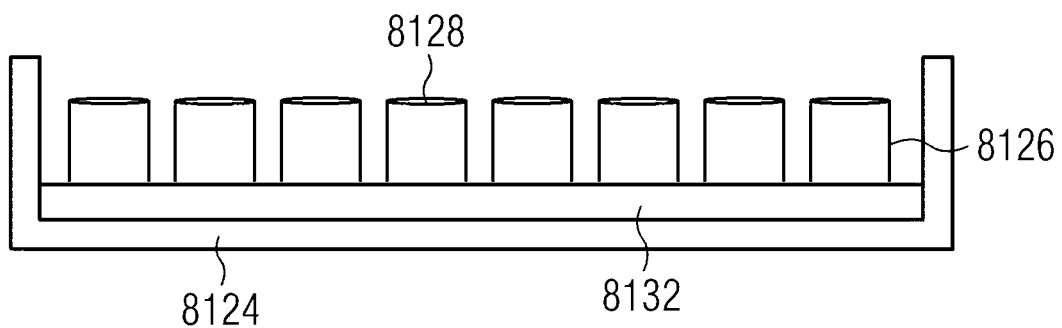
FIG. 8g is a simplified block diagram of a partial view of a system to enable a vapor chamber, in accordance with an example of the present disclosure.

Turning to FIG. 8*g*, FIG. 8*g* is a simplified block diagram of a portion of vapor chamber 8110*f*. As illustrated in FIG. 8*g*, a plurality of columns 8126 can be secured to wick 8132.

In an example, the plurality of columns 8126 are secured to wick 8132 by attaching the fiber braid strands through welding, soldering, sintering the copper fiber strand to the top plate of vapor chamber, etc. In some examples, wick 8132 is configured as a fine mesh structure and the mesh can also be a knotted structure where the knots can act as pillars. In some examples, one or more support columns 8128 can be added to provide additional support.

Figure 8H:
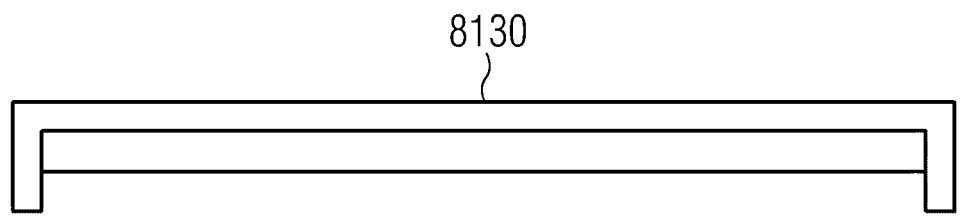
FIG. 8h is a simplified block diagram of a partial view of a system to enable a vapor chamber, in accordance with an example of the present disclosure.

Turning to FIG. 8*h*, FIG. 8*h* is a simplified block diagram of a portion of vapor chamber 8110*f*. Vapor chamber 8110*f* can include a top plate 8130 and wick 8132. In some examples, instead of bottom plate 8124 including one or more columns 8126, as illustrated in FIG. 8*g*, one or more columns 8126 may be on top plate 8130. In addition, top plate 8130 can include one or more support columns 8128 to provide additional support to vapor chamber 8110*f*.

Figure 8I:
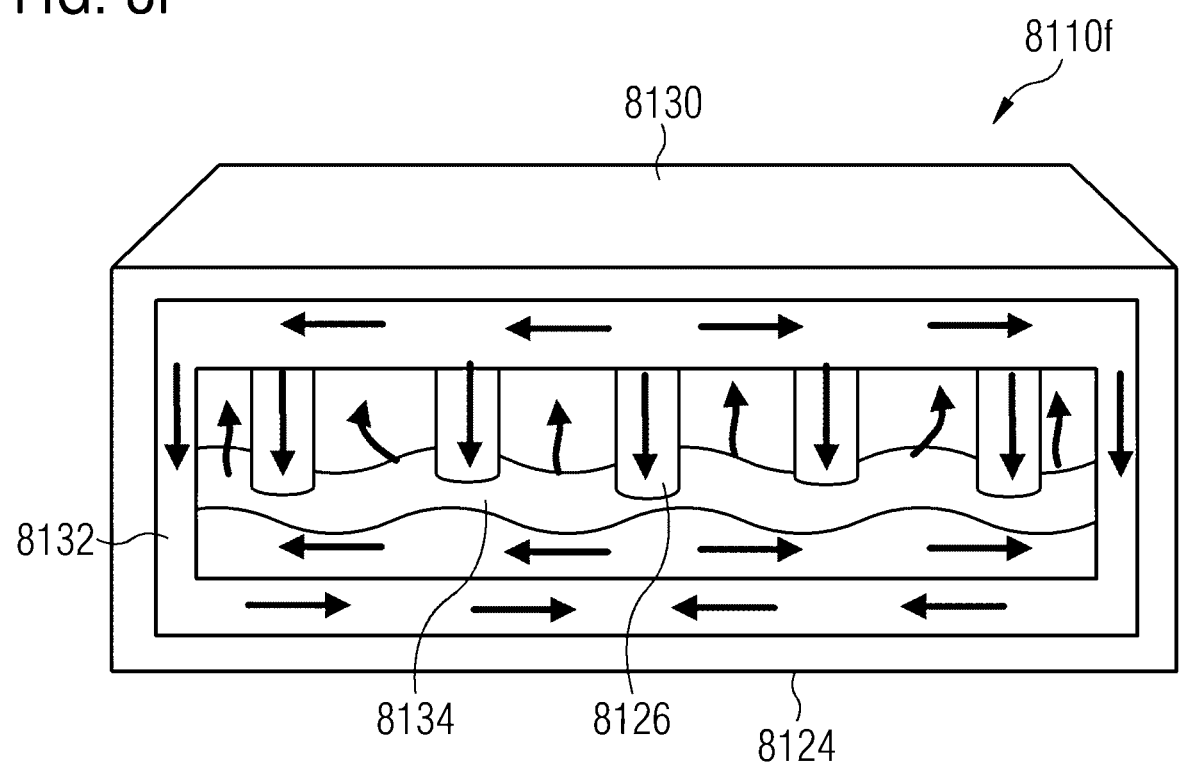
FIG. 8i is a simplified block diagram of a partial view of a vapor chamber, in accordance with an example of the present disclosure.

Turning to FIG. 8*i*, FIG. 8*i* is a simplified block diagram of vapor chamber 8110*f*. Vapor chamber 8110*f* can include a bottom plate 8124, one or more columns 8126, top plate 8130, wick 8132, and fluid 8134. Fluid 8134 can be water. Vapor chamber 8110*f* can be created by securing bottom plate 8124 to top plate 8130. Columns 8126 can help to provide mechanical strength to vapor chamber 8110*f* as well as capillary action for the liquid inside vapor chamber 8110*f*. In some examples, one or more support columns 8128 can be added to provide additional support to vapor chamber 8110*f*.

In an example, at a hot interface of vapor chamber 8110*f* (e.g., the area where the outer wall of bottom plate 8124 is proximate to a heat source) fluid 8134 turns into a vapor by absorbing heat from bottom plate 8124. The vapor then travels through vapor chamber 8110*f* to a cooler interface (e.g., top plate 8130), condenses back into fluid 8134, and releases heat to the cooler interface. Fluid 8134 then returns to the hot interface through capillary action, centrifugal force, gravity, etc. and the cycle repeats.

Figure 8J:
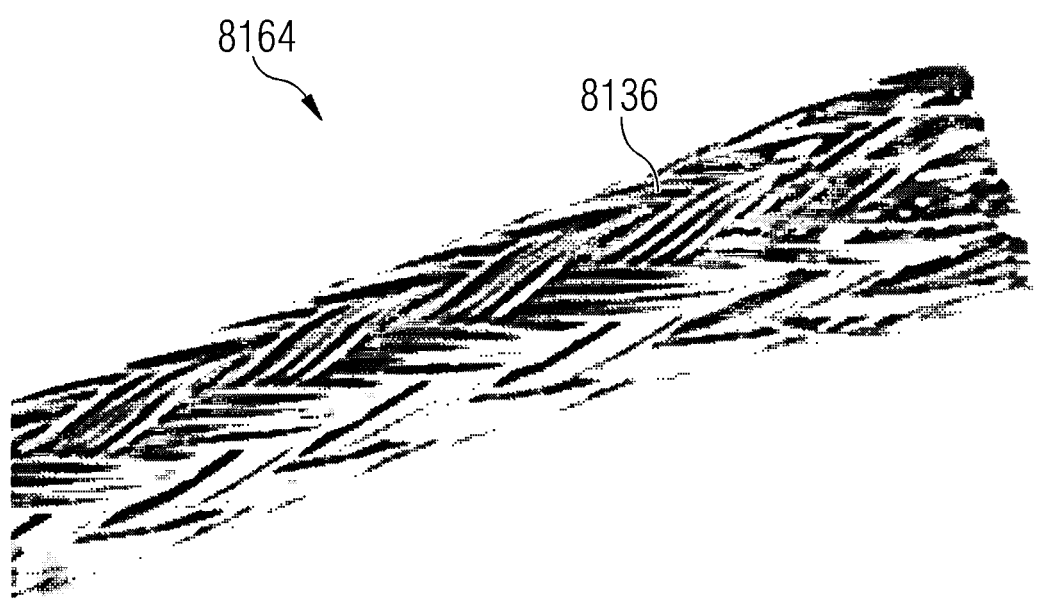
FIG. 8j is a simplified diagram of a partial perspective view of a system to enable a vapor chamber, in accordance with an example of the present disclosure.

Turning to FIG. 8*j*, FIG. 8*j* is a simplified block diagram of a portion of a fiber braid 8164. Fiber braid 8164 can include fiber strands 8136. Fiber strands 8136 may be braided copper fiber, braided titanium fiber, or some other braided thermal conductivity fiber material. In an example, fiber strands 8136 are braded or woven together to create fiber braid 8164. Fiber braid 8164 can be brazed to the bottom and/or the top of the vapor chamber, as illustrated in FIGS. 8*e* and 8*i*, to create one or more columns 8126 and/or one or more wicks 8132. Fiber strands 8136 in fiber braid 8164 help to provide a capillary path for the fluid in vapor chamber and add support to the top plate and the bottom plate of the vapor chamber.

Fiber braid 8164 can help to reduce the weight of column 8126 and/or wick 8132. Also, using fiber strands 8136 to create a fiber wick structure for column 8126 and/or wick 8132 allows for a better thermal performance compared to sintered and composite wick structures. In addition, using fiber braid 8164 can help to reduce the vapor chamber manufacturing time by using already available wick and columns in form of fiber braid 8164. For example, fiber braid 8164 can be made before the manufacturing of the vapor chamber and then cut to the required height per the thickness of a vapor chamber.

Figure 8K:
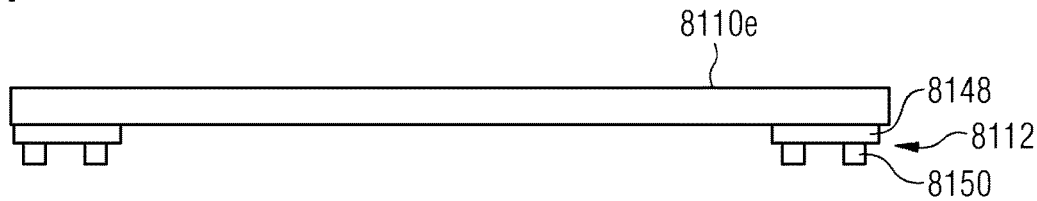
FIG. 8k is a simplified block diagram view of a system to enable a vapor chamber and means of attachment, in accordance with an example of the present disclosure.

Turning to FIG. 8*k*, FIG. 8*k* is a simplified block diagram of a vapor chamber 8110*e*. In an example, one or more vapor chamber securing means 8112 can be secured to vapor chamber 8110*e*. Vapor chamber securing means 8112 can include a flange 8148 and one or more spring arms 8150. Flange 8148 can be soldered to vapor chamber 8110*e*.

Figure 8L:
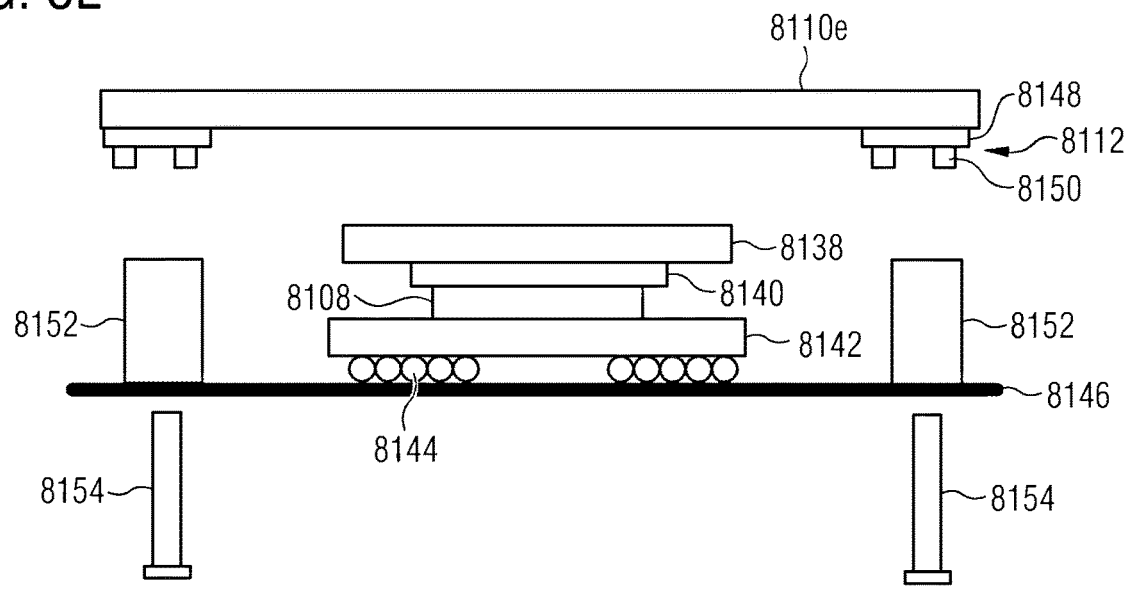
FIG. 8l is a simplified block diagram of a partial view of a system to enable a vapor chamber and means of attachment, in accordance with an example of the present disclosure.

Turning to FIG. 8*l*, FIG. 8*l* is a simplified block diagram of vapor chamber 8110*e* over a heat source 8108. As illustrate in FIG. 8*l*, one or more vapor chamber securing means 8112 can be secured to vapor chamber 8110*e*. Vapor chamber securing means 8112 can include flange 8148 and one or more spring arms 8150.

Heat source 8108 can be on a substrate 8142 and substrate 8142 can be secured to a PCB 8146 using a solder ball grid array 8144. A thermal interface material (TIM) 8140 can be over heat source 8108. If there will be a gap between vapor chamber 8110*e* and TIM 8140 when vapor chamber 8110*e* is secured to PCB 8146, a pedestal 8138 can be configured to close the gap. Pedestal 8138 may also be used to add stiffness to vapor chamber 8110*e* and to help provide a uniform pressure on heat source 8108 from vapor chamber 8110*e*. A riser 8152 can extend from PCB 8146 to help coupled vapor chamber 8110*e* over heat source 8108. Riser 8152 can account for the height of solder ball grid array 8144, substrate 8142, heat source 8108, TIM 8140, and pedestal 8138, if pedestal 8138 is present. An attachment means 8154 can be used to couple with vapor chamber securing means 8112 to help secure vapor chamber 8110*e* over heat source 8108.

Figure 8M:
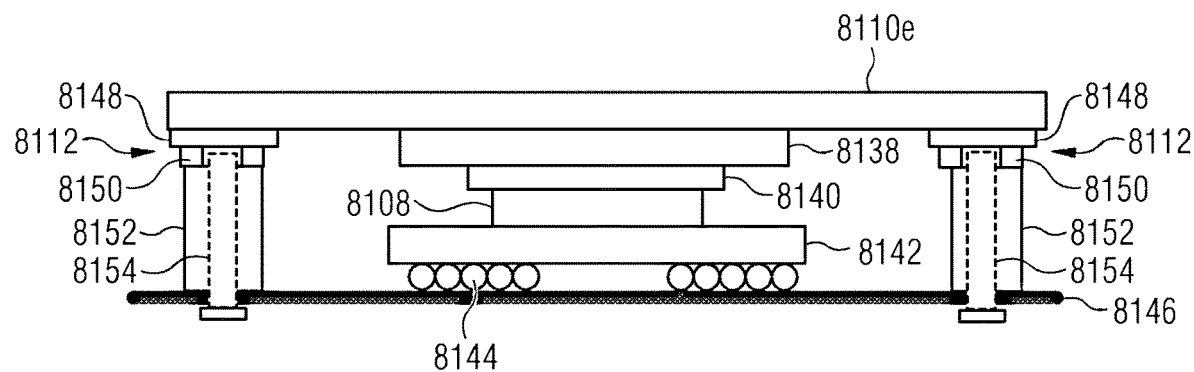
FIG. 8m is a simplified block diagram of a partial view of a system to enable a vapor chamber and means of attachment, in accordance with an example of the present disclosure.

Turning to FIG. 8*m*, FIG. 8*m* is a simplified block diagram of a portion of an electronic device that includes vapor chamber 8110*e* over heat source 8108. As illustrate in FIG. 8*m*, vapor chamber 8110*e* can be secured over heat source 8108 using vapor chamber securing means 8112. Vapor chamber securing means 8112 can include flange 8148 and one or more spring arms 8150. Flange 8148 can be coupled to vapor chamber 8110*e*.

TIM 8140 can be between heat source 8108 and vapor chamber 8110*e*. If there is a gap between vapor chamber 8110*e* and TIM 8140, pedestal 8138 can be configured to close the gap. Heat source 8108 can be on a substrate 8142 and substrate 8142 can be secured to PCB 8146 using solder ball grid array 8144. Vapor chamber securing means 8112 can be coupled to vapor chamber 8110*e* and attachment means 8154 can extend through PCB 8146 and coupled with vapor chamber securing means 8112 to help secure vapor chamber 8110*e* over heat source 8108. Riser 8152 can extend from PCB 8146 to vapor chamber securing means 8112 (more specifically, to spring arms 8150 of vapor chamber securing means 8112) and surround attachment means 8154. Riser 8152 can account for the height of solder ball grid array 8144, substrate 8142, heat source 8108, TIM 8140, and pedestal 8138, if pedestal 8138 is present.

Figure 8N:
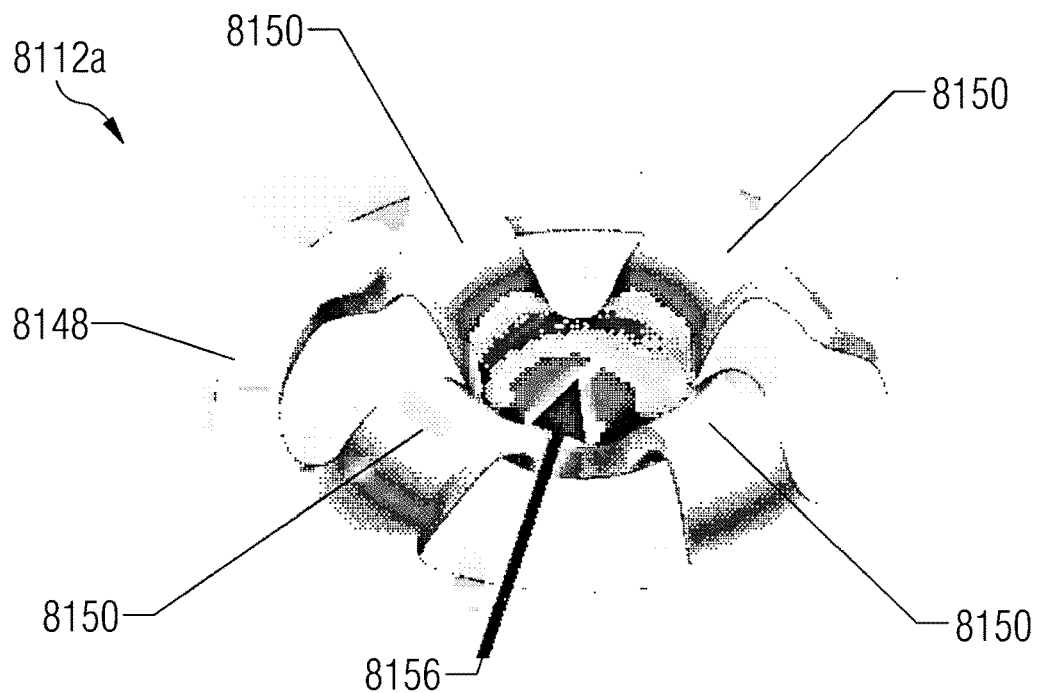
FIG. 8n is a simplified diagram of a partial view of a system to enable a vapor chamber and means of attachment, in accordance with an example of the present disclosure.
Figure 8O:
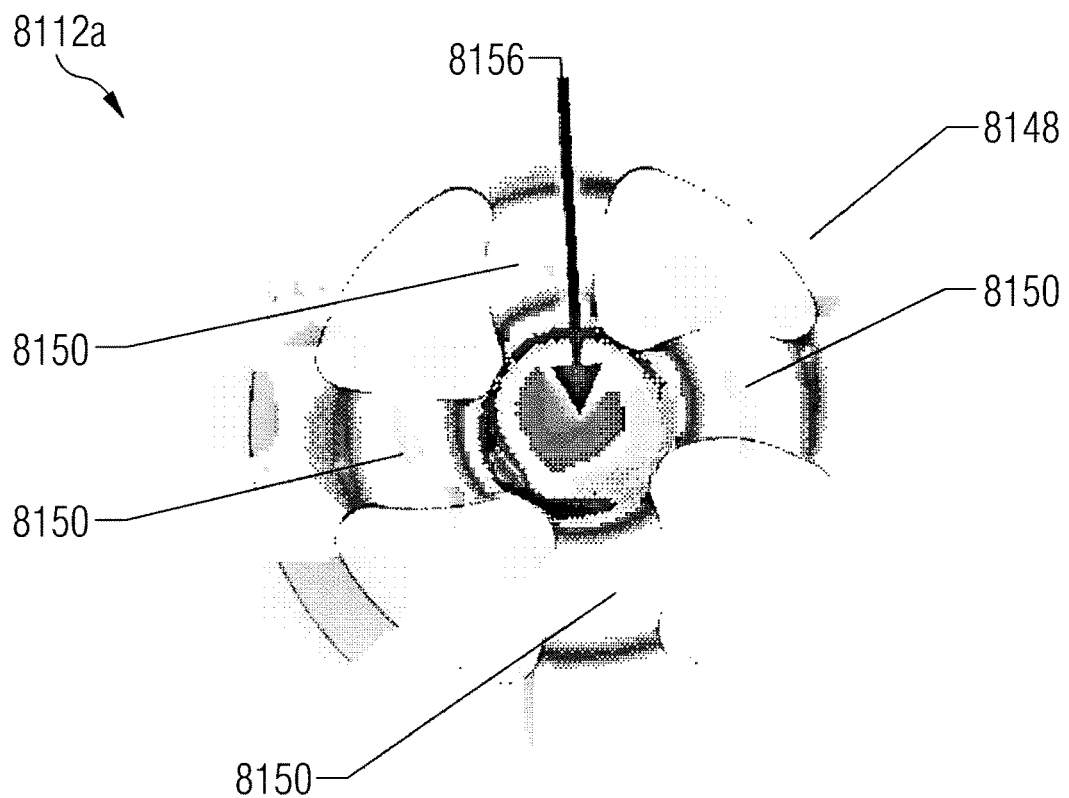
FIG. 8o is a simplified diagram of a partial view of a system to enable a vapor chamber and means of attachment, in accordance with an example of the present disclosure.

Turning to FIGS. 8*n* and 8*o*, FIGS. 8*n* and 8*o* are a simplified diagram of vapor chamber securing means 8112*a*. Vapor chamber securing means 8112*a* can include flange 8148 and plurality of spring arms 8150. For example, as illustrated in FIGS. 8*n* and 8*o*, vapor chamber securing means 8112*a* includes four (4) spring arms 8150. Spring arms 8150 can extend from flange 8148 to a middle portion 8156 of vapor chamber securing means 8112*a*. Middle portion 8156 can include an attachment mechanism that allows attachment means 8154 to couple with vapor chamber securing means 8112*a*. For example, if attachment means 8154 is a screw or threaded fastener, then middle portion 8156 can include threads that allow attachment means 8154 to be screwed or threaded into middle portion 8156 and couple with vapor chamber securing means 8112*a*.

Figure 8P:
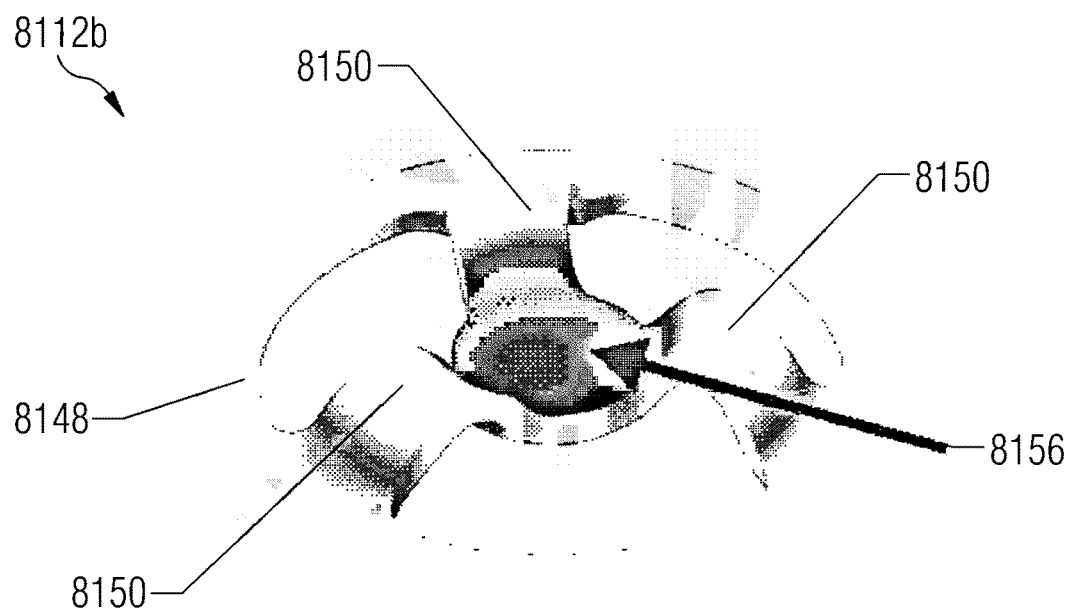
FIG. 8p is a simplified diagram of a partial view of a system to enable a vapor chamber and means of attachment, in accordance with an example of the present disclosure.
Figure 8Q:
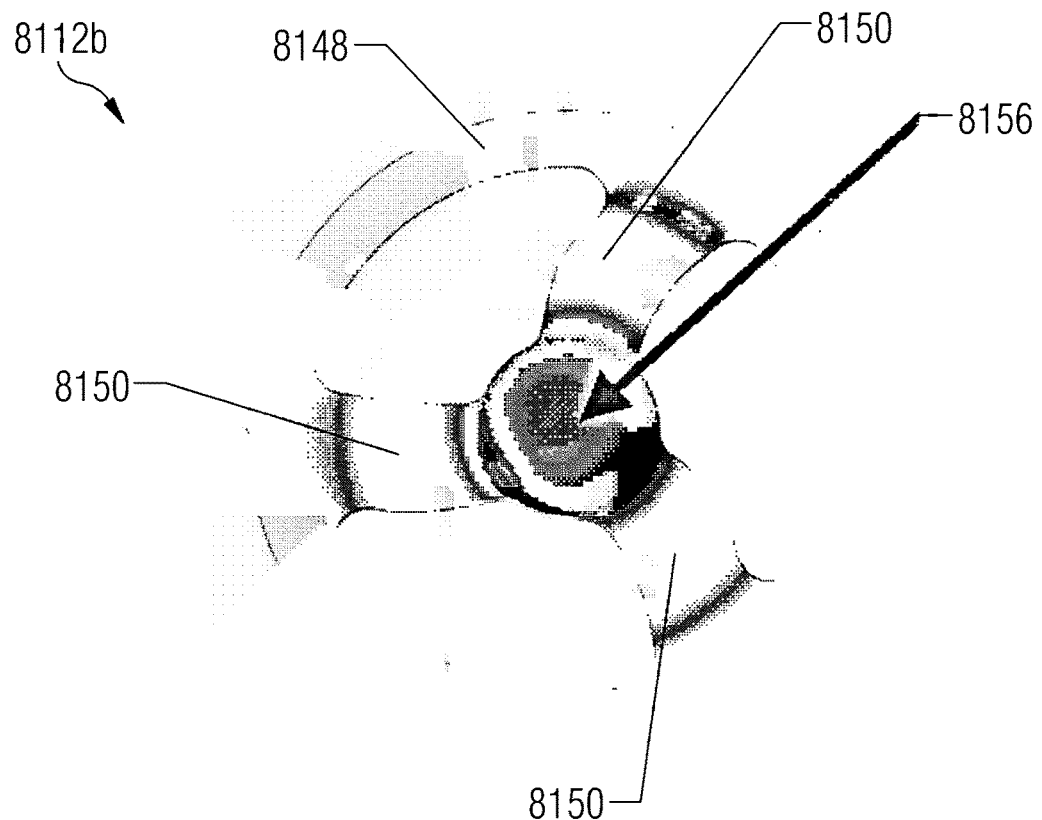
FIG. 8q is a simplified diagram of a partial view of a system to enable a vapor chamber and means of attachment, in accordance with an example of the present disclosure.

Turning to FIGS. 8*p* and 8*q*, FIGS. 8*p* and 8*q* are a simplified diagram of vapor chamber securing means 8112*b*. Vapor chamber securing means 8112*b* can include flange 8148 and plurality of spring arms 8150. For example, as illustrated in FIGS. 8*p* and 8*q*, vapor chamber securing means 8112*b* includes three (3) spring arms 8150. Spring arms 8150 can extend from flange 8148 to middle portion 8156 of vapor chamber securing means 8112*b*. Middle portion 8156 can include an attachment mechanism that allows attachment means 8154 to couple with vapor chamber securing means 8112*b*. For example, if attachment means 8154 is a screw or threaded fastener, then middle portion 8156 can include threads that allow attachment means 8154 to be screwed or threaded into middle portion 8156 and couple with vapor chamber securing means 8112*b*.

Figure 8R:
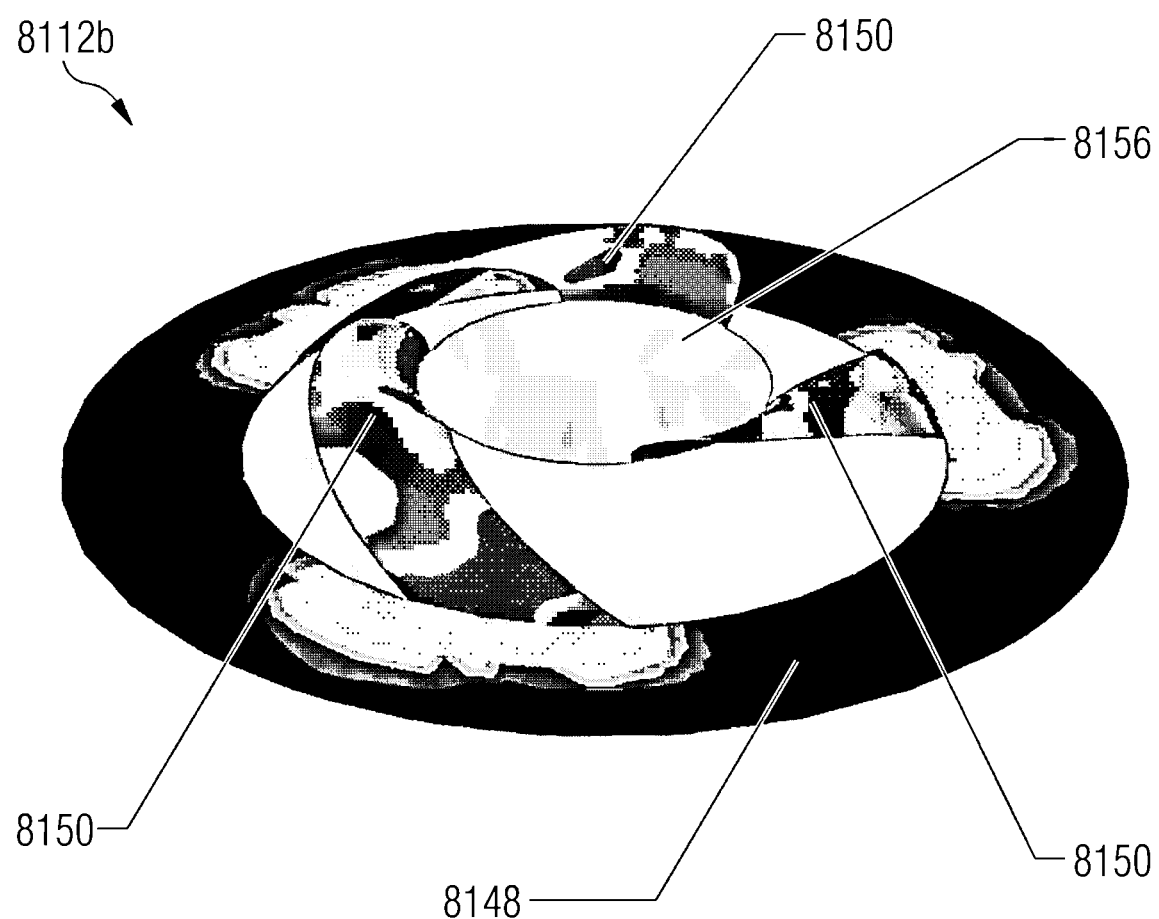
FIG. 8r is a simplified block diagram of a partial view of a system to enable a vapor chamber and means of attachment, in accordance with an example of the present disclosure.

Turning to FIG. 8*r*, FIG. 8*r* is a simplified diagram of an example stress field for vapor chamber securing means 8112*b*. When attachment means 8154 is coupled with vapor chamber securing means 8112*b*, forces extend from attachment means 8154 to middle portion 8156 and spring arms 8150. Spring arms 8150 are configured to bend, flex, rotate, etc. to absorb some of the force and help prevent the force from reaching flange 8148 and the vapor chamber that includes vapor chamber securing means 8112*b*.

Figure 8S:
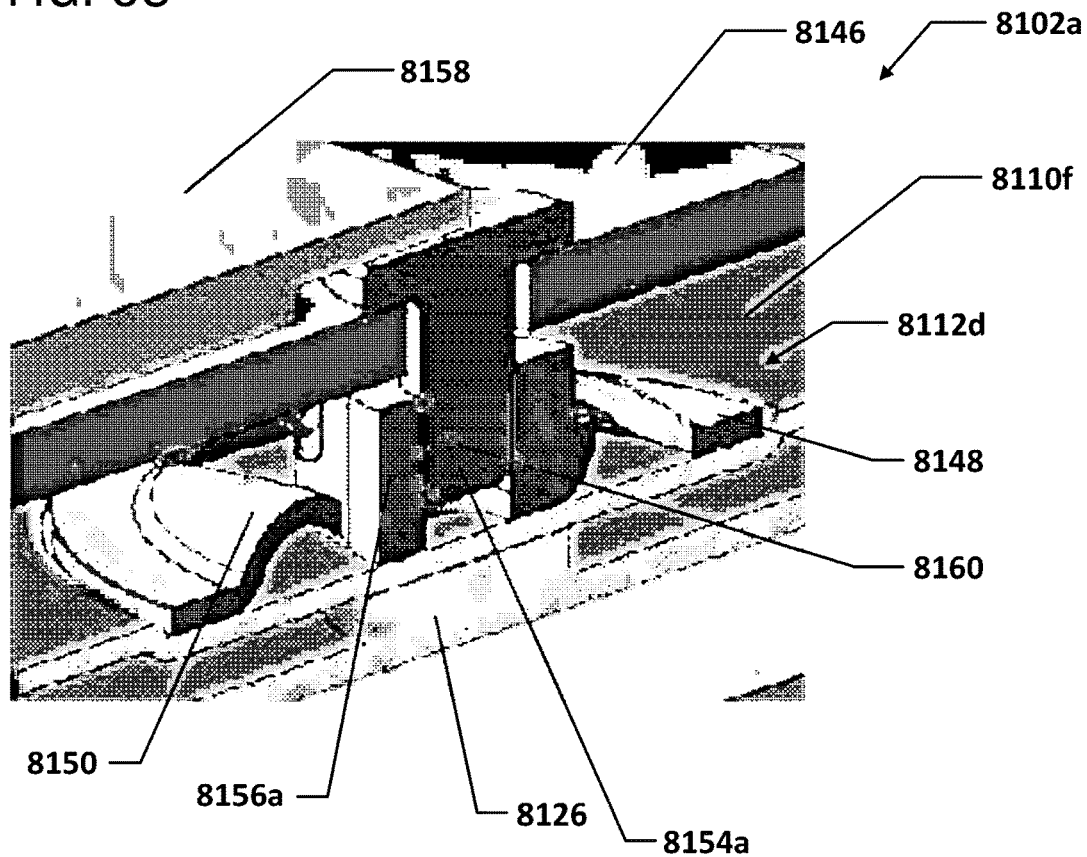
FIG. 8s is a simplified block diagram of a partial view of a system to enable a vapor chamber and means of attachment, in accordance with an example of the present disclosure.
Figure 8T:
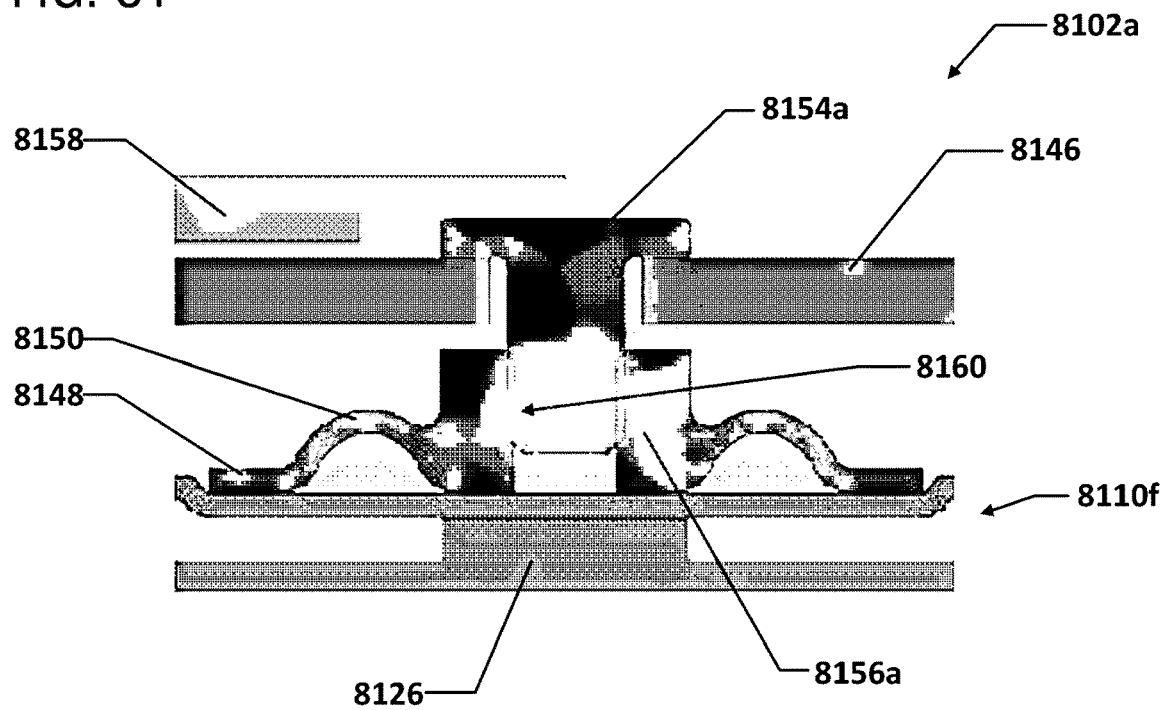
FIG. 8t is a simplified block diagram of a partial view of a system to enable a vapor chamber and means of attachment, in accordance with an example of the present disclosure.

Turning to FIGS. 8*s* and 8*t*, FIGS. 8*s* and 8*t* are a simplified block diagram illustrating a portion of electronic device 8102*a*. Electronic device 8102*a* can include a chassis 8158, PCB 8146, and vapor chamber 8110*f*. Vapor chamber securing means 8112*d* can coupled with attachment means 8154*a* and help to secure vapor chamber 8110*f* to PCB 8146. In an example, attachment means 8154*a* is a threaded screw, bolt, or some other threaded attachment means. As illustrated in FIGS. 8*s* and 8*t*, vapor chamber securing means 8112*d* can include flange 8148, spring arms 8150, and middle portion 8156*a*. Middle portion 8156*a* can include threads 8160 that allow attachment means 8154*a* to be screwed or threaded into middle portion 8156*a* of vapor chamber securing means 8112*d*.

Figure 8U:
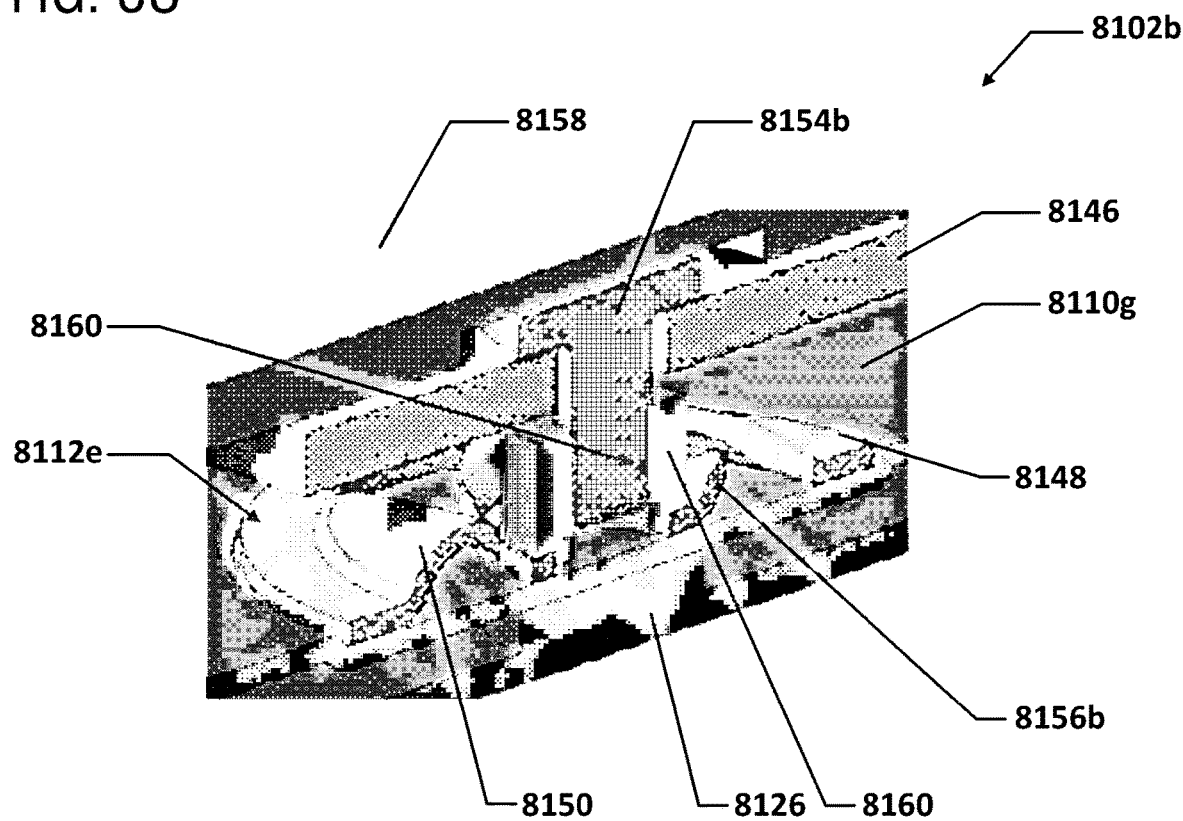
FIG. 8u is a simplified block diagram of a partial view of a system to enable a vapor chamber and means of attachment, in accordance with an example of the present disclosure.
Figure 8V:
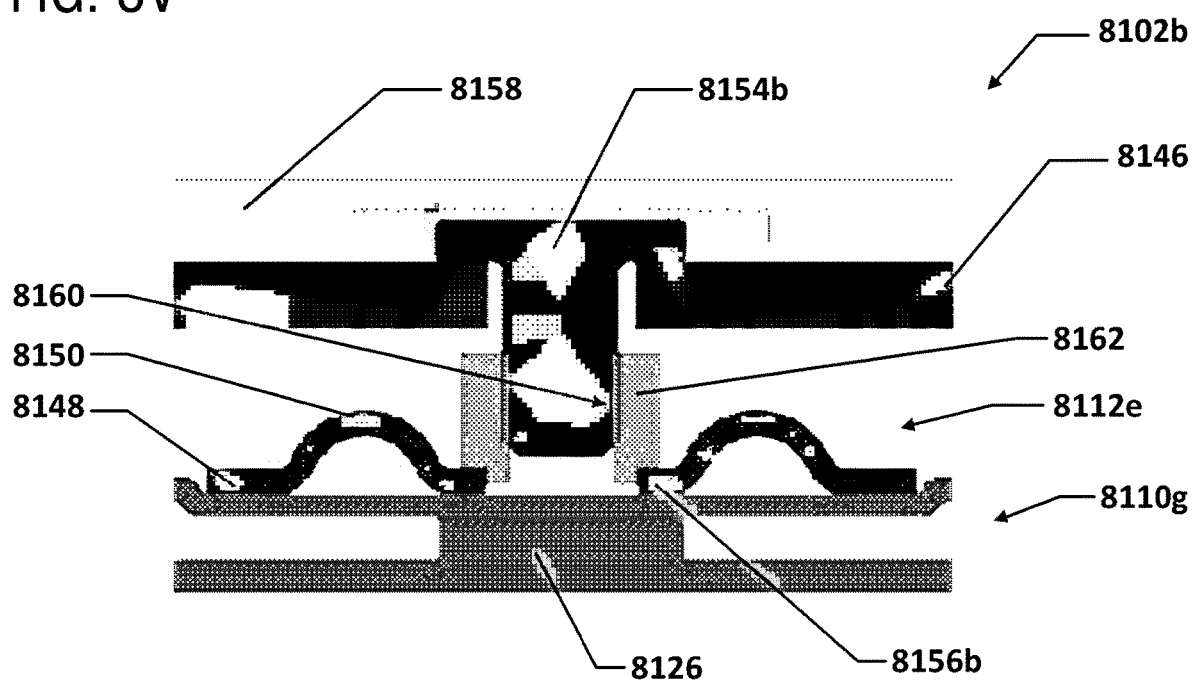
FIG. 8v is a simplified block diagram of a partial view of a system to enable a vapor chamber and means of attachment, in accordance with an example of the present disclosure.

Turning to FIGS. 8*u* and 8*v*, FIGS. 8*u* and 8*v* are a simplified block diagram illustrating a portion of electronic device 8102*b*. Electronic device 8102*b* can include a chassis 8158, PCB 8146, and vapor chamber 8110*g*. As illustrated in FIGS. 8*u* and 8*v*, vapor chamber securing means 8112*e* can include flange 8148, spring arms 8150, and middle portion 8156. Middle portion 8156 can include a screw insert 8162. In an example, screw insert 8162 can be soldered or otherwise secured to middle portion 8156.

Vapor chamber securing means 8112*e* can coupled with attachment means 8154*b* and help to secure vapor chamber 8110*g* to PCB 8146. In an example, attachment means 8154*b* is a threaded screw, bolt, or some other threaded attachment means. Screw insert 8162 can include threads 8160 that allow attachment means 8154*b* to be screwed or threaded into screw insert 8162 of vapor chamber securing means 8112*e* and help to secure vapor chamber 8110*g* to PCB 8146.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although vapor chambers 8110 and vapor chamber securing means 8112 have been illustrated with reference to particular elements and operations, these elements and operations may be replaced by any suitable architecture, protocols, and/or processes that achieve the intended functionality of vapor chambers 8110 and vapor chamber securing means 8112.

Particular examples described herein provide for an electronic device that can be configured to include a vapor chamber and means of attachment for the vapor chamber. The vapor chamber can include one or more columns, where at least a portion of the columns include fiber braids and one or more wicks. At least one of the wicks can also include the fiber braids. The columns can be braised to a top plate or a bottom plate of the vapor chamber. The vapor chamber can be secured over a heat source using a vapor chamber securing means that can include spring arms. The spring arms can bend, flex, rotate, etc. to absorb some of the force when vapor chamber is secured over the heat source.

The present disclosure may repeat reference numerals and/or letters in the various examples. This repetition is for the purpose of simplicity and clarity and does not in itself dictate a relationship between the various embodiments and/or configurations discussed. Different embodiments may have different advantages, and no particular advantage is necessarily required of any embodiment.

In large desktop systems, where room is abundant, heat dissipation may be accomplished via a simple heat sink and fan atop the processor and graphics processing unit (GPU). This may be sufficient to carry away excess heat and protect the system.

But in smaller portable systems, such as laptop computers and tablet computers, "z-space" (space along the "z-axis," or in other words device thickness) is usually at a premium. When a user first picks up a device, almost the first thing she will notice is its size and weight. So system designers are under pressure to make thinner, lighter devices. Such light, thin devices require more sophisticated and integrated heat solutions.

Vapor chambers may form part of a sophisticated and integrated heat dissipation solution. A vapor chamber has a (usually) conductive outer casing, such as of copper. The vapor chamber includes a hermetically sealed cavity (the chamber), which may be evacuated of air during manufacture, thus forming a vacuum chamber. There is disposed within the chamber an evaporative fluid, such as deionized water or some other fluid, which may be selected for non-corrosivity and high specific heat. The chamber may also include columns that provide structural support and help to ensure that the chamber does not collapse easily.

A portion of the vapor chamber may be placed into contact or near-contact with a heat generating element such as a processor, GPU, or similar. This portion of the vapor chamber may be referred to as the "hot plate," though it need not be a separate or discrete plate. This section may also be called the evaporator. A "cold plate" is a portion that is well-removed from the heat plate. This section may also be called the condenser. As the hot plate heats, the outer wall absorbs heat, and transfers it to the evaporative fluid, which efficiently absorbs the heat because of its high specific heat. Once the evaporative fluid reaches its boiling point, it evaporates and spreads across the vacuum chamber, carrying the heat away from the heat plate. The heated vapor reaches one or more "cold plates," which again need not be separate or discrete plates. The cold plates absorb the heat via condensation. The excess heat may be further dissipated, for example by placing fans at or near the condenser, so that excess heat can be expelled from the system. Because evaporation and condensation are heat-intensive activities (particularly for a fluid with a high specific heat like deionized water), they are very effective heat transfer mechanisms.

After the heat condenses at the cold plate, wicking means may be provided to carry the cooled liquid back toward the heat plate, so the cycle can repeat. Various wicking means are known in the art, including by way of illustrative and nonlimiting example, sluices that carry fluid back toward the heat plate gravitationally, capillaries, or metallic wicks, which may include porous metal that collects water and directs it back toward the heat plate.

In general, a substantially planar vapor chamber (e.g., one in which the dimensions of length and width are within approximately half an order of magnitude of one another), heat is dissipated substantially radially away from the heat source, and it is common to dispose the heat source near a geometric center of gravity of the vapor chamber. A special case of a vapor chamber is the heat pipe, in which the length is more than (and sometimes much more than) approximately five times the width. The heat pipe carries heat laterally along the length of the heat pipe, and can be used to distribute heat from one portion of the device to another. In the case of a heat pipe, the heat source may be placed at or near one end of the heat pipe, so that the heat can be carried to the other end.

Some aspects of the present specification provide a number of improvements to vapor chambers. These improvements may be used individually, or in conjunction with one another, to realize improved structural and operational performance in vapor chambers. To simplify this disclosure, the improvements are disclosed as discrete improvements, and each improvement can stand alone. However, this should not be construed to imply that the improvements need to be independent of one another. For example, a vapor chamber and system design can be improved by jointly applying one, two, or more of the improvements disclosed herein. Thus, while the various improvements are presented separately as discrete features, these embodiments may be joined in any combination desired to realize system-level advantages.

In a first feature, vapor chambers can be improved by using them in conjunction with heat pipes. Specifically, vapor chambers are relatively expensive, and because of their cost, large vapor chambers are sometimes limited to "high-end" laptop computers, such as gaming laptops. However, as noted above, planar vapor chambers conduct heat generally radially. Thus, a vapor chamber may experience "cold spots" at its extremities, where heat cannot effectively reach. This issue may be exacerbated if the vapor chamber has a complex geometry, such as one other than a simple rectangle.

However, the efficiency of a vapor chamber can be increased, while its cost can be reduced, by using the vapor chamber in conjunction with well-placed heat pipes. For example, the size of the vapor chamber may be reduced in one dimension, thus reducing its complexity and cost. Heat pipes may be placed at the edges of the reduced-size vapor chamber, with the lateral dimension of the heat pipes running in the direction that the vapor chamber's dimension was reduced. This may enable the planar vapor chamber to better perform its function of dissipating heat radially. When that heat reaches edges, it can be conducted away by the heat pipes. This may provide improved heat dissipation relative to a planar vapor chamber that is larger in the lateral dimension of the heat pipe. Furthermore, the cost of the smaller vapor chamber may be substantially reduced, thus realizing economic advantages, and making it possible to use vapor chambers in less expensive devices that previously would not have warranted a vapor chamber.

In a second feature, which may be used separately or in conjunction with the embodiment just described, a planar vapor chamber may be structurally improved. In some cases, "ultrathin" vapor chambers may be used to meet aggressive "z-space" requirements. These may be particularly strict in tablets or similar small devices.

To reduce thermal impedance between the heat source and the vapor chamber, mechanical affixing means may be used to keep the hot plate in close contact with the heat source. The affixing means may include, for example, mechanical bolts or other structures to hold the vapor chamber down "tight" against the heat source. However, particularly in ultra-thin vapor chambers, this can cause mechanical stress, which may cause flexing or z-axis displacement of the vapor chamber. Such flexing may create a danger of buckling, or may reduce the efficiency or service life of the vapor chamber.

To help reduce such z-axis displacement, embodiments of the present specification include an internal "starburst" structure for the vapor chamber that helps to structurally stiffen the chamber, prevent collapse, and provide for a low-profile mounting feature.

In a third feature, improvements may be made to the wick of a vapor chamber. These improvements may reduce the pressure loss of vapor in a thin vapor chamber as vapor travels from the evaporator to the condenser, thereby improving its thermal performance. This may be achieved, for example, by selectively removing portions of the wick to reduce pressure loss from the evaporator to the condenser.

The overall efficiency of a vapor chamber is influenced by a number of factors, including the heat gradient between the evaporator and the condenser, and the pressure loss across the vapor chamber. If there is a high heat gradient, then this means that heat is not being spread efficiently across the entire vapor chamber. The pressure loss also influences the ability of the vapor to carry heat away from the evaporator to the condenser. In fact, it has been observed experimentally that there is approximately an inverse cube relationship between pressure loss within the vapor chamber and heat transfer efficiency. Thus, even modest improvements to pressure loss can lead to dramatic improvements in efficiency.

The pressure loss of the vapor chamber is inversely proportional to the available volume of the vapor chamber. Thus, increasing the volume of the vapor chamber reduces the pressure loss.

However, as noted before, in portable computing devices, which are a common application of vapor chambers, z-space may be relatively limited. For example, a 1 mm thick vapor chamber may have a 0.2 mm wick on top and bottom, leaving a 0.2 millimeter gap for vapor to flow, assuming a 0.2 mm wall thickness. However, if either the top or bottom portion of the wick is removed, then the available flow area for the vapor locally increases from 0.2 mm to 0.4 mm. If both the top and the bottom are removed in a particular region, then the available cross-sectional area for vapor flow may be as high as 0.6 mm.

Because the wick may still be needed to carry fluid back from the condenser to the evaporator, it may not be practical to remove the entire wick. However, if a certain percentage of the wick is strategically removed, such as in patches, then the available cross-sectional area of vapor flow can be locally increased, while still providing sufficient wicking to return condensed vapor back to the evaporator. In an illustrative example, approximately 30% or 45% of the wick may be removed to increase the available volume for vapor flow. In a more general case, anywhere between 15% and 70% of the wick may be removed to provide increased vapor flow.

Removal of the wick from these areas increases the vapor flow area inside the vapor chamber without increasing its thickness. Once condensed, the fluid can reach the evaporator through wicks located elsewhere in the vapor chamber. This effectively increases the local thickness, and thus the vapor flow area, of portions of the vapor chamber. Thus, a relatively thinner vapor chamber can provide thermal performance that is equivalent to the performance of a relatively thicker vapor chamber.

The three features illustrated above define three broad categories of improvements to vapor chambers. For convenience, these first, second, and third categories may be referred to as "A," "B," and "C," respectively. Features A, B, and C are described separately below. For example, FIGS. 9a-9e relate to feature category A. FIG. 9f-9n relate to feature category B. FIGS. 9o-9v relate to feature category C.

These features are described separately below to aid the reader in understanding each feature. However, this is not intended to imply that the features must exist separately from one another. For example, the present specification anticipates, by way of illustrative and non-limiting example, the following advantages arising from the following combinations:

a. A—Improved thermal performance in a vapor chamber with reduced size and corresponding reduced cost.
b. B—Improved planar integrity for vapor chambers, including for thin vapor chambers.
c. C—Reduced pressure loss in a vapor chamber, resulting in improved performance and efficiency.
d. A+B—Improved thermal performance and synergistically improved planar integrity in ultra-thin vapor chambers, with reduced size and cost of the vapor chamber.
e. A+C—Reduced size and reduced pressure loss in a vapor chamber, resulting in synergistically improved thermal performance.
f. B+C—Improved planar integrity and reduced pressure loss in ultra-thin vapor chambers, resulting in improved planar integrity and synergistically improved thermal performance.
g. A+B+C—Reduced size with synergistically improved planar integrity, and reduced pressure loss for synergistically improved thermal performance, in ultra-thin vapor chambers.

A system and method for providing improved vapor chambers will now be described with more particular reference to the attached Figures. It should be noted that throughout the Figures, certain reference numerals may be repeated to indicate that a particular device or block is wholly or substantially consistent across the Figures. This is not, however, intended to imply any particular relationship between the various embodiments disclosed. In certain examples, a genus of elements may be referred to by a particular reference numeral ("widget 10"), while individual species or examples of the genus may be referred to by a hyphenated numeral ("first specific widget 10-1" and "second specific widget 10-2").

Certain of the Figures below detail example architectures and systems to implement embodiments of the above. In some embodiments, one or more hardware components and/or instructions described above are emulated as detailed below, or implemented as software modules.

FIG. 9a is a block diagram illustration of internal components of a portable computing system 9100, such as a laptop computer. In this illustration, portable computing system 9100 includes a number of electronic components that provide the functions and features of the portable computing device. These electronic components may generate heat, and in particular, a central processing unit (CPU), system-on-a-chip (SoC), GPU, or other high-power device may produce more heat than most of the rest of the system. Thus, a vapor chamber 9104 is provided to draw heat from a heat generating device, such as the CPU or SoC, and to expel the heat from the system.

In this illustration, vapor chamber 9104 is a large planar vapor chamber, with an irregular (e.g., nonrectangular) shape. Vapor chamber 9104 includes an evaporator 9116, which may be placed over a heat source such as the CPU. Evaporator 9116 need not be a discrete or separate plate, but rather may simply be the portion of vapor chamber 9104 that most nearly contacts the heat source. The condenser of vapor chamber 9104 includes the remote areas removed from evaporator 9116 where fluid begins to condense as the temperature drops.

Fans 9112-1 and 9112-2 are placed strategically at selected portions of vapor chamber 9104 to provide heat flows 9108 that expel heat away from vapor chamber 9104. This effectively transfers the heat from evaporator 9116 to the condenser portions of vapor chamber 9104, where heat is then expelled outside of the overall system.

In many applications, vapor chambers are considered a "premium" thermal solution, particularly for systems that are constrained in their z-axis (i.e., thin systems). As a premium solution, vapor chambers are both highly effective, and relatively more expensive compared to some other thermal solutions. Thus, cost is still an issue in deploying vapor chambers on non-premium laptops. Because size can be a cost-driver for vapor chambers, they are more common on smaller devices such as smart phones and tablet computers.

Embodiments of the present specification reduce the relative cost by minimizing the spatial coverage of vapor chambers, and by extending their effective reach within a system using additional heat pipes. This design approach may result in an expected cost reduction of up to 40%, due to an improved manufacturing yield rate and cost savings on raw material. Advantageously, it may also improve performance of thermal dissipation in areas within systems (such as the corner zones) typically regarded as areas that vapor can't easily reach. This can be solved by adding straightened heat pipes to the edges of vapor chambers. Furthermore, with the linear thermal conducting characteristics of heat pipes, embodiments of this disclosure may improve overall performance while realizing substantially reduced costs over larger and heavier vapor chambers.

Some existing heat solutions use large vapor chambers covering almost 40% of the internal area of some systems. This is illustrated in the example system of FIG. 9*a*.

In an example consumer-end gaming laptop system, the vapor chamber is extended toward the right edge of the internal system base. This allows the system to have an additional fan outlet with better cooling capability.

Both of these configurations may incur costs that exceed a desired target. Another consideration with existing vapor chambers is the "corner dead end" issue. Vapor chambers are generally designed to transfer heat radially, whereas heat pipes transfer heat linearly. Therefore, vapor chambers are best suited for a rectangular geometry. In practice, however, vapor chamber geometry needs to be aligned to existing system layouts. Thus, the current designs may be inadequate for efficient heat transference.

For example, in FIG. 9*a* a temperature delta may be produced at the bottom-right corner of the vapor chamber, which means that heat cannot transfer to this area due to the geometry of the system base. An additional graphite spreader could be added to solve this issue, but would lead to increased cost.

The present disclosure describes an edge-to-edge vapor chamber design for high-performance laptops with fan outlets on the side edges. This design includes straight heat pipes placed perpendicular to the motherboard without bends or steps, that are mounted to the side edges of the vapor chamber to maximize the performance of these heat pipes. By using this approach, the size of the vapor chamber and the length of the heat pipes can be minimized without tradeoffs in performance.

Advantages of the disclosed embodiments include:
1. Reduced vapor chamber cost by way of savings in raw material and weight reduction.
2. Easier manufacturing, which improves the yield rate and reduces cost.
3. Improved performance, lower skin temperature, and better acoustics.

Figure 9B:
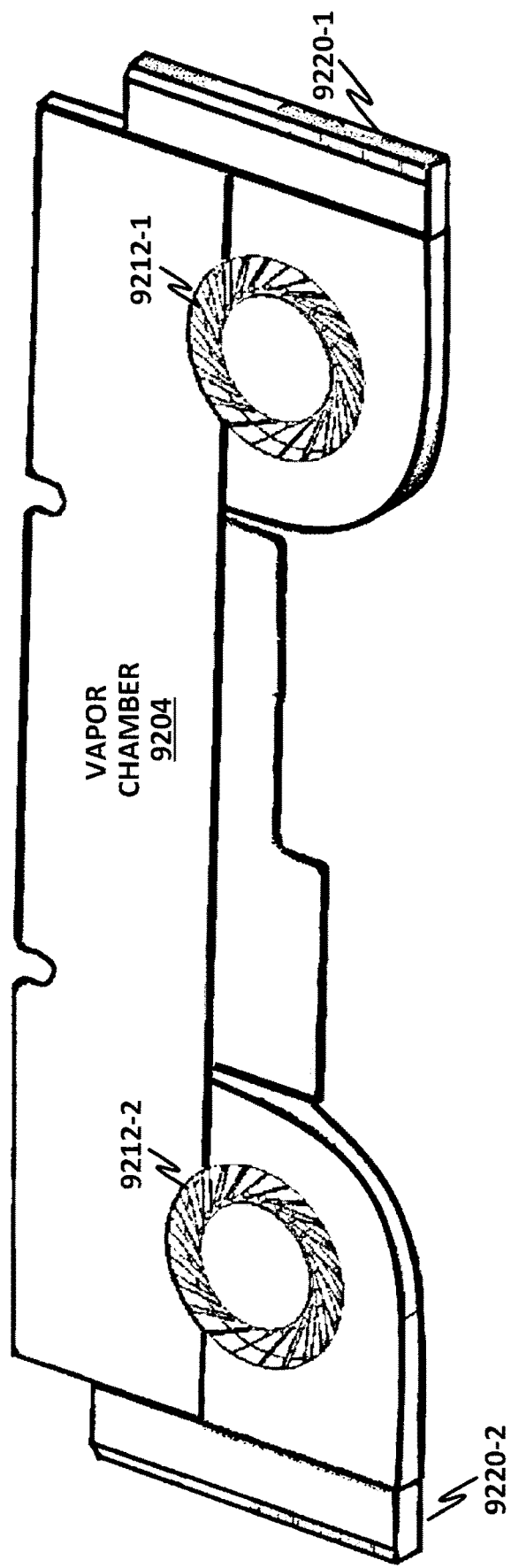

FIG. 9*b* is an illustration of a heat transfer assembly 9200 that may be used in place of, or in conjunction with, the assembly of FIG. 9*a*.

In this example, heat transfer assembly 9200 includes a planar vapor chamber 9204 that in this case is substantially rectangular. This vapor chamber may still be considered a planar vapor chamber because, for example, the length is not more than approximately five times the width. This is a non-precise definition that divides a vapor chamber from a heat pipe, but not in this case. Heat transfer assembly 9200 also includes fans 9212-1 and 9212-2, again strategically placed to expel heat away from vapor chamber 9204. At the shorter ends of vapor chamber 9204 are two heat pipes 9220-1 and 9220-2. Heat pipes 9220 are special cases of a vapor chamber. Specifically, heat pipes 9220 have a long dimension that is approximately five times or more greater than the shorter dimension.

A truly planar vapor chamber, such as one wherein the length and width are approximately equal, radiates heat radially, so that the heat spreads substantially in every direction. Because vapor chamber 9204 in this illustration is not close to a perfect plane, it may experience a somewhat hybrid heat spread. Heat spreads radially out from an evaporator region that may be located, for example, at approximately the geometric center of mass of vapor chamber 9204. But because vapor chamber 9204 is longer than it is wide, it also experiences some lateral transfer along its long dimension. This carries heat out to the extreme edges of vapor chamber 9204, and because heat pipes 9220 are in conductive contact with vapor chamber 9204, heat is transferred into heat pipes 9220. Heat pipes 9220 can then efficiently carry heat to fans 9212.

In this illustration, it should be noted that heat pipes 9220 are sealed off from vapor chamber 9204. Thus, there are no vapor chambers with complex geometry in this illustration, but rather they are simply rectangles. This configuration realizes advantages over the heat transfer system of FIG. 9*a*, in that vapor chamber 9204 is smaller than vapor chamber 9104 of FIG. 9*a*, and thus less expensive to manufacture. Furthermore, heat pipes 9220 in conjunction with vapor chamber 9204 transfer heat more effectively than a single large vapor chamber with complex geometry. Thus, heat transfer assembly 9200 of FIG. 9*b* is both less expensive and more effective than the complex geometry vapor chamber of FIG. 9*a*.

Figure 9C:
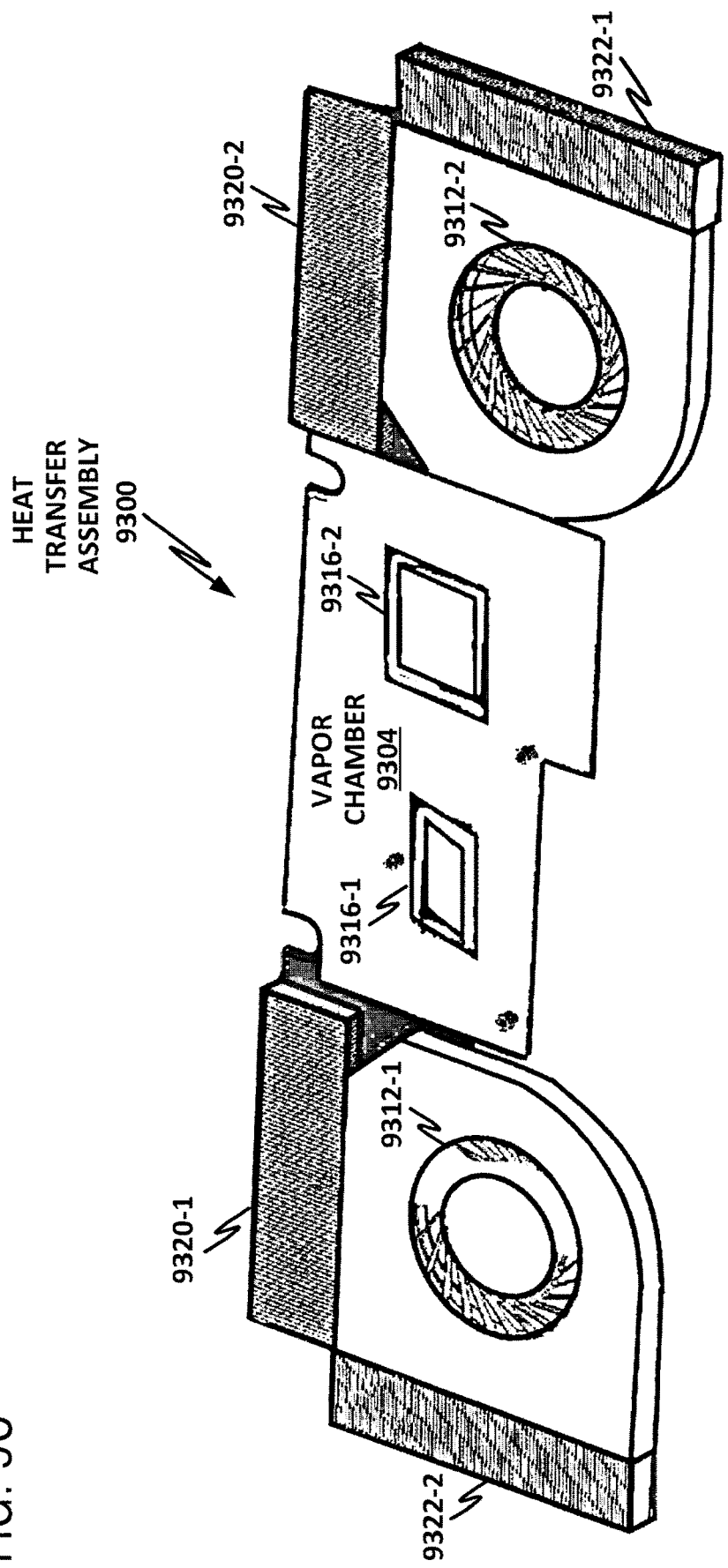
FIG. 9c is a perspective view illustration of an alternative heat transfer assembly.

FIG. 9*c* is a perspective view illustration of an alternative heat transfer assembly 9300.

Heat transfer assembly 9300 is somewhat different from heat transfer assembly 9200. In this case, heat transfer assembly 9300 includes a vapor chamber 9304 with two "hot plates," or evaporators, 9316-1 and 9316-2. As illustrated, vapor chamber 9304 is closer to a square, with the length and width dimensions being more approximately equal to one another. In this case, lengthwise heat pipes 9320-1 and 9320-2 carry heat away from vapor chamber 9304. Widthwise heat pipes 9322-1 and 9322-2 then carry heat down and toward fans 9312-1 and 9312-2.

As noted above, heat pipes provide a more linear or lateral heat displacement, whereas planar vapor chambers experience more radial heat transfer. Thus, heat pipes 9320 and 9322 may be used to direct heat to specific regions, away from the disclosed heat sources.

Figure 9D:
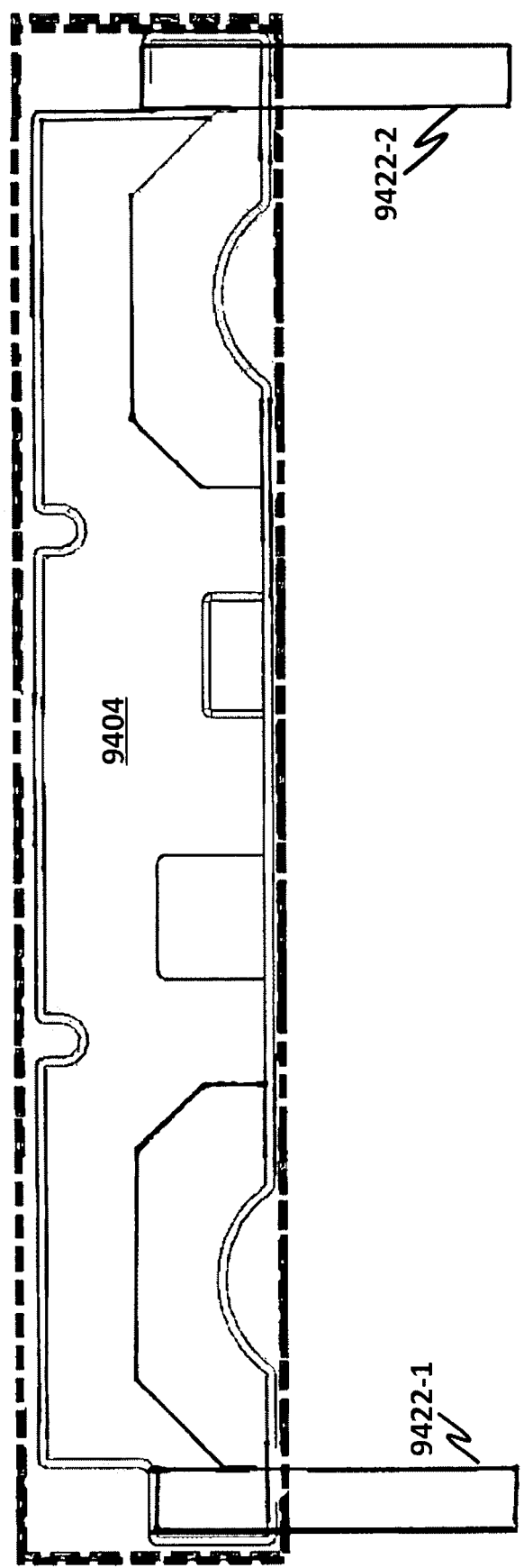
FIG. 9d is an alternative view illustration of a vapor chamber.

FIG. 9d is an alternative top view illustration of a vapor chamber 9404, with heat pipes 9422-1 and 9422-2. FIG. 9d illustrates how the effective vapor zone is distributed, and how the heat pipes are connected to the vapor chamber. The vapor chamber is connected to the heat pipes only from the side edges of the vapor chamber. In simulation cases, it has been found that this is an advantageous placement for the heat pipes. While extending the vapor chamber toward the bottom edges of the side heat exchanger produces good temperature simulation results, previous models have shown that the vapor inside the vapor chamber may not be able to spread sufficiently due to physical limitations of the internal structure of the vapor chamber. The design of the present disclosure is a balance between cost and performance.

Figure 9E:
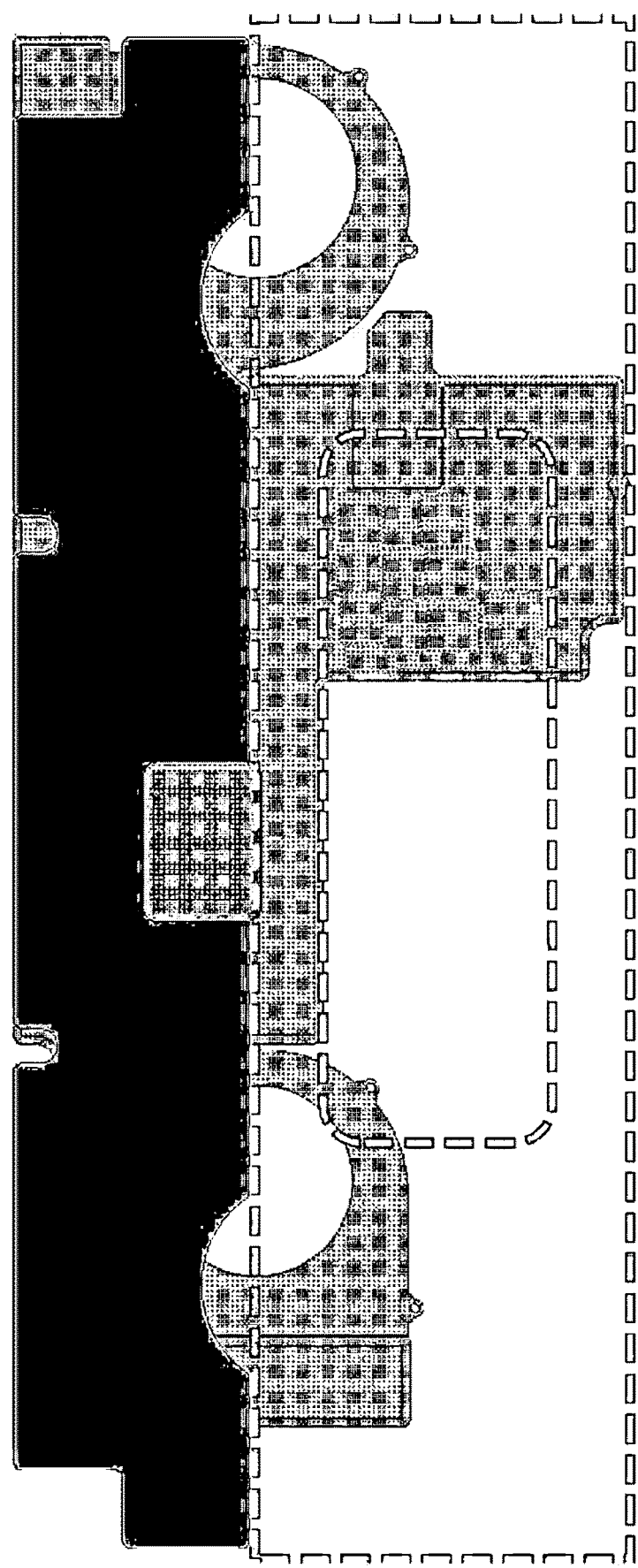
FIG. 9e is a top view illustration of a heat transfer assembly.

FIG. 9e is a top view illustration showing a heat transfer assembly 9500 in situ with a portable computing device. FIG. 9e illustrates details of an example vapor chamber assembly design of the present disclosure, and how it may be placed within a system. In the example of FIG. 9e, vapor chamber size reduction of up to 60% compared to previous designs is shown, without compromising the heat spreading performance.

Figure 9F:
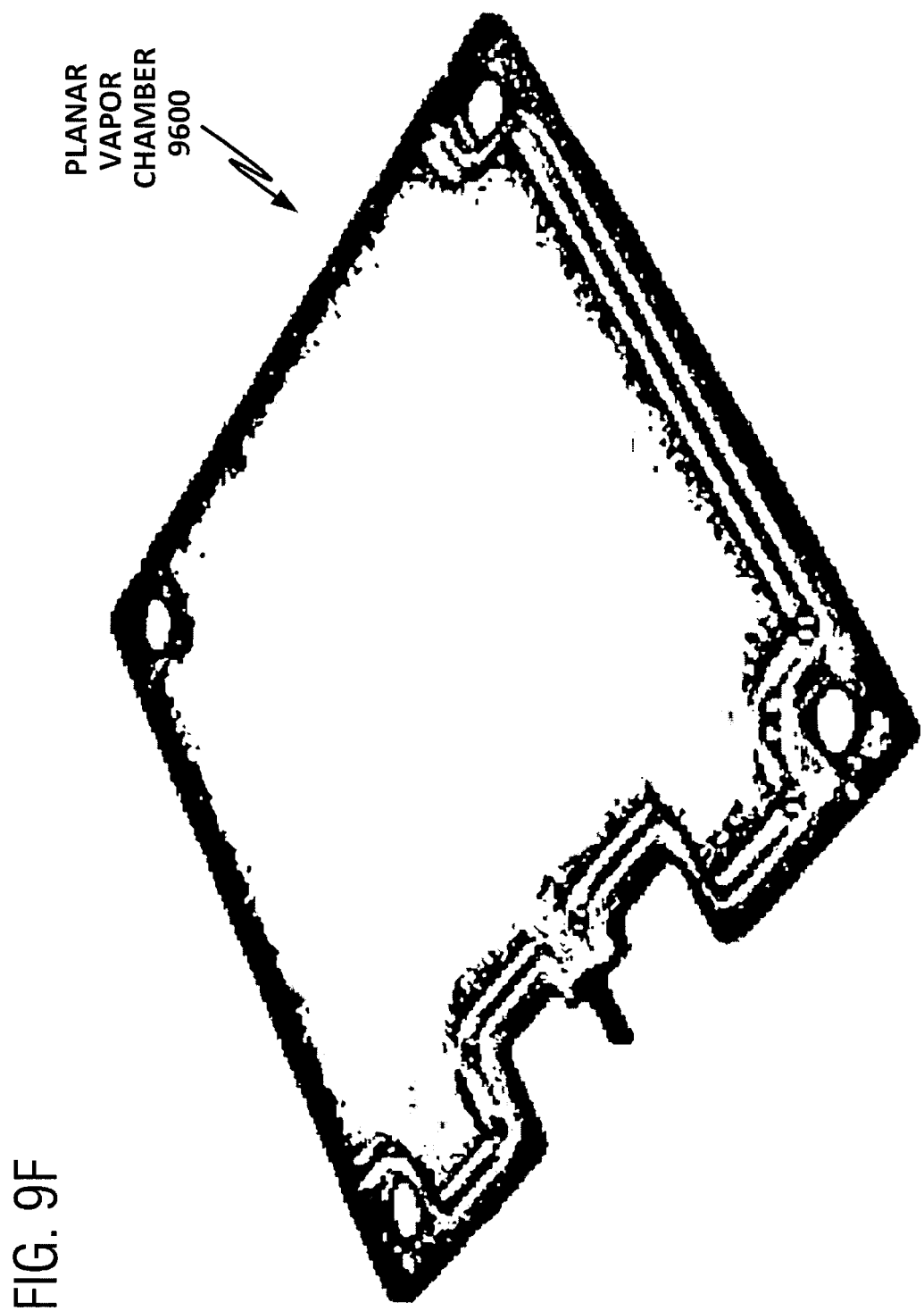
FIG. 9f is a perspective view illustration of a planar vapor chamber.

FIG. 9f is a perspective view illustration of a planar vapor chamber 9600, which may be used in conjunction with a "starburst" structural support pattern.

Improving thermal spreading in low-profile, aggressive z-height mobile systems (as defined by the thickness of the motherboard and its components, which can be as little as 3 mm) is often critical to maintaining safe junction temperatures, reducing hot spots on outside skins, and meeting ergonomic temperature limits. Ultra-thin vapor chambers are one option for thermal dissipation in these low-profile systems. As with other thermal spreading and dissipation solutions, such vapor chambers may need to be mechanically coupled to the die or other heat source to operate effectively.

Applying a load to a vapor chamber to reduce thermal impedance to the heat source can create challenges due to the somewhat weak, hollow nature of vapor chambers. With excessive loads, a vapor chamber may collapse or flex excessively, thus reducing the effectiveness of the thermal interface material (TIM) or the vapor chamber itself. This problem is further exacerbated by reducing the overall thickness of the vapor chamber in aggressively thin form factors.

In an embodiment of the present disclosure, an internal structural element is included within the vapor chamber that enables a stiffer assembly capable of supporting the thermal interface load. Such an embodiment may open up a new design space for low-profile mounting methods for thinner and lighter clamshells and 2-in-1 devices.

The internal structural element may be referred to as a "starburst" or "radial" pattern.

Previous solutions include:
Thermal adhesive may be employed to avoid the need to maintain a load on a vapor chamber. However, many low-pressure and low-temperature curing thermal adhesives have relatively poor thermal performance. In general, a reduction in thermal resistance dictates a necessity for the thinnest gap possible between the heat source and the thermal solution. Better thermal performance and thinner bond line adhesives are possible, but may require load applied during the curing process. Some adhesives also require an elevated curing temperature that could compromise the function of a vapor chamber due to thermal expansion of the working fluid within.

Stiffener plates may be soldered or attached to a vapor chamber to provide additional rigidity, yet these also consume z-space, which may be precious in a low-profile system. Additionally, stiffener plates on the condenser side of the chamber may not reduce the risk of vapor chamber collapse on the evaporator side if the die surface being attached to is relatively small and creates local loads on the attached surface. Stiffeners on the evaporator side may need to be placed outside the package area to conserve z-height, and thus share space with other components on the motherboard.

Copper pillars may be added internally to a vapor chamber to help maintain spacing between the evaporator and condenser sides, but may primarily improve compressive load performance versus bending and/or flexural stiffness.

Figure 9G:
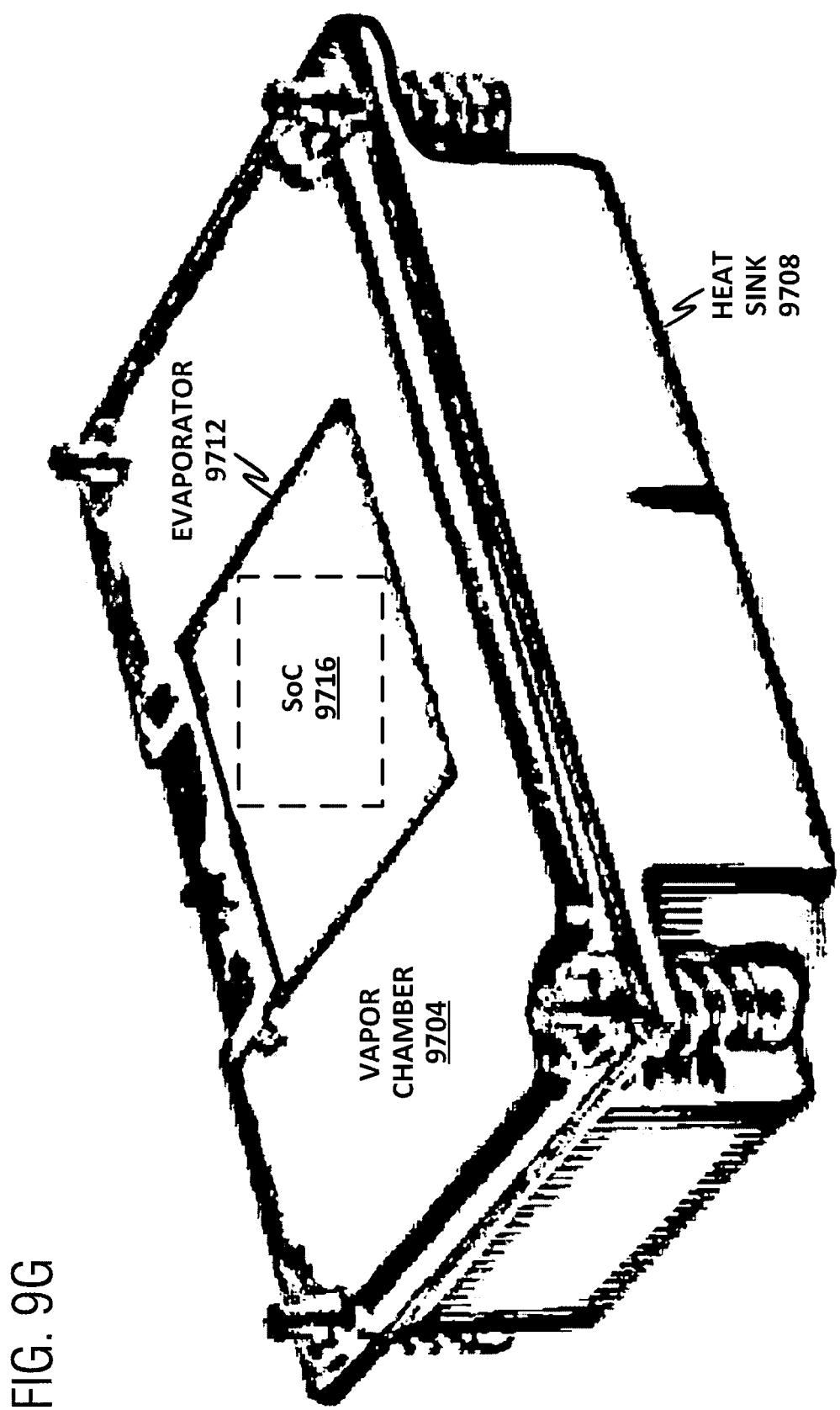
FIG. 9g is a perspective view illustration of a vapor chamber in situ with a heat sink.

FIG. 9g is a perspective view illustration of a vapor chamber 9704 in situ with a heat sink 9708, with a system-on-a-chip 9716 directly or nearly directly thermally coupled to evaporator 9712.

Figure 9H:
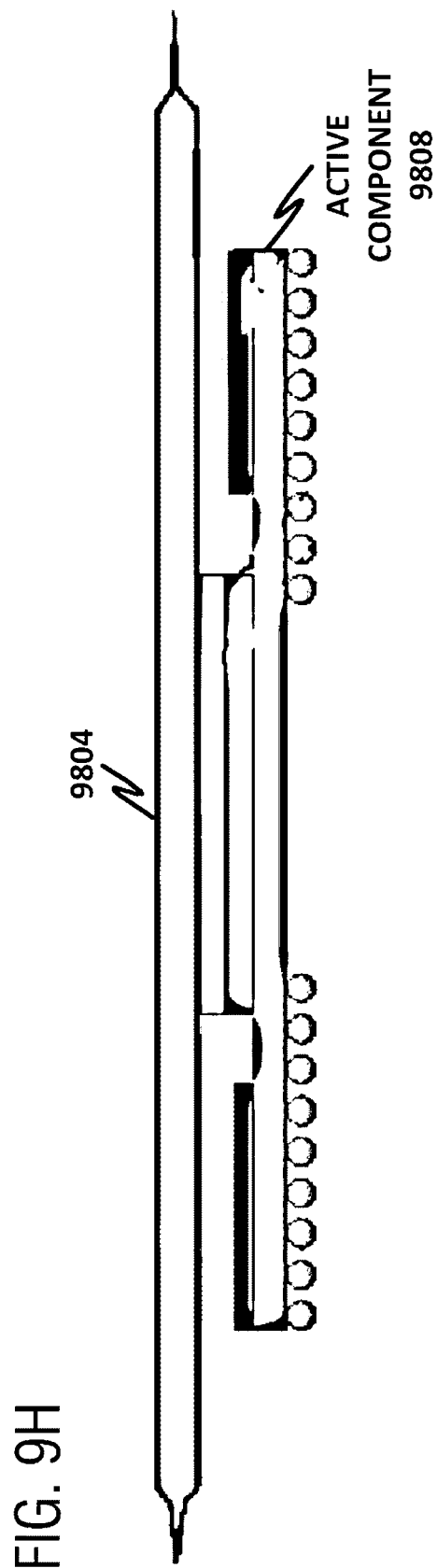
FIG. 9h is a side view in situ illustration of a planar vapor chamber.

FIG. 9h is a side view in situ illustration of a planar vapor chamber 9804.

Planar vapor chamber 9804 is thermally coupled to an active component 9808, which may be soldered, for example, to a motherboard or other circuit board.

Figure 9I:
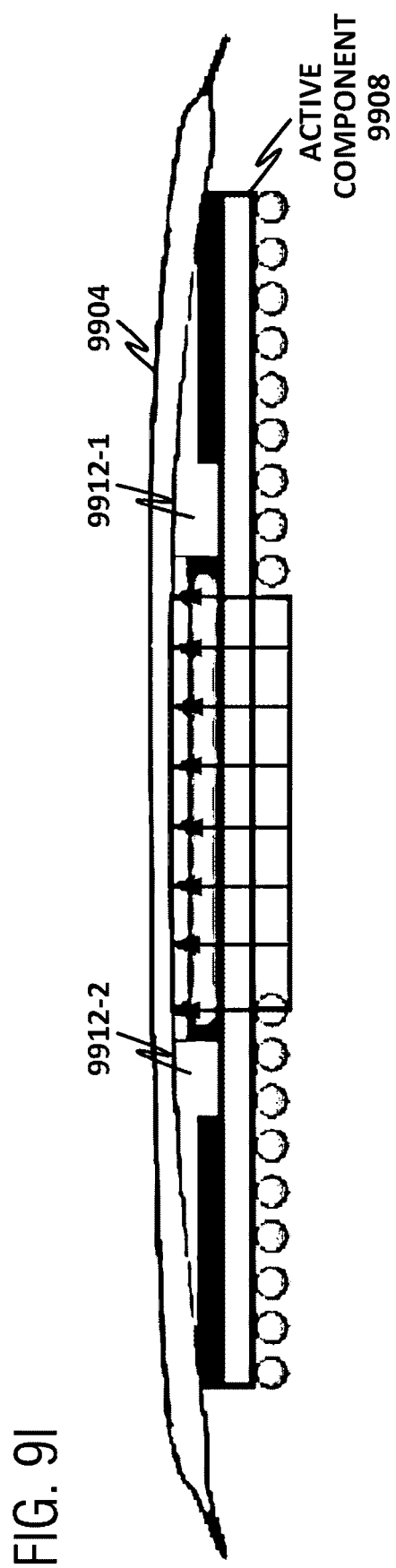
FIG. 9i is a side view illustration of flexing of a vapor chamber.

FIG. 9i is a side view illustration of flexing of a vapor chamber. As shown, vapor chamber 9904 mounts to active component 9908. Affixing means 9912-1 and 9912-2, such as screws or bolts, secure vapor chamber 9904 to active component 9908. This ensures good, close thermal contact, and increases the efficiency of the heat transfer. However, as illustrated, this can result in flexing of vapor chamber 9904.

Embodiments of the present disclosure provide an integrated structure within a vapor chamber that structurally acts to both stiffen and prevent collapse of the chamber, and to provide for low-profile mounting features. Disclosed embodiments may also provide advantages for devices with passive cooling, enable higher loads applied to vapor chambers for improved thermal interfaces to the die (with thinner, more consistent bond lines), and mitigate deflection in vapor chambers, reducing the risk of interference with package stiffeners or neighboring components. These advantages may reduce the total z-budget required, as formed pedestals that space vapor chambers away from the die could be shortened or removed. Certain embodiments may also enable lower-profile mounting methods that meet increasingly restrictive z-height goals.

Vapor chambers with multi-artery wicks to enhance fluid transport in high-power applications have been in use for many years. However, such embodiments are sometimes not utilized in mobile products that are driven by skin temperature limits. The artery-like wicks of the present specification expand beyond the heat source to integrate with their respective mounting locations. This interfacing where a vapor chamber attaches to the system dramatically improves stiffness above the package, while facilitating proper loading.

Figure 9J:
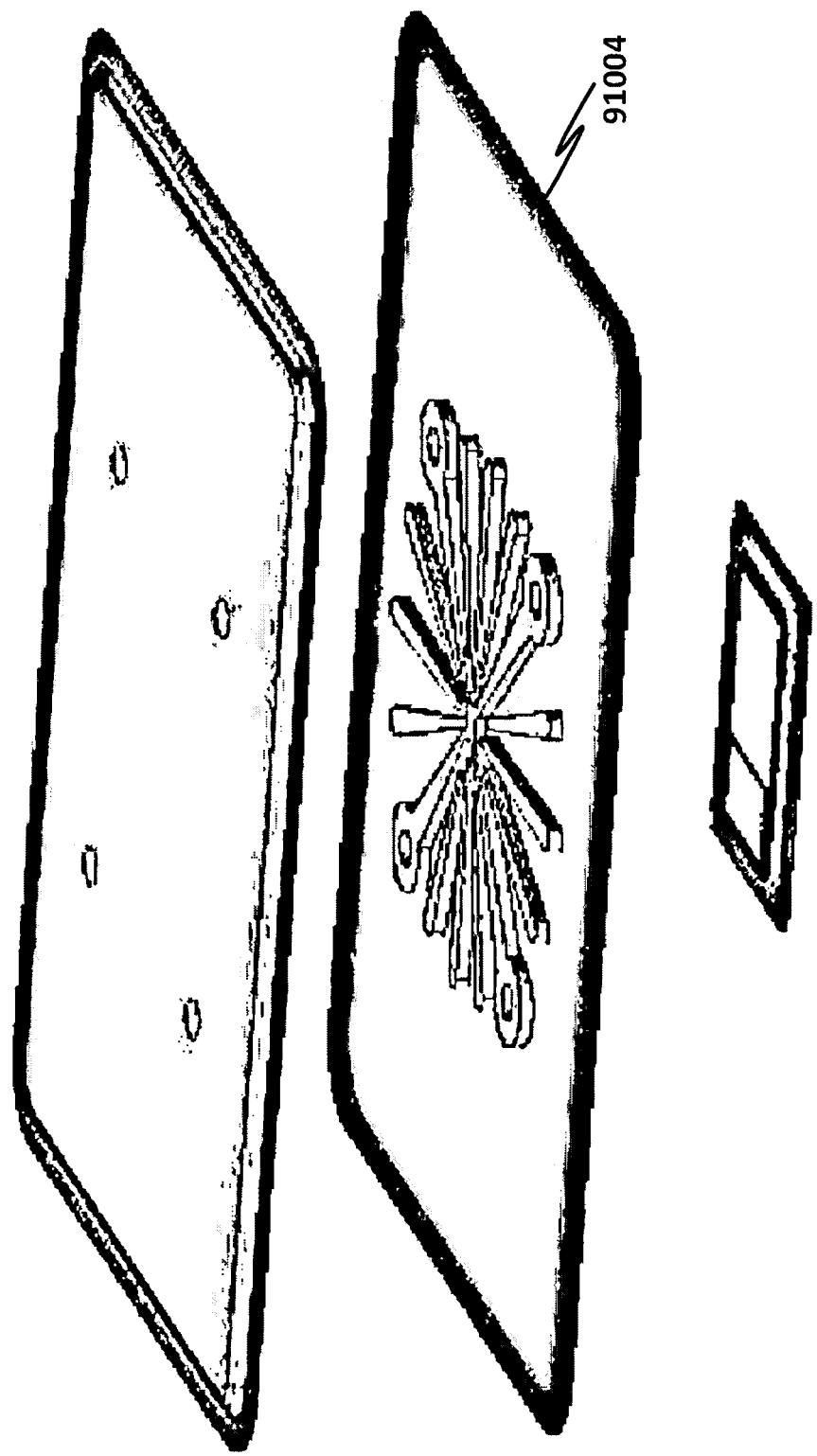
FIG. 9j is a cutaway perspective view illustration of a vapor chamber.

FIG. 9*j* is a cutaway perspective view illustration of a vapor chamber 91004 employing a starburst structural support pattern.

Figure 9K:
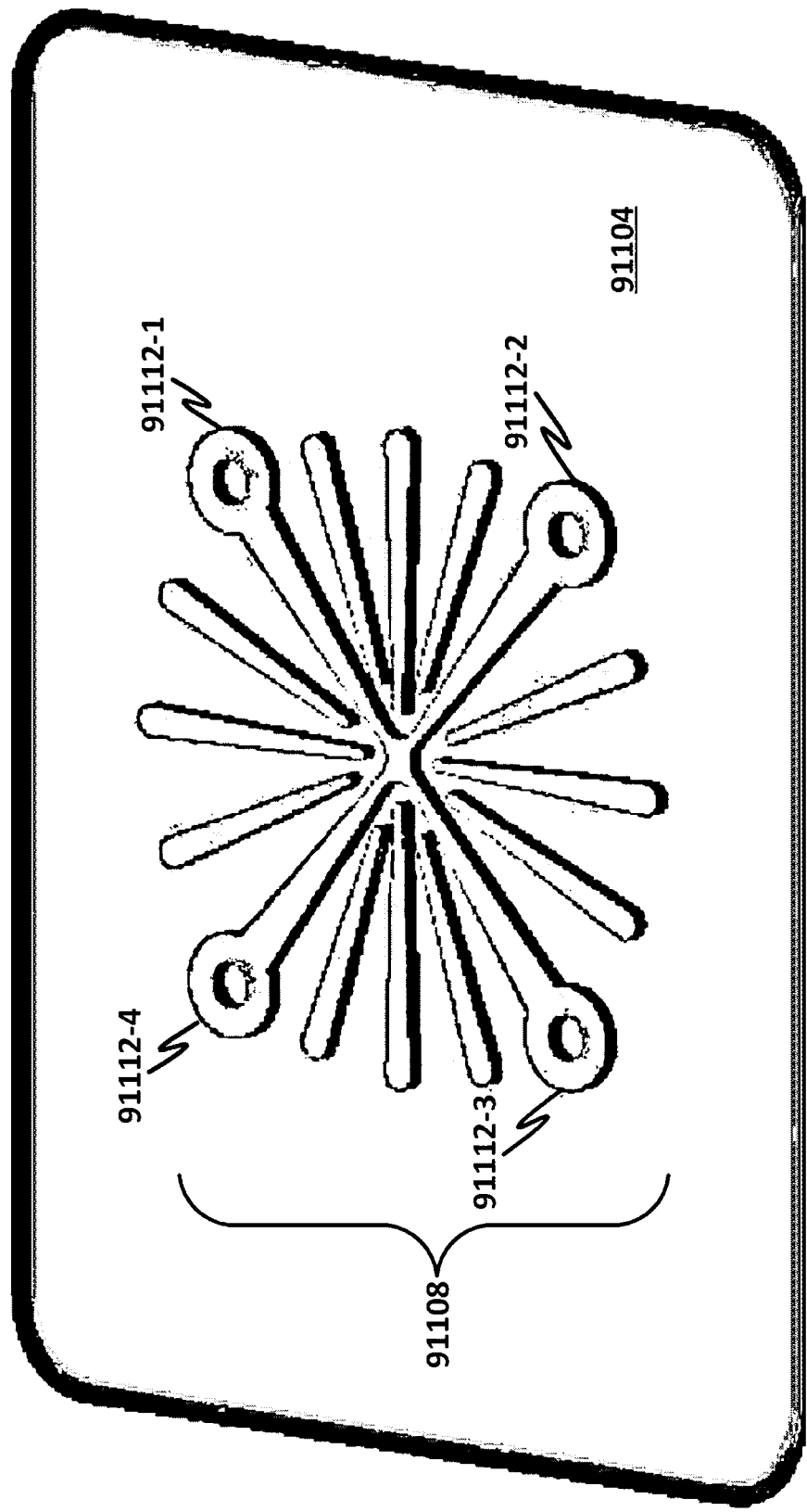
FIG. 9k is a detailed view illustration of a starburst structural support pattern on a vapor chamber.

FIG. 9*k* is a more detailed view of a starburst structural support pattern on a vapor chamber. In FIG. 9*k*, vapor chamber 91104 includes starburst structural support pattern 91108. Starburst structure 91108 includes mounting points 91112-1, 91112-2, 91112-3, and 91112-4. Mounting points 91112 may provide through-holes where affixing means such as screws or bolts can pass through columns to mount vapor chamber 91104.

Figure 9L:
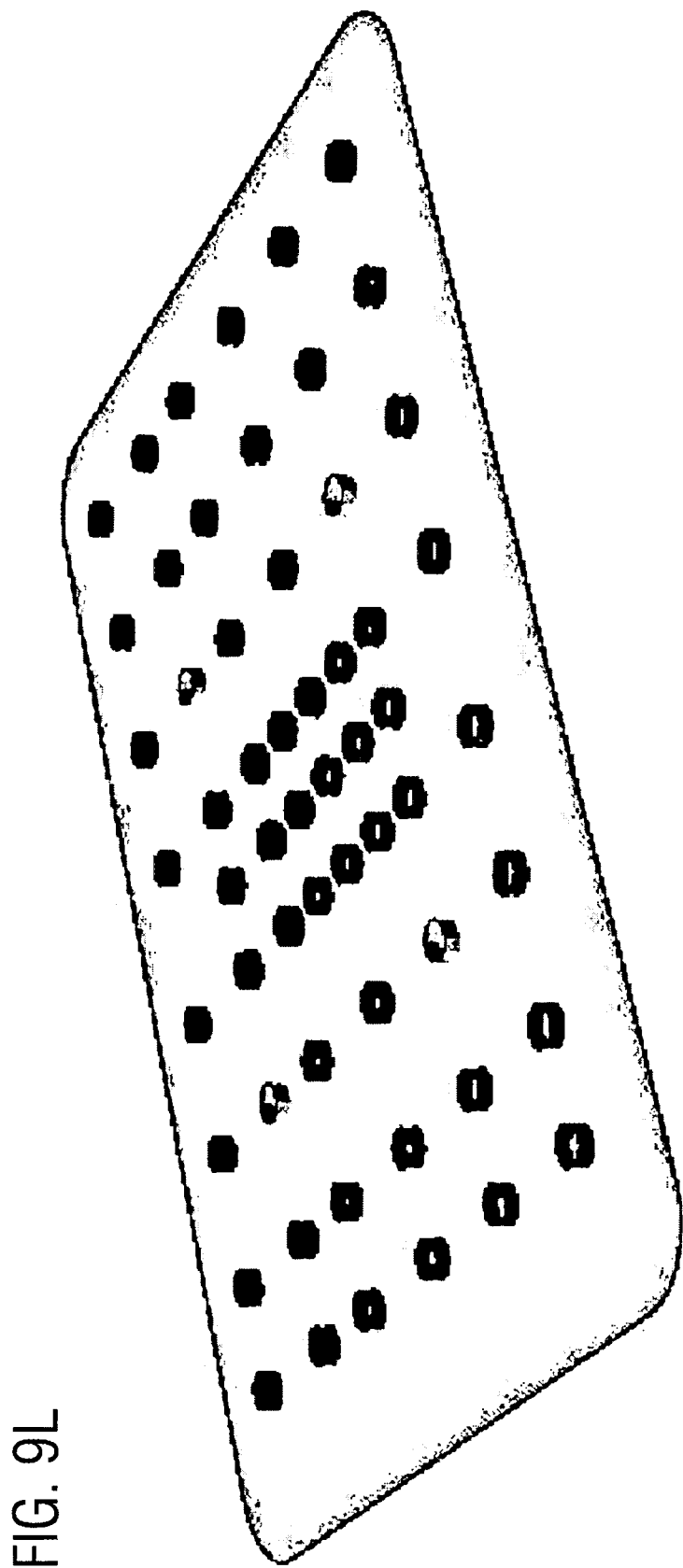
FIG. 9l is a perspective view illustration of support columns within a vapor chamber.

FIG. 9*l* is a perspective view illustration of support columns within a vapor chamber.

Figure 9M:
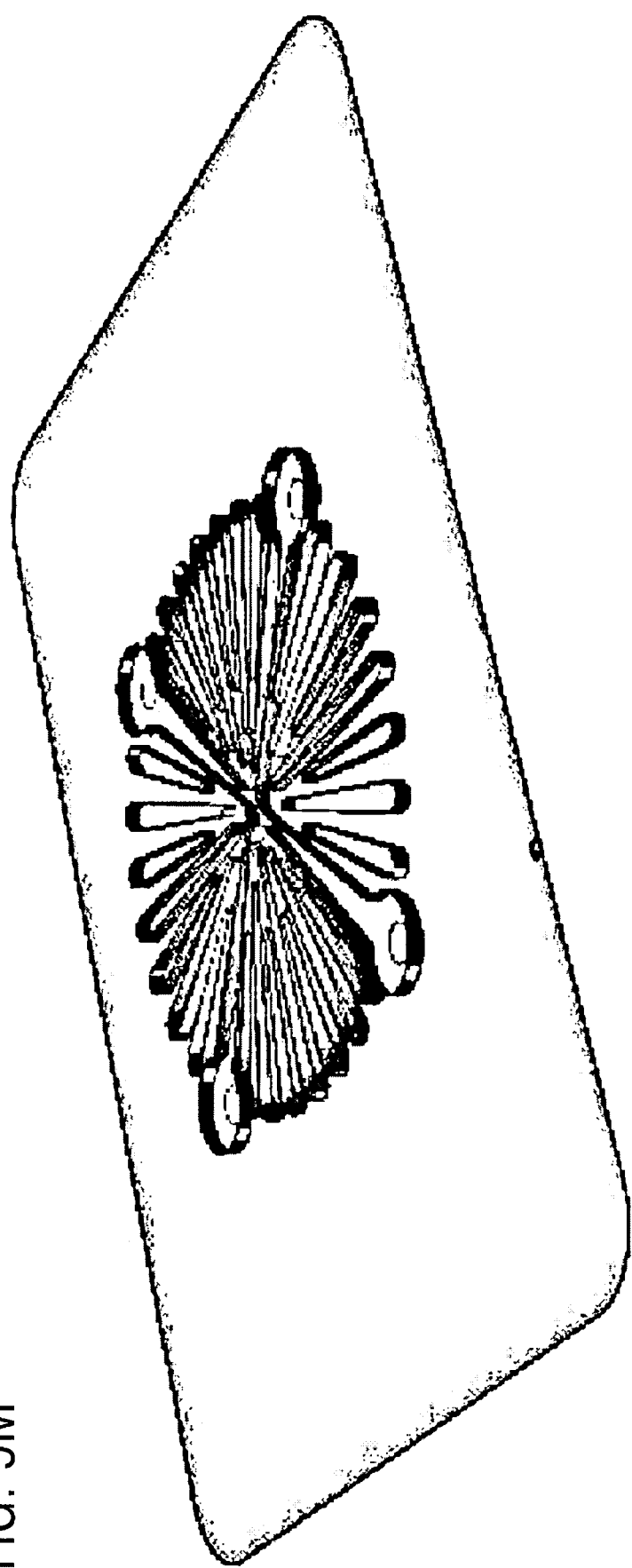
FIG. 9m is a perspective view illustration of a columnar starburst pattern.

FIG. 9*m* is a perspective view illustration of a columnar starburst pattern.

In some applications, these structures are focused on increasing fluid flow into the "hot zone" or evaporator of the chamber, and not primarily on improving the structural properties of the chamber. Embodiments of the present disclosure introduce a radial or starburst pattern that can be enlarged to encompass the entire package surface and not just the die. Artery size and shape may balance thermal as well as structural performance. Individual ribs may also incorporate features for mounting, such as through-holes or rings around counter-sunk holes, to improve structural integrity along the load path within a vapor chamber.

Modeling with finite element analysis (FEA) has been used to compare a standard copper pillar vapor chamber to embodiments of the present specification. Both the copper pillar vapor chamber and a vapor chamber of the present disclosure employ 200 µm thick walls with 1 mm thick vapor cavities for a total 1.4 mm thick assembly. The chamber assembly may be constrained by the four corner mounting holes (or locations in absence of holes) and a 20 pound-force (lbf) die load may be applied at the lower evaporator surface for modeling purposes. Maximum deflection of the baseline under these conditions has been shown to be four to five times larger in the copper pillar vapor chamber than in the presently disclosed embodiment.

One possible embodiment of a lower-profile mounting system utilizes the internal structure of the disclosed vapor chamber to carry the spring force from the backing plate to the top of the die and through the thermal interface. Because the structure is integrated into the vapor chamber, perhaps as sintered versus solid material, this type of structure may be lighter overall.

Note that the internal structure may need to be refined to balance both the structural and thermal performance, so the actual shape and design of the internal structure may vary from the disclosed examples.

Figure 9N:
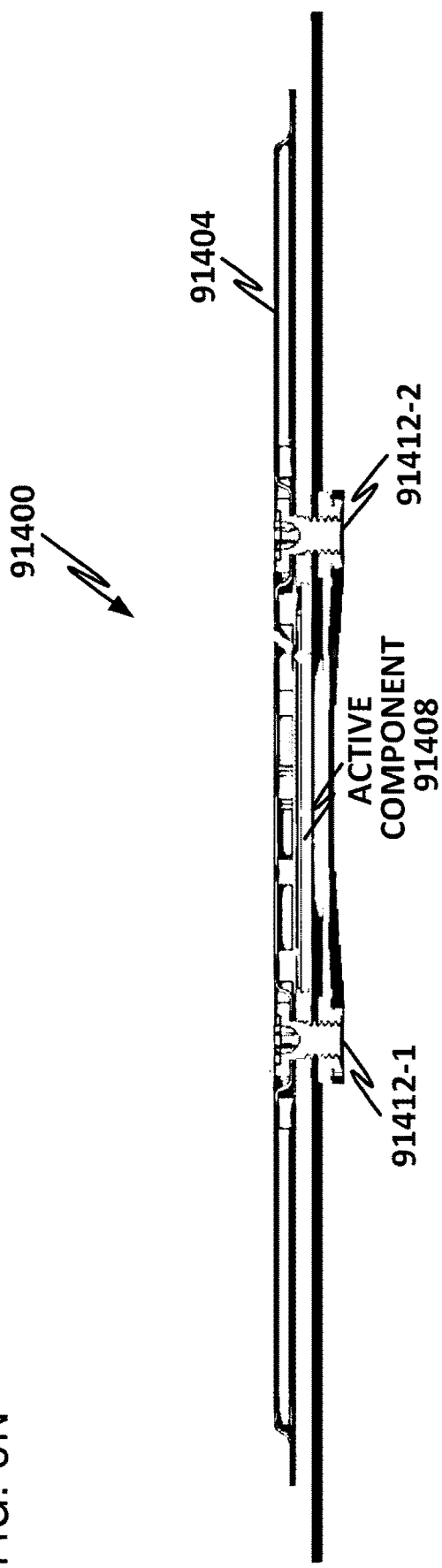
FIG. 9n is a side view in situ illustration of a vapor chamber.
Figure 90:
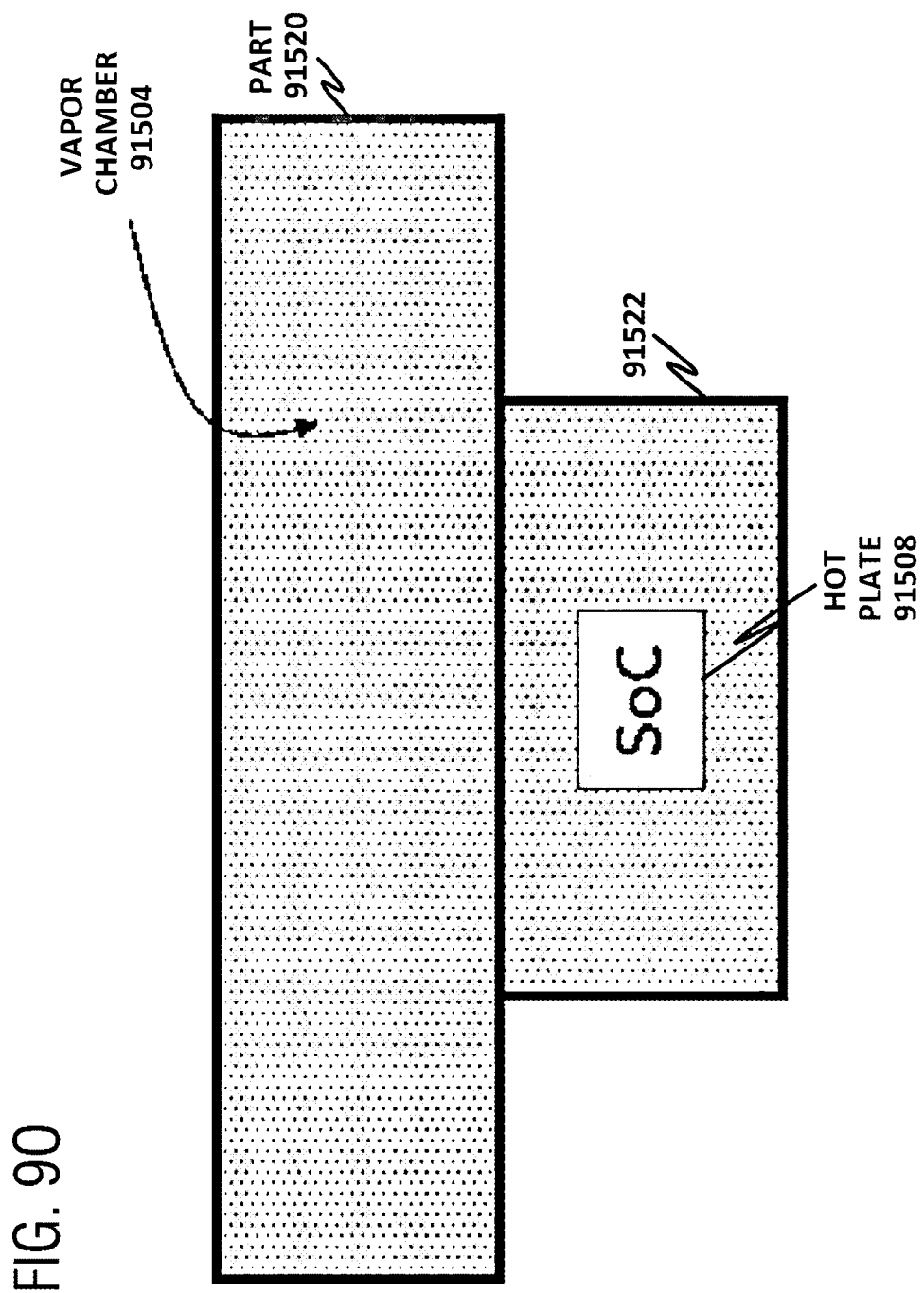

FIG. 9*n* is a side view in situ illustration 91400 of a vapor chamber 91404. This in situ view illustrates a benefit of the starburst pattern. Specifically, vapor chamber 91404 sits atop active component 91408, and affixing means 91412-1 and 91412-2 hold vapor chamber 91404 in close contact with active component 91408 for good thermal conduction and heat transfer. However, with the starburst structural pattern, there is less flexing of vapor chamber 91404.

FIG. 9*o* is a top view illustration of a vapor chamber 91504. Vapor chamber 91504 is a two-part vapor chamber, with the parts labeled simply part 1 91520, and part 2 91522. A hot plate 91508 is located above an active component such as an SoC.

In an additional aspect of the present specification, pressure loss of the vapor in a thin vapor chamber is reduced as it travels from evaporator to condenser, thereby improving its thermal performance. This is achieved by strategically removing the wick from patches to reduce vapor pressure loss from evaporator to condenser. Removal of the wick increases the vapor flow area inside the vapor chamber without increasing the vapor chamber thickness. Once condensed, the liquid reaches the evaporator through wicks located elsewhere in the system base. A similar effect may be achieved in heat pipes through local thickening.

Figure 9P:
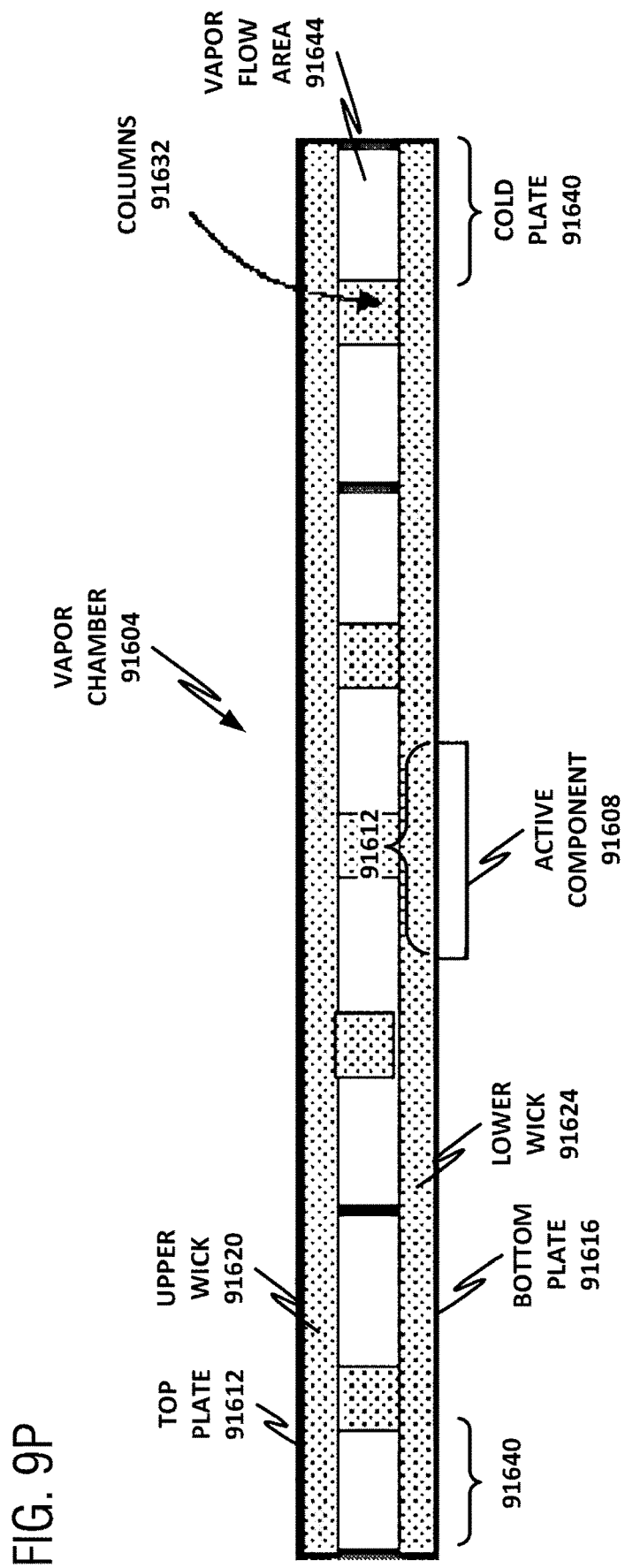
FIG. 9p is a side view illustration of a vapor chamber.

FIG. 9*p* is a side view illustration of a vapor chamber 91604. In the illustrated side view of vapor chamber 91604, there is visible a top plate 91612 and a bottom plate 91616. An upper wick 91620 is affixed to top plate 91612, and a lower wick 91624 is affixed to bottom plate 91616. An active component 91608 is in close thermal contact with a hot plate of vapor chamber 91604. Columns 91632 help provide structural support to vapor chamber 91604.

By way of illustrative example, vapor chamber 91604 may have an overall thickness of 1 mm. This is provided by way of illustrative and nonlimiting example only, and it should be noted that a vapor chamber may have any suitable thickness for the application.

In the case of a vapor chamber that is 1 mm thick, top plate 91612 and bottom plate 91616 may both be approximately 0.2 mm thick to provide structural integrity to the hermetic enclosure. Upper wick 91620 and lower wick 91624 may both be approximately 0.2 mm thick to provide transfer of fluid from cold plate regions 91640 back to top plate 91612. This leaves an internal vapor flow area 91644 of approximately 0.2 mm. Heat transfer efficiency can be increased by reducing the pressure loss within vapor flow area 91644. However, wicks 91620, 91624 may be necessary to carry fluid from cold plates 91640 back to top plate 91612.

Figure 9Q:
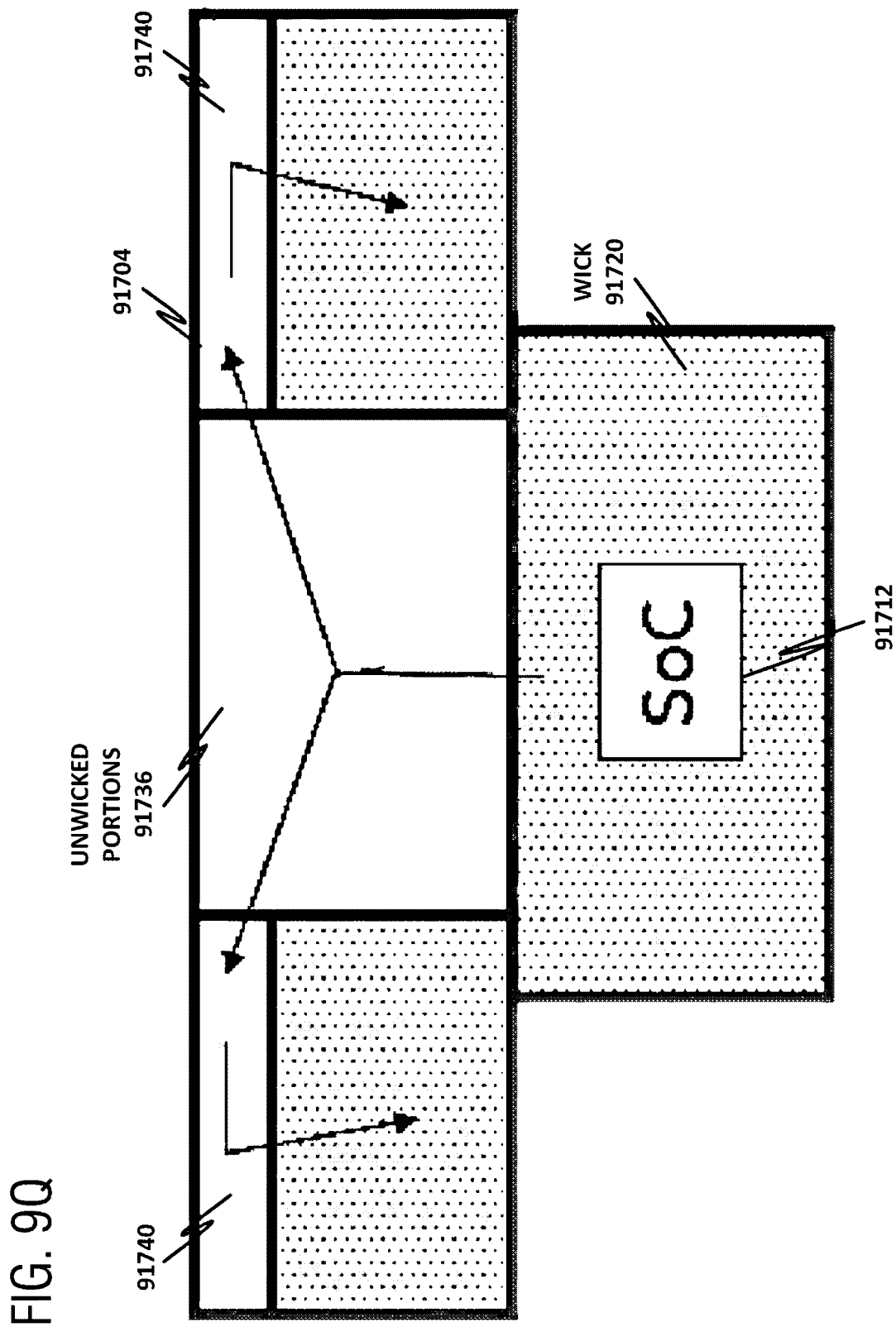
FIG. 9q is a top view illustration of selective removal of portions of a wick.

FIG. 9*q* is a top view illustration of selective removal of portions of the wick.

In this example, vapor chamber 91704 includes wick 91720, which carries fluid from wicked portions 91740 back to hot plate 91712. However, portions of vapor chamber 91704 do not include a wick 91720. These are labeled as unwicked portions 91736. Vapor flows freely through unwicked portions 91736, but unwicked portions 91736 may be selected to be portions of vapor chamber 91704 where the evaporative fluid generally does not condense, but rather remains in its vaporous state. Fluid condenses at wicked portions 91740, and is then carried by wick 91720 back to hot plate 91712, where it can evaporate again. Because portions of vapor chamber 91704 that do not generally experience condensation are selected for removal of wick, pressure loss across vapor chamber 91704 is reduced, because a greater flow area is provided within unwicked portions 91736. Wicked portions 91740 may include those portions where fluid generally condenses, as well as wicking means that may be required to carry fluid back to hot plate 91712.

Figure 9R:
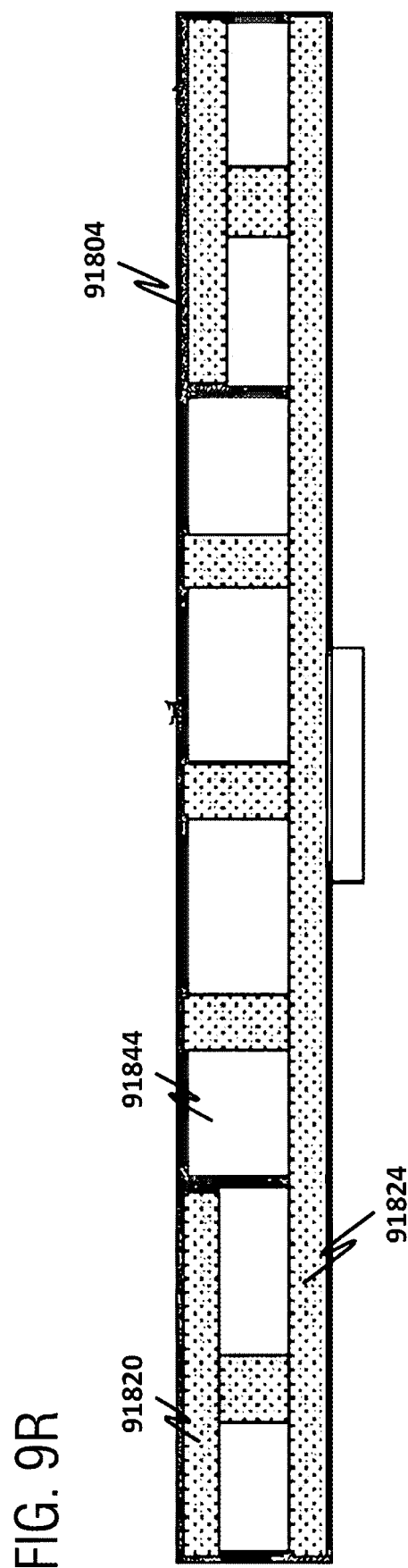

FIG. 9*r* is a cutaway side view illustration of a vapor chamber 91804 with selected portions of the wick removed. As can be seen in this illustration, portions of upper wick 91820 have been removed so that, in certain local areas, the thickness of vapor flow area 91844 is substantially increased. For example, using the previous illustrative measurements, the vapor flow area thickness is increased from 0.2 mm to 0.4 mm. This could be further increased by removing portions of lower wick 91824 in those same regions. Alternatively, portions of lower wick 91824 could be removed from different areas.

By effectively increasing the vapor flow area, a thin vapor chamber can be made to provide similar thermal performance as that of a thicker vapor chamber. Alternatively, a thick vapor chamber can be made thinner for similar performance. Embodiments of this specification may achieve improved performance in current systems of average chassis height, or in systems with reduced chassis thickness while retaining similar performance. Performance improvement may also be realized by removing only portions of upper wick 91820. Advantageously, the disclosed embodiments may further reduce vapor chamber cost and weight due to less wick powder usage.

FIGS. 9o-9p and 9q-9r respectively illustrate benefits of selectively removing portions of the wick to reduce pressure loss. In some existing systems, the wick is present in the entirety of the top and bottom surfaces of the vapor chamber, as illustrated in FIGS. 9o and 9p.

In disclosed embodiments, the wick layout is designed in patches, such that the wick is not present continuously throughout the vapor chamber, as illustrated in FIGS. 9q and 9r.

Figure 9S:
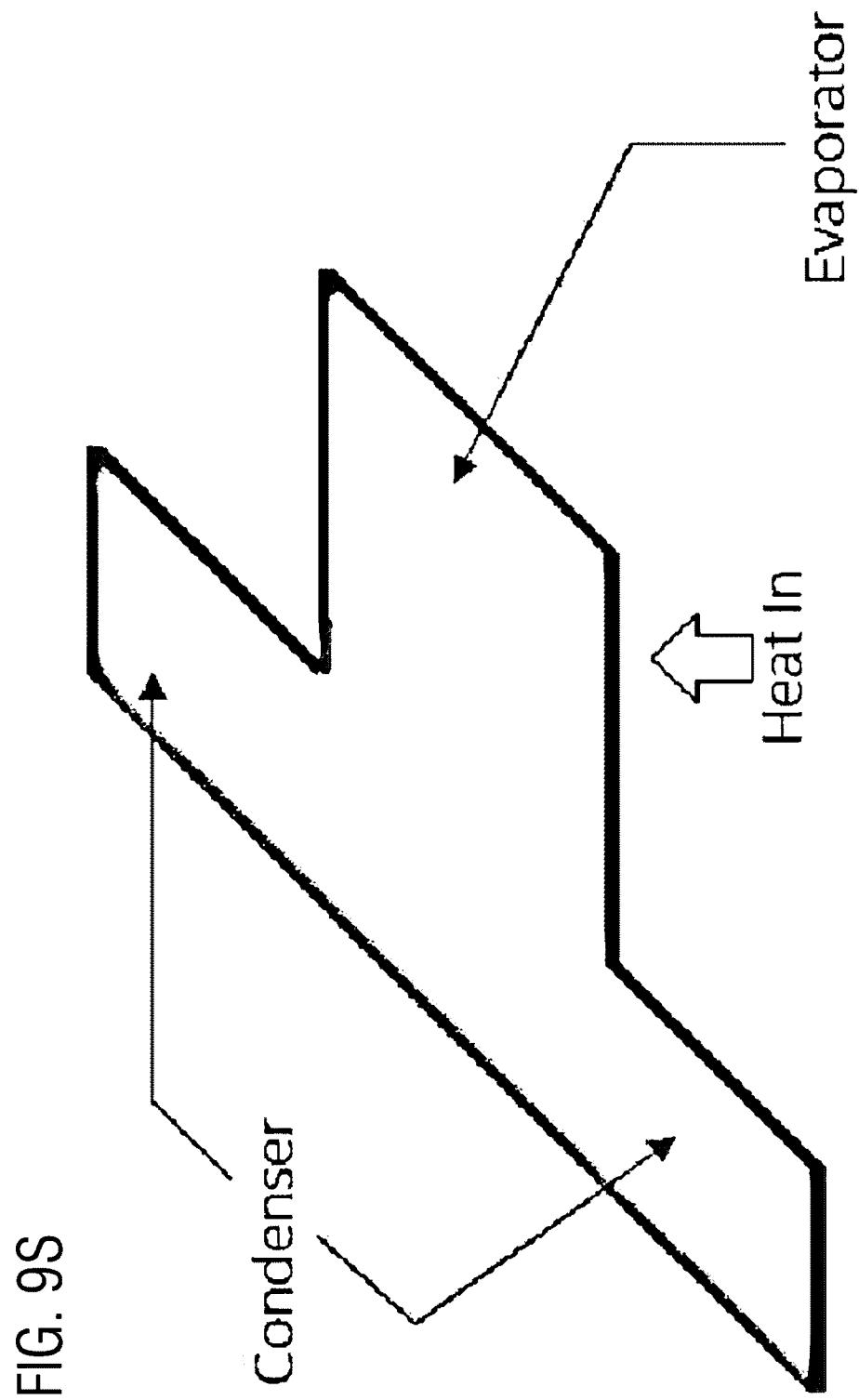

FIG. 9s is a perspective view illustration of heat transfer from an evaporator to a condenser.

Strategically, the wick is removed in portions to guide the vapor from the evaporator to the condenser, as illustrated in FIG. 9s. The liquid from the condenser reaches the evaporator through the wick present elsewhere in the system base. This ensures that vapor pressure loss is reduced as it travels from the evaporator to the condenser, enabling higher flux handling capacity since vapor reaches the condenser with lesser resistance and lower back pressure development near the evaporator. This enables quicker replenishment of the evaporator with condensed liquid, and hence, delayed dryout.

An illustrative vapor chamber of 1 mm thickness may have 0.2 mm of wick on the top and bottom, leaving a 0.2 mm gap for the vapor to flow (given a wall thickness of 0.2 mm). In the present disclosure, the same 1 mm vapor chamber will have pathways for the vapor as high as 0.4-0.5 mm (since the wick is absent), which is about three times the area available in other vapor chambers.

Figure 9T:
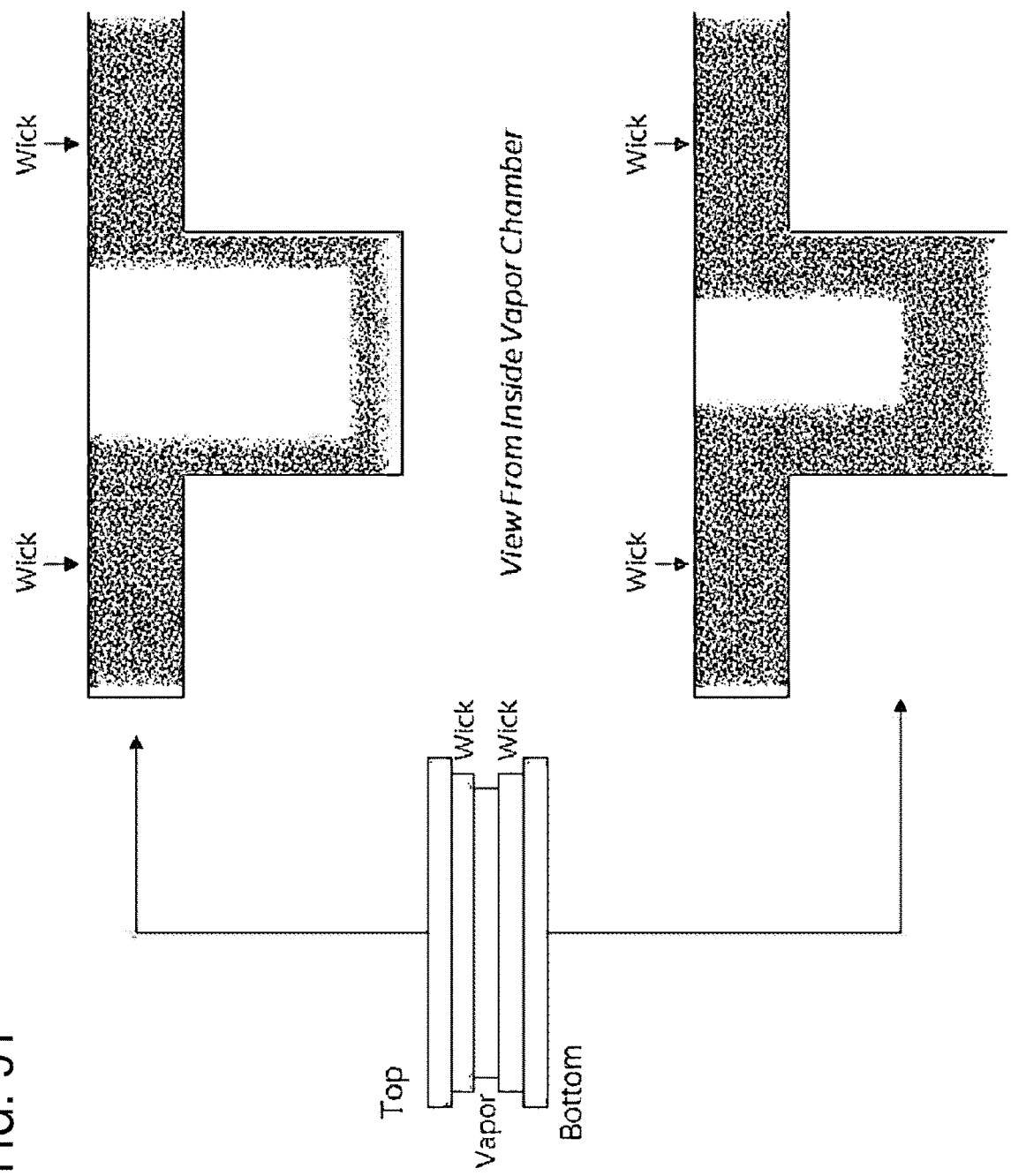

FIG. 9t is a cutaway side view illustration of a vapor chamber with selected portions of the wick removed. FIG. 9t illustrates two example embodiments where varying amounts of wick have been removed. For example, approximately 30% or 45% may be removed, or between 15% and 70%.

Disclosed embodiments benefit from the fact that increasing the flow area reduces the pressure loss in a two-phase heat transport device. Hence, the benefit can be demonstrated by showing the performance improvement in a locally thickened heat pipe. Local thickening in heat pipes results in locally increased flow area.

This benefit may be demonstrated in an example test setup. In one embodiment, the setup may consist of heat pipes without local thickening (i.e., they are uniformly flat with a 1.2 mm thickness). In another embodiment, the heat pipes have been made locally thicker in the highlighted region from 1.2 mm to 1.5 mm. This means that in the highlighted patch, the vapor flow area may increase by 25%. This increase is indicative of the thermocouple location.

The concept of local thickening in heat pipes has been tested in an alternate embodiment. This embodiment employs a single heat pipe and a water bath to control the evaporator and condenser temperatures, and to demonstrate the benefit of local thickening.

Both embodiments indicate that local thickening in heat pipes results in improved Q MAX capacity. This benefit may be obtained solely by increasing the flow area available to the vapor. Even a 25% increase in the flow area results in a substantial performance improvement. This indicates that for vapor chambers, benefit may be much higher given that in portions the flow area is increased by 300%. One feature of this embodiment is the absence of the wick in patches, and more importantly, the strategic locations from which the wick may be removed so that the best outcome is obtained.

Figure 9U:
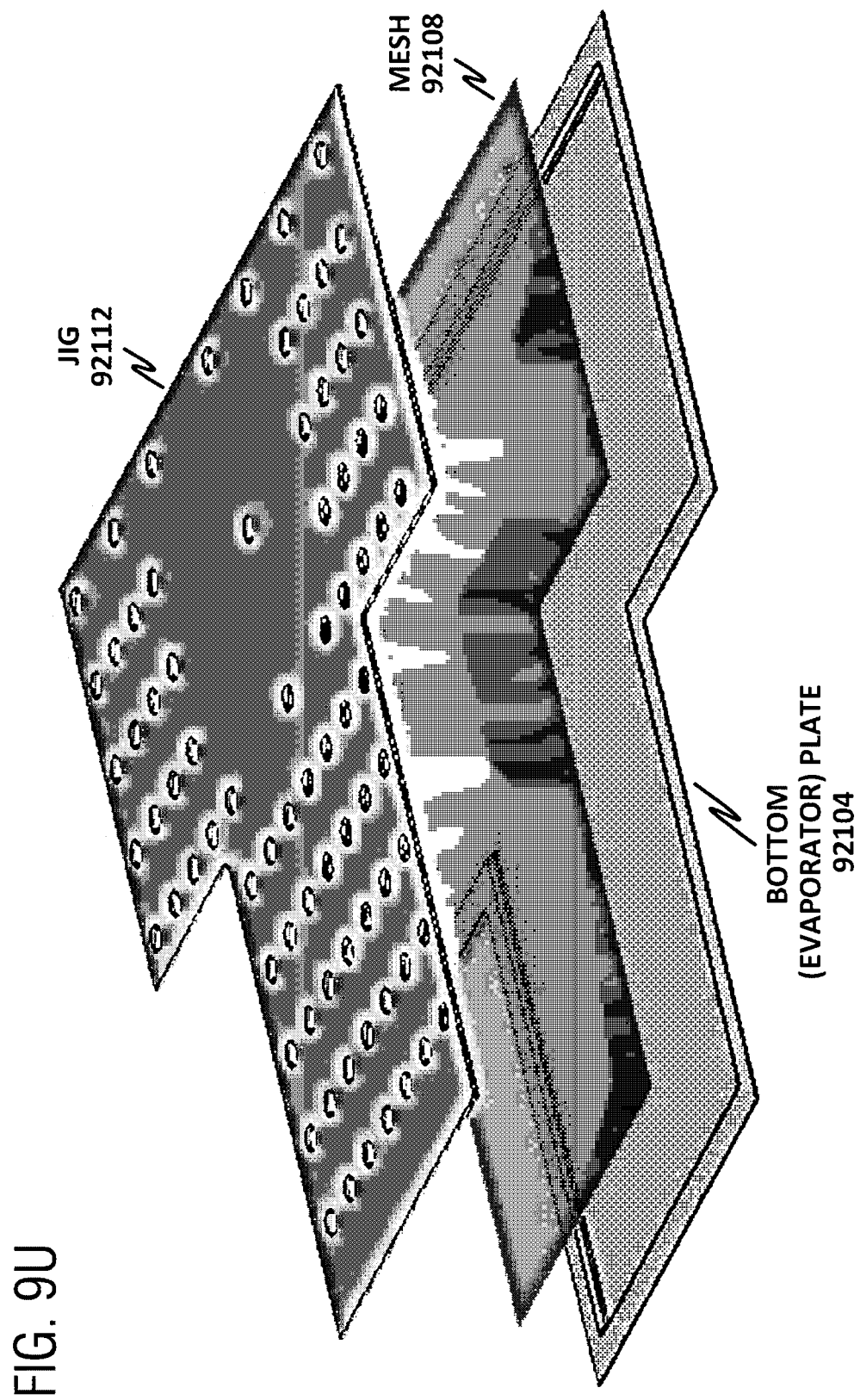
Figure 9V:
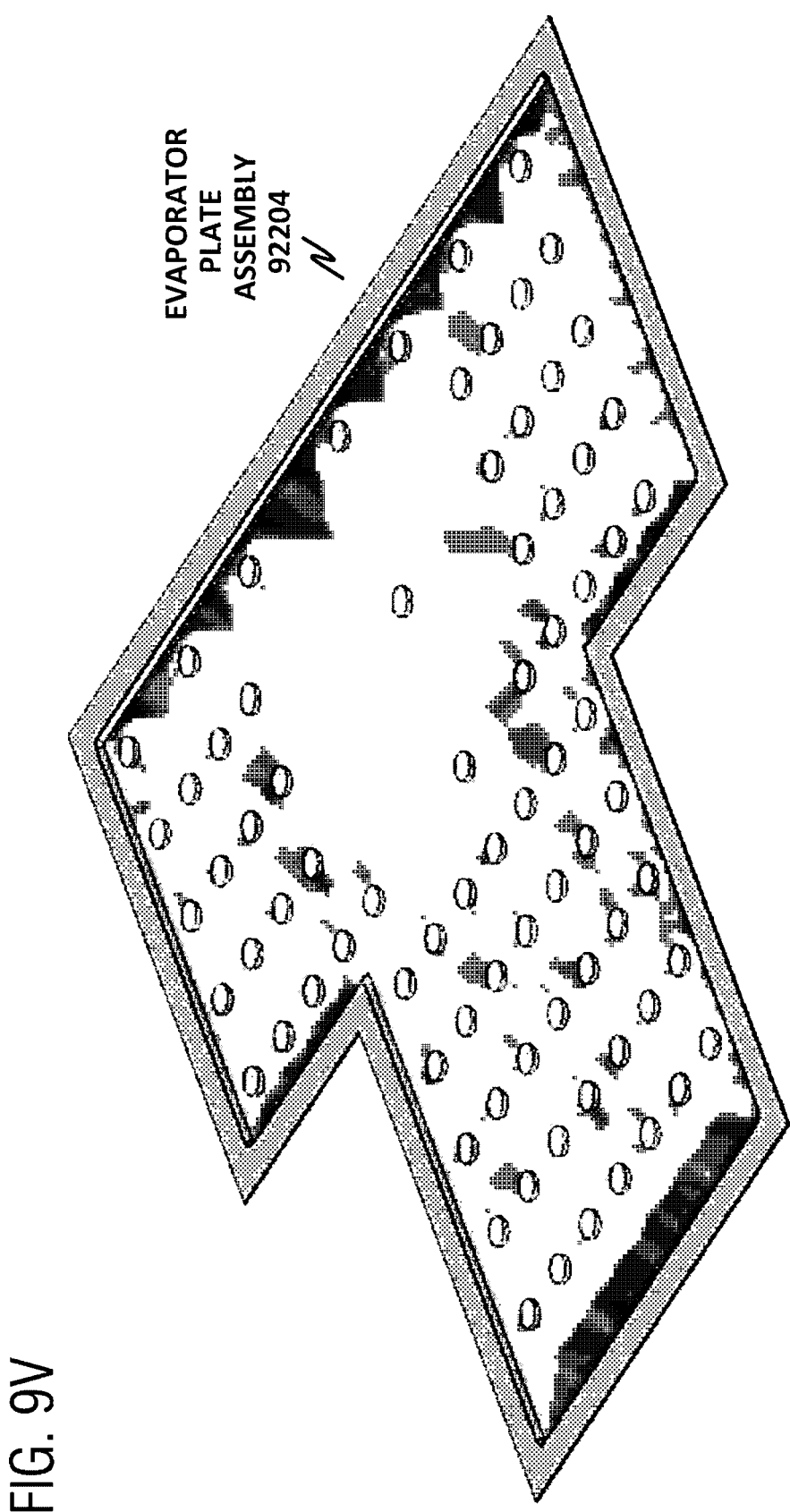

FIGS. 9u-9v disclose a manufacturing method that may be used for any of the embodiments herein. This method is described by way of illustration, with particular reference to the embodiment that includes selective removal of portions of the wick.

Figure 9W:
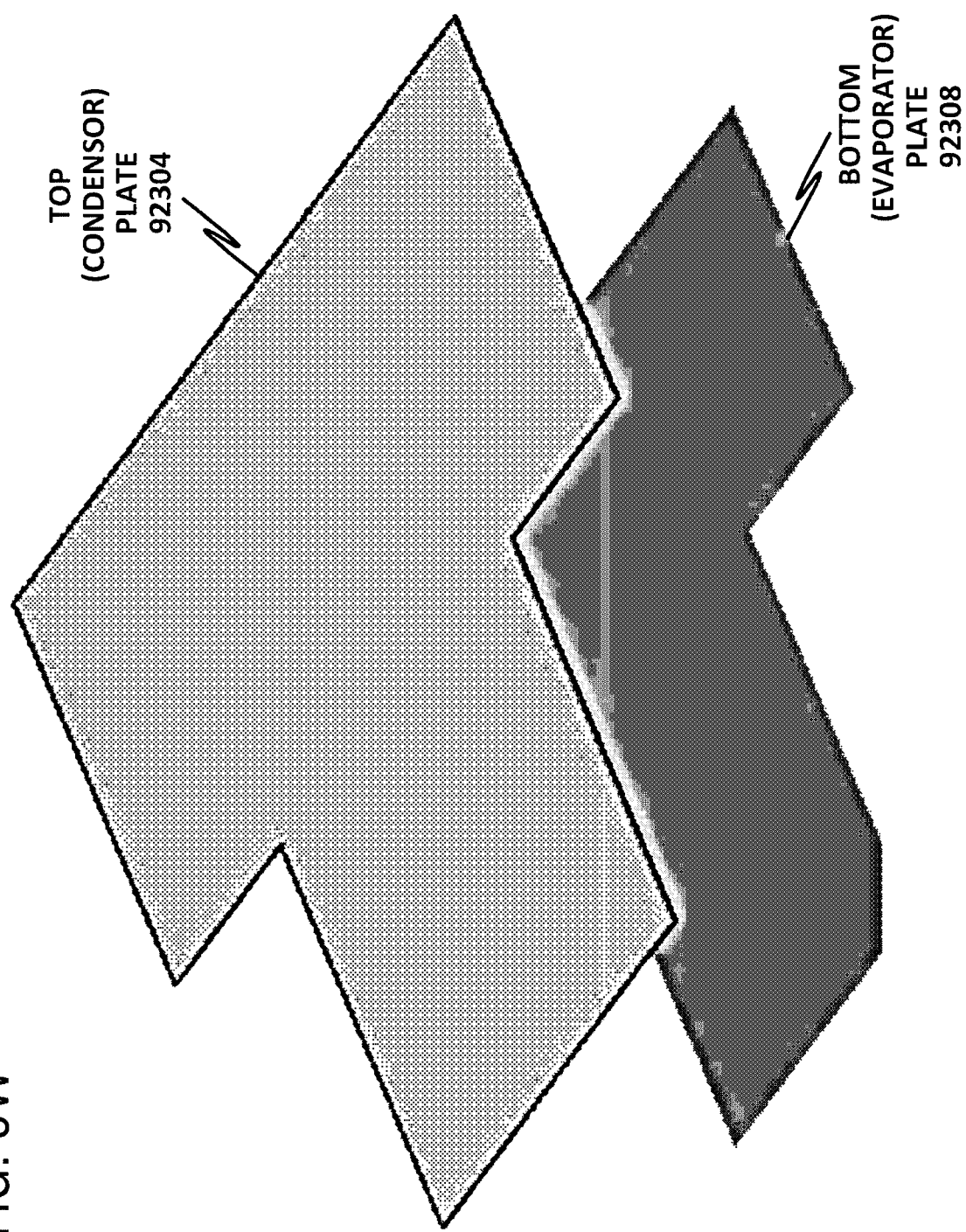
Figure 9X:
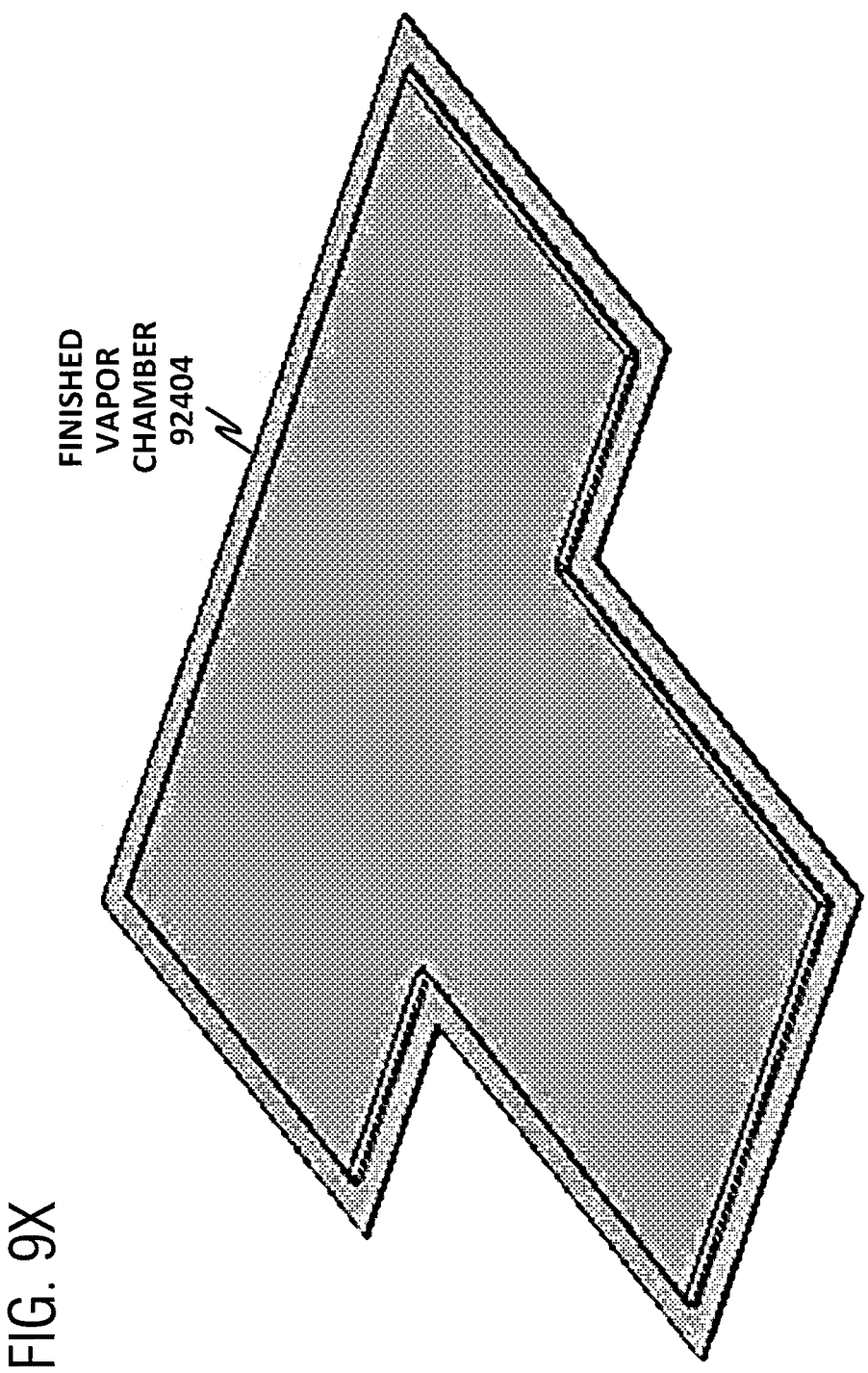
Figure 9Y:
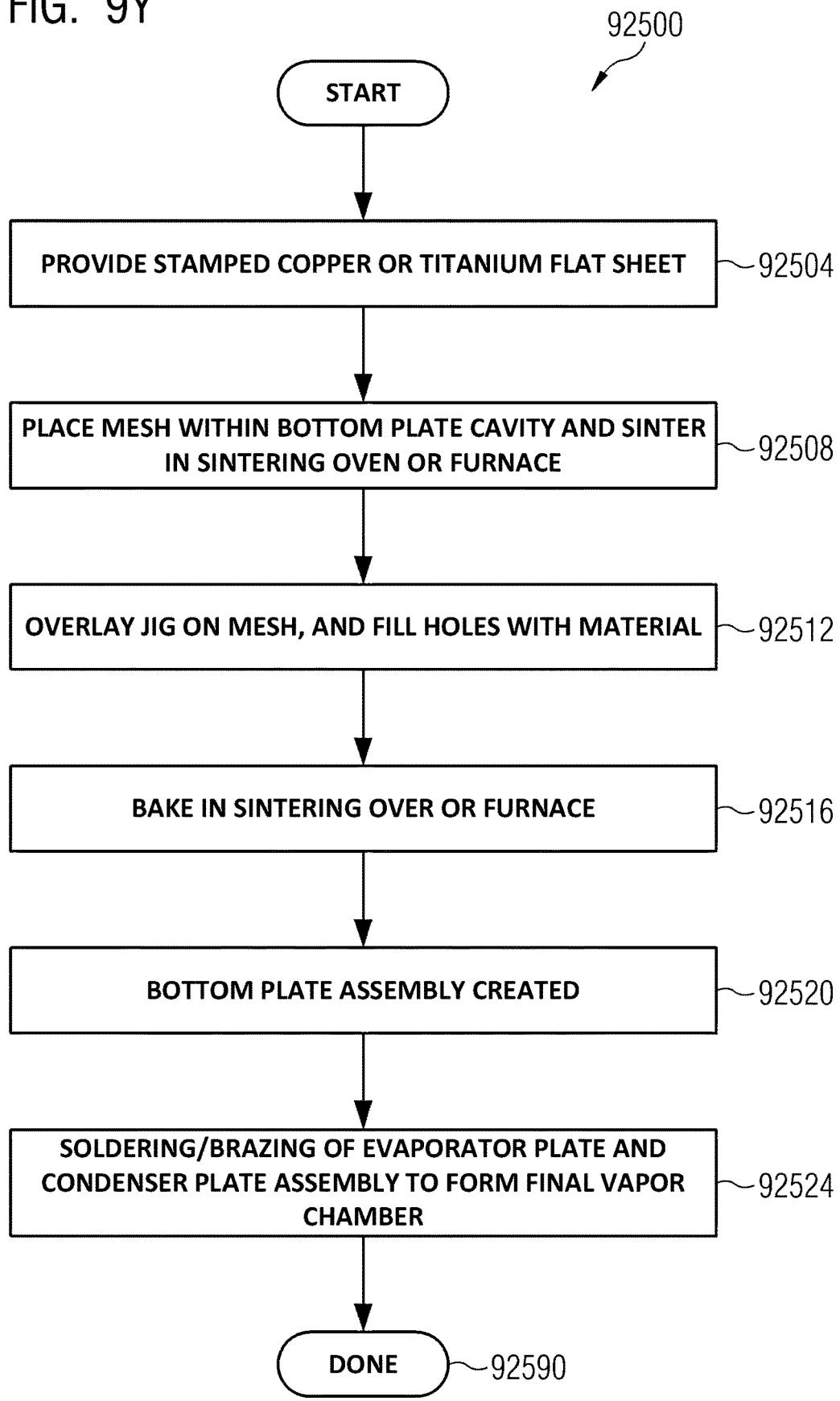

FIGS. 9u-9x illustrate a step-by-step manufacturing process, while FIG. 9y provides a flowchart of a method 92500 of performing the manufacturing process.

In FIG. 9u, there is shown a bottom plate 92104, which may also be referred to as an evaporator plate. By convention, bottom plate 92104 is sometimes called an evaporator plate because it is in contact with the heat source, and therefore fluid evaporates from bottom plate 92104. By convention, the top plate is sometimes called the condenser plate, because fluid condenses on the top plate, and then drips back down to be wicked back to the evaporator plate. These conventional uses may be confusing in light of other conventional uses that designate portions near the heat source as the "evaporator" or "evaporator region," and portions removed from the heat source as the "condenser" or "condenser region." In the industry, there is occasionally ambiguity. Some individuals or groups use "evaporator" to mean the bottom plate, and others use it to mean regions near the heat source. Other individuals or groups use "condenser" to mean the top plate, and others use it to mean regions removed from the heat source. To avoid ambiguity, throughout this specification the terms "hot plate," "evaporator," and "evaporator region" are used exclusively to refer to a portion of the vapor chamber that is near the heat source (i.e., regions that are hot enough that the cooling fluid exists as a vapor). The terms "bottom plate" and "evaporator plate" are used exclusively to refer to the bottom plate of the vapor chamber. The terms "cold plate," "condenser," and "condenser region" are used exclusively to refer to a portion of the vapor chamber that is removed from the heat source (i.e., regions that are cool enough that the cooling fluid exists as a condensate). The terms "top plate" and "condenser plate" are used exclusively to refer to the top plate of the vapor chamber.

In this example, evaporator plate 92104 may be manufactured according to a stamping or forging process, and may be made for example of a material such as copper, titanium, or some other conductive material that may have good anti-corrosive properties.

Overlaid on bottom plate 92104 is a mesh 92108. Mesh 92108 may for example be fiber braided or die cut. The material for mesh 92108 may be for example copper or titanium, or some other conductive metal. In some embodiments, mesh 92108 is made of the same material as bottom plate 92104, although this is not an absolute requirement.

A jig 92112 may be overlaid on mesh 92108. Jig 92112 can be used to form columns within the vapor chamber. For example, a stamped evaporator plate or bottom plate 92104 may have a "cavity" portion (i.e., a stamped depression in the metal). Mesh 92108 may be overlaid, such as by locating the mesh into the evaporator plate cavity. Sintering jig 92112 may then be laid on top of mesh 92108, and the holes within jig 92112 may be filled for example with copper or titanium powder. Both wick and columns may be omitted from certain regions of the assembly, as illustrated herein (regions where there are no columns formed). These regions may be selected to form a flow path for the evaporate, from the evaporator region to the condenser region. As described above, omitting wick and columns from these regions provides locally increased flow volume, with correspondingly increased cooling efficiency. In the illustration here, approximately 20% of the two-dimensional surface area of the vapor chamber is free of wick and columns.

The assembly may then be baked in a sintering oven or furnace to provide the structure of FIG. 9v.

FIG. 9v illustrates a patched wick 92204 that is a result of the sintering process described in connection with FIG. 9u. After the sintering, the powdered aluminum or copper (or other material) hardens into pillars as illustrated. Notably, pillars and/or mesh may be absent from portions of the product to reduce pressure loss, as described in connection with FIGS. 9o through 9t. Furthermore, sintering may be used to create a starburst or radial pattern, as illustrated in connection with FIGS. 9f through 9n. The shape of the vapor chamber may be selected in accordance with the teachings illustrated in FIGS. 9a-9e.

After the sintering is complete, the evaporator plate assembly 92204 may be joined to a top plate, as illustrated in FIG. 9w.

In this example, a top plate assembly 92304 is provided. Top plate 92304 is by convention sometimes referred to as the condenser plate, and in this illustration, the top plate assembly includes only the top plate. In manufacturing, top plate 92304 may also be stamped or forged into the desired shape. Then top plate 92304 may be welded or otherwise joined to bottom plate assembly 92308, such that a hermetic seal is formed. This ensures that vapor does not escape from the vapor chamber.

FIG. 9x illustrates a finished vapor chamber 92404, in which the top plate assembly and bottom plate assembly have been soldered or otherwise joined together.

FIG. 9y is a flowchart of a method 92500 that describes the process illustrated in FIGS. 9u-9x.

In block 92504, a stamped or forged copper or titanium flat sheet may be provided as the bottom plate or evaporator plate. Similarly, a stamped or forged sheet of the same or a different material may be provided as the evaporator plate.

In block 92508, the mesh is placed within the bottom plate cavity.

In block 92512, the jig is overlaid on the mesh and the holes are filled with appropriate material such as copper powder, titanium powder, or other powder or material.

In block 92516, the assembly is baked in a sintering oven or furnace.

The result is that in block 92520, the bottom plate assembly is created.

In block 92524, soldering, brazing, welding, gluing, or other joining methods may be used to join the evaporator plate and the condenser plate assembly to form the final vapor chamber.

In block 92590, the method is done.

Figure 9Z:
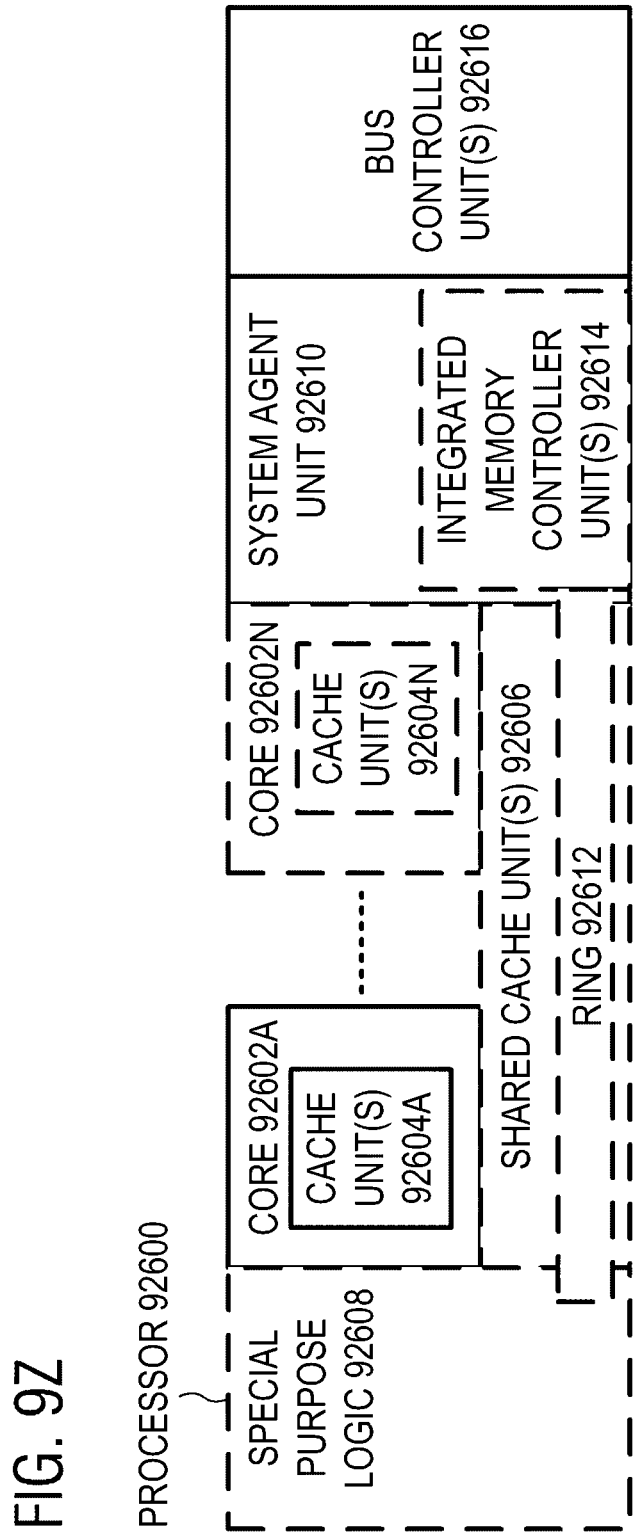
Figure 9A:
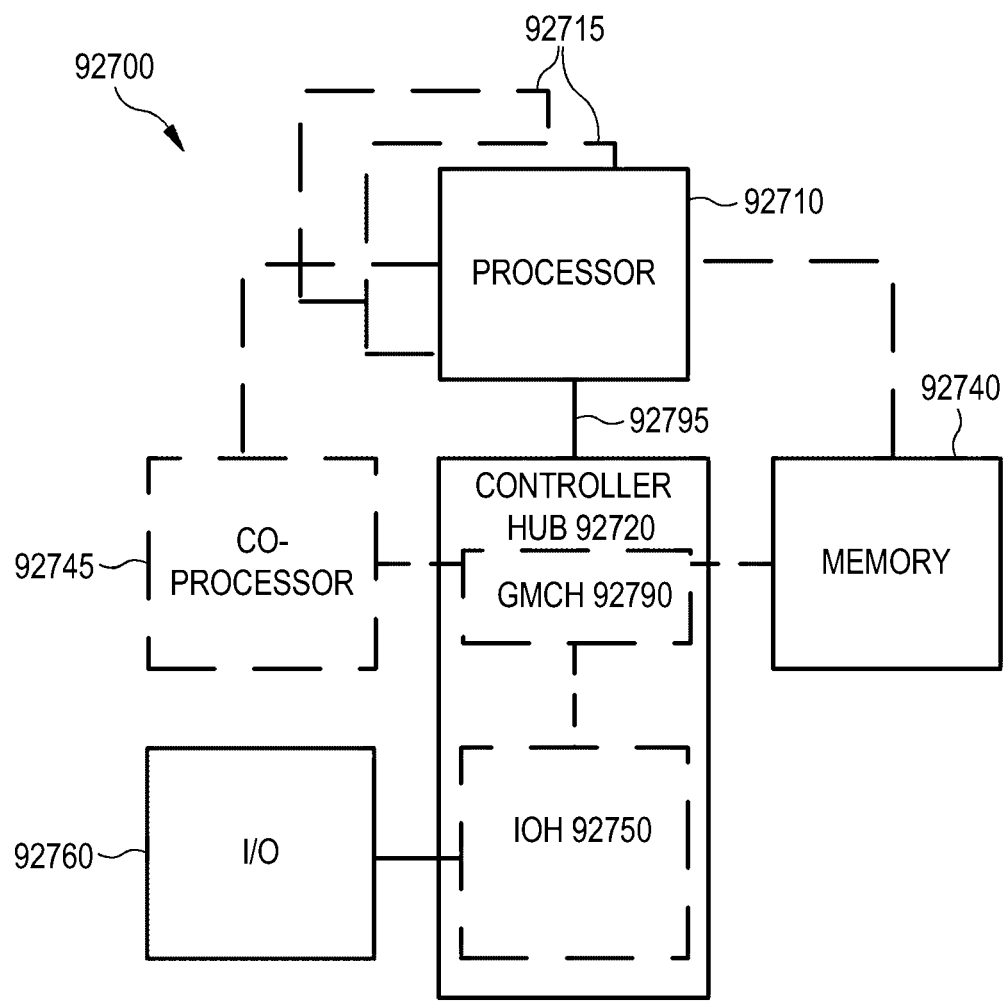
Figure 9A:
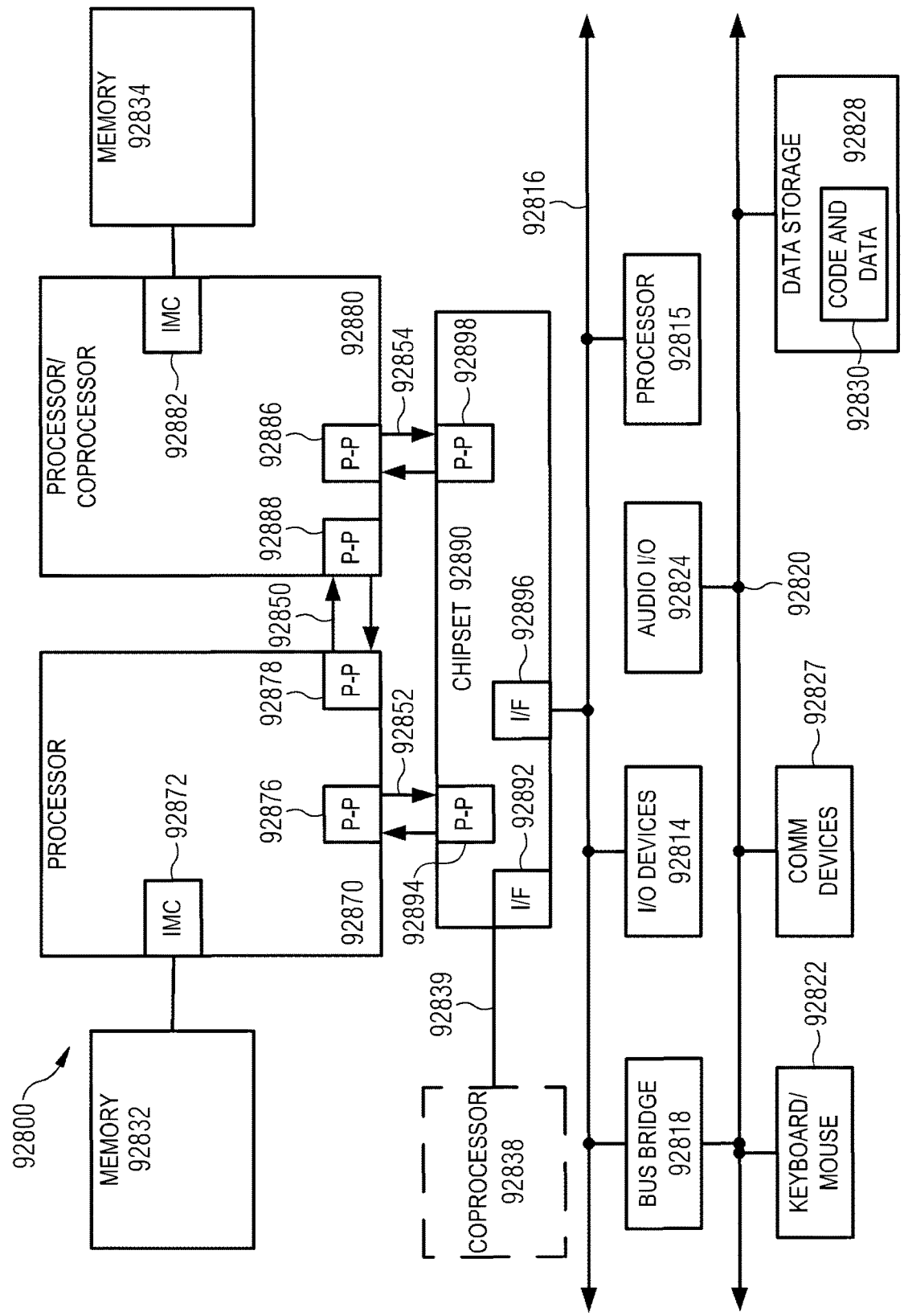
Figure 9A:
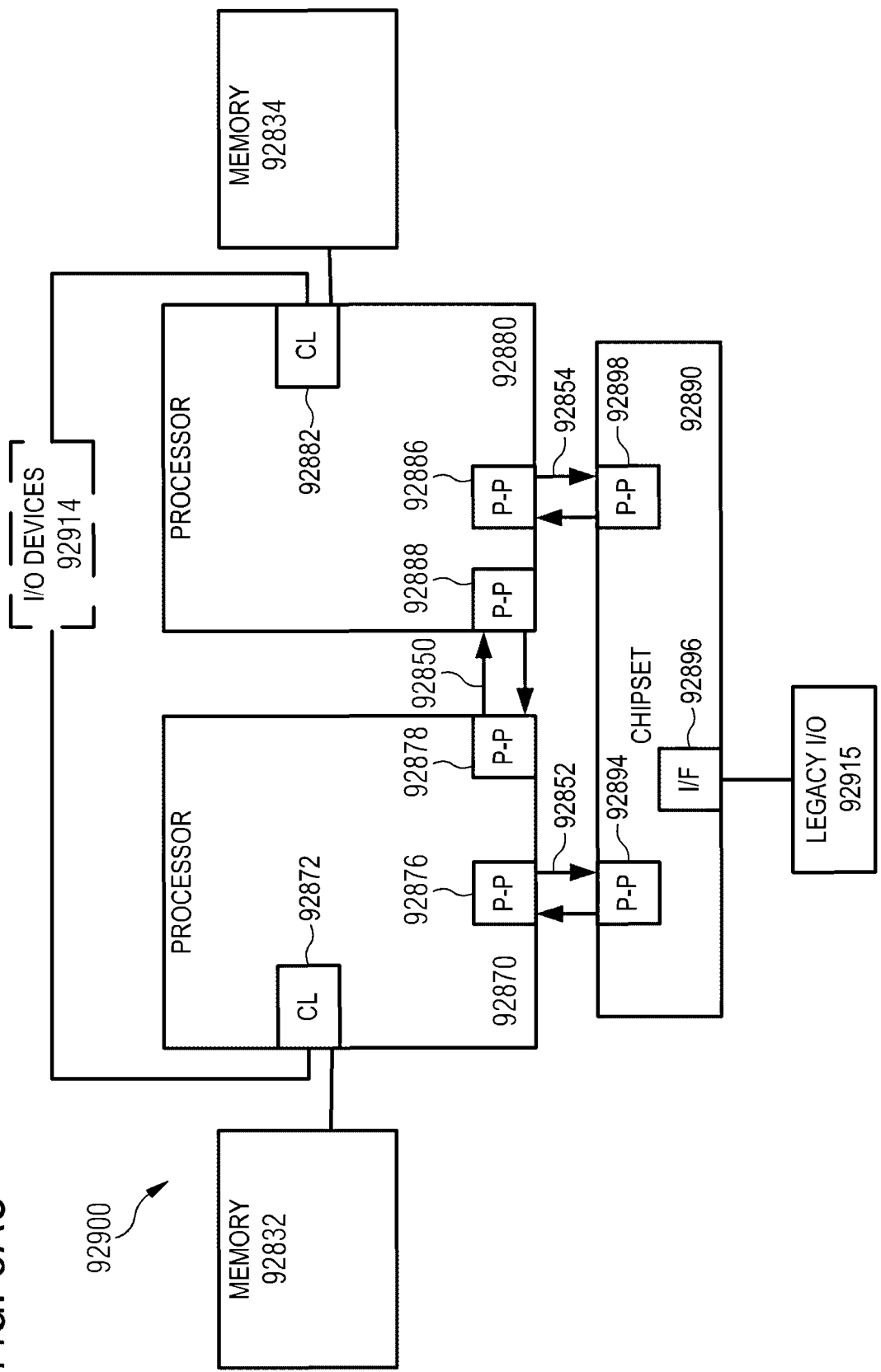
Figure 9A:
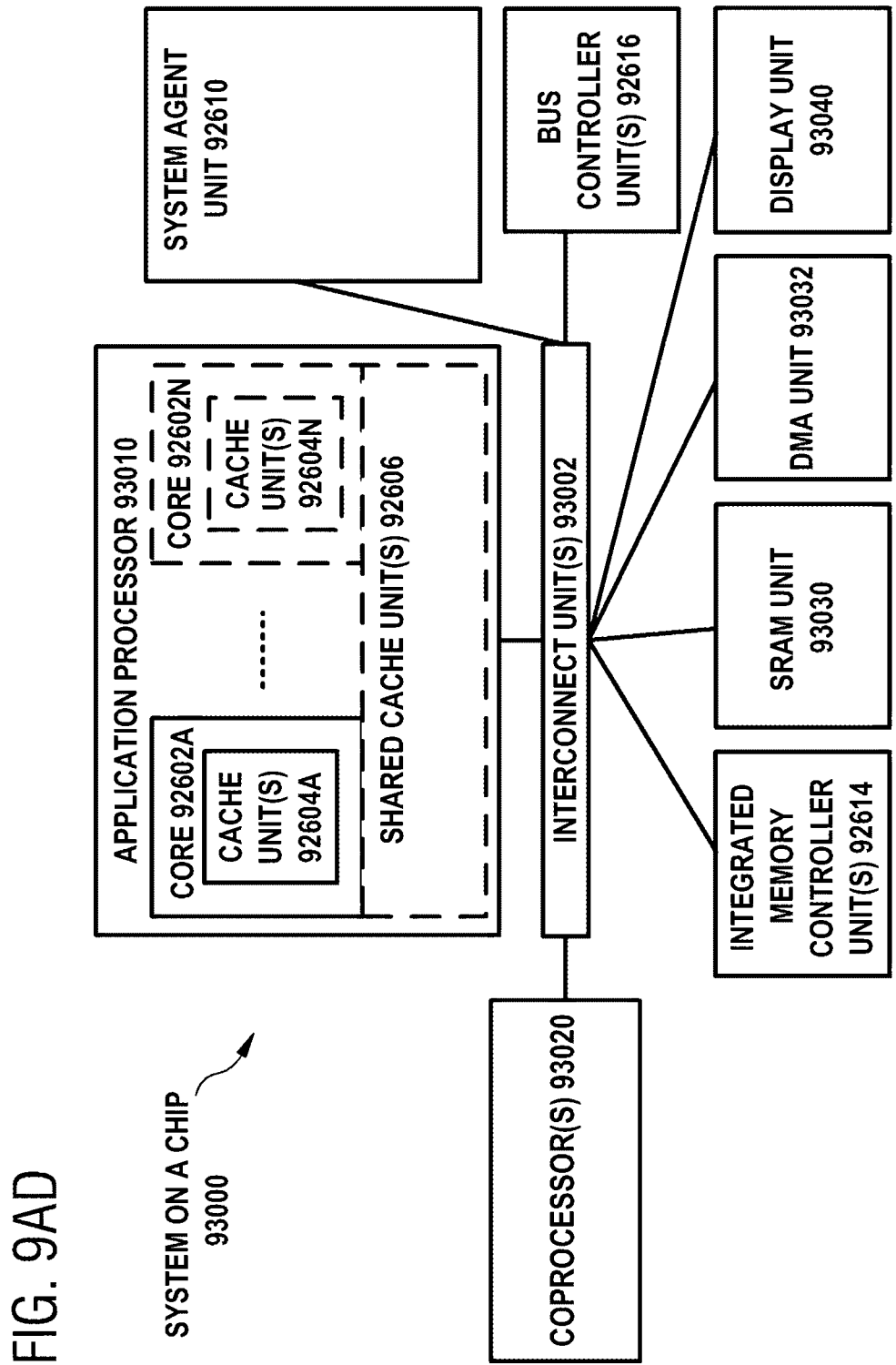
Figure 9A:
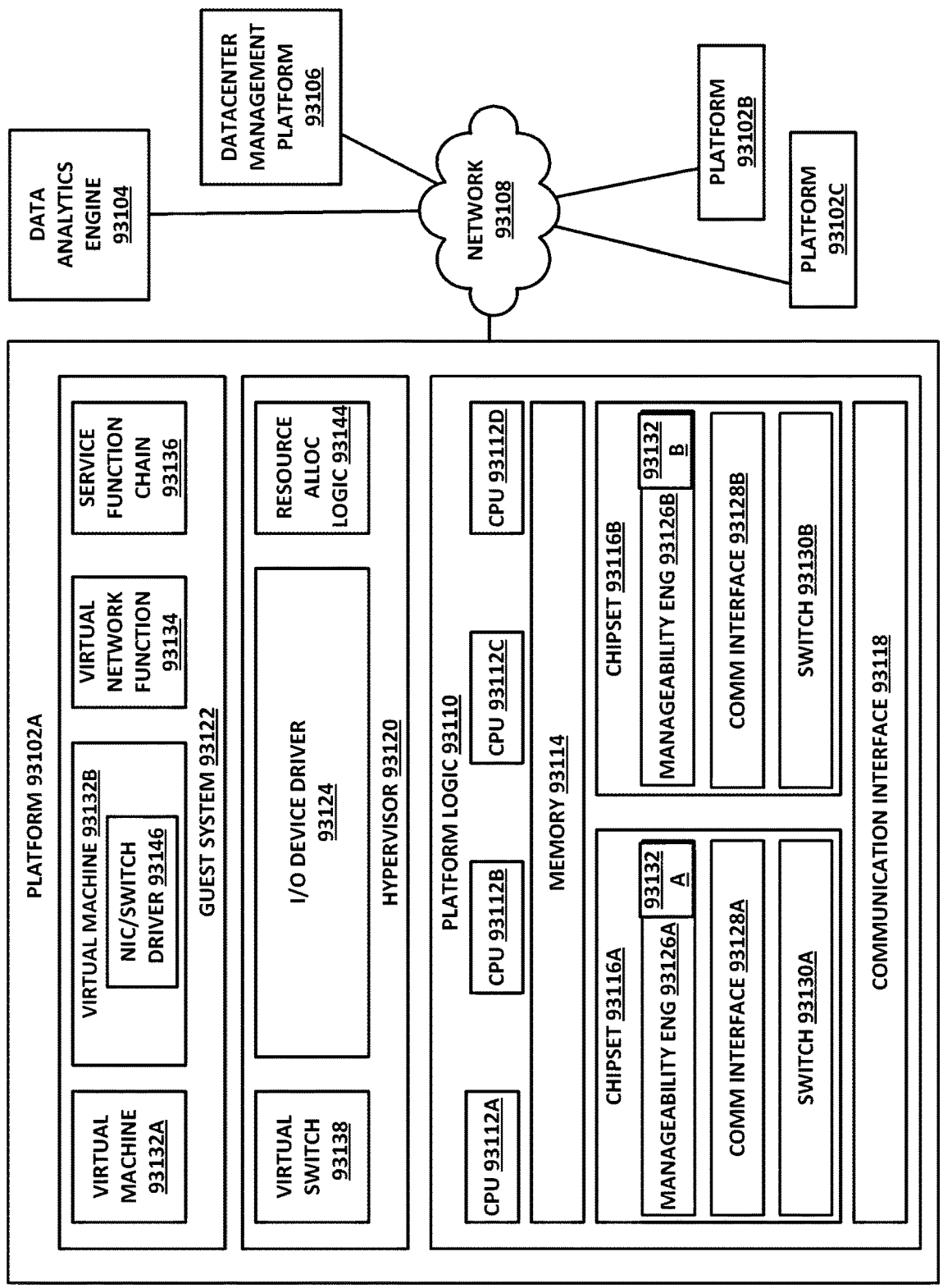

FIG. 9z is a block diagram of a processor 92600 that may have more than one core, may have an integrated memory controller, and may have integrated graphics according to embodiments of the specification. The solid lined boxes in FIG. 9z illustrate a processor 92600 with a single core 92602A, a system agent 92610, a set of one or more bus controller units 92616, while the optional addition of the dashed lined boxes illustrates an alternative processor 92600 with multiple cores 92602A-N, cache units 92604A-N, a set of one or more integrated memory controller unit(s) 92614 in the system agent unit 92610, and special-purpose logic 92608.

Thus, different implementations of the processor 92600 may include: 1) a CPU with the special-purpose logic 92608 being integrated graphics and/or scientific (throughput) logic (which may include one or more cores), and the cores 92602A-N being one or more general purpose cores (e.g., general purpose in-order cores, general purpose out-of-order cores, a combination of the two); 2) a coprocessor with the cores 92602A-N being a large number of special-purpose cores intended primarily for graphics and/or scientific throughput; and 3) a coprocessor with the cores 92602A-N being a large number of general purpose in-order cores.

Thus, the processor 92600 may be a general purpose processor, coprocessor or special-purpose processor, such as, for example, a network or communication processor, compression engine, graphics processor, GPGPU, a high-throughput many integrated core (MIC) coprocessor (including 30 or more cores), embedded processor, or the like. The processor may be implemented on one or more chips. The processor 92600 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 92606, and external memory (not shown) coupled to the set of integrated memory controller units 92614. The set of shared cache units 92606 may include one or more mid-level caches, such as level 2 (L2), level 3 (L3), level 4 (L4), or other levels of cache, a last level cache (LLC), and/or combinations thereof. While in one embodiment a ring-based interconnect unit 92612 interconnects the integrated graphics logic 92608, the set of shared cache units 92606, and the system agent unit 92610/integrated memory controller unit(s) 92614, alternative embodiments may use any number of well-known techniques for interconnecting such units. In one embodiment, coherency is maintained between one or more cache units 92606 and cores 92602A-N.

In some embodiments, one or more of the cores 92602A-N are capable of multithreading. The system agent 92610 includes those components coordinating and operating cores 92602A-N. The system agent unit 92610 may include, for example, a power control unit (PCU) and a display unit. The PCU may be or include logic and components needed for regulating the power state of the cores 92602A-N and the integrated graphics logic 92608. The display unit is for driving one or more externally connected displays.

The cores 92602A-N may be homogenous or heterogeneous in terms of architecture instruction set; that is, two or more of the cores 92602A-N may be capable of executing the same instruction set, while others may be capable of executing only a subset of that instruction set or a different instruction set.

FIGS. 9aa-9ad are block diagrams of example computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 9*aa*, shown is a block diagram of a system 92700 in accordance with one embodiment. The system 92700 may include one or more processors 92710, 92715, which are coupled to a controller hub 92720. In one embodiment the controller hub 92720 includes a graphics memory controller hub (GMCH) 92790 and an input/output hub (IOH) 92750 (which may be on separate chips); the GMCH 92790 includes memory and graphics controllers to which are coupled memory 92740 and a coprocessor 92745; the IOH 92750 couples input/output (I/O) devices 92760 to the GMCH 92790. Alternatively, one or both of the memory and graphics controllers are integrated within the processor (as described herein), the memory 92740 and the coprocessor 92745 are coupled directly to the processor 92710, and the controller hub 92720 in a single chip with the IOH 92750.

The optional nature of additional processors 92715 is denoted in FIG. 9*aa* with broken lines. Each processor 92710, 92715 may include one or more of the processing cores described herein and may be some version of the processor 92600.

The memory 92740 may be, for example, dynamic random access memory (DRAM), phase change memory (PCM), or a combination of the two. For at least one embodiment, the controller hub 92720 communicates with the processor(s) 92710, 92715 via a multidrop bus, such as a frontside bus (FSB), point-to-point interface such as Ultra Path Interconnect (UPI), or similar connection 92795.

In one embodiment, the coprocessor 92745 is a special-purpose processor, such as, for example, a high-throughput MIC processor, a network or communication processor, compression engine, graphics processor, GPGPU, embedded processor, or the like. In one embodiment, controller hub 92720 may include an integrated graphics accelerator.

There can be a variety of differences between the physical resources 92710, 92715 in terms of a spectrum of metrics of merit including architectural, microarchitectural, thermal, power consumption characteristics, and the like.

In one embodiment, the processor 92710 executes instructions that control data processing operations of a general type. Embedded within the instructions may be coprocessor instructions. The processor 92710 recognizes these coprocessor instructions as being of a type that should be executed by the attached coprocessor 92745. Accordingly, the processor 92710 issues these coprocessor instructions (or control signals representing coprocessor instructions) on a coprocessor bus or other interconnect, to coprocessor 92745. Coprocessor(s) 92745 accepts and executes the received coprocessor instructions.

Referring now to FIG. 9*ab*, shown is a block diagram of a first more specific example system 92800. As shown in FIG. 9*ab*, multiprocessor system 92800 is a point-to-point interconnect system, and includes a first processor 92870 and a second processor 92880 coupled via a point-to-point interconnect 92850. Each of processors 92870 and 92880 may be some version of the processor 92600. In one embodiment, processors 92870 and 92880 are respectively processors 92710 and 92715, while coprocessor 92838 is coprocessor 92745. In another embodiment, processors 92870 and 92880 are respectively processor 92710 coprocessor 92745.

Processors 92870 and 92880 are shown including integrated memory controller (IMC) units 92872 and 92882, respectively. Processor 92870 also includes as part of its bus controller units point-to-point (P-P) interfaces 92876 and 92878; similarly, second processor 92880 includes P-P interfaces 92886 and 92888. Processors 92870, 92880 may exchange information via a point-to-point (P-P) interface 92850 using P-P interface circuits 92878, 92888. As shown in FIG. 9*ab*, IMCs 92872 and 92882 couple the processors to respective memories, namely a memory 92832 and a memory 92834, which may be portions of main memory locally attached to the respective processors.

Processors 92870, 92880 may each exchange information with a chipset 92890 via individual P-P interfaces 92852, 92854 using point-to-point interface circuits 92876, 92894, 92886, 92898. Chipset 92890 may optionally exchange information with the coprocessor 92838 via a high-performance interface 92839. In one embodiment, the coprocessor 92838 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 92890 may be coupled to a first bus 92816 via an interface 92896. In one embodiment, first bus 92816 may be a peripheral component interconnect (PCI) bus, or a bus such as a PCI Express bus or another third generation input/output (TO) interconnect bus, by way of nonlimiting example.

As shown in FIG. 9*ab*, various IO devices 92814 may be coupled to first bus 92816, along with a bus bridge 92818 which couples first bus 92816 to a second bus 92820. In one embodiment, one or more additional processor(s) 92815, such as coprocessors, high-throughput MIC processors, GPGPUs, accelerators (such as, e.g., graphics accelerators or DSP units), field programmable gate arrays, or any other processor, are coupled to first bus 92816. In one embodiment, second bus 92820 may be a low pin count (LPC) bus. Various devices may be coupled to a second bus 92820 including, for example, a keyboard and/or mouse 92822, communication devices 92827 and a storage unit 92828 such as a disk drive or other mass storage device which may include instructions or code and data 92830, in one embodiment. Further, an audio IO 92824 may be coupled to the second bus 92820. Note that other architectures are possible. For example, instead of the point-to-point architecture of FIG. 9*ab*, a system may implement a multidrop bus or other such architecture.

Referring now to FIG. 9*ac*, shown is a block diagram of a second more specific example system 2900. FIGS. 9*ab* and 9*ac* bear like reference numerals, and certain aspects of FIG. 9*ab* have been omitted from FIG. 9*ac* in order to avoid obscuring other aspects of FIG. 9*ac*.

FIG. 9*ac* illustrates that the processors 92870, 92880 may include integrated memory and IO control logic ("CL") 92872 and 92882, respectively. Thus, the CL 92872, 92882 include IMC units and include IO control logic. FIG. 9*ac* illustrates that not only are the memories 92832, 92834 coupled to the CL 92872, 92882, but also that IO devices 92914 are also coupled to the control logic 92872, 92882. Legacy IO devices 92915 are coupled to the chipset 92890.

Referring now to FIG. 9*ad*, shown is a block diagram of a system-on-a-chip (SoC) 93000 in accordance with an embodiment. Similar elements in FIG. 9z bear like reference numerals. Also, dashed lined boxes are optional features on more advanced SoCs. In FIG. 9ad, an interconnect unit(s) 93002 is coupled to: an application processor 93010 which includes a set of one or more cores 92602A-N and shared cache unit(s) 92606; a system agent unit 92610; a bus controller unit(s) 92616; IMC unit(s) 92614; a set of one or more coprocessors 93020 which may include integrated graphics logic, an image processor, an audio processor, and a video processor; a static random access memory (SRAM) unit 93030; a direct memory access (DMA) unit 93032; and a display unit 93040 for coupling to one or more external displays. In one embodiment, the coprocessor(s) 93020 includes a special-purpose processor, such as, for example, a network or communication processor, compression engine, GPGPU, a high-throughput MIC processor, embedded processor, or the like.

FIG. 9ae is a block diagram of components of a computing platform 93102A. In the embodiment depicted, hardware platforms 93102A, 93102B, and 93102C, along with a data center management platform 93106 and data analytics engine 93104 are interconnected via network 93108. In other embodiments, a computer system may include any suitable number of (i.e., one or more) platforms, including hardware, software, firmware, and other components. In some embodiments (e.g., when a computer system only includes a single platform), all or a portion of the system management platform 93106 may be included on a platform 93102. A platform 93102 may include platform logic 93110 with one or more CPUs 93112, memories 93114 (which may include any number of different modules), chipsets 93116, communication interfaces 93118, and any other suitable hardware and/or software to execute a hypervisor 93120 or other operating system capable of executing workloads associated with applications running on platform 93102. In some embodiments, a platform 93102 may function as a host platform for one or more guest systems 93122 that invoke these applications. Platform 93102A may represent any suitable computing environment, such as a high-performance computing environment, a data center, a communications service provider infrastructure (e.g., one or more portions of an Evolved Packet Core), an in-memory computing environment, a computing system of a vehicle (e.g., an automobile or airplane), an Internet of Things environment, an industrial control system, other computing environment, or combination thereof.

In various embodiments of the present disclosure, accumulated stress and/or rates of stress accumulated of a plurality of hardware resources (e.g., cores and uncores) are monitored and entities (e.g., system management platform 93106, hypervisor 93120, or other operating system) of computer platform 93102A may assign hardware resources of platform logic 93110 to perform workloads in accordance with the stress information. In some embodiments, self-diagnostic capabilities may be combined with the stress monitoring to more accurately determine the health of the hardware resources. Each platform 93102 may include platform logic 93110. Platform logic 93110 comprises, among other logic enabling the functionality of platform 93102, one or more CPUs 93112, memory 93114, one or more chipsets 93116, and communication interfaces 93128. Although three platforms are illustrated, computer platform 93102A may be interconnected with any suitable number of platforms. In various embodiments, a platform 93102 may reside on a circuit board that is installed in a chassis, rack, or other suitable structure that comprises multiple platforms coupled together through network 93108 (which may comprise, e.g., a rack or backplane switch).

CPUs 93112 may each comprise any suitable number of processor cores and supporting logic (e.g., uncores). The cores may be coupled to each other, to memory 93114, to at least one chipset 93116, and/or to a communication interface 93118, through one or more controllers residing on CPU 93112 and/or chipset 93116. In particular embodiments, a CPU 93112 is embodied within a socket that is permanently or removably coupled to platform 93102A. Although four CPUs are shown, a platform 93102 may include any suitable number of CPUs.

Memory 93114 may comprise any form of volatile or nonvolatile memory including, without limitation, magnetic media (e.g., one or more tape drives), optical media, random access memory (RAM), read-only memory (ROM), flash memory, removable media, or any other suitable local or remote memory component or components. Memory 93114 may be used for short, medium, and/or long-term storage by platform 93102A. Memory 93114 may store any suitable data or information utilized by platform logic 93110, including software embedded in a computer-readable medium, and/or encoded logic incorporated in hardware or otherwise stored (e.g., firmware). Memory 93114 may store data that is used by cores of CPUs 93112. In some embodiments, memory 93114 may also comprise storage for instructions that may be executed by the cores of CPUs 93112 or other processing elements (e.g., logic resident on chipsets 93116) to provide functionality associated with the manageability engine 93126 or other components of platform logic 93110. A platform 93102 may also include one or more chipsets 93116 comprising any suitable logic to support the operation of the CPUs 93112. In various embodiments, chipset 93116 may reside on the same die or package as a CPU 93112 or on one or more different dies or packages. Each chipset may support any suitable number of CPUs 93112. A chipset 93116 may also include one or more controllers to couple other components of platform logic 93110 (e.g., communication interface 93118 or memory 93114) to one or more CPUs. In the embodiment depicted, each chipset 93116 also includes a manageability engine 93126. Manageability engine 93126 may include any suitable logic to support the operation of chipset 93116. In a particular embodiment, a manageability engine 93126 (which may also be referred to as an innovation engine) is capable of collecting real-time telemetry data from the chipset 93116, the CPU(s) 93112 and/or memory 93114 managed by the chipset 93116, other components of platform logic 93110, and/or various connections between components of platform logic 93110. In various embodiments, the telemetry data collected includes the stress information described herein.

In various embodiments, a manageability engine 93126 operates as an out-of-band asynchronous compute agent which is capable of interfacing with the various elements of platform logic 93110 to collect telemetry data with no or minimal disruption to running processes on CPUs 93112. For example, manageability engine 93126 may comprise a dedicated processing element (e.g., a processor, controller, or other logic) on chipset 93116, which provides the functionality of manageability engine 93126 (e.g., by executing software instructions), thus conserving processing cycles of CPUs 93112 for operations associated with the workloads performed by the platform logic 93110. Moreover, the dedicated logic for the manageability engine 93126 may operate asynchronously with respect to the CPUs 93112 and may gather at least some of the telemetry data without increasing the load on the CPUs.

A manageability engine 93126 may process telemetry data it collects (specific examples of the processing of stress information are provided herein). In various embodiments, manageability engine 93126 reports the data it collects and/or the results of its processing to other elements in the computer system, such as one or more hypervisors 93120 or other operating systems and/or system management software (which may run on any suitable logic such as system management platform 93106). In particular embodiments, a critical event such as a core that has accumulated an excessive amount of stress may be reported prior to the normal interval for reporting telemetry data (e.g., a notification may be sent immediately upon detection).

Additionally, manageability engine 93126 may include programmable code configurable to set which CPU(s) 93112 a particular chipset 93116 manages and/or which telemetry data may be collected.

Chipsets 93116 also each include a communication interface 93128. Communication interface 93128 may be used for the communication of signaling and/or data between chipset 93116 and one or more I/O devices, one or more networks 93108, and/or one or more devices coupled to network 93108 (e.g., system management platform 93106). For example, communication interface 93128 may be used to send and receive network traffic such as data packets. In a particular embodiment, a communication interface 93128 comprises one or more physical network interface controllers (NICs), also known as network interface cards or network adapters. A NIC may include electronic circuitry to communicate using any suitable physical layer and data link layer standard such as Ethernet (e.g., as defined by a IEEE 802.3 standard), Fibre Channel, InfiniBand, Wi-Fi, or other suitable standard. A NIC may include one or more physical ports that may couple to a cable (e.g., an Ethernet cable). A NIC may enable communication between any suitable element of chipset 93116 (e.g., manageability engine 93126 or switch 93130) and another device coupled to network 93108. In various embodiments a NIC may be integrated with the chipset (i.e., may be on the same integrated circuit or circuit board as the rest of the chipset logic) or may be on a different integrated circuit or circuit board that is electromechanically coupled to the chipset.

In particular embodiments, communication interfaces 93128 may allow communication of data (e.g., between the manageability engine 93126 and the data center management platform 93106) associated with management and monitoring functions performed by manageability engine 93126. In various embodiments, manageability engine 93126 may utilize elements (e.g., one or more NICs) of communication interfaces 93128 to report the telemetry data (e.g., to system management platform 93106) in order to reserve usage of NICs of communication interface 93118 for operations associated with workloads performed by platform logic 93110.

Switches 93130 may couple to various ports (e.g., provided by NICs) of communication interface 93128 and may switch data between these ports and various components of chipset 93116 (e.g., one or more Peripheral Component Interconnect Express (PCIe) lanes coupled to CPUs 93112). Switches 93130 may be a physical or virtual (i.e., software) switch.

Platform logic 93110 may include an additional communication interface 93118. Similar to communication interfaces 93128, communication interfaces 93118 may be used for the communication of signaling and/or data between platform logic 93110 and one or more networks 93108 and one or more devices coupled to the network 93108. For example, communication interface 93118 may be used to send and receive network traffic such as data packets. In a particular embodiment, communication interfaces 93118 comprise one or more physical NICs. These NICs may enable communication between any suitable element of platform logic 93110 (e.g., CPUs 93112 or memory 93114) and another device coupled to network 93108 (e.g., elements of other platforms or remote computing devices coupled to network 93108 through one or more networks).

Platform logic 93110 may receive and perform any suitable types of workloads. A workload may include any request to utilize one or more resources of platform logic 93110, such as one or more cores or associated logic. For example, a workload may comprise a request to instantiate a software component, such as an I/O device driver 93124 or guest system 93122; a request to process a network packet received from a virtual machine 93132 or device external to platform 93102A (such as a network node coupled to network 93108); a request to execute a process or thread associated with a guest system 93122, an application running on platform 93102A, a hypervisor 93120 or other operating system running on platform 93102A; or other suitable processing request.

A virtual machine 93132 may emulate a computer system with its own dedicated hardware. A virtual machine 93132 may run a guest operating system on top of the hypervisor 93120. The components of platform logic 93110 (e.g., CPUs 93112, memory 93114, chipset 93116, and communication interface 93118) may be virtualized such that it appears to the guest operating system that the virtual machine 93132 has its own dedicated components.

A virtual machine 93132 may include a virtualized NIC (vNIC), which is used by the virtual machine as its network interface. A vNIC may be assigned a media access control (MAC) address or other identifier, thus allowing multiple virtual machines 93132 to be individually addressable in a network.

VNF 93134 may comprise a software implementation of a functional building block with defined interfaces and behavior that can be deployed in a virtualized infrastructure. In particular embodiments, a VNF 93134 may include one or more virtual machines 93132 that collectively provide specific functionalities (e.g., WAN optimization, virtual private network (VPN) termination, firewall operations, load balancing operations, security functions, etcetera). A VNF 93134 running on platform logic 93110 may provide the same functionality as traditional network components implemented through dedicated hardware. For example, a VNF 93134 may include components to perform any suitable network function virtualization (NFV) workloads, such as virtualized evolved packet core (vEPC) components, mobility management entities, 3rd Generation Partnership Project (3GPP) control and data plane components, etc.

SFC 93136 is a group of VNFs 93134 organized as a chain to perform a series of operations, such as network packet processing operations. Service function chaining may provide the ability to define an ordered list of network services (e.g. firewalls, load balancers) that are stitched together in the network to create a service chain.

A hypervisor 93120 (also known as a virtual machine monitor) may comprise logic to create and run guest systems 93122. The hypervisor 93120 may present guest operating systems run by virtual machines with a virtual operating platform (i.e., it appears to the virtual machines that they are running on separate physical nodes when they are actually consolidated onto a single hardware platform) and manage the execution of the guest operating systems by platform logic 93110. Services of hypervisor 93120 may be provided by virtualizing in software or through hardware assisted resources that require minimal software intervention, or both. Multiple instances of a variety of guest operating systems may be managed by the hypervisor 93120. Each platform 93102 may have a separate instantiation of a hypervisor 93120.

Hypervisor 93120 may be a native or bare metal hypervisor that runs directly on platform logic 93110 to control the platform logic and manage the guest operating systems. Alternatively, hypervisor 93120 may be a hosted hypervisor that runs on a host operating system and abstracts the guest operating systems from the host operating system. Hypervisor 93120 may include a virtual switch 93138 that may provide virtual switching and/or routing functions to virtual machines of guest systems 93122. The virtual switch 93138 may comprise a logical switching fabric that couples the vNICs of the virtual machines 93132 to each other, thus creating a virtual network through which virtual machines may communicate with each other.

Virtual switch 93138 may comprise a software element that is executed using components of platform logic 93110. In various embodiments, hypervisor 93120 may be in communication with any suitable entity (e.g., a software-defined networking controller) which may cause hypervisor 93120 to reconfigure the parameters of virtual switch 93138 in response to changing conditions in platform 93102 (e.g., the addition or deletion of virtual machines 93132 or identification of optimizations that may be made to enhance performance of the platform).

Hypervisor 93120 may also include resource allocation logic 93144, which may include logic for determining allocation of platform resources based on the telemetry data (which may include stress information). Resource allocation logic 93144 may also include logic for communicating with various components of platform logic 93110 entities of platform 93102A to implement such optimization, such as components of platform logic 93110.

Any suitable logic may make one or more of these optimization decisions. For example, system management platform 93106; resource allocation logic 93144 of hypervisor 93120 or other operating system; or other logic of computer platform 93102A may be capable of making such decisions. In various embodiments, the system management platform 93106 may receive telemetry data from and manage workload placement across multiple platforms 93102. The system management platform 93106 may communicate with hypervisors 93120 (e.g., in an out-of-band manner) or other operating systems of the various platforms 93102 to implement workload placements directed by the system management platform.

The elements of platform logic 93110 may be coupled together in any suitable manner. For example, a bus may couple any of the components together. A bus may include any known interconnect, such as a multidrop bus, a mesh interconnect, a ring interconnect, a point-to-point interconnect, a serial interconnect, a parallel bus, a coherent (e.g. cache coherent) bus, a layered protocol architecture, a differential bus, or a Gunning transceiver logic (GTL) bus. Elements of the computer platform 93102A may be coupled together in any suitable manner such as through one or more networks 93108. A network 93108 may be any suitable network or combination of one or more networks operating using one or more suitable networking protocols. A network may represent a series of nodes, points, and interconnected communication paths for receiving and transmitting packets of information that propagate through a communication system. For example, a network may include one or more firewalls, routers, switches, security appliances, antivirus servers, or other useful network devices.

Embodiments of the mechanisms disclosed herein may be implemented in hardware, software, firmware, or a combination of such implementation approaches. Some embodiments may be implemented as computer programs or program code executing on programmable systems comprising at least one processor, a storage system (including volatile and nonvolatile memory and/or storage elements), at least one input device, and at least one output device.

Program code, such as code 2830 illustrated in FIG. 9*ab*, may be applied to input instructions to perform the functions described herein and generate output information. The output information may be applied to one or more output devices, in known fashion. For purposes of this application, a processing system includes any system that has a processor, such as, for example, a DSP, a microcontroller, an application-specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "intellectual property (IP) cores" may be stored on a tangible, machine-readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard discs, any other type of disk including floppy disks, optical disks, compact disc read-only memories (CD-ROMs), compact disc rewritables (CD-RWs), and magneto-optical disks, semiconductor devices such as ROMs, RAMs such as DRAMs, SRAMs, erasable programmable read-only memories (EPROMs), flash memories, electrically erasable programmable read-only memories (EEPROMs), PCM, magnetic or optical cards, or any other type of media suitable for storing electronic instructions.

Accordingly, some embodiments also include non-transitory, tangible machine-readable media containing instructions or containing design data, such as Hardware Description Language (HDL), which defines structures, circuits, apparatuses, processors and/or system features described herein. Such embodiments may also be referred to as program products.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present specification.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

In the foregoing description, certain aspects of some or all embodiments are described in greater detail than is strictly necessary for practicing the appended claims. These details are provided by way of nonlimiting example only, for the purpose of providing context and illustration of the disclosed embodiments. Such details should not be understood to be required, and should not be "read into" the claims as limitations. The phrase may refer to "an embodiment" or "embodiments." These phrases, and any other references to embodiments, should be understood broadly to refer to any combination of one or more embodiments. Furthermore, the several features disclosed in a particular "embodiment" could just as well be spread across multiple embodiments. For example, if features 1 and 2 are disclosed in "an embodiment," embodiment A may have feature 1 but lack feature 2, while embodiment B may have feature 2 but lack feature 1.

This specification may provide illustrations in a block diagram format, wherein certain features are disclosed in separate blocks. These should be understood broadly to disclose how various features interoperate, but are not intended to imply that those features must necessarily be embodied in separate hardware or software. Furthermore, where a single block discloses more than one feature in the same block, those features need not necessarily be embodied in the same hardware and/or software. For example, a computer "memory" could in some circumstances be distributed or mapped between multiple levels of cache or local memory, main memory, battery-backed volatile memory, and various forms of persistent memory such as a hard disk, storage server, optical disk, tape drive, or similar. In certain embodiments, some of the components may be omitted or consolidated. In a general sense, the arrangements depicted in the FIGURES may be more logical in their representations, whereas a physical architecture may include various permutations, combinations, and/or hybrids of these elements. Countless possible design configurations can be used to achieve the operational objectives outlined herein. Accordingly, the associated infrastructure has a myriad of substitute arrangements, design choices, device possibilities, hardware configurations, software implementations, and equipment options.

References may be made herein to a computer-readable medium, which may be a tangible and non-transitory computer-readable medium. As used in this specification and throughout the claims, a "computer-readable medium" should be understood to include one or more computer-readable mediums of the same or different types. A computer-readable medium may include, by way of nonlimiting example, an optical drive (e.g., CD/DVD/Blu-Ray), a hard drive, a solid-state drive, a flash memory, or other nonvolatile medium. A computer-readable medium could also include a medium such as a ROM, a field-programmable gate array (FPGA), or ASIC configured to carry out the desired instructions, stored instructions for programming an FPGA or ASIC to carry out the desired instructions, an IP block that can be integrated in hardware into other circuits, or instructions encoded directly into hardware or microcode on a processor such as a microprocessor, DSP, microcontroller, or in any other suitable component, device, element, or object where appropriate and based on particular needs. A non-transitory storage medium herein is expressly intended to include any non-transitory special-purpose or programmable hardware configured to provide the disclosed operations, or to cause a processor to perform the disclosed operations.

Various elements may be "communicatively," "electrically," "mechanically," or otherwise "coupled" to one another throughout this specification and the claims. Such coupling may be a direct, point-to-point coupling, or may include intermediary devices. For example, two devices may be communicatively coupled to one another via a controller that facilitates the communication. Devices may be electrically coupled to one another via intermediary devices such as signal boosters, voltage dividers, or buffers. Mechanically coupled devices may be indirectly mechanically coupled.

Any "module" or "engine" disclosed herein may refer to or include software, a software stack, a combination of hardware, firmware, and/or software, a circuit configured to carry out the function of the engine or module, or any computer-readable medium as disclosed above. Such modules or engines may, in appropriate circumstances, be provided on or in conjunction with a hardware platform, which may include hardware compute resources such as a processor, memory, storage, interconnects, networks and network interfaces, accelerators, or other suitable hardware. Such a hardware platform may be provided as a single monolithic device (e.g., in a PC form factor), or with some or part of the function being distributed (e.g., a "composite node" in a high-end data center, where compute, memory, storage, and other resources may be dynamically allocated and need not be local to one another).

There may be disclosed herein flow charts, signal flow diagram, or other illustrations showing operations being performed in a particular order. Unless otherwise expressly noted, or unless required in a particular context, the order should be understood to be a nonlimiting example only. Furthermore, in cases where one operation is shown to follow another, other intervening operations may also occur, which may be related or unrelated. Some operations may also be performed simultaneously or in parallel. In cases where an operation is said to be "based on" or "according to" another item or operation, this should be understood to imply that the operation is based at least partly on or according at least partly to the other item or operation. This should not be construed to imply that the operation is based solely or exclusively on, or solely or exclusively according to the item or operation.

All or part of any hardware element disclosed herein may readily be provided in an SoC, including a CPU package. An SoC represents an integrated circuit (IC) that integrates components of a computer or other electronic system into a single chip. Thus, for example, client devices or server devices may be provided, in whole or in part, in an SoC. The SoC may contain digital, analog, mixed-signal, and radio frequency functions, all of which may be provided on a single chip substrate. Other embodiments may include a multichip module (MCM), with a plurality of chips located within a single electronic package and configured to interact closely with each other through the electronic package.

In a general sense, any suitably-configured circuit or processor can execute any type of instructions associated with the data to achieve the operations detailed herein. Any processor disclosed herein could transform an element or an article (for example, data) from one state or thing to another state or thing. Furthermore, the information being tracked, sent, received, or stored in a processor could be provided in any database, register, table, cache, queue, control list, or storage structure, based on particular needs and implementations, all of which could be referenced in any suitable timeframe. Any of the memory or storage elements disclosed herein, should be construed as being encompassed within the broad terms "memory" and "storage," as appropriate.

Computer program logic implementing all or part of the functionality described herein is embodied in various forms, including, but in no way limited to, a source code form, a computer executable form, machine instructions or microcode, programmable hardware, and various intermediate forms (for example, forms generated by an assembler, compiler, linker, or locator). In an example, source code includes a series of computer program instructions implemented in various programming languages, such as an object code, an assembly language, or a high level language such as OpenCL, FORTRAN, C, C++, JAVA, or HTML for use with various operating systems or operating environments, or in hardware description languages such as Spice, Verilog, and VHDL. The source code may define and use various data structures and communication messages. The source code may be in a computer executable form (e.g., via an interpreter), or the source code may be converted (e.g., via a translator, assembler, or compiler) into a computer executable form, or converted to an intermediate form such as byte code. Where appropriate, any of the foregoing may be used to build or describe appropriate discrete or integrated circuits, whether sequential, combinatorial, state machines, or otherwise.

In one example embodiment, any number of electrical circuits of the FIGURES may be implemented on a board of an associated electronic device. The board can be a general circuit board that can hold various components of the internal electronic system of the electronic device and, further, provide connectors for other peripherals. Any suitable processor and memory can be suitably coupled to the board based on particular configuration needs, processing demands, and computing designs. Note that with the numerous examples provided herein, interaction may be described in terms of two, three, four, or more electrical components. However, this has been done for purposes of clarity and example only. It should be appreciated that the system can be consolidated or reconfigured in any suitable manner. Along similar design alternatives, any of the illustrated components, modules, and elements of the FIGURES may be combined in various possible configurations, all of which are within the broad scope of this specification.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 (pre-AIA) or paragraph (f) of the same section (post-AIA), as it exists on the date of the filing hereof unless the words "means for" or "steps for" are specifically used in the particular claims; and (b) does not intend, by any statement in the specification, to limit this disclosure in any way that is not otherwise expressly reflected in the appended claims.

There is disclosed in one example a heat dissipator for an electronic apparatus, including: a planar vapor chamber having a substantially rectangular form factor, wherein a second dimension $d_2$ of the rectangular form factor is at least approximately twice a first dimension $d_1$ of the rectangular form factor; a first fan and second fan; and a first heat pipe and second heat pipe discrete from the planar vapor chamber and disposed along first and second $d_1$ edges of the planar vapor chamber, further disposed to conduct heat from the first and second $d_1$ edges to the first and second fan respectively.

The following examples pertain to examples in accordance with this Specification. It will be understood that certain examples may be combined with certain other examples, in certain examples. Aspects described in the following examples may be combined with examples described with respect to one or more of the figures above and vice versa.

Example 1. An electronic device comprising:
a heat source; and
a vapor chamber coupled to the heat source to distribute heat generated by the heat source during operation of the electronic device.

Example 2. The electronic device of example 1, further comprising a fan comprising a main blow direction, wherein the fan is arranged so that the main blow direction is directed towards the vapor chamber.

Example 3. The electronic device of example 2, wherein the fan is configured to blow air along a surface of the vapor chamber.

Example 4. The electronic device of example 3, wherein at least 50% of the air flow caused by the fan flows along the surface of the vapor chamber.

Example 5. The electronic device of one of the examples 2-4, wherein the fan is configured to blow air into a gap extending from the vapor chamber to at least one of a part of an enclosure of the electronic device or a backside of a screen of the electronic device.

Example 6. The electronic device of one of the examples 2-5, further comprising a circuit board configured to carry the heat source, wherein the fan is configured to blow air into a gap extending from the circuit board to at least one of a part of an enclosure of the electronic device or a backside of a screen of the electronic device.

Example 7. The electronic device of one of the examples 2-6, further comprising a guiding structure configured to guide the air flow caused by the fan along the surface of the vapor chamber, wherein the guiding structure is arranged on at least one of the surface of the vapor chamber, a part of an enclosure of the electronic device or a backside of a screen of the electronic device.

Example 8. The electronic device of example 7, wherein the guiding structure comprises gasket material.

Example 9. The electronic device of example 7 or 8, wherein the guiding structure completely surrounds the vapor chamber except for one or more air inlet openings and one or more air outlet openings.

Example 10. The electronic device of one of the examples 2-9, wherein the main blow direction of the fan is substantially perpendicular to the rotation axis of the fan.

Example 11. The electronic device of one of the examples 2-10, wherein a main air inlet direction of the fan is substantially in parallel to the rotation axis of the fan.

Example 12. The electronic device of one of the examples 2-11, wherein no heat sink is located adjacent to the fan.

Example 13. The electronic device of one of the examples 2-12, wherein the fan comprises a maximal dimension with respect to height, length and width of at most 50 mm.

Example 14. The electronic device of one of the examples 2-13, wherein the fan is a single outlet fan.

Example 15. The electronic device of one of the examples 2-14, wherein the vapor chamber has a maximal dimension of at least 150 mm.

Example 16. The electronic device of one of the examples 2-15, wherein the fan is arranged laterally beside the vapor chamber.

Example 17. The electronic device of one of the examples 2-16, wherein a vertical extension of the fan overlaps a vertical extension of the vapor chamber.

Example 18. The electronic device of one of the examples 2-17, wherein the vapor chamber is arranged along an air flow path between the fan and an air outlet.

Example 19. The electronic device of one of the examples 2-18, wherein the electronic device comprises a thickness of at most 8 mm.

Example 20. The electronic device of one of the examples 2-19, wherein the electronic device comprises a thermal design power of at most 10 W and at least 5 W.

Example 21. The electronic device of one of the examples 2-20, wherein the electronic device is implemented without a heat pipe.

Example 22. The electronic device of one of the examples 2-21, wherein the electronic device is implemented without heat sink for the fan.

Example 23. The electronic device of one of the examples 2-22, wherein the electronic device is a tablet, a laptop, a mobile phone or a personal computer.

Example 24. The electronic device of one of the examples 2-23, further comprising an enclosure comprising one or more inlet openings in proximity to the fan, wherein the fan is configured to suck air from outside the electronic device through the one or more inlet openings.

Example 25. The electronic device of one of the examples 2-24, wherein the fan is configured to cause an air flow from an air inlet through the fan to a surface of the vapor chamber and from the surface of the vapor chamber to an air outlet.

Example 26. The electronic device of one of the previous examples, further comprising a blower configured to cause an air flow along a surface of the vapor chamber, wherein the blower comprises at least one of:
a maximal length and maximal width of at most 20 mm; or
a maximal thickness of at most 3 mm.

Example 27. The electronic device of example 26, wherein the blower is configured to blow air towards the heat distribution structure.

Example 28. The electronic device of one of the examples 26-27, wherein at least 50% of the air flow caused by the blower flows along the surface of the heat distribution structure.

Example 29. The electronic device of one of the examples 26-28, wherein the blower is configured to blow air into a gap extending from the heat distribution structure to a part of an enclosure of the electronic device or a backside of a screen of the electronic device.

Example 30. The electronic device of example 29, wherein the gap has a thickness of at most 2 mm.

Example 31. The electronic device of one of the examples 26-30, further comprising a circuit board configured to carry the heat source, wherein the blower is configured to cause an air flow through a gap between the circuit board and the heat distribution structure.

Example 32. The electronic device of one of the examples 26-31, further comprising a guiding structure configured to guide the air flow caused by the blower along the surface of the heat distribution structure, wherein the guiding structure is arranged on at least one of the surface of the heat distribution structure or a part of an enclosure of the electronic device.

Example 33. The electronic device of example 32, wherein the guiding structure comprises a wall having a height of at most 2 mm.

Example 34. The electronic device of one of the examples 26-33, wherein no heat sink is located adjacent to the blower.

Example 35. The electronic device of one of the examples 26-34, wherein the vapor chamber has a maximal dimension of at least 150 mm.

Example 36. The electronic device of one of the examples 26-35, wherein the blower is arranged laterally beside the vapor chamber.

Example 37. The electronic device of one of the examples 26-36, wherein a vertical extension of the blower overlaps with a vertical extension of the vapor chamber.

Example 38. The electronic device of one of the examples 26-37, wherein the vapor chamber is arranged along an air flow path between the blower and an air outlet.

Example 39. The electronic device of one of the examples 26-38, further comprising a second blower configured to cause an air flow along a surface of the vapor chamber, wherein the second blower comprises at least one of:
a maximal length and maximal width of at most 20 mm; or
a maximal thickness of at most 3 mm.

Example 40. The electronic device of example 39, wherein the first blower and the second blower are arranged laterally on opposite sides of the heat distribution structure.

Example 41. The electronic device of one of the examples 26-40, wherein the blower has a maximal current consumption of at most 0.08 A.

Example 42. The electronic device of example 41, wherein the electronic device comprises a thermal design power of at most 25 W and at least 5 W.

Example 43. The electronic device of one of the examples 26-42, wherein the electronic device is implemented without a heat pipe.

Example 44. The electronic device of one of the examples 26-43, wherein the electronic device is implemented without heat spreader for the blower.

Example 45. The electronic device of one of the examples 26-44, further comprising an enclosure comprising one or more inlet openings in proximity to the blower, wherein the blower is configured to suck air from outside the electronic device through the one or more inlet openings.

Example 46. The electronic device of one of the examples 26-45, wherein the blower is configured to cause an air flow from an air inlet through the blower to a surface of the vapor chamber and from the vapor chamber to an air outlet.

Example 47. The electronic device of one of the examples 26-46, further comprising a circuit board, wherein the circuit board is configured to carry the heat source, wherein the circuit board comprises an opening, wherein the blower is at least partially located in the opening.

Example 48. The electronic device of one of the examples 26-47, wherein the electronic device is implemented without a blower comprising a maximal dimension with respect to height, length and width of at least 20 mm Example 49. The electronic device of one of the examples 26-47, further comprising a fan, wherein the fan comprises at least one of:
   a maximal length and maximal width of at least 30 mm; or
   a maximal thickness of at least 4 mm,
   wherein the blower is located closer to the heat source than the fan.

Example 50. The electronic device of one of the examples 26-49, further comprising control circuitry configured to activate or deactivate the at least one blower fan based on a heat load of the heat source of the electronic device.

Example 51. The electronic device of example 50, wherein the control circuitry is configured to activate the at least one blower if the heat load of the heat source is above a threshold, and to deactivate the at least one blower if the heat load of the heat source is below the threshold.

Example 52. The electronic device of one of the examples 50-51, wherein the control circuitry is configured to operate the cooling system of the electronic device passively if the heat load of the heat source is below a threshold.

Example 53. The electronic device of one of the examples 50-52, wherein the control circuitry is configured to obtain information on the head load from a processing unit of the computing device.

Example 54. The electronic device of one of the examples 50-53, wherein the information on the heat load is based on at least one temperature that is measured or estimated within the electronic device.

Example 55. The electronic device of one of the examples 50-54, wherein the information on the heat load is based on a turbo state of the heat source.

Example 56. The electronic device of one of the examples 50-55, wherein the information on the heat load is based on a predicted development of the heat load.

Example 57. The electronic device of one of the examples 50-56, wherein the at least one blower has a fan diameter of at most 30 mm.

Example 58. The electronic device of one of the examples 50-57, wherein the at least one blower has a fan height of at most 5 mm.

Example 59. The electronic device of one of the examples 50-58, wherein the vapor chamber comprises at least one substantially flat major surface, wherein the at least one blower fan is arranged to blow air across the at least one substantially flat major surface.

Example 60. The electronic device of one of the examples 50-59, comprising two blowers, the two blowers being arranged at either lateral side of the vapor chamber.

Example 61. The electronic device of one of the examples 50-60, further comprising at least one air flow conductor for conducting the air blown by the at least one blower towards the vapor chamber.

Example 62. The electronic device of one of the examples 50-61, wherein the at least one blower is arranged at a non-zero angle relative to a main portion of a bottom plate of a chassis of the electronic device.

Example 63. The electronic device of example 62, wherein the angle of the at least one blower relative to the main portion of the bottom plate of the chassis is between 2° and 15°.

Example 64. The electronic device of one of the examples 50-63, wherein the vapor chamber is held by a chassis of the electronic device.

Example 65. The electronic device of one of the examples 50-64, wherein the heat source is configured to determine information on a heat load of the heat source, and to provide the information on the heat load to the control circuitry.

Example 66. The electronic device of one of the examples 50-65, wherein the heat source is configured to determine the information on the heat load based on at least one temperature that is measured or estimated within the electronic device or based on a turbo state of the processing unit.

Example 67. The electronic device of one of the examples 50-66, wherein the heat source is configured to determine the information on the heat load by predicting the heat load using a machine-learning model.

Example 68. The electronic device of one of the previous examples, further comprising:
   a thermal electric cooler, wherein the vapor chamber is a first heat distribution structure; and
   a second heat distribution structure, wherein a first surface of the thermal electric cooler is thermally coupled to the vapor chamber and a second surface of the thermal electric cooler is thermally coupled to the second heat distribution structure.

Example 69. The electronic device of example 68, further comprising a heat pipe arranged adjacent to the thermal electric cooler on the first heat distribution structure.

Example 70. The electronic device of example 69, wherein the thermal electric cooler is located at least in one direction closer to an edge of the vapor chamber than the heat pipe.

Example 71. The electronic device of one of the examples 69-70, wherein the heat pipe extends to a fan of the cooling system.

Example 72. The electronic device of one of the examples 69-71, wherein the heat pipe has a thickness of at most 3 mm.

Example 73. The electronic device of one of the examples 69-72, wherein the heat pipe is coupled to the first heat distribution structure in an area opposite to a center of the heat source.

Example 74. The electronic device of one of the examples 69-73, wherein the heat pipe is arranged between on the vapor chamber and the second heat distribution structure.

Example 75. The electronic device of one of the examples 69-74, wherein a first surface of the heat pipe is thermally coupled to the vapor chamber and a second surface of the heat pipe is thermally coupled to the second heat distribution structure.

Example 76. The electronic device of one of the examples 69-75, further comprising a second heat pipe, wherein the first heat pipe is arranged laterally between the thermal electric cooler and the second heat pipe.

Example 77. The electronic device of one of the examples 69-76, wherein the second heat pipe is arranged between the vapor chamber and the second heat distribution structure.

Example 78. The electronic device of example 76, further comprising a third heat pipe, wherein the third heat pipe is thermally coupled to the second heat distribution structure, wherein the third heat pipe is laterally spaced apart from the vapor chamber.

Example 79. The electronic device of example 78, wherein a thickness of the thermal electric cooler is larger than a thickness of the vapor chamber.

Example 80. The electronic device of one of the examples 78-79, wherein a thickness of the vapor chamber is larger than a distance between the vapor chamber and the second heat distribution structure.

Example 81. The electronic device of one of the examples 68-80, wherein the second heat distribution structure is a metal plate or vapor chamber.

Example 82. The electronic device of one of the examples 68-81, wherein the thermal electric cooler has a thickness of at most 3 mm.

Example 83. The electronic device of one of the examples 68-82, wherein a distance between the vapor chamber and the second heat distribution structure is at most 3 mm.

Example 84. The electronic device of one of the examples 68-83, wherein the electronic device is configured to activate and deactivate the thermal electric cooler based on one or more device parameters.

Example 85. The electronic device of example 84, wherein a device parameter of the one or more device parameters indicates a junction temperature of the heat source.

Example 86. The electronic device of example 84 or 85, wherein a device parameter of the one or more device parameters indicates a charging status of the electronic device.

Example 87. The electronic device of example 84, 85 or 86, wherein a device parameter of the one or more device parameters indicates a workload of the electronic device.

Example 88. The electronic device of one of the examples 68-87, wherein a distance between the second heat distribution structure and a part of an enclosure of the electronic device or a backside of a screen of the electronic device is at most 2 mm.

Example 89. The electronic device of one of the examples 68-88, wherein the second heat distribution structure is thermally coupled to a part of an enclosure of the electronic device.

Example 90. The electronic device of one of the examples 68-89, wherein the heat source comprises a thermal design power of at least 15 W.

Example 91. The electronic device of one of the examples 68-89, wherein the heat source comprises a thermal design power of at most 15 W.

Example 92. The electronic device of one of the examples 68-91, wherein the electronic device is implemented without a heat pipe.

Example 93. The electronic device of one of the examples 68-92, wherein the electronic device is implemented without a fan.

Example 94. The electronic device of one of the previous examples, comprising:
the vapor chamber configured to spread heat caused by the heat source from a center region to an edge region of the vapor chamber, wherein the vapor chamber is coupled with the heat source in the center region at a first side of the vapor chamber; and
a border located on the vapor chamber, wherein the border surrounds the center region of the heat distribution structure at the first side of the heat distribution structure.

Example 95. The electronic device of example 94, wherein the vapor chamber comprises a planar surface in the center region.

Example 96. The electronic device of one of the examples 94-95, wherein the border protrudes from the surface of the center region by at most 1 mm.

Example 97. The electronic device of one of the examples 94-96, wherein the region enclosed by the border comprises a maximal dimension with respect to length and width of at most 30 mm.

Example 98. The electronic device of one of the examples 94-97, wherein the border forms walls laterally enclosing the center region.

Example 99. The electronic device of example 98, wherein the walls extend perpendicular to a surface of the center region.

Example 100. The electronic device of one of the examples 94-99, wherein a heat sink is mounted to a second side of the vapor chamber.

Example 101. The electronic device of example 100, wherein the heat sink is thermally coupled to the second side of the vapor chamber by a thermal interface material between the heat sink and the vapor chamber.

Example 102. The electronic device of one of the examples 94-101, wherein the edge region of the vapor chamber extends along an edge of the of the vapor chamber, wherein the border is located on the of the vapor chamber laterally between the edge region and the center region.

Example 103. The electronic device of one of the examples 94-102, further comprising a seal ring attached to the border, wherein the seal ring is configured to seal a gap between the border and a carrier structure of the heat source.

Example 104. The electronic device of one of the examples 94-103, wherein the vapor chamber comprises a thickness of at most 4 mm.

Example 105. The electronic device of one of the examples 94-104, wherein the vapor chamber comprises a maximal dimension with respect to length and width of at least 60 mm and at most 150 mm.

Example 106. The electronic device of one of the previous examples, wherein the heat source comprises a semiconductor die, wherein the vapor chamber is configured to spread heat caused by the semiconductor die from a center region to an edge region of the vapor chamber, wherein the vapor chamber is thermally coupled with the semiconductor die in the center region at a first side of the vapor chamber,
wherein the bare semiconductor die is thermally directly coupled to the vapor chamber through a thermal interface material.

Example 107. The electronic device of example 106, wherein the semiconductor die is a central processing unit.

Example 108. The electronic device of one of the examples 106-107, further comprising a seal ring attached to the border, wherein the seal ring seals a gap between the border and a package substrate of the semiconductor die.

Example 109. The electronic device of one of the examples 106-108, wherein a distance between a backside surface of the semiconductor die and a cavity of the vapor chamber is at most 1 mm.

Example 110. The electronic device of one of the examples 106-109, further comprising a circuit board, wherein the semiconductor die is arranged on the circuit board.

Example 111. The electronic device of one of the examples 106-110, further comprising a fan configured to blow air towards a heat sink mounted to the vapor chamber.

Example 112. The electronic device of one of the examples 106-111, wherein the thermal interface material is a thermal grease or a liquid metal.

Example 113. The electronic device of one of the examples 106-112, wherein the semiconductor die comprises a thermal design power of at least 100 W.

Example 114. The electronic device of one of the previous examples, further comprising:
An enclosure; and
A laminar heat spreader thermally coupled to the vapor chamber inside the enclosure, wherein the laminar heat spreader extends from the inside of the enclosure to the outside of the enclosure.

Example 115. The electronic device of example 114, wherein the laminar heat spreader comprises a graphite sheet, a graphene sheet or a metal foil.

Example 116. The electronic device of one of the examples 114-115, wherein the laminar heat spreader has a thermal conductivity of at least 100 W/mK in at least one direction along the laminar heat spreader Example 117. The electronic device of one of the examples 114-116, wherein the enclosure comprises an opening, wherein the laminar heat spreader extends from the inside through the opening to the outside.

Example 118. The electronic device of example 117, wherein the opening comprises a length of at least 290 mm and a width of at most 2 mm.

Example 119. The electronic device of example 117 or 118, wherein the laminar heat spreader is covered by a protective layer in the region of the opening.

Example 120. The electronic device of example 119, wherein the protective layer comprises plastic or a nickel-titanium-alloy.

Example 121. The electronic device of example 119 or 120, wherein the protective layer is covered by a cover layer in the region of the opening.

Example 122. The electronic device of example 121, wherein the cover layer comprises microfiber material.

Example 123. The electronic device of one of the examples 114-122, wherein the vapor chamber is thermally coupled to the heat source at a first side, wherein the laminar heat spreader is thermally coupled to a second side of the vapor chamber.

Example 124. The electronic device of one of the examples 114-123, wherein the vapor chamber comprises a thickness of at most 4 mm.

Example 125. The electronic device of one of the examples 114-124, wherein the vapor chamber comprises a maximal dimension with respect to length and width of at least 60 mm.

Example 126. The electronic device of one of the examples 114-125, further comprising a kickstand connected to the enclosure, wherein a part of the laminar heat spreader extends between the enclosure and the kickstand.

Example 127. The electronic device of example 126, wherein a part of the laminar heat spreader is attached to the kickstand.

Example 128. The electronic device of one of the examples 114-127, wherein a part of the laminar heat spreader is attached to an outside surface of the enclosure.

Example 129. The electronic device of one of the examples 114-128, wherein a part of the laminar heat spreader located outside the enclosure is covered by a soft cover.

Example 130. The electronic device of one of the examples 114-129, wherein a part of the laminar heat spreader located outside the enclosure extends along a backside of a keyboard.

Example 131. The electronic device of one of the examples 114-130, wherein a part of the laminar heat spreader located inside the enclosure extends between the enclosure and a battery of the electronic device.

Example 132. The electronic device of one of the examples 114-131, wherein the electronic device comprises a thermal design power of at most 25 W and at least 5 W.

Example 133. The electronic device of one of the examples 114-132, wherein the electronic device is implemented without a fan.

Example 134. The electronic device of one of the previous examples, wherein the vapor chamber comprises:
a sealed first cavity defined at least partially by a first metal wall and a second metal wall, wherein an internal pressure of the sealed first cavity is lower than an ambient pressure outside the sealed first cavity; and
a sealed second cavity defined at least partially by a flat third metal wall and the second metal wall, wherein the second cavity comprises a liquid disposed therein and wick material coupled to an interior surface of the third wall.

Example 135. The electronic device of example 134, wherein the sealed first cavity is disposed within the sealed second cavity.

Example 136. The electronic device of one of the examples 134-135, wherein an internal pressure of the first cavity is below 0.1 torr.

Example 137. The electronic device of one of the examples 134-136, further comprising a material within the first cavity having a thermal conductivity less than air.

Example 138. The electronic device of example 137, wherein the material is an aerogel.

Example 139. The electronic device of one of the examples 134-138, further comprising one or more support structures in the first cavity, the support structures in contact with the first metal wall and the second metal wall.

Example 140. The electronic device of example 139, wherein the support structures are at least partially orthogonal to the first metal wall and second metal wall.

Example 141. The electronic device of example 139 or 140, wherein the support structures are composed of one or more of plastic, graphite, metal, and composite material.

Example 142. The electronic device of one of the examples 134-141, further comprising additional wick material coupled to an interior surface of the second wall.

Example 143. The electronic device of one of the examples 134-142, wherein the wick material comprises sintered metal.

Example 144. The electronic device of example 143, wherein the wick material comprises a first portion and a second portion, the sintered metal of the first portion having a higher porosity than the sintered metal of the second portion.

Example 145. The electronic device of example 144, wherein the sintered metal of the first portion has a porosity between approximately 40% and 70%, and the sintered metal of the second portion has a porosity between approximately 30% and 50%.

Example 146. The electronic device of one of the examples 134-145, wherein a cross-sectional area of the first cavity is one of substantially rectangular and substantially trapezoidal.

Example 147. The electronic device of one of the examples 134-146, wherein a cross-sectional area of the second cavity is substantially rectangular.

Example 148. The electronic device of one of the examples 134-147, wherein a cross-sectional area of the first cavity is less than a cross-sectional area of the second cavity.

Example 149. The electronic device of one of the examples 134-148, wherein the first wall comprises one of copper, titanium, and aluminum.

Example 150. The electronic device of one of the examples 134-149, wherein the third wall comprises one of copper, titanium, and aluminum.

Example 151. The electronic device of one of the previous examples, wherein the vapor chamber comprises:
one or more columns, wherein at least a portion of the one or more columns include fiber braids; and
one or more wicks.

Example 152. The electronic device of example 151, wherein at least one of the one or more wicks of the vapor chamber include the fiber braids.

Example 153. The electronic device of one of the examples 151-152, wherein the fiber braids are made of copper fiber or titanium fiber.

Example 154. The electronic device of one of the examples 151-153, wherein the one or more columns of the vapor chamber are brazed to a bottom plate of the vapor chamber.

Example 155. The electronic device of one of the examples 151-154, wherein the one or more columns of the vapor chamber are brazed to a top plate of the vapor chamber.

Example 156. The electronic device of one of the examples 151-155, wherein a portion of the one or more columns of the vapor chamber are support columns and the support columns do not include the fiber braids.

Example 157. The electronic device of one of the previous examples, wherein the vapor chamber is a planar vapor chamber having a substantially rectangular form factor, wherein a second dimension $d_2$ of the rectangular form factor is at least approximately twice a first dimension $d_1$ of the rectangular form factor.

Example 158. The electronic device of example 157, further comprising:
a first fan and second fan; and
a first heat pipe and second heat pipe discrete from the planar vapor chamber and disposed along first and second $d_1$ edges of the planar vapor chamber, further disposed to conduct heat from the first and second $d_1$ edges to the first and second fan respectively.

Example 159. The electronic device of one of the examples 157-158, wherein $d_2$ is between approximately $2 \cdot d_1$ and $5 \cdot d_1$.

Example 160. The electronic device of one of the examples 157-159, wherein the heat pipe is disposed along a $d_1$ edge of the vapor chamber.

Example 161. The electronic device of one of the examples 157-160, further comprising a second heat pipe disposed along an opposite $d_1$ edge of the vapor chamber.

Example 162. The electronic device of one of the examples 157-161, wherein the first and second heat pipes are vapor chambers.

Example 163. The electronic device of one of the examples 157-162, wherein the vapor chamber further comprises wicking means to conduct fluid from a condenser of the vapor chamber to an evaporator of the vapor chamber.

Example 164. The electronic device of example 163, wherein the wicking means are locally absent from a portion of the planar vapor chamber.

Example 165. The electronic device of one of the examples 157-164, wherein the planar vapor chamber further comprises radial pattern internal support ribbing.

Example 166. The electronic device of one of the previous examples, wherein the vapor chamber comprises:
an upper wall;
a heat conductive lower wall wherein the upper wall and lower wall are hermetically sealed together, and wherein the vapor chamber is evacuated of air;
an evaporative fluid disposed within the vapor chamber; and
a metallic wick affixed to the upper wall and lower wall and disposed to conduct fluid from a condenser region of the vapor chamber to an evaporator region of the vapor chamber, wherein the metallic wick is locally absent from a portion of the upper wall.

Example 167. The electronic device of example 166, wherein the portion of the upper wall is approximately 30% or 45%.

Example 168. The electronic device of one of the examples 157-167, wherein the portion of the upper wall is between 15% and 70%.

Example 169. The electronic device of one of the examples 157-167, wherein the portion of the upper wall is selected to provide a flow from the evaporator portion to the condenser portion.

Example 170. The electronic device of one of the examples 157-167, wherein the metallic wick is locally absent from a portion of the lower wall.

Example 171. The electronic device of one of the examples 157-167, wherein the metallic wick forms a starburst pattern on at least one of the upper wall or lower wall.

Example 172. The electronic device of one of the previous examples, wherein the vapor chamber comprises:
an upper wall;
a lower wall hermetically sealed to the upper wall to form a vacuum chamber;
an evaporative fluid within the vacuum chamber;
wicking means to carry condenser vapor from a condenser region of the vapor chamber to an evaporator region of the vapor chamber; and
starburst-patterned ribbing on at least one of the upper wall and lower wall.

Example 173. The electronic device of example 172, wherein the starburst-patterned ribbing provides at least some of the wicking means.

Example 174. The electronic device of one of the examples 172-173, further comprising mount points for the vapor chamber that pass through one or more terminals of the starburst pattern.

Example 175. The electronic device of one of the previous examples, wherein the heat source comprises a semiconductor die configured to generate heat during operation.

Example 176. The electronic device of one of the previous examples, wherein the heat source is at least one of a processor, a transmitter, a receiver, a power supply integrated circuit or a voltage converter integrated circuit.

Example 177. The electronic device of one of the previous examples, wherein the electronic device is a tablet, a laptop, a mobile phone or a personal computer.

Example 178. A method for operating an electronic device, comprising:
Operating the heat source; and
Distributing heat generated by the heat source during operation by a vapor chamber.

Example 179. The method of example 178, further comprising blowing air along a surface of a vapor chamber by a fan, wherein the fan is arranged so that the main blow direction is directed towards the vapor chamber.

Example 180. The method of example 178 or 179, further comprising blowing air along a surface of a heat distribution structure by a blower, wherein the blower comprises at least one of:
- a maximal length and maximal width of at most 20 mm; or
- a maximal thickness of at most 3 mm.

Example 181. The method of example 178, 179 or 180, further comprising:
- activating a thermal electric cooler based on a device parameter of the electronic device,
- wherein a first surface of the thermal electric cooler is thermally coupled to vapor chamber and a second surface of the thermal electric cooler is thermally coupled to a second heat distribution structure.

Example 182. A method for manufacturing an electronic device, comprising thermally coupling a vapor chamber to a heat source.

Example 183. The method of example 182, wherein the vapor chamber is configured to spread heat caused by the heat source from a center region to an edge region of the vapor chamber, wherein the vapor chamber is thermally coupled with the heat source in the center region at a first side of the vapor chamber, wherein the method further comprises forming or attaching a border on the vapor chamber, wherein the border surrounds the center region of the vapor chamber at the first side of the vapor chamber.

Example 184. The method of example 183, further comprising mounting a heat sink on the vapor chamber.

Example 185. The method of one of the examples 182-184, the method further comprising:
- creating one or more columns for the vapor chamber from a fiber braid by cutting the fiber braid; and
- brazing the created one or more columns to a top plate or a bottom plate to create at least a portion of the columns for the vapor chamber.

Example 186. The method of example 185, further comprising:
- creating one or more wicks for the vapor chamber from the fiber braid.

Example 187. The method of one of the examples 185-186, wherein the fiber braid was created before creating the vapor chamber.

Example 188. The method of one of the examples 185-187, wherein the fiber braid is made of copper fiber or titanium fiber.

Example 189. The method of one of the examples 185-188, further comprising:
- creating one or more support columns for the vapor chamber, wherein the support columns do not include the fiber braid; and
- securing the one or more support columns to the top plate or the bottom plate.

Example 190. The method of one of the examples 185-189, further comprising:
- securing the top plate to the bottom plate to create the vapor chamber.

Example 191. A machine-readable storage medium including program code, when executed, to cause a machine to perform the method of any example or combination of examples.

Example 192. A computer program having a program code for performing the method of any example or combination of examples, when the computer program is executed on a computer, a processor, or a programmable hardware component.

Example 193. A machine-readable storage including machine readable instructions, when executed, to implement a method or realize an apparatus as in any pending example.

Example 194. A cooling system for an electronic device, comprising:
- a vapor chamber configured to be coupled to a heat source of an electronic device; and
- a fan comprising a main blow direction, wherein the fan is arranged so that the main blow direction is directed towards the vapor chamber.

Example 195. The cooling system of example 194, wherein the fan is configured to blow air along a surface of the vapor chamber.

Example 196. The cooling system of example 195, wherein at least 50% of the air flow caused by the fan flows along the surface of the vapor chamber.

Example 197. The cooling system of one of the examples 194-196, wherein the fan is configured to blow air into a gap extending from the vapor chamber to at least one of a part of an enclosure of the electronic device or a backside of a screen of the electronic device.

Example 198. The cooling system of one of the examples 194-197, further comprising a circuit board configured to carry the heat source, wherein the fan is configured to blow air into a gap extending from the circuit board to at least one of a part of an enclosure of the electronic device or a backside of a screen of the electronic device.

Example 199. The cooling system of one of the examples 194-198, wherein the heat source comprises a semiconductor die configured to generate heat during operation.

Example 200. The cooling system of one of the examples 194-199, wherein the heat source is at least one of a processor, a transmitter, a receiver, a power supply integrated circuit or a voltage converter integrated circuit.

Example 201. The cooling system of one of the examples 194-200, further comprising a guiding structure configured to guide the air flow caused by the fan along the surface of the vapor chamber, wherein the guiding structure is arranged on at least one of the surface of the vapor chamber, a part of an enclosure of the electronic device or a backside of a screen of the electronic device.

Example 202. The cooling system of example 201, wherein the guiding structure comprises gasket material.

Example 203. The cooling system of example 201 or 202, wherein the guiding structure completely surrounds the vapor chamber except for one or more air inlet openings and one or more air outlet openings.

Example 204. The cooling system of one of the examples 194-203, wherein the main blow direction of the fan is substantially perpendicular to the rotation axis of the fan.

Example 205. The cooling system of one of the examples 194-204, wherein a main air inlet direction of the fan is substantially in parallel to the rotation axis of the fan.

Example 206. The cooling system of one of the examples 194-205, wherein no heat sink is located adjacent to the fan.

Example 207. The cooling system of one of the examples 194-206, wherein the fan comprises a maximal dimension with respect to height, length and width of at most 50 mm.

Example 208. The cooling system of one of the examples 194-207, wherein the fan is a single outlet fan.

Example 209. The cooling system of one of the examples 194-208, wherein the vapor chamber has a maximal dimension of at least 150 mm.

Example 210. The cooling system of one of the examples 194-209, wherein the fan is arranged laterally beside the vapor chamber.

Example 211. The cooling system of one of the examples 194-210, wherein a vertical extension of the fan overlaps a vertical extension of the vapor chamber.

Example 212. The cooling system of one of the examples 194-211, wherein the vapor chamber is arranged along an air flow path between the fan and an air outlet.

Example 213. An electronic device comprising:
the cooling system of one of the previous examples; and
the heat source.

Example 214. The electronic device of example 213, wherein the electronic device comprises a thickness of at most 8 mm.

Example 215. The electronic device of one of the examples 213-214, wherein the electronic device comprises a thermal design power of at most 10 W and at least 5 W.

Example 216. The electronic device of one of the examples 213-215, wherein the electronic device is implemented without a heat pipe.

Example 217. The electronic device of one of the examples 213-216, wherein the electronic device is implemented without heat sink for the fan.

Example 218. The electronic device of one of the examples 213-217, wherein the electronic device is a tablet, a laptop, a mobile phone or a personal computer.

Example 219. The electronic device of one of the examples 213-218, further comprising an enclosure comprising one or more inlet openings in proximity to the fan, wherein the fan is configured to suck air from outside the electronic device through the one or more inlet openings.

Example 220. The electronic device of one of the examples 213-219, wherein the fan is configured to cause an air flow from an air inlet through the fan to a surface of the vapor chamber and from the surface of the vapor chamber to an air outlet.

Example 221. A method for cooling an electronic device, comprising:
Blowing air along a surface of a vapor chamber by a fan, wherein the fan is arranged so that the main blow direction is directed towards the vapor chamber.

Example 222. A cooling system for an electronic device, comprising:
a heat distribution structure configured to be coupled to a heat source of an electronic device, wherein the heat distribution structure comprises at least one of a vapor chamber or a heat pipe; and
a blower configured to cause an air flow along a surface of the heat distribution structure, wherein the blower comprises at least one of:
a maximal length and maximal width of at most 20 mm; or
a maximal thickness of at most 3 mm.

Example 223. The cooling system of example 222, wherein the blower is configured to blow air towards the heat distribution structure.

Example 224. The cooling system of example 223, wherein at least 50% of the air flow caused by the blower flows along the surface of the heat distribution structure.

Example 225. The cooling system of one of the examples 222-224, wherein the blower is configured to blow air into a gap extending from the heat distribution structure to a part of an enclosure of the electronic device or a backside of a screen of the electronic device.

Example 226. The cooling system of example 225, wherein the gap has a thickness of at most 2 mm.

Example 227. The cooling system of one of the examples 222-226, further comprising a circuit board configured to carry the heat source, wherein the blower is configured to cause an air flow through a gap between the circuit board and the heat distribution structure.

Example 228. The cooling system of one of the examples 222-227, wherein the heat source comprises a semiconductor die configured to generate heat during operation.

Example 229. The cooling system of one of the examples 222-228, wherein the heat source is at least one of a processor, a transmitter, a receiver, a power supply or a voltage converter.

Example 230. The cooling system of one of the examples 222-229, further comprising a guiding structure configured to guide the air flow caused by the blower along the surface of the heat distribution structure, wherein the guiding structure is arranged on at least one of the surface of the heat distribution structure or a part of an enclosure of the electronic device.

Example 231. The cooling system of example 230, wherein the guiding structure comprises a wall having a height of at most 2 mm.

Example 232. The cooling system of one of the examples 222-231, wherein no heat sink is located adjacent to the blower.

Example 233. The cooling system of one of the examples 222-232, wherein the heat distribution structure is a vapor chamber having a maximal dimension of at least 150 mm.

Example 234. The cooling system of one of the examples 222-232, wherein the heat distribution structure is an array of heat pipes arranged side by side.

Example 235. The cooling system of one of the examples 222-234, wherein the blower is arranged laterally beside the heat distribution structure.

Example 236. The cooling system of one of the examples 222-235, wherein a vertical extension of the blower overlaps with a vertical extension of the heat distribution structure.

Example 237. The cooling system of one of the examples 222-236, wherein the heat distribution structure is arranged along an air flow path between the blower and an air outlet.

Example 238. The cooling system of one of the examples 222-237, further comprising a second blower configured to cause an air flow along a surface of the heat distribution structure, wherein the second blower comprises at least one of:
a maximal length and maximal width of at most 20 mm; or
a maximal thickness of at most 3 mm.

Example 239. The cooling system of example 238, wherein the first blower and the second blower are arranged laterally on opposite sides of the heat distribution structure.

Example 240. The cooling system of one of the examples 222-29, wherein the blower has a maximal current consumption of at most 0.08 A.

Example 241. An electronic device comprising:
the cooling system of one of the examples 222-240; and
the heat source.

Example 242. The electronic device of example 241, wherein the electronic device comprises a thermal design power of at most 25 W and at least 5 W.

Example 243. The electronic device of one of the examples 241-242, wherein the heat distribution structure is a vapor chamber and the electronic device is implemented without a heat pipe.

Example 244. The electronic device of one of the examples 241-243, wherein the electronic device is implemented without heat spreader for the blower.

Example 245. The electronic device of one of the examples 241-244, wherein the electronic device is a tablet, a laptop, a mobile phone or a personal computer.

Example 246. The electronic device of one of the examples 241-245, further comprising an enclosure comprising one or more inlet openings in proximity to the blower, wherein the blower is configured to suck air from outside the electronic device through the one or more inlet openings.

Example 247. The electronic device of one of the examples 241-246, wherein the blower is configured to cause an air flow from an air inlet through the blower to a surface of the vapor chamber and from the vapor chamber to an air outlet.

Example 248. The electronic device of one of the examples 241-247, further comprising a circuit board, wherein the circuit board is configured to carry the heat source, wherein the circuit board comprises an opening, wherein the blower is at least partially located in the opening.

Example 249. The electronic device of one of the examples 241-248, wherein the electronic device is implemented without a blower comprising a maximal dimension with respect to height, length and width of at least 20 mm Example 250. The cooling system of one of the examples 241-249, further comprising a fan, wherein the fan comprises at least one of:
- a maximal length and maximal width of at least 30 mm; or
- a maximal thickness of at least 4 mm,
- wherein the blower is located closer to the heat source than the fan.

Example 251. A method for cooling an electronic device, comprising:
Blowing air along a surface of a heat distribution structure by a blower, wherein the blower comprises at least one of:
- a maximal length and maximal width of at most 20 mm; or
- a maximal thickness of at most 3 mm.

Example 252. A cooling system for a computing device, the cooling system comprising:
- a heat conduction element, the heat conduction element being suitable for cooling a processing unit of the computing device;
- at least one blower fan for blowing air across a portion of the heat conduction element; and
- control circuitry configured to activate or deactivate the at least one blower fan based on a heat load of a processing unit of the computing device.

Example 253. The cooling system according to example 252, wherein the control circuitry is configured to activate the at least one blower fan if the heat load of the processing unit is above a threshold, and to deactivate the at least one blower fan if the heat load of the processing unit is below the threshold.

Example 254. The cooling system of one of the examples 252-253, wherein the control circuitry is configured to operate the cooling system passively if the heat load of the processing unit is below a threshold.

Example 255. The cooling system of one of the examples 252-254, wherein the control circuitry is configured to obtain information on the head load from a processing unit of the computing device.

Example 256. The cooling system of one of the examples 252-255, wherein the information on the heat load is based on at least one temperature that is measured or estimated within the computing device.

Example 257. The cooling system of one of the examples 252-256, wherein the information on the heat load is based on a turbo state of the processing unit.

Example 258. The cooling system of one of the examples 252-257, wherein the information on the heat load is based on a predicted development of the heat load.

Example 259. The cooling system of one of the examples 252-258, wherein the at least one blower fan has a fan diameter of at most 30 mm.

Example 260. The cooling system of one of the examples 252-259, wherein the at least one blower fan has a fan width of at most 5 mm.

Example 261. The cooling system of one of the examples 252-260, wherein the heat conduction element comprises a vapor chamber.

Example 262. The cooling system of one of the examples 252-261, wherein the heat conduction element comprises at least one substantially flat major surface, wherein the at least one blower fan is arranged to blow air across the at least one substantially flat major surface.

Example 263. The cooling system of one of the examples 252-262, wherein the cooling system comprises two blower fans, the two blower fans being arranged at either lateral side of the heat conduction element.

Example 264. The cooling system of one of the examples 252-263, wherein the cooling system comprises at least one air flow conductor for conducting the air blown by the at least one blower fan towards the heat conduction element.

Example 265. A computing device comprising the cooling system of one of the examples 252-264 and a processing unit, the heat conduction element being in contact with the processing unit.

Example 266. The computing device of example 265, wherein the at least one blower fan is arranged at a non-zero angle relative to a main portion of a bottom plate of a chassis of the computing device.

Example 267. The computing device of one of the examples 265-266, wherein the angle of the at least one blower fan relative to the main portion of the bottom plate of the chassis is between 2° and 15°.

Example 268. The computing device of one of the examples 265-267, wherein the heat conduction element of the cooling system is held by a chassis of the computation device.

Example 269. The computing device of one of the examples 265-268, wherein the processing unit is configured to determine information on a heat load of the processing unit, and to provide the information on the heat load to the control circuitry of the cooling system.

Example 270. The computing device of one of the examples 265-269, wherein the processing unit is configured to determine the information on the heat load based on at least one temperature that is measured or estimated within the computing device and/or based on a turbo state of the processing unit.

Example 271. The computing device of one of the examples 265-270, wherein the processing unit is configured to determine the information on the heat load by predicting the heat load using a machine-learning model.

Example 272. A cooling system for a computing device, the cooling system comprising:
- means for conducting heat suitable for cooling a processing unit of the computing device;
- means for blowing air across a portion of the heat conduction element; and
- means for activating or deactivating the means for blowing air based on a heat load of a processing unit of the computing device.

Example 273. A computing device comprising the cooling system of example 272 and a processing unit, the means for conducting heat being in contact with the processing unit.

Example 274. A method for a computing device, the computing device comprising a cooling system and a processing unit, the method comprising determining information on a heat load of the processing unit, and providing the information on the heat load to a control circuitry of the cooling system.

Example 274. A cooling system for an electronic device, comprising:
- a first heat distribution structure configured to be coupled to a heat source;
- a thermal electric cooler; and
- a second heat distribution structure, wherein a first surface of the thermal electric cooler is thermally coupled to the first heat distribution structure and a second surface of the thermal electric cooler is thermally coupled to the second heat distribution structure.

Example 275. The cooling system of example 274, further comprising a heat pipe arranged adjacent to the thermal electric cooler on the first heat distribution structure.

Example 276. The cooling system of example 275, wherein the thermal electric cooler is located at least in one direction closer to an edge of the first heat distribution structure than the heat pipe.

Example 277. The cooling system of one of the examples 275-276, wherein the heat pipe extends to a fan of the cooling system.

Example 278. The cooling system of one of the examples 275-277, wherein the heat pipe has a thickness of at most 3 mm.

Example 279. The cooling system of one of the examples 275-278, wherein the heat pipe is coupled to the first heat distribution structure in an area opposite to a center of the heat source.

Example 280. The cooling system of one of the examples 275-279, wherein the heat pipe is arranged between on the first heat distribution structure and the second heat distribution structure.

Example 281. The cooling system of one of the examples 275-280, wherein a first surface of the heat pipe is thermally coupled to the first heat distribution structure and a second surface of the heat pipe is thermally coupled to the second heat distribution structure.

Example 282. The cooling system of one of the examples 275-281, further comprising a second heat pipe, wherein the first heat pipe is arranged laterally between the thermal electric cooler and the second heat pipe.

Example 283. The cooling system of one of the examples 275-282, wherein the second heat pipe is arranged between the first heat distribution structure and the second heat distribution structure.

Example 284. The cooling system of example 282 or 283, further comprising a third heat pipe, wherein the third heat pipe is thermally coupled to the second heat distribution structure, wherein the third heat pipe is laterally spaced apart from the first heat distribution structure.

Example 285. The cooling system of example 284, wherein a thickness of the thermal electric cooler is larger than a thickness of the first heat distribution structure.

Example 286. The cooling system of one of the examples 282-283, wherein a thickness of the heat pipe is larger than a distance between the first heat distribution structure and the second heat distribution structure.

Example 287. The cooling system of one of the examples 274-286, wherein the first heat distribution structure is a metal plate or a vapor chamber.

Example 288. The cooling system of one of the examples 274-287, wherein the second heat distribution structure is a metal plate or vapor chamber.

Example 289. The cooling system of one of the examples 274-288, wherein the first heat distribution structure has a thickness of at most 1 mm.

Example 290. The cooling system of one of the examples 274-289, wherein the thermal electric cooler has a thickness of at most 3 mm.

Example 291. The cooling system of one of the examples 274-290, wherein a distance between the first heat distribution structure and the second heat distribution structure is at most 3 mm.

Example 292. The cooling system of one of the examples 274-291, wherein the heat source comprises a semiconductor die configured to generate heat during operation.

Example 293. The cooling system of one of the examples 274-292, wherein the heat source is at least one of a processor, a transmitter, a receiver, a power supply or a voltage converter.

Example 294. An electronic device comprising:
- the cooling system of one of the examples 274-293; and
- the heat source.

Example 295. The electronic device of example 294, wherein the electronic device is configured to activate and deactivate the thermal electric cooler based on one or more device parameters.

Example 296. The electronic device of example 296, wherein a device parameter of the one or more device parameters indicates a junction temperature of the heat source.

Example 297. The electronic device of example 296 or 297, wherein a device parameter of the one or more device parameters indicates a charging status of the electronic device.

Example 298. The electronic device of example 296, 297 or 298, wherein a device parameter of the one or more device parameters indicates a workload of the electronic device.

Example 299. The electronic device of one of the examples 294-298, wherein a distance between the second heat distribution structure and a part of an enclosure of the electronic device or a backside of a screen of the electronic device is at most 2 mm.

Example 300. The electronic device of one of the examples 294-299, wherein the second heat distribution structure is thermally coupled to a part of an enclosure of the electronic device.

Example 301. The electronic device of one of the examples 294-300, wherein the heat source comprises a thermal design power of at least 15 W.

Example 302. The electronic device of one of the examples 294-301, wherein the heat source comprises a thermal design power of at most 15 W.

Example 303. The electronic device of one of the examples 294-302, wherein the electronic device is implemented without a heat pipe.

Example 304. The electronic device of one of the examples 294-303, wherein the electronic device is implemented without a fan.

Example 305. The electronic device of one of the examples 294-304, wherein the first heat distribution structure comprises a first part thermally coupled to the heat source and a second part thermally connected to the first part, wherein the second part of the first heat distribution structure is arranged laterally beside the heat source, wherein the heat source is located vertically between the first part and the second part of the first heat distribution structure.

Example 306. The electronic device of example 305, wherein a vertical extension of the thermal electric cooler overlaps with a vertical extension of the heat source.

Example 307. The electronic device of one of the examples 294-306, wherein the electronic device is a tablet, a laptop, a mobile phone or a personal computer.

Example 308. A method for cooling an electronic device, comprising:
- activating a thermal electric cooler based on a device parameter of the electronic device,
- wherein a first surface of the thermal electric cooler is thermally coupled to a first heat distribution structure and a second surface of the thermal electric cooler is thermally coupled to a second heat distribution structure, wherein the first heat distribution structure is coupled to a heat source.

Example 309. A cooling structure for an electronic device, comprising:
- a heat distribution structure configured to spread heat caused by a heat source from a center region to an edge region of the heat distribution structure, wherein the heat distribution structure is configured to be thermally coupled with the heat source in the center region at a first side of the heat distribution structure; and
- a border located on the heat distribution structure, wherein the border surrounds the center region of the heat distribution structure at the first side of the heat distribution structure.

Example 310. The cooling structure of example 309, wherein the heat distribution structure comprises a planar surface in the center region.

Example 311. The cooling structure of one of the examples 309-310, wherein the border protrudes from the surface of the center region by at most 1 mm.

Example 312. The cooling structure of one of the examples 309-311, wherein the region enclosed by the border comprises a maximal dimension with respect to length and width of at most 30 mm.

Example 313. The cooling structure of one of the examples 309-312, wherein the border forms walls laterally enclosing the center region.

Example 314. The cooling structure of example 313, wherein the walls extend perpendicular to a surface of the center region.

Example 315. The cooling structure of one of the examples 309-314, wherein a heat sink is mounted to a second side of the heat distribution structure.

Example 316. The cooling structure of example 315, wherein the heat sink is thermally coupled to the second side of the heat distribution structure by a thermal interface material between the heat sink and the heat distribution structure.

Example 317. The cooling structure of one of the examples 309-316, wherein the edge region of the heat distribution structure extends along an edge of the of the heat distribution structure, wherein the border is located on the of the heat distribution structure laterally between the edge region and the center region.

Example 318. The cooling structure of one of the examples 309-317, further comprising a seal ring attached to the border, wherein the seal ring is configured to seal a gap between the border and a carrier structure of the heat source.

Example 319. The cooling structure of one of the examples 309-318, wherein the heat distribution structure comprises a metal plate, a plurality of heat pipes or a vapor chamber.

Example 320. The cooling structure of one of the examples 309-319, wherein the heat distribution structure comprises a thickness of at most 4 mm.

Example 321. The cooling structure of one of the examples 309-320, wherein the heat distribution structure comprises a maximal dimension with respect to length and width of at least 60 mm and at most 150 mm.

Example 322. The cooling structure of one of the examples 309-321, wherein the heat source is a semiconductor die configured to generate heat during operation.

Example 323. The cooling structure of one of the examples 309-322, wherein the heat source is at least one of a processor, a transmitter, a receiver, a power supply or a voltage converter.

Example 324. An electronic device comprising:
- A semiconductor die; and
- a cooling structure comprising a heat distribution structure configured to spread heat caused by the semiconductor die from a center region to an edge region of the heat distribution structure, wherein the heat distribution structure is thermally coupled with the semiconductor die in the center region at a first side of the heat distribution structure,
- wherein the bare semiconductor die is thermally directly coupled to the heat distribution structure through a thermal interface material.

Example 325. The electronic device of example 324, wherein the semiconductor die is a central processing unit.

Example 326. The electronic device of one of the examples 324-325, wherein the cooling structure is a cooling structure according to one of the examples 309-322.

Example 327. The electronic device of example 326, further comprising a seal ring attached to the border, wherein the seal ring seals a gap between the border and a package substrate of the semiconductor die.

Example 328. The electronic device of one of the examples 324-327, wherein the heat distribution structure is a vapor chamber and a distance between a backside surface of the semiconductor die and a cavity of the vapor chamber is at most 1 mm.

Example 329. The electronic device of one of the examples 324-328, further comprising a circuit board, wherein the semiconductor die is arranged on the circuit board.

Example 330. The electronic device of one of the examples 324-329, further comprising a fan configured to blow air towards a heat sink mounted to the heat distribution structure.

Example 331. The electronic device of one of the examples 324-330, wherein the thermal interface material is a thermal grease or a liquid metal.

Example 332. The electronic device of one of the examples 324-331, wherein the semiconductor die comprises a thermal design power of at least 100 W.

Example 333. The electronic device of one of the examples 324-332, wherein the electronic device is a tablet, a laptop, a mobile phone or a personal computer.

Example 334. A method for forming a cooling structure, comprising:
- Providing a heat distribution structure configured to spread heat caused by a heat source from a center region to an edge region of the heat distribution structure, wherein the heat distribution structure is configured to be thermally coupled with the heat source in the center region at a first side of the heat distribution structure; and Forming or attaching a border on the heat distribution structure, wherein the border surrounds the center region of the heat distribution structure at the first side of the heat distribution structure.

Example 335. The method of example 334, further comprising mounting a heat sink on the heat distribution structure.

Example 336. An electronic device, comprising:

An enclosure; and

A laminar heat spreader thermally coupled to a heat source inside the enclosure, wherein the laminar heat spreader extends from the inside of the enclosure to the outside of the enclosure.

Example 337. The electronic device of example 336, wherein the laminar heat spreader comprises a graphite sheet, a graphene sheet or a metal foil.

Example 338. The electronic device of one of the examples 336-337, wherein the laminar heat spreader has a thermal conductivity of at least 100 W/mK in at least one direction along the laminar heat spreader Example 339. The electronic device of one of the examples 336-338, wherein the enclosure comprises an opening, wherein the laminar heat spreader extends from the inside through the opening to the outside.

Example 340. The electronic device of example 339, wherein the opening comprises a length of at least 290 mm and a width of at most 2 mm.

Example 341. The electronic device of example 339 or 340, wherein the laminar heat spreader is covered by a protective layer in the region of the opening.

Example 342. The electronic device of example 341, wherein the protective layer comprises plastic or a nickel-titanium-alloy.

Example 343. The electronic device of example 341 or 342, wherein the protective layer is covered by a cover layer in the region of the opening.

Example 344. The electronic device of example 343, wherein the cover layer comprises microfiber material.

Example 345. The electronic device of one of the examples 336-344, further comprising a heat distribution structure thermally coupled to the heat source at a first side, wherein the laminar heat spreader is thermally coupled to a second side of the heat distribution structure.

Example 346. The electronic device of example 345, wherein the heat distribution structure comprises at least one of a metal plate, a heat pipe or a vapor chamber.

Example 347. The electronic device of example 345 or 346, wherein the heat distribution structure comprises a thickness of at most 4 mm.

Example 348. The electronic device of example 345, 346 or 347, wherein the heat distribution structure comprises a maximal dimension with respect to length and width of at least 60 mm.

Example 349. The electronic device of one of the examples 336-348, further comprising a kickstand connected to the enclosure, wherein a part of the laminar heat spreader extends between the enclosure and the kickstand.

Example 350. The electronic device of example 349, wherein a part of the laminar heat spreader is attached to the kickstand.

Example 351. The electronic device of one of the examples 336-350, wherein a part of the laminar heat spreader is attached to an outside surface of the enclosure.

Example 352. The electronic device of one of the examples 336-351, wherein a part of the laminar heat spreader located outside the enclosure is covered by a soft cover.

Example 353. The electronic device of one of the examples 336-352, wherein a part of the laminar heat spreader located outside the enclosure extends along a backside of a keyboard.

Example 354. The electronic device of one of the examples 336-353, wherein a part of the laminar heat spreader located inside the enclosure extends between the enclosure and a battery of the electronic device.

Example 355. The electronic device of one of the examples 336-354, wherein the heat source is a semiconductor die configured to generate heat during operation.

Example 356. The electronic device of one of the examples 336-355, wherein the heat source is at least one of a processor, a transmitter, a receiver, a power supply or a voltage converter.

Example 357. The electronic device of one of the examples 336-356, wherein the electronic device is a tablet or a mobile phone.

Example 358. The electronic device of one of the examples 336-357, wherein the electronic device comprises a thermal design power of at most 25 W and at least 5 W.

Example 359. The electronic device of one of the examples 336-358, wherein the electronic device is implemented without a fan.

Example 360. A cover for an electronic device comprising:

a laminar heat spreader having a thermal conductivity at least in one direction of at least 100 W/mK; and a laminar carrier, wherein the laminar heat spreader is attached to the laminar carrier.

Example 361. The cover of example 360, wherein the laminar heat spreader comprises a graphite sheet, a graphene sheet or a metal foil.

Example 362. The cover of example 360 or 361, wherein the laminar carrier comprises a protective layer attached to the laminar heat spreader.

Example 363. The cover of example 362, wherein the protective layer comprises plastic or a nickel-titanium-alloy.

Example 364. The cover of one of the examples 360-363, wherein the laminar carrier comprises a cover layer.

Example 365. The cover of example 364, wherein the cover layer comprises microfiber material.

Example 366. The cover of one of the examples 360-365, wherein the cover is a soft cover or a hard cover.

Example 367. The cover of one of the examples 360-366, wherein the cover is configured to detachably house the electronic device.

Example 368. The cover of one of the examples 360-367, wherein the electronic device is a tablet or a mobile phone.

Example 369. The cover of one of the examples 360-368, further comprising a keyboard, wherein a part of the laminar heat spreader extends between the laminar carrier and the keyboard.

Example 370 includes a two-tier vapor chamber apparatus comprising: a sealed first cavity defined at least partially by a first metal wall and a second metal wall, wherein an internal pressure of the sealed first cavity is lower than an ambient pressure outside the sealed first cavity; and a sealed second cavity defined at least partially by a flat third metal wall and the second metal wall, wherein the second cavity comprises a liquid disposed therein and wick material coupled to an interior surface of the third wall.

Example 372 includes the subject matter of Example 1 and/or other Example(s), and optionally, wherein the sealed first cavity is disposed within the sealed second cavity.

Example 373 includes the subject matter of Example 1 or 2 and/or other Example(s), and optionally, wherein an internal pressure of the first cavity is below 0.1 torr.

Example 374 includes the subject matter of any one of Examples 1-3 and/or other Example(s), and optionally, further comprising a material within the first cavity having a thermal conductivity less than air.

Example 375 includes the subject matter of Example 4 and/or other Example(s), and optionally, wherein the material is an aerogel.

Example 376 includes the subject matter of any one of Examples 1-5 and/or other Example(s), and optionally, further comprising one or more support structures in the first cavity, the support structures in contact with the first metal wall and the second metal wall.

Example 377 includes the subject matter of Example 6 and/or other Example(s), and optionally, wherein the support structures are at least partially orthogonal to the first metal wall and second metal wall.

Example 378 includes the subject matter of Example 6 and/or other Example(s), and optionally, wherein the support structures are composed of one or more of plastic, graphite, metal, and composite material.

Example 379 includes the subject matter of any one of Examples 1-8 and/or other Example(s), and optionally, further comprising additional wick material coupled to an interior surface of the second wall.

Example 380 includes the subject matter of any one of Examples 1-9 and/or other Example(s), and optionally, wherein the wick material comprises sintered metal.

Example 381 includes the subject matter of Example 10 and/or other Example(s), and optionally, wherein the wick material comprises a first portion and a second portion, the sintered metal of the first portion having a higher porosity than the sintered metal of the second portion.

Example 382 includes the subject matter of Example 11 and/or other Example(s), and optionally, wherein the sintered metal of the first portion has a porosity between approximately 40% and 70%, and the sintered metal of the second portion has a porosity between approximately 30% and 50%.

Example 383 includes an apparatus comprising: a cooling system for a computer, wherein the cooling system comprises a two-tier vapor chamber, and the two-tier vapor chamber comprises: a sealed first cavity defined at least partially by a first metal wall and a second metal wall, wherein an internal pressure of the sealed first cavity is lower than an ambient pressure outside the sealed first cavity; and a sealed second cavity defined at least partially by a flat third metal wall and the second metal wall, wherein the second cavity comprises a liquid disposed therein and wick material coupled to an interior surface of the third wall.

Example 384 includes the subject matter of Example 13 and/or other Example(s), and optionally, wherein the sealed first cavity is disposed within the sealed second cavity.

Example 385 includes the subject matter of Example 13 or 14 and/or other Example(s), and optionally, wherein a cross-sectional area of the first cavity is one of substantially rectangular and substantially trapezoidal.

Example 386 includes the subject matter of Example 13 or 14 and/or other Example(s), and optionally, wherein a cross-sectional area of the second cavity is substantially rectangular.

Example 387 includes the subject matter of Example 13, 15, or 16 and/or other Example(s), and optionally, wherein a cross-sectional area of the first cavity is less than a cross-sectional area of the second cavity.

Example 388 includes the subject matter of any one of Examples 13-17 and/or other Example(s), and optionally, wherein the first wall comprises one of copper, titanium, and aluminum.

Example 389 includes the subject matter of any one of Examples 13-17 and/or other Example(s), and optionally, wherein the third wall comprises one of copper, titanium, and aluminum.

Example 390 includes a system comprising: a chip package comprising a processor; and a vapor chamber apparatus comprising: a first cavity defined at least partially by a first metal wall and a second metal wall, wherein an internal pressure of the first cavity is lower than an ambient pressure outside the first cavity; and a second cavity defined at least partially by a flat third metal wall and the second metal wall, wherein the second cavity comprises a liquid disposed therein wick material coupled to an interior surface of the third wall and the chip package is positioned such that it coupled to the flat third metal wall of the vapor chamber.

Example 391 includes the subject matter of Example 20 and/or other Example(s), and optionally, wherein the first cavity is disposed within the second cavity.

Example 392 includes the subject matter of Example 20 or 21 and/or other Example(s), and optionally, further comprising a heat exchanger coupled to the vapor chamber apparatus.

Example 393 includes the subject matter of any one of Examples 20-22 and/or other Example(s), and optionally, wherein the chip package comprises one of a central processing unit and a graphics processing unit.

Example 394 includes the subject matter of any one of Examples 20-23 and/or other Example(s), and optionally, further comprising: a printed circuit board housing the chip package, wherein the vapor chamber apparatus is coupled to the chip package on a surface of the chip package opposite the printed circuit board; and a top cover comprising glass, wherein the top cover and vapor chamber apparatus are positioned such that there is an air gap between an interior surface of the top cover and a surface of the vapor chamber apparatus opposite the chip package.

Example 395 includes the subject matter of any one of Examples 20-24 and/or other Example(s), and optionally, wherein the system is one of a mobile phone or tablet computer device.

In Example A1, a vapor chamber can include one or more columns, where at least a portion of the one or more columns include fiber braids and one or more wicks.

In Example A2, the subject matter of Example A1 can optionally include where at least one of the one or more wicks of the vapor chamber include the fiber braids.

In Example A3, the subject matter of any one of Examples A1-A2 can optionally include where the fiber braids are made of copper fiber or titanium fiber.

In Example A4, the subject matter of any one of Examples A1-A3 can optionally include where the one or more columns of the vapor chamber are brazed to a bottom plate of the vapor chamber.

In Example A5, the subject matter of any one of Examples A1-A4 can optionally include where the one or more columns of the vapor chamber are brazed to a top plate of the vapor chamber.

In Example A6, the subject matter of any one of Examples A1-A5 can optionally include where a portion of the one or more columns of the vapor chamber are support columns and the support columns do not include the fiber braids.

Example AA1 is a device including one or more heat sources and a vapor chamber over the one or more heat sources, where the vapor chamber includes fiber braids.

In Example AA2, the subject matter of Example AA1 can optionally include where one or more columns of the vapor chamber include the fiber braids.

In Example AA3, the subject matter of any one of the Examples AA1-AA2 can optionally include where one or more wicks of the vapor chamber include the fiber braids.

In Example AA4, the subject matter of any one of the Examples AA1-AA3 can optionally include where the fiber braids are made of copper fiber or titanium fiber.

In Example AA5, the subject matter of any one of the Examples AA1-AA4 can optionally include where one or more columns of the vapor chamber include the fiber braids and the columns are brazed to a bottom plate of the vapor chamber.

In Example AA6, the subject matter of any one of the Examples AA1-AA5 can optionally include where one or more columns of the vapor chamber include the fiber braids and the columns are brazed to a top plate of the vapor chamber.

In Example AA7, the subject matter of any one of the Examples AA1-AA6 can optionally include where one or more columns of the vapor chamber and one or more wicks of the vapor chamber include the fiber braids.

In Example AA8, the subject matter of any one of the Examples AA1-AA7 can optionally include where one or more columns of the vapor chamber are support columns and the support columns do not include the fiber braids.

Example M1 is a method including creating one or more columns for the vapor chamber from a fiber braid by cutting the fiber braid and brazing the created one or more columns to a top plate or a bottom plate to create at least a portion of the columns for the vapor chamber.

In Example M2, the subject matter of Example M1 can optionally include creating one or more wicks for the vapor chamber from the fiber braid.

In Example M3, the subject matter of any one of the Examples M1-M2 can optionally include where the fiber braid was created before creating the vapor chamber.

In Example M4, the subject matter of any one of the Examples M1-M3 can optionally include where the fiber braid is made of copper fiber or titanium fiber.

In Example M5, the subject matter of any one of the Examples M1-M4 can optionally include creating one or more support columns for the vapor chamber, where the support columns do not include the fiber braid and securing the one or more support columns to the top plate or the bottom plate.

In Example M6, the subject matter of any one of the Examples M1-M5 can optionally include where securing the top plate to the bottom plate to create the vapor chamber.

Example AA1 is an apparatus including means for creating one or more columns for the vapor chamber from a fiber braid and means for brazing the created one or more columns to a top plate or a bottom plate to create at least a portion of the columns for the vapor chamber.

In Example AA2, the subject matter of Example AA1 can optionally include means for creating one or more wicks for the vapor chamber from the fiber braid.

In Example AA3, the subject matter of any one of Examples AA1-AA2 can optionally include where the fiber braid was created before creating the vapor chamber.

In Example AA4, the subject matter of any one of Examples AA1-AA3 can optionally include where the fiber braid is made of copper fiber or titanium fiber.

In Example AA5, the subject matter of any one of Examples AA1-AA4 can optionally include means for creating one or more support columns for the vapor chamber, where the support columns do not include the fiber braid and means for securing the one or more support columns to the top plate or the bottom plate.

In Example AA6, the subject matter of any one of Examples AA1-AA5 can optionally include means for securing the top plate to the bottom plate to create the vapor chamber.

There is disclosed in one example a heat dissipator for an electronic apparatus, comprising: a planar vapor chamber having a substantially rectangular form factor, wherein a second dimension $d_2$ of the rectangular form factor is at least approximately twice a first dimension $d_1$ of the rectangular form factor; a first fan and second fan; and a first heat pipe and second heat pipe discrete from the planar vapor chamber and disposed along first and second $d_1$ edges of the planar vapor chamber, further disposed to conduct heat from the first and second $d_1$ edges to the first and second fan respectively.

There is further disclosed an example heat dissipator, wherein $d_2$ is between approximately $2 \cdot d_1$ and $5 \cdot d_1$.

There is further disclosed an example heat dissipator, wherein the heat pipe is disposed along a $d_1$ edge of the vapor chamber.

There is further disclosed an example heat dissipator, further comprising a second heat pipe disposed along an opposite $d_1$ edge of the vapor chamber.

There is further disclosed an example heat dissipator, wherein the first and second heat pipes are vapor chambers.

There is further disclosed an example heat dissipator, wherein the vapor chamber further comprises wicking means to conduct fluid from a condenser of the vapor chamber to an evaporator of the vapor chamber.

There is further disclosed an example heat dissipator, wherein the wicking means are locally absent from a portion of the planar vapor chamber.

There is further disclosed an example heat dissipator, wherein the wicking means are locally absent from approximately 30% or 45% of the planar vapor chamber.

There is further disclosed an example heat dissipator, wherein the wicking means are locally absent from approximately 15% to 70% of the planar vapor chamber.

There is further disclosed an example heat dissipator, wherein the portion of the vapor chamber provides a vapor flow path from an evaporator of the vapor chamber to a condenser of the vapor chamber.

There is further disclosed an example heat dissipator, wherein the planar vapor chamber further comprises radial pattern internal support ribbing.

There is also disclosed an example computing system, comprising: a processor; a memory; a human interface; and the heat dissipator of a number of the above examples.

There is further disclosed an example computing system, wherein the system is a laptop computer.

There is further disclosed an example computing system, wherein the system is a tablet computer or smart phone.

There is also disclosed an example vapor chamber, comprising: an upper wall; a heat conductive lower wall wherein the upper wall and lower wall are hermetically sealed together, and wherein the vapor chamber is evacuated of air; an evaporative fluid disposed within the vapor chamber; and a metallic wick affixed to the upper wall and lower wall and disposed to conduct fluid from a condenser region of the vapor chamber to an evaporator region of the vapor chamber, wherein the metallic wick is locally absent from a portion of the upper wall.

There is further disclosed an example vapor chamber, wherein the portion of the upper wall is approximately 30% or 45%.

There is further disclosed an example vapor chamber, wherein the portion of the upper wall is between 15% and 70%.

There is further disclosed an example vapor chamber, wherein the portion of the upper wall is selected to provide a flow from the evaporator portion to the condenser portion.

There is further disclosed an example vapor chamber, wherein the metallic wick is locally absent from a portion of the lower wall.

There is further disclosed an example vapor chamber, wherein the metallic wick forms a starburst pattern on at least one of the upper wall or lower wall.

There is further disclosed an example vapor chamber, wherein the vapor chamber is planar.

There is further disclosed an example heat dissipation assembly comprising the vapor chamber of a number of the above examples.

There is further disclosed an example heat dissipation assembly, further comprising a heat pipe.

There is further disclosed an example heat dissipation assembly, wherein the vapor chamber has a first dimension $d_1$ and a second dimension $d_2$, wherein $d_2$ is between approximately $2 \cdot d_1$ and $5 \cdot d_1$, and wherein the heat pipe is disposed along the axis of $d_1$.

There is further disclosed an example computing system comprising a processor, a memory, and the heat dissipation assembly of a number of the above examples.

There is also disclosed an example vapor chamber, comprising: an upper wall; a lower wall hermetically sealed to the upper wall to form a vacuum chamber; an evaporative fluid within the vacuum chamber; wicking means to carry condenser vapor from a condenser region of the vapor chamber to an evaporator region of the vapor chamber; and starburst-patterned ribbing on at least one of the upper wall and lower wall.

There is further disclosed an example vapor chamber, wherein the starburst-patterned ribbing provides at least some of the wicking means.

There is further disclosed an example vapor chamber, further comprising mount points for the vapor chamber that pass through one or more terminals of the starburst pattern.

There is further disclosed an example vapor chamber, wherein the wicking means comprise a porous metal.

There is further disclosed an example vapor chamber, wherein the wicking means comprise capillaries.

There is further disclosed an example vapor chamber, wherein capillaries run along radial arms of the starburst pattern.

There is further disclosed an example vapor chamber, wherein the wicking means is locally absent from selected portions of the vapor chamber.

There is further disclosed an example vapor chamber, wherein the selected portions comprise approximately 30% or 45% of the vapor chamber.

There is further disclosed an example vapor chamber, wherein the selected portion is between approximately 15% and 70% of the vapor chamber.

There is further disclosed an example vapor chamber, further comprising a heat pipe to conduct heat from an edge of the vapor chamber.

There is further disclosed an example vapor chamber, wherein the vapor chamber is substantially rectangular.

There is further disclosed an example vapor chamber, wherein the rectangular vapor chamber has a planar dimension at least approximately twice another planar dimension.

There is further disclosed an example vapor chamber, wherein the rectangular vapor chamber has a planar dimension between approximately two times and five times the size of another planar dimension.

There is further disclosed an example heat dissipator for a computer apparatus, comprising: a fan; a heat sink; and the vapor chamber of a number of the above examples.

There is further disclosed an example computing apparatus comprising the heat dissipator of a number of the above examples.

There is further disclosed an example computing apparatus, wherein the apparatus is a laptop computer.

There is further disclosed an example computing apparatus, wherein the apparatus is a tablet or smart phone.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A cooling system for an electronic device, comprising:
    vapor chamber coupled to a heat source to distribute heat generated by the heat source;
    at least one fan comprising a main blow direction, wherein the at least one fan is arranged so that the main blow direction is directed towards the vapor chamber, and
    a guiding structure comprising a plurality of channel walls extending into a gap between the vapor chamber and an enclosure of the electronic device or a backside of a screen of the electronic device.

2. The cooling system of claim 1, wherein the guiding structure is arranged on at least one of the surface of the vapor chamber, the enclosure of the electronic device, or a backside of a screen of the electronic device.

3. The cooling system of claim 1, wherein at least 50% of an air flow caused by the at least one fan flows along the surface of the vapor chamber.

4. The cooling system of claim 1, wherein the guiding structure is attached to or integrally formed on the enclosure of the electronic device or the backside of a screen of the electronic device.

5. The cooling system of claim 1, wherein the fan is configured to blow air into the gap.

6. The cooling system of claim 1, further comprising a circuit board configured to carry the heat source, wherein the fan is configured to blow air into a gap extending from the circuit board to the enclosure of the electronic device or the backside of a screen of the electronic device.

7. The cooling system of claim 1, wherein the guiding structure is configured to guide an air flow caused by the fan along the surface of the vapor chamber through one or more channels formed by the plurality of channel walls.

8. The cooling system of claim 1, wherein the guiding structure comprises gasket material.

9. The cooling system of claim 1, wherein the guiding structure completely encloses the vapor chamber at an edge of the vapor chamber except for one or more air inlet openings of the guiding structure and one or more air outlet openings of the guiding structure.

10. The cooling system of claim 1, wherein the main blow direction of the fan is substantially perpendicular to the rotation axis of the fan.

11. The cooling system of claim 1, wherein a main air inlet direction of the fan is substantially in parallel to the rotation axis of the fan.

12. The cooling system of claim 1, wherein no heat sink is located adjacent to the fan.

13. The cooling system of claim 1, wherein the fan comprises a maximal dimension with respect to height, length and width of at most 50 mm.

14. The cooling system of claim 1, wherein a vertical extension of the fan overlaps a vertical extension of the vapor chamber.

15. A cooling system for an electronic device, comprising:
    a heat distribution structure configured to be coupled to a heat source of an electronic device, wherein the heat distribution structure comprises at least one of a vapor chamber or a heat pipe;
    a blower configured to cause an air flow along a surface of the heat distribution structure, wherein the blower comprises at least one of:
        a maximal length and maximal width of at most 20 mm; or
        a maximal thickness of at most 3 mm, and
    a guiding structure comprising a plurality of channel walls extending into a gap between the heat distribution structure and an enclosure of the electronic device.

16. The cooling system of claim 15, wherein at least 50% of the air flow caused by the blower flows along the surface of the heat distribution structure.

17. A cooling system for a computing device, the cooling system comprising:
    a heat conduction element, the heat conduction element being suitable for cooling a processing unit of the computing device;
    at least one blower fan for blowing air across a portion of the heat conduction element;
    a guiding structure comprising a plurality of channel walls extending into a gap between the heat conduction element and a backside of a screen of the electronic device; and
    control circuitry configured to activate or deactivate the at least one blower fan based on a heat load of a processing unit of the computing device.

18. The cooling system of claim 17, wherein the heat conduction element comprises a vapor chamber.

19. A cooling system, comprising:
    a first heat distribution structure coupled to a heat source to distribute heat generated by the heat source;
    a thermal electric cooler;
    a second heat distribution structure, wherein a first surface of the thermal electric cooler is thermally coupled to the first heat distribution structure and a second surface of the thermal electric cooler is thermally coupled to the second heat distribution structure, wherein the first surface is opposite the second surface; and
    a heat pipe arranged adjacent to the thermal electric cooler on the first heat distribution structure.

20. The cooling system of claim 19, wherein the thermal electric cooler is located at least in one direction closer to an edge of the first heat distribution structure than the heat pipe.

21. The cooling system of claim 19, wherein a first surface of the heat pipe is thermally coupled to the first heat distribution structure and a second surface of the heat pipe is thermally coupled to the second heat distribution structure.

* * * * *